(12) United States Patent
Felix

(10) Patent No.: US 12,050,846 B1
(45) Date of Patent: Jul. 30, 2024

(54) ARTIFICIAL INTELLIGENCE BASED ON CELLULAR AUTOMATA

(71) Applicant: Hart Felix LLC, Sarasota, FL (US)

(72) Inventor: Gerard E. Felix, Sarasota, FL (US)

(*) Notice: Subject to any disclaimer, the term of this patent is extended or adjusted under 35 U.S.C. 154(b) by 0 days.

(21) Appl. No.: 18/221,687

(22) Filed: Jul. 13, 2023

Related U.S. Application Data

(62) Division of application No. 18/113,280, filed on Feb. 23, 2023, now Pat. No. 11,847,386.

(51) Int. Cl.
  *G06F 30/20* (2020.01)
  *G06N 3/082* (2023.01)
  *G06N 7/00* (2023.01)

(52) U.S. Cl.
  CPC ............ *G06F 30/20* (2020.01); *G06N 3/082* (2013.01); *G06N 7/00* (2013.01)

(58) Field of Classification Search
  CPC ........... G06N 7/00; G06N 3/082; G06F 30/20
  See application file for complete search history.

(56) References Cited

U.S. PATENT DOCUMENTS

| | | | |
|---|---|---|---|
| 4,333,107 A | | 6/1982 | McGuire et al. |
| 4,512,025 A | * | 4/1985 | Frankel ............... H04L 12/2801 |
| | | | 455/527 |
| 4,809,202 A | | 2/1989 | Wolfram |
| 6,700,946 B2 | | 3/2004 | Zarrineh et al. |
| 8,639,093 B2 | | 1/2014 | Choo et al. |
| 9,507,756 B2 | | 11/2016 | Arad et al. |
| 10,333,802 B2 | | 6/2019 | Arad et al. |
| 2004/0199745 A1 | * | 10/2004 | Schlansker ........... G06F 9/3851 |
| | | | 712/21 |
| 2008/0288566 A1 | | 11/2008 | Umeno et al. |
| 2012/0312879 A1 | * | 12/2012 | Rolin ..................... G07F 7/0846 |
| | | | 235/492 |
| 2021/0326743 A1 | * | 10/2021 | Iftekharuddin ........ G06N 3/044 |

OTHER PUBLICATIONS

Haifeng et al., "Memory Confidentiality and Integrity Protection Method Based on Variable Length Counter", 2014, Journal of Algorithms & Computational Technology vol. 8 No. 4, 421-439.
Liu et al., "SEAD Counter: Self-Adaptive Counters With Different Counting Ranges", 2021, IEEE/ACM Transactions on Networking PP(99):1-17, DOI:10.1109/TNET.2021.3107418.
Basat et al., "SALSA: Self-Adjusting Lean Streaming Analytics", 2021, arXIv:2012.1231 [cs.DS], URL: https://doi.org/10.48550/arXiv.2102.12531, accessed on Mar. 28, 2023, 15 pages.
Morris, Robert H., "Counting large numbers of events in small registers." Commun. ACM 21 (1978): 840-842.

(Continued)

*Primary Examiner* — Zachary K Huson
(74) *Attorney, Agent, or Firm* — Frost Brown Todd LLP

(57) ABSTRACT

An artificial intelligence system can be implemented to identify relationships through the propagation of ripple patterns through a grid. In such a system, the grid may comprise cells which operate as cellular automata. Relationships may be identified based on collisions of signals detected by the cells in the grid, and, when a relationship is identified, it may be used to create high speed connections between cells.

45 Claims, 59 Drawing Sheets

(56) References Cited

OTHER PUBLICATIONS

"Conway's Game of Life", Web page, <https://en.wikipedia.org/wiki/Conway%27s_Game_of_Life>, 6 pages, Feb. 17, 2023, retrieved from Wikipedia, The Free Encyclopedia, Wikimedia Foundation, accessed on Mar. 29, 2023.

"Adder (electronics)", Web page, <https://en.wikipedia.org/w/index.php?title=Adder_(electronics)&oldid=1137956574>, 3 pages, Feb. 7, 2023, retrieved from Wikipedia, The Free Encyclopedia, Wikimedia Foundation, accessed on Mar. 29, 2023.

"Approximate counting algorithm", Web page, <https://en.wikipedia.org/wiki/Approximate_counting_algorithm>, 2 pages, Dec. 24, 2022, retrieved from Wikipedia, The Free Encyclopedia, Wikimedia Foundation, accessed on Mar. 29, 2023.

"Cellular automaton", Web page, <https://en.wikipedia.org/wiki/Cellular_automaton>, 6 pages, Jan. 19, 2023, retrieved from Wikipedia, The Free Encyclopedia, Wikimedia Foundation, accessed on Mar. 29, 2023.

"Carry-lookahead adder", Web page, <https://en.wikipedia.org/w/index.php?title=Carry-lookahead_adder&oldid=1140339826>, 4 pages, Feb. 19, 2023, retrieved from Wikipedia, The Free Encyclopedia, Wikimedia Foundation, accessed on Mar. 29, 2023.

\* cited by examiner

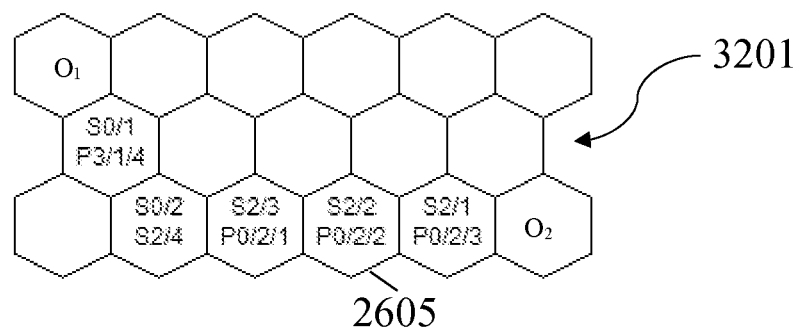
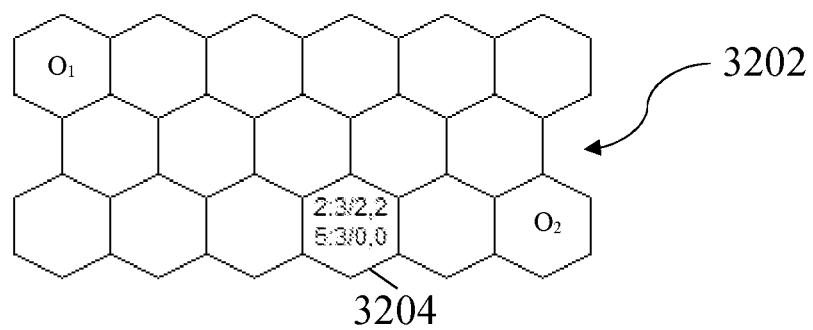
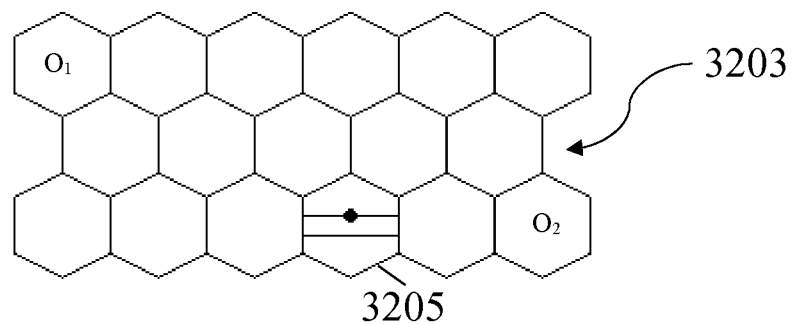
FIG. 32

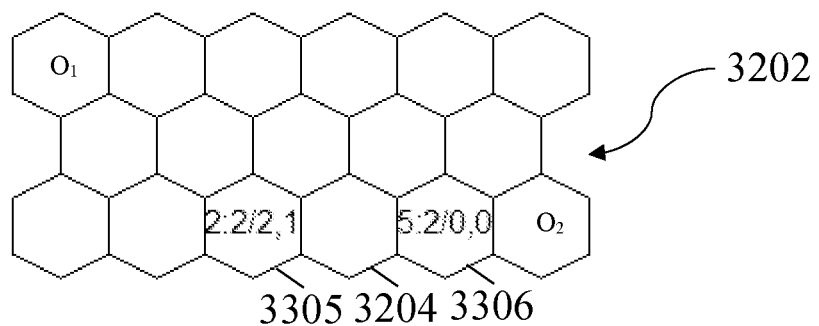
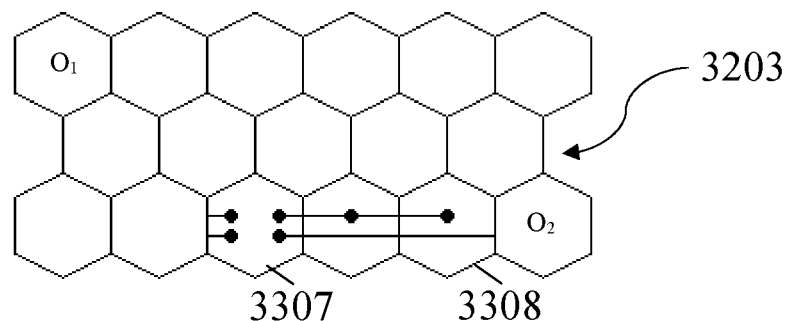
FIG. 33

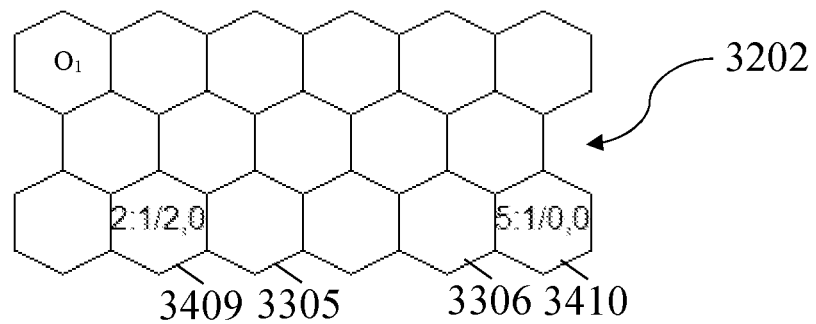
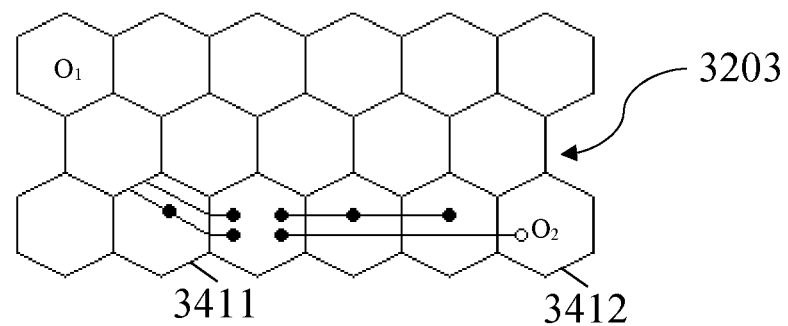
FIG. 34

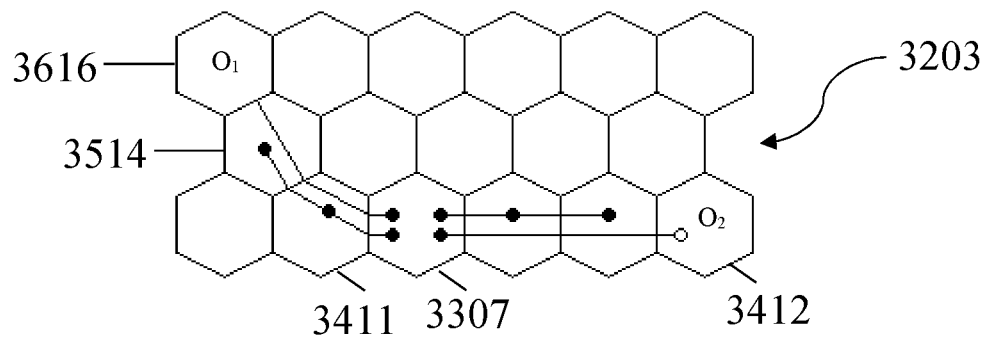
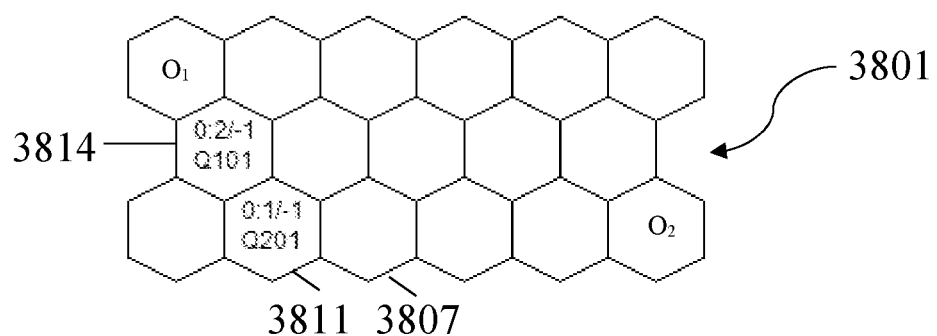
FIG. 38

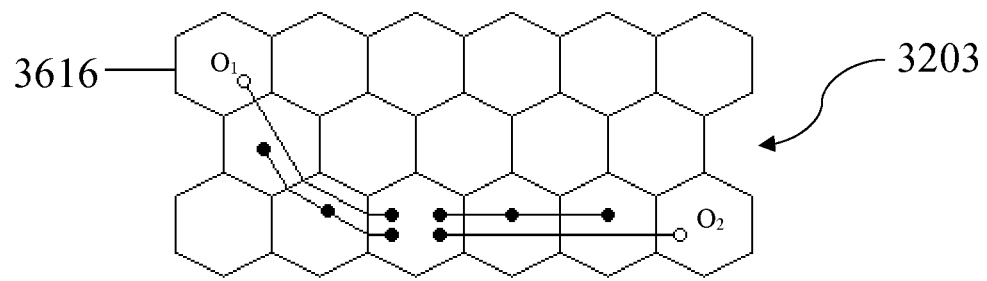
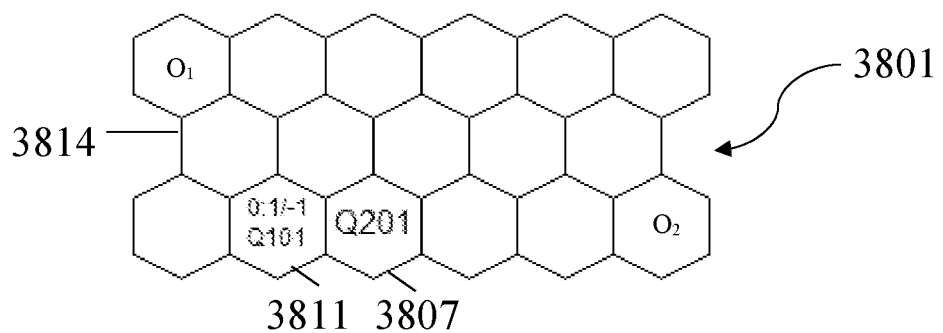
FIG. 39

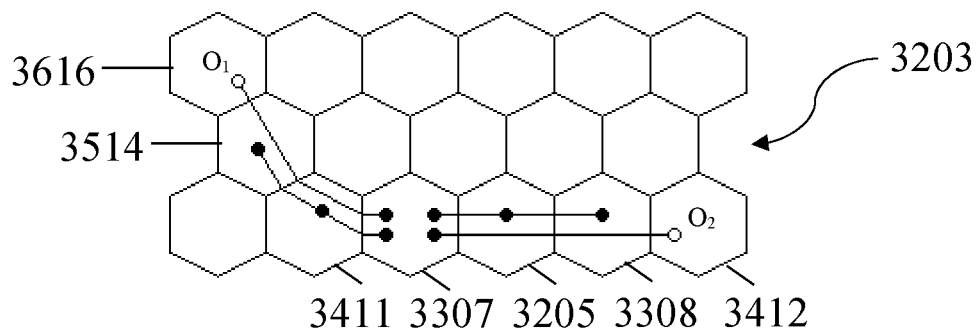
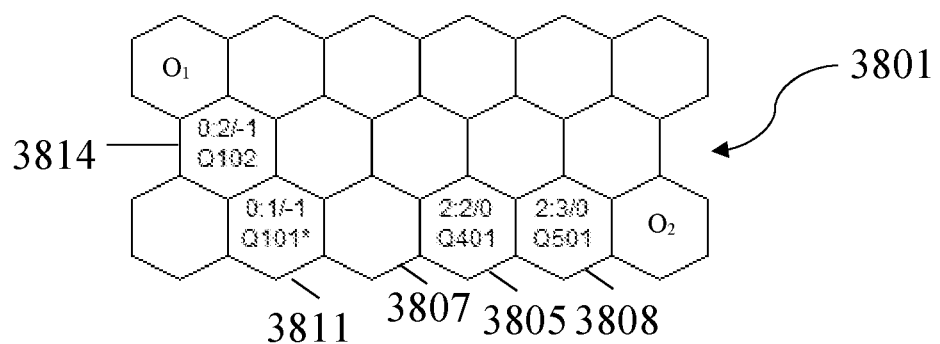
FIG. 40

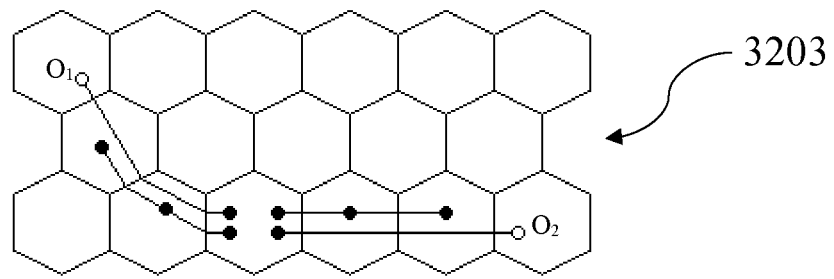
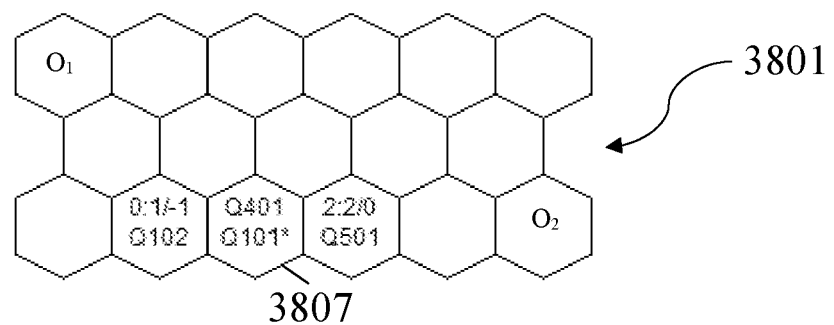
FIG. 41

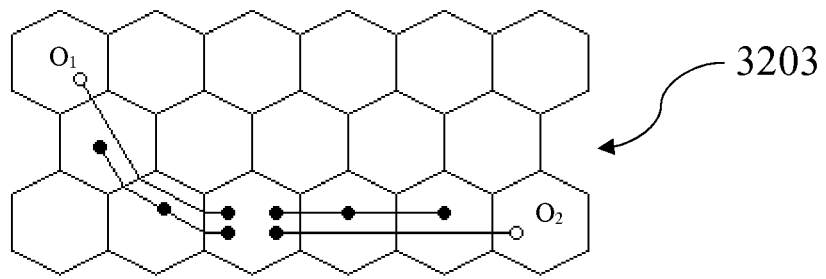
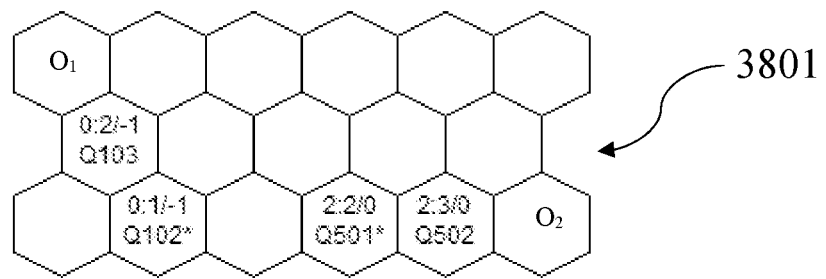
FIG. 42

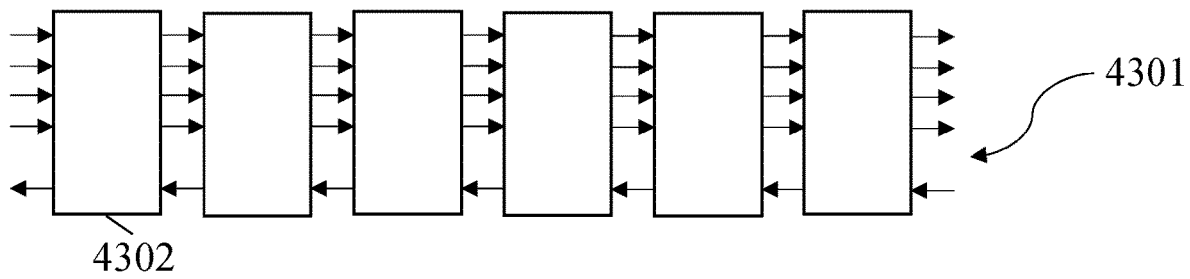
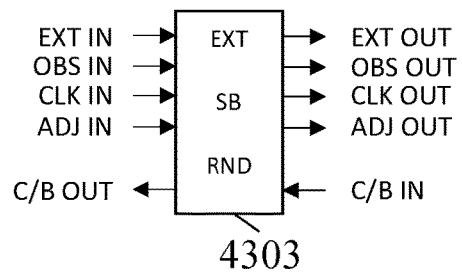
FIG. 43

| Inputs | | | | | Internal State Bits | | | | | Outputs | | | | | |
|---|---|---|---|---|---|---|---|---|---|---|---|---|---|---|---|
| EXT IN | OBS IN | CLK IN | ADJ IN | C/B IN | SB | RND | EXT | SB' | EXT' | C/B OUT | EXT OUT | OBS OUT | CLK OUT | ADJ OUT | |
| 0 | X | X | X | X | X | X | X | dnm | 0 | 0 | 0 | dnm | 0 | dnm | 4501 |
| 0 -> 1 | 0 | X | X | X | X | X | X | 0 | 0 | 0 | 0 | 0 | 0 | 0 | 4502 |
| 0 -> 1 | 1 | X | X | X | X | X | X | 1 | 0 | 0 | 0 | 1 | 0 | 0 | 4503 |
| 1 | X | 0 | X | X | X | X | X | SB | EXT | 0 | EXT | OBS IN | 0 | 0 | 4504 |
| 1 | 0 | 0 -> 1 | 0 | 0 | 0 | 0 | 0 | 0 | 1 | 0 | 1 | 0 | 0 | 0 | 4505 |
| 1 | 0 | 0 -> 1 | 0 | 0 | 0 | 0 | 1 | 0 | 1 | 0 | 1 | 0 | 0 -> 1 | 0 | 4506 |
| 1 | 0 | 0 -> 1 | 0 | 0 | 0 | 1 | 0 | 0 | 0 | 0 | 0 | 0 | 0 | 0 | 4507 |
| 1 | 0 | 0 -> 1 | 0 | 0 | 0 | 1 | 1 | 0 | 1 | 0 | 1 | 0 | 0 | 0 | 4508 |
| 1 | 0 | 0 -> 1 | 0 | 0 | 1 | 0 | 0 | 0 | 0 | 0 | 0 | 0 | 0 | 0 | 4509 |
| 1 | 0 | 0 -> 1 | 0 | 0 | 1 | 0 | 1 | 1 | 1 | 0 | 1 | 0 | 0 -> 1 | 1 | 4510 |
| 1 | 0 | 0 -> 1 | 0 | 0 | 1 | 1 | 0 | 1 | 1 | 0 | 1 | 0 | 0 | 0 | 4511 |
| 1 | 0 | 0 -> 1 | 0 | 0 | 1 | 1 | 1 | 1 | 1 | 0 | 1 | 0 | 0 -> 1 | 0 | 4512 |
| 1 | 0 | 0 -> 1 | 1 | 0 | 0 | 0 | 0 | 1 | 0 | 0 -> 1 | 0 | 0 | 0 | 0 | 4513 |
| 1 | 0 | 0 -> 1 | 1 | 0 | 0 | 0 | 1 | 0 | 1 | 0 | 1 | 0 | 0 -> 1 | 1 | 4514 |
| 1 | 0 | 0 -> 1 | 1 | 0 | 0 | 1 | 0 | 1 | 0 | 0 -> 1 | 0 | 0 | 0 | 0 | 4515 |
| 1 | 0 | 0 -> 1 | 1 | 0 | 0 | 1 | 1 | 0 | 1 | 0 | 1 | 0 | 0 -> 1 | 1 | 4516 |
| 1 | 0 | 0 -> 1 | 1 | 0 | 1 | 0 | 0 | 0 | 0 | 0 | 0 | 0 | 0 | 0 | 4517 |
| 1 | 0 | 0 -> 1 | 1 | 0 | 1 | 0 | 1 | 1 | 1 | 0 | 1 | 0 | 0 -> 1 | 1 | 4518 |
| 1 | 0 | 0 -> 1 | 1 | 0 | 1 | 1 | 0 | 0 | 0 | 0 | 0 | 0 | 0 | 0 | 4519 |
| 1 | 0 | 0 -> 1 | 1 | 0 | 1 | 1 | 1 | 1 | 1 | 0 | 1 | 0 | 0 -> 1 | 1 | 4520 |

FIG. 45A

| Inputs | | | | | Internal State Bits | | | | | Outputs | | | | | |
|---|---|---|---|---|---|---|---|---|---|---|---|---|---|---|---|
| EXT IN | OBS IN | CLK IN | ADJ IN | C/B IN | SB | RND | EXT | SB* | EXT* | C/B OUT | EXT OUT | OBS OUT | CLK OUT | ADJ OUT | |
| 1 | 1 | 0->1 | 0 | 0 | 0 | 0 | 0 | 0 | 1 | 0 | 1 | 1 | 0 | 0 | 4521 |
| 1 | 1 | 0->1 | 0 | 0 | 0 | 0 | 1 | 0 | 1 | 0 | 1 | 1 | 0->1 | 0 | 4522 |
| 1 | 1 | 0->1 | 0 | 0 | 0 | 1 | 0 | 1 | 0 | 0 | 0 | 1 | 0 | 0 | 4523 |
| 1 | 1 | 0->1 | 0 | 0 | 0 | 1 | 1 | 0 | 1 | 0 | 1 | 1 | 0->1 | 1 | 4524 |
| 1 | 1 | 0->1 | 0 | 0 | 1 | 0 | 0 | 1 | 0 | 0 | 0 | 1 | 0 | 0 | 4525 |
| 1 | 1 | 0->1 | 0 | 0 | 1 | 0 | 1 | 1 | 1 | 0 | 1 | 1 | 0 | 0 | 4526 |
| 1 | 1 | 0->1 | 0 | 0 | 1 | 1 | 0 | 1 | 1 | 0 | 1 | 1 | 0 | 0 | 4527 |
| 1 | 1 | 0->1 | 0 | 0 | 1 | 1 | 1 | 1 | 1 | 0 | 1 | 1 | 0->1 | 0 | 4528 |
| 1 | 1 | 0->1 | 1 | 0 | 0 | 0 | 0 | 1 | 0 | 0 | 0 | 1 | 0 | 0 | 4529 |
| 1 | 1 | 0->1 | 1 | 0 | 0 | 0 | 1 | 0 | 1 | 0 | 1 | 1 | 0->1 | 1 | 4530 |
| 1 | 1 | 0->1 | 1 | 0 | 0 | 1 | 0 | 1 | 0 | 0 | 0 | 1 | 0 | 0 | 4531 |
| 1 | 1 | 0->1 | 1 | 0 | 0 | 1 | 1 | 0 | 1 | 0 | 1 | 1 | 0->1 | 1 | 4532 |
| 1 | 1 | 0->1 | 1 | 0 | 1 | 0 | 0 | 0 | 0 | 0->1 | 0 | 1 | 0 | 0 | 4533 |
| 1 | 1 | 0->1 | 1 | 0 | 1 | 0 | 1 | 1 | 1 | 0 | 1 | 1 | 0->1 | 1 | 4534 |
| 1 | 1 | 0->1 | 1 | 0 | 1 | 1 | 0 | 0 | 0 | 0->1 | 0 | 1 | 0 | 0 | 4535 |
| 1 | 1 | 0->1 | 1 | 0 | 1 | 1 | 1 | 1 | 1 | 0 | 1 | 1 | 0->1 | 1 | 4536 |
| 1 | 0 | 1 | X | 0->1 | 0 | X | X | 1 | 1 | 0->1 | 1 | 0 | 0 | 0 | 4537 |
| 1 | 0 | 1 | X | 0->1 | 1 | X | X | 0 | 1 | 0 | 1 | 0 | 0 | 0 | 4538 |
| 1 | 1 | 1 | X | 0->1 | 0 | X | X | 1 | 1 | 0 | 1 | 1 | 0 | 0 | 4539 |
| 1 | 1 | 1 | X | 0->1 | 1 | X | X | 0 | 1 | 0->1 | 1 | 1 | 0 | 0 | 4540 |
| 1 | X | 1->0 | X | X | X | X | X | SB | EXT | 0 or 1->0 | EXT | dnm | 0 or 1->0 | dnm | 4541 |

FIG. 45B

| | 4601 Incoming Disposition and Instruction | 4602 Extend Check | 4603 Extend Action | 4604 Adjust Check | 4605 Adjust and C/B Action |
|---|---|---|---|---|---|
| | | | Narrative | | |
| 4501 | EM Currently Inactive | | | | |
| 4502 | Initialize, set SB' to OBS IN (0) | | | | |
| 4503 | Initialize, set SB' to OBS IN (1) | | | | |
| 4504 | EM in Ready State | | | | |
| 4505 | In from Left: consider extend | Possibly extend | Extend: activate Right neighbor | | |
| 4506 | In from Left: consider extend | Possibly extend | Tell Right: consider extending | | |
| 4507 | In from Left: consider extend | Don't extend; adjust? | | No, silently quit | |
| 4508 | In from Left: consider extend | Don't extend; adjust? | | No, silently quit | |
| 4509 | In from Left: consider extend | Don't extend; adjust? | | Yes, adjust self | Flip Stored Bit (SB) |
| 4510 | In from Left: consider extend | Don't extend; adjust? | | Yes, tell Right to adjust. | |
| 4511 | In from Left: consider extend | Possibly extend | Extend: activate Right neighbor | | |
| 4512 | In from Left: consider extend | Possibly extend | Tell Right: consider extending | | |
| 4513 | In from Left: Adjust | | | | Flip SB; Tell Left to Carry/Borrow |
| 4514 | In from Left: Adjust | | | Tell Right to adjust | |
| 4515 | In from Left: Adjust | | | | Flip SB; Tell Left to Carry/Borrow |
| 4516 | In from Left: Adjust | | | Tell Right to adjust | |
| 4517 | In from Left: Adjust | | | | Flip Stored Bit (SB) |
| 4518 | In from Left: Adjust | | | Tell Right to adjust | |
| 4519 | In from Left: Adjust | | | | Flip Stored Bit (SB) |
| 4520 | In from Left: Adjust | | | Tell Right to adjust | |

FIG. 46A

| | Incoming Disposition and Instruction | Extend Check | Narrative Extend Action | Adjust Check | Adjust and C/B Action |
|---|---|---|---|---|---|
| 4521 | In from Left: consider extend | Possibly extend | Extend: activate Right neighbor | | |
| 4522 | In from Left: consider extend | Possibly extend | Tell Right: consider extending | | |
| 4523 | In from Left: consider extend | Don't extend; adjust? | | Yes, adjust self | Flip Stored Bit (SB) |
| 4524 | In from Left: consider extend | Don't extend; adjust? | | Yes, tell Right to adjust. | |
| 4525 | In from Left: consider extend | Don't extend; adjust? | | No, silently quit | |
| 4526 | In from Left: consider extend | Don't extend; adjust? | | No, silently quit | |
| 4527 | In from Left: consider extend | Possibly extend | Extend: activate Right neighbor | | |
| 4528 | In from Left: consider extend | Possibly extend | Tell Right: consider extending | | |
| 4529 | In from Left: Adjust | | | | Flip Stored Bit (SB) |
| 4530 | In from Left: Adjust | | | Tell Right to adjust | |
| 4531 | In from Left: Adjust | | | | Flip Stored Bit (SB) |
| 4532 | In from Left: Adjust | | | Tell Right to adjust | |
| 4533 | In from Left: Adjust | | | | Flip SB; Tell Left to Carry/Borrow |
| 4534 | In from Left: Adjust | | | Tell Right to adjust | |
| 4535 | In from Left: Adjust | | | | Flip SB; Tell Left to Carry/Borrow |
| 4536 | In from Left: Adjust | | | Tell Right to adjust | |
| 4537 | In From Right: Carry / Borrow | | | | Flip SB; Tell Left to Carry/Borrow |
| 4538 | In From Right: Carry / Borrow | | | | Flip Stored Bit (SB) |
| 4539 | In From Right: Carry / Borrow | | | | Flip Stored Bit (SB) |
| 4540 | In From Right: Carry / Borrow | | | | Flip SB; Tell Left to Carry/Borrow |
| 4541 | Clean up: Q-> C/B OUT, CLK OUT | | | | |

ARTIFICIAL INTELLIGENCE BASED ON CELLULAR AUTOMATA

This application is a divisional application of U.S. patent application Ser. No. 18/113,280, entitled "Artificial Intelligence Based on Cellular Automata," filed Feb. 23, 2023.

BACKGROUND

Artificial intelligence has been applied in a wide variety of contexts, from text generation algorithms which can generate extensive prose from minimal prompts, to neural networks which can be trained to classify inputs and make predictions. However, existing artificial intelligence systems tend to be pre-wired, in that their structure and function will be tuned for a particular purpose and/or type of information collection. This makes these systems both more difficult to create and less flexible in practice. Accordingly, there is a need for a system which could provide benefits of artificial intelligence without the same degree of pre-wiring which characterizes many presently used systems. While various types of systems with varying degrees of flexibility have been made and used, it is believed that no one prior to the inventor has made or used the invention described in the appended claims.

SUMMARY

The disclosed technology can be used to implement artificial intelligence systems which identify relationships between items in an input data set based on detecting collisions of ripple patterns in a grid of cellular automata. For example, an embodiment may include a machine which comprises a plurality of cells. In such an embodiment, each of the cells may be configured to, based on receiving an input signal, send a ripple pattern outward from that cell. In such an embodiment, each of the cells may be configured to receive ripple patterns sent from other cells comprised by the plurality of cells. In such an embodiment, each of the cells may be configured to determine that a signal collision has taken place based on simultaneously receiving a plurality of ripple patterns sent from other cells comprised by the plurality of cells. In such an embodiment, each of the cells may be configured to, based on determining that the signal collision has taken place, determine whether to report the signal collision. In such an embodiment, each of the cells may be configured to, based on determining to report the signal collision, send signal collision information for the signal collision to a memory element. Corresponding methods and non-transitory computer readable media could also be implemented based on the disclosure set forth herein.

While multiple examples are described, still other examples of the described subject matter will become apparent to those skilled in the art from the following detailed description and drawings, which show and describe illustrative examples of disclosed subject matter. As will be realized, the disclosed subject matter is capable of modifications in various aspects, all without departing from the spirit and scope of the described subject matter. Accordingly, the drawings and detailed description are to be regarded as illustrative in nature and not restrictive.

BRIEF DESCRIPTION OF THE DRAWINGS

The accompanying drawings, which are incorporated in and constitute a part of this specification, illustrate embodiments of the invention, and, together with the general description of the invention given above, and the detailed description of the embodiments given below, serve to explain the principles of the present invention.

FIG. 32 shows how a memory grid might interact with a transient part of a connection system grid and a persistent part of a connection system grid;

FIG. 33 shows how a transient part of a connection system and a persistent part of a connection system grid might appear one time step after FIG. 32;

FIG. 34 shows how the transient part of a connection system and a persistent part of a connection system grid might appear one time step after FIG. 33;

FIG. 38 shows the persistent part of a connection system at the same time step as FIG. 35, showing how a transient memory grid may appear at that time step;

FIG. 39 shows the persistent part of a connection system one time step after FIG. 38, consistent with the time step of FIG. 36, and how a transient memory grid may appear at that time step;

FIG. 40 shows the persistent part of a connection system and the transient part of a memory network as they may appear one time step after FIG. 39;

FIG. 41 shows the persistent part of a connection system and the transient part of a memory network as they may appear one time step after FIG. 40;

FIG. 42 shows the persistent part of a connection system and the transient part of a memory network as they may appear one time step after FIG. 41;

FIG. 43 depicts an exemplary architecture for an estimator and an estimator module;

FIGS. 45A-45B are a table of values providing the resultant state changes, and outputs, based on various inputs;

FIGS. 46A-46B provide narratives for each of the state changes in the table shown on FIGS. 45A-45B;

Figure 1:
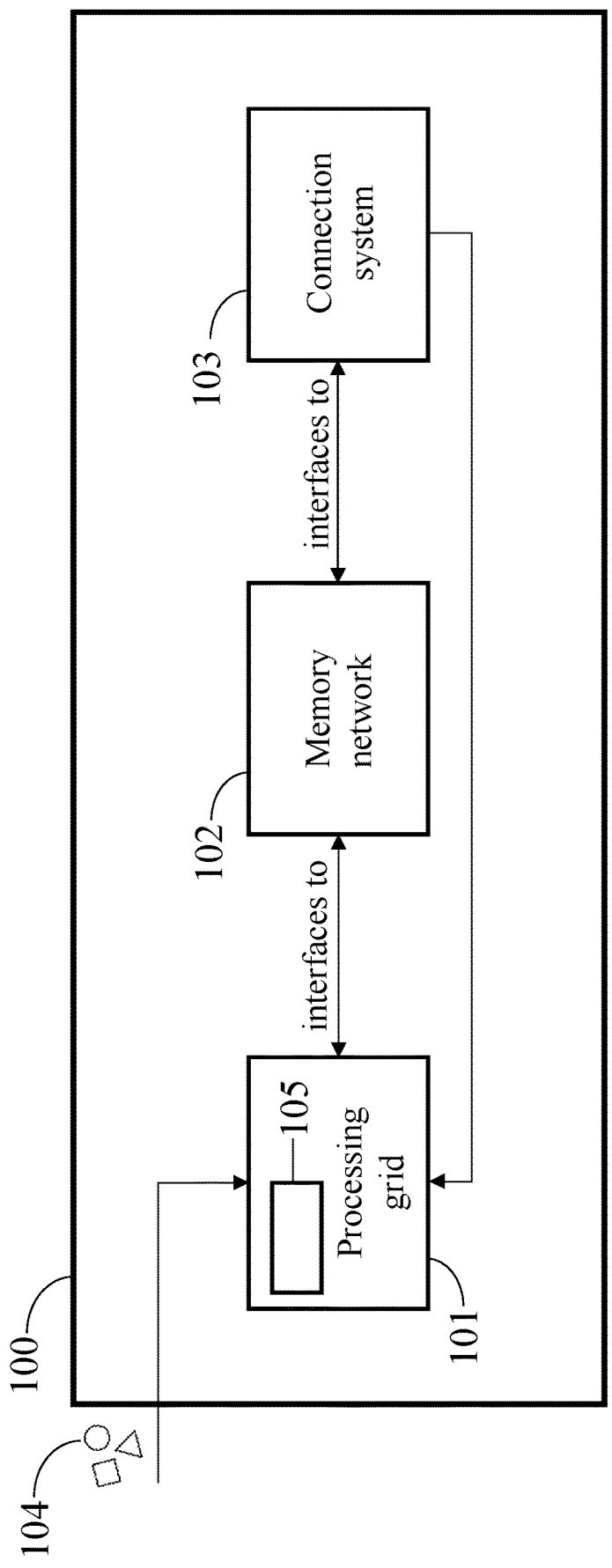
FIG. 1 depicts a high-level architecture for an artificial intelligence system.

The drawings are not intended to be limiting in any way, and it is contemplated that various embodiments of the invention may be carried out in a variety of other ways, including those not necessarily depicted in the drawings. The accompanying drawings incorporated in and forming a part of the specification illustrate several aspects of the present invention, and together with the description serve to explain the principles of the invention; it being understood, however, that this invention is not limited to the precise arrangements shown.

DETAILED DESCRIPTION

The following description should not be used to limit the scope of protection provided by this document or any related document. Other examples, features, aspects, embodiments, and advantages of the disclosed technology will become apparent to those skilled in the art from the following description. As will be realized, the disclosed technology is capable of other different and obvious aspects, all without departing from the invention. Accordingly, the drawings and descriptions should be regarded as illustrative in nature and not restrictive.

Turning now to the figures, FIG. 1 illustrates a high-level architecture for an artificial intelligence system 100 that could be implemented based on this disclosure. As shown in that figure, such a system 100 may comprise three primary components, a processing grid 101, a memory network 102, and a connection system 103. As discussed in more detail herein, the processing grid 101 may receive inputs 104 (e.g., data files for training the system 100 or for the system 100 to use as a basis for predictions) and identify potential relationships between data items in the inputs 104 for reporting to the memory network 102. The memory network 102 may then track the potential relationships reported by the processing grid, and may pass those relationships to the connection system 103 for use in establishing connections between related cells in the processing grid. Once such relationships and connections had been established, they could allow an artificial intelligence system 100 such as described to be used for tasks such as classification, prediction, and/or filling in missing data. Additionally, in some cases these relationships and connections may be encoded on a computer readable medium and used to configure the memory network and connection system of a different instance of the artificial intelligence system, essentially allowing learning by one instance to be seamlessly transferred to another instance without requiring a separate training process. Similarly, in some cases, an artificial intelligence system such as described herein could allow for relationships established for one portion of a processing grid (e.g., in the form of values in corresponding portions of the memory network and connection system) to be copied to other portions, thereby allowing the training of one part of an artificial intelligence system to be leveraged for other parts, in much the same way as analogies may allow humans to more quickly understand and/or gain insights regarding new or unfamiliar subjects.

The discussion below provides examples of how each of the components illustrated in FIG. 1 could be implemented, and how their operation could support the overall functionality of the artificial intelligence system 100. However, it should be understood that the examples discussed below are intended to be illustrative only, and that one of ordinary skill in the art could implement components of an artificial intelligence system in other ways based on this disclosure. Accordingly, the descriptions of how the components shown in FIG. 1 could be implemented should not be treated as implying limitations on the protection provided by this document or any other related document.

Figure 2:
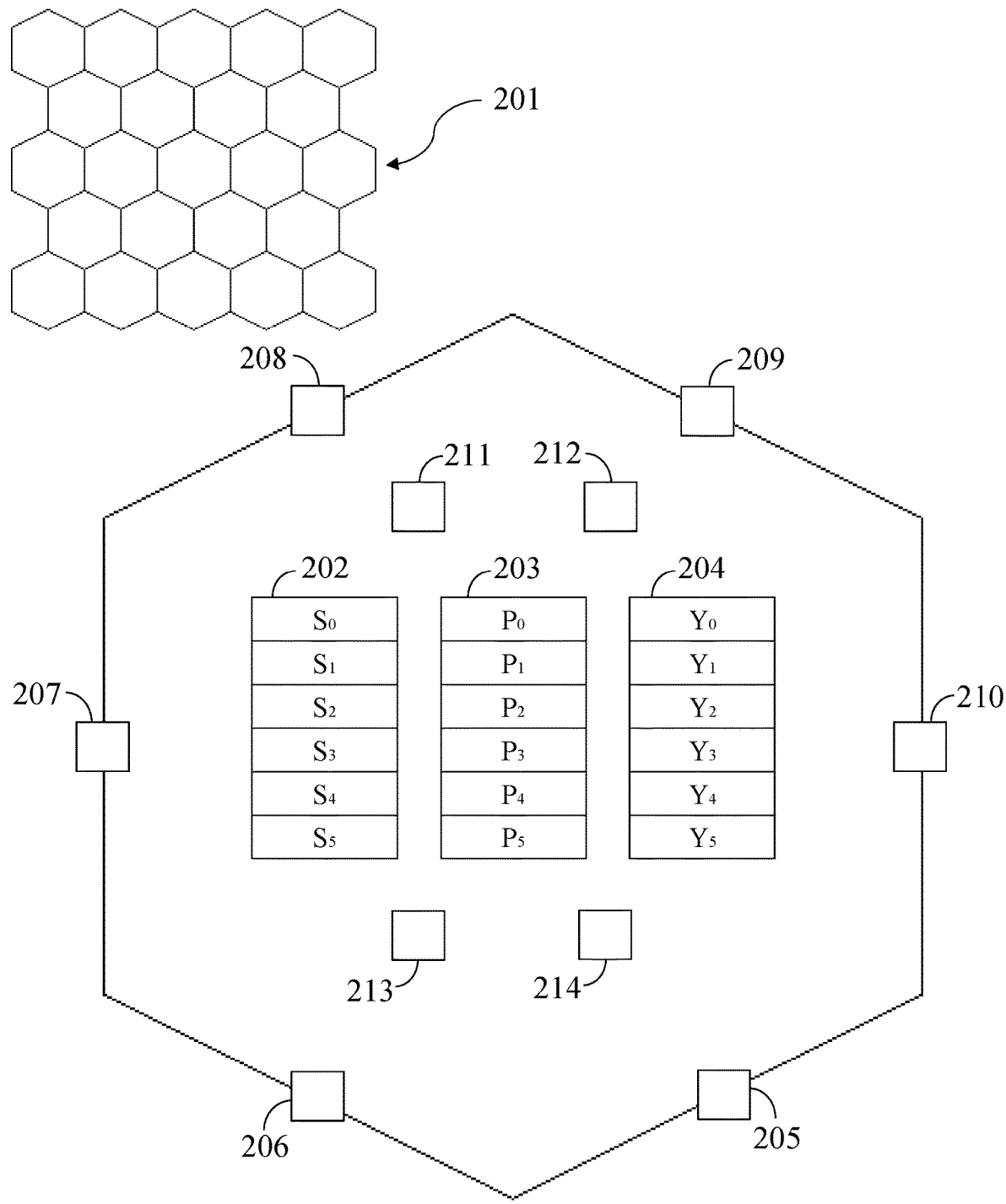
FIG. 2 depicts an exemplary architecture which could be used in implementing a processing grid.

Turning first to the processing grid 101, FIG. 2 illustrates an exemplary architecture which could be used in implementing a processing grid 101 in some embodiments. As shown in FIG. 2, a processing grid 101 may comprise a plurality of cells 201, and each of the cells within the plurality of cells may comprise memory elements 202 203 204, connections 205 206 207 208 209 210 to other cells, as well as a memory connection 211 to a corresponding element in the memory network 102, an input connection 212, a clock connection 213, and a connection 214 to the connection system 103. Additionally, as shown in FIG. 1, a processing grid 101 may include a mapping module 105 which could control provision of signals representing particular data items from an input 104 to cells in the grid. Subsequently, the cells, using their connections 205-210 to other cells, could propagate those signals throughout the processing grid 101, thereby allowing relationships between signals to be detected and used for purposes such as making predictions or filling in missing data items in data sets related to the input 104.

Processing grids 101 following the architecture of FIG. 2 could be implemented in a variety of manners. For example, in some cases, a processing grid 101 may be implemented as a collection of physical cells, in which case the connections 205-213 may be implemented using wires which could transmit electric signals into or out of a cell, while the memory elements 202-204 may be implemented as arrays of registers, with each array comprising one register for each connection 205-210 between that cell and another cell. Alternatively, a processing grid 101 may be implemented using software, in which case each cell may be an object of a cell base class, with the memory elements 202-204 being implemented using a fixed size array stored as a data element within the object, the connections 205-212 being implemented as pointers to appropriate objects (e.g., neighboring cells in the grid), and the clock connection 213 being implemented using a function which would be exposed by the cell object and periodically called by an external process (e.g., the main control loop of a software application). As another example of a potential software implementation, in some cases, rather than storing data in fixed sized arrays, a cell could store only data indicating where nonzero values would be stored in an array based implementation such as described above. In such a case, rather than having dedicated $S_0$-$S_5$, $Y_0$-$Y_5$ and $P_0$-$P_5$ components, a linked list, vector or similar data structure could store pairs of values such as ($S_0$, 127) or ($P_1$, 124), capturing the same information as a fixed size array implementation, but in potentially a more memory efficient form.

Variations on these potential implementations are also possible. For example, in a software embodiment, rather than implementing connections 205-210 as pointers to neighboring cells, a cell could store identifiers for its neighboring cells, and pass those identifiers (along with information to be communicated) to a global function which would be responsible for properly directing the information based on the identifiers. Similarly, in a hardware embodiment, rather than implementing memory elements 202-204 as arrays of registers, the memory elements 202-204 could be implemented using random access memory (RAM) microchips, or using non-volatile memory elements such as solid state memory. Other variations are also possible and will be immediately apparent to those of ordinary skill in light of this disclosure. Accordingly, the above examples should be understood as being illustrative only, and should not be treated as limiting on the protection provided by this document or any related document.

Figure 3:
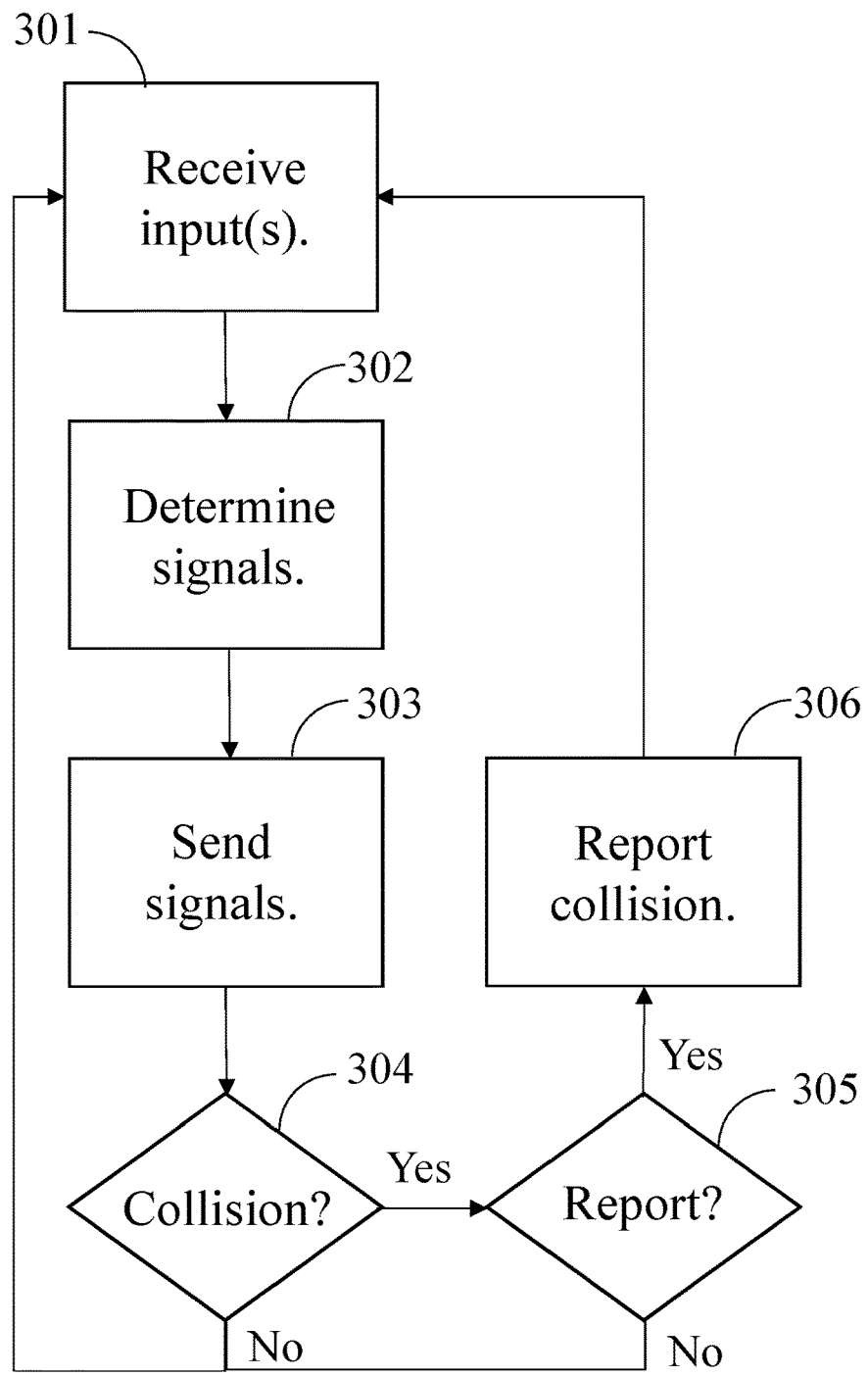
FIG. 3 depicts a process in which signals could be propagated, and relationships identified, through the distributed processing of individual cells in a grid.
Figure 4:
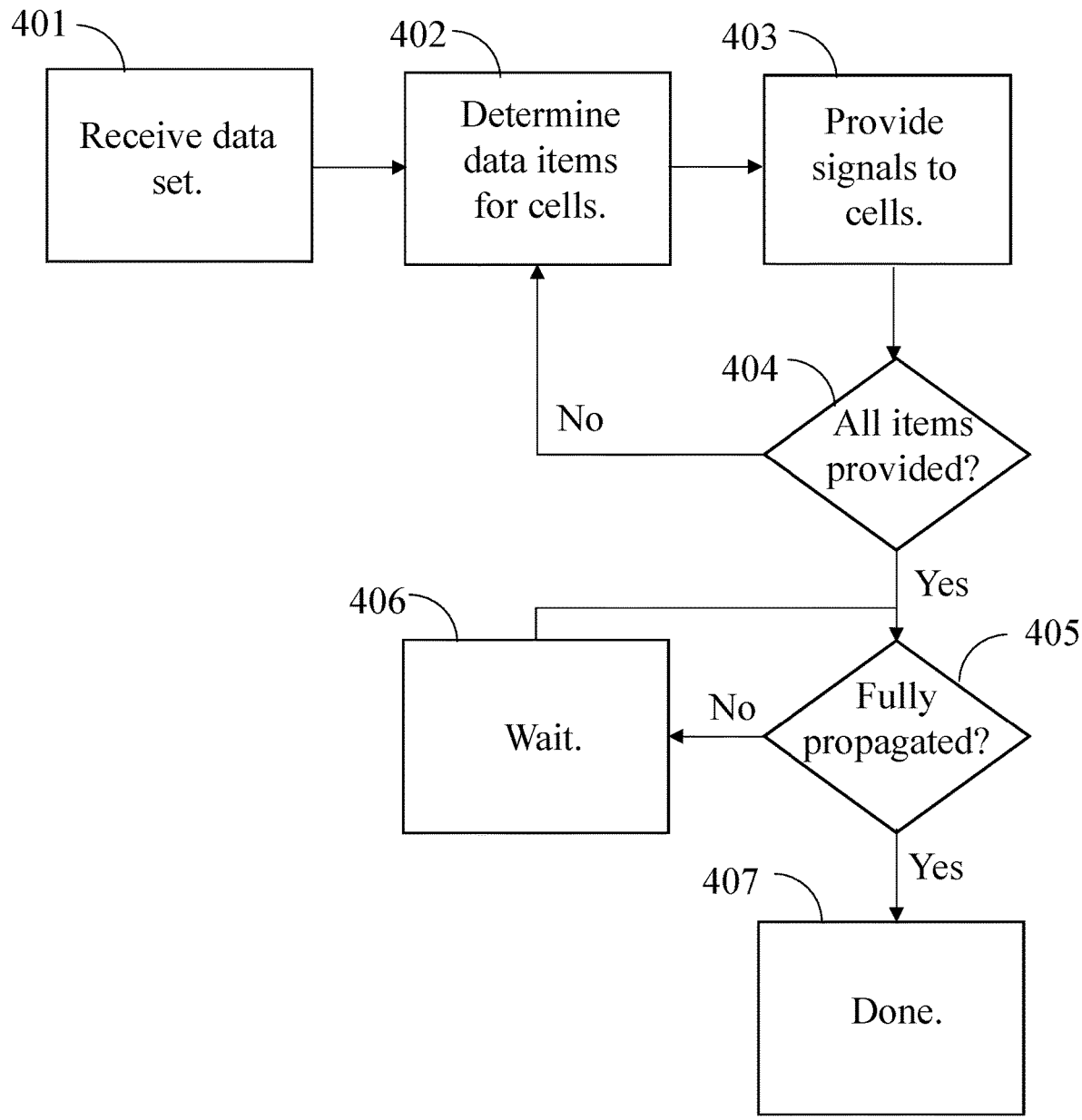
FIG. 4 depicts an illustrative process which may be used in mapping inputs to cells.

A mentioned above, a processing grid 101 having an architecture such as shown in FIG. 2 may identify relationships between input data items based on propagation of signals representing those data items through the grid's cells. To illustrate how this may take place, consider FIG. 3, which illustrates a process in which signals could be propagated, and relationships identified, through the distributed processing of individual cells in the grid. As shown in FIG. 3, such a process could begin with a cell receiving 301 inputs. This may be done, for example, by an external input 104 being provided to a mapping module 105, and the mapping module 105 providing signals on the input connections 212 of the cells based on the external input using a process such as shown in FIG. 4. As shown in that figure, such a process may begin with the mapping module 105 receiving 401 a data set, with the data set being information comprising values with relationships relevant to a task. For example, for the task of identifying digits, then each image in the MNIST database, together with an identification of the digit that image represented, could be conceived of as a data set, since relationships of the pixels in an image to each other and to the identification of the digit represented by that image, would be relevant to the task of digit identification. Thus, in this example, receiving 401 a data set may constitute receiving an image from the MNIST database, along with metadata indicting the digit depicted in that image.

Once the data set had been received 401, the mapping module 105 could determine 402 the data items to use for providing inputs to cells in the processing grid 101. To continue the example in which the data set is an image from the MNIST database, consider that such an image can be conceived of as a string of 6,276 bits (i.e., 8 bits for each pixel of a 28×28 pixel image, plus 4 bits representing the digit depicted in that image). In a case where the processing grid 101 comprises at least one cell for each of those 6,276 bits, determining 402 the data items for the cells may be performed by simply maintaining a correlation between each bit in the 6,276 bit string and an input connection 212 of a corresponding cell in the processing grid 201. This may be done physically using wires, optical fibers, or other information communication media, or logically, such as by maintaining correlations between cells in the processing grid and locations in the input dataset in a memory. However, other approaches to determining 402 data items for cells may be used in some cases. For example, if the processing grid 101 only had eight cells which would receive input signals based on the received data set, then determining 402 the data items may be performed by separating the input data set into 8 bit chunks, and establishing connections between only the chunk which was presently being processed and the corresponding cells in the processing grid 101 (e.g., establishing connections between the first 8 bits in the 6,276 bit string and the 8 cells which would receive input on a first iteration, establishing connections between the second 8 bits in the 6,276 bit string and the 8 cells which would receive input on a second iteration, etc.).

In the process of FIG. 4, once the data items had been determined 402, signals could be provided 403 on the input connections 212 of those data items' cells. This may be done in a variety of manners. For example, in some cases, signals could be provided to appropriate cells in the processing grid using a data bus which would deliver them based on addresses used to identify the individual cells. Alternatively, in other cases (e.g., where cells in the processing grid are not individually addressable), individual cells in a processing grid may be wired (or otherwise connected, such as through the use of optical fiber) to locations which could store the input signals, and the input signals would be provided simply by being transmitted across the wires.

Variations are also possible based on the relationship between the input data and the processing grid itself. To illustrate, consider the case from the preceding example where an image from the MNIST database was represented as a string of 6,276 bits, and the processing grid 101 comprises one cell corresponding to each of those bits (e.g., 624,100 cell grid, with 6,276 cells dedicated to receiving individual bits from the string), a positive input signal (e.g., sequence representing an initial value of 127) could be provided on the input connection 212 of each cell corresponding to a "1" in the 6,276 bit string, and a negative input signal (e.g., a sequence representing an initial value of −127) could be provided on the input connection 212 of each cell corresponding to a "0" in the 6,276 bit string. Similarly, if the processing grid 101 comprised only eight cells which would receive input signals, the first bit of the relevant eight bit sequence of the 6,276 bit string could be converted to an appropriate input signal (e.g., a positive input signal if the bit was a "1", and a negative input signal if the bit was a "0") and provided on the input connection 212 of a first cell, a second bit of the relevant eight bit sequence could be converted to an appropriate input signal and provided on the input connection of a second cell, etc.

Other approaches to providing signals 403 may also be used in some cases. For example, in some cases, a mapping module 105 may be configured to provide an input signal based on multiple data items. For example, in the case where a processing grid comprises eight cells which would receive signals based on individual bits in an eight-bit sequence (e.g., a first cell which could receive a signal based on the first bit, a second cell which could receive a signal based on the second bit, etc.) the grid might also comprise cells which would receive signals based on combinations of bits. For example, a first multi-bit cell which could receive a signal if the first and second bit were both 1, a second multi-bit cell which would receive a signal if the first and third bit were both 1, etc. Similarly, in some cases, a multi-bit cell may receive an input determined based on comparing data bits with each other (e.g., could be provided an input signal by providing data streams as inputs to an XOR or NOT XOR gate). Accordingly, the examples provided above, in which cells would receive based exclusively on individual data items, should be understood as being illustrative only, and should not be treated as limiting.

Once signals for the determined data items had been provided 403 to the appropriate cells, a mapping module 105 performing a process such as shown in FIG. 4 could determine 404 if all items from a particular data set had been provided. Whether this had been done could depend on the relationships between the data items and cells, and on how many times the determination 402 of data items and provision 403 of signals had been performed for that data set. For example, in the case of a data set represented by a 6,276 bit string where the processing grid 101 comprised at least one cell for each of those 6,276 bits, all of the necessary input signals could be provided at once, so the determination 404 would be that all data items had been provided after the first iteration. Alternatively, in the case where the data set was represented by a 6,276 bit string and signals would be provided 403 for only eight bits of that string at a time, then, after the first iteration, the determination 404 would be that all data items had not yet been provided. In this case, on the next clock tick the mapping module could repeat data item determination 402 and signal provision 403 with the next eight bits of the string. This loop could then be repeated until all of the data items from the data set had been processed (which, in the case of a 6,276 bit string which was provided eight bits at a time, would be 785 iterations).

Once all items from a data set (e.g., in the example above all the bits from a single picture in the MNIST dataset) had been provided, a further determination 405 could be made as to whether all of the signals from those items had fully propagated through the processing grid 101. In this way, a system implemented using a mapping module such as described could ensure that all signals representing information in a particular data set had potentially been allowed to interact, while preventing interactions of signals across data sets which could potentially generate spurious relationships. To illustrate how this may take place, consider the case in which eight cells in a processing grid received input signals based on eight-bit sequences of data items, but the processing grid itself had dimensions of 500×500 and the signals provided based on the data items decreased in intensity as they propagated through the grid. In such a case, to ensure that signals could propagate through the entire processing grid, each input signal (which, as noted above, some embodiments may allow to be either positive or negative) may be provided at an intensity of 256, which could allow even cells which were as far apart as possible (i.e., 500 cells apart) to generate signals which could intersect before fully dissipating (assuming that signals were emitted from their input cells and dissipated at a rate of 1 intensity/cell). To account for this intensity, a mapping module 105 performing the method of FIG. 4 may wait 406 for 256 clock ticks after the last signals were provided 403, thereby giving those signals a chance to fully propagate through the processing grid 101. Once the signals had fully propagated, the process of FIG. 4 may be complete 407, and the processing grid 101 may be ready to receive signals from the next data set (e.g., the next picture from the MNIST database, in the example given previously).

Returning now to the discussion of FIG. 3, after a cell had received 301 its input, it could determine 302 what signals to send to its neighboring cells, and then send 303 those signals as appropriate. This may be done, for example, using logic which propagates a signal from an external input 104 in a ripple pattern in which, over time, the signal would both expand away from its origin and decrease in intensity. One way this type of logic could be implemented is to cause an input to generate a first type of signal, which would extend in straight lines until it had been completely attenuated, and a second type of signal, which would move in a straight line in a direction oblique to the direction of a signal of the first type.

Figure 5:
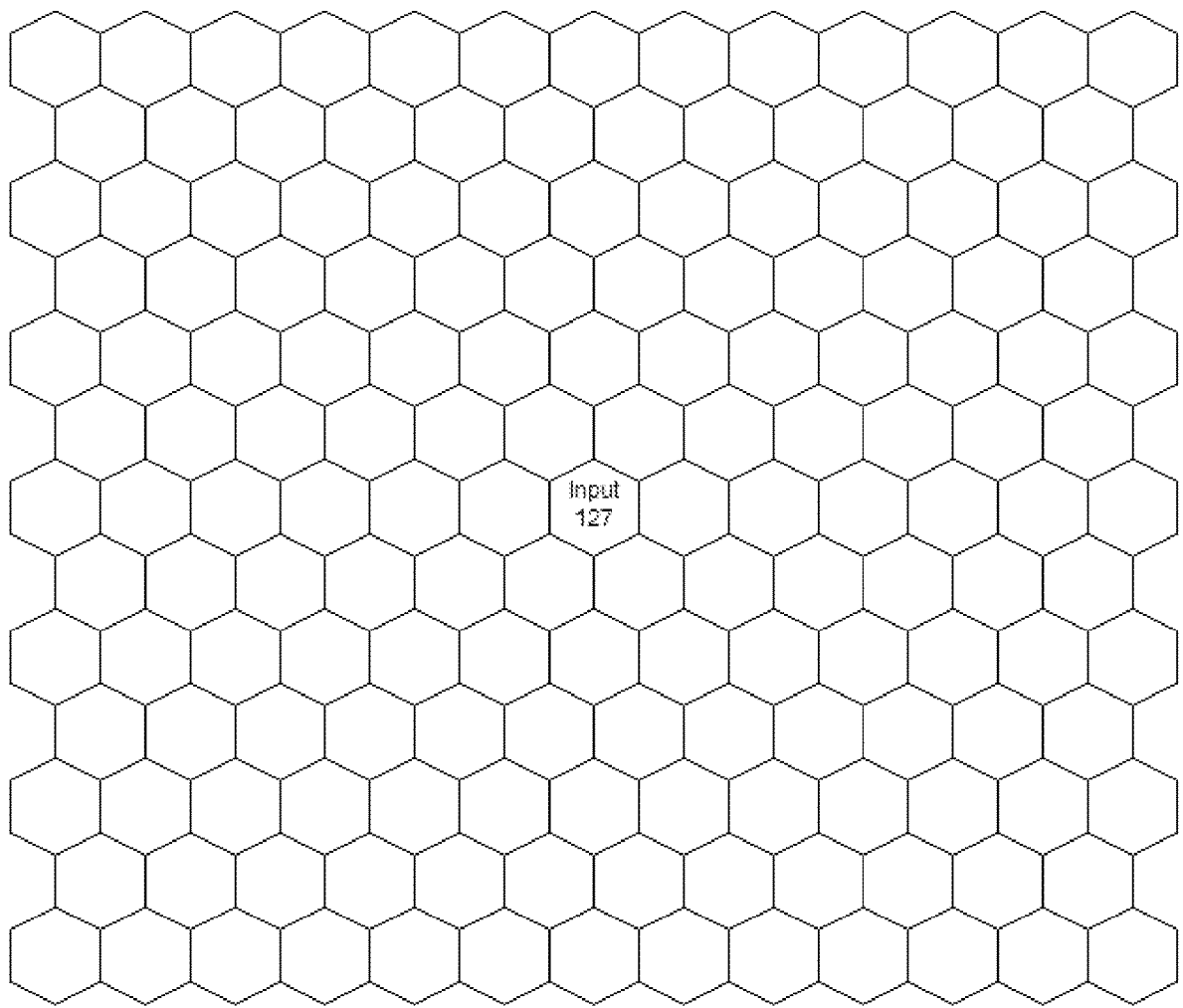
FIG. 5 shows a grid with an initial input signal.
Figure 6:
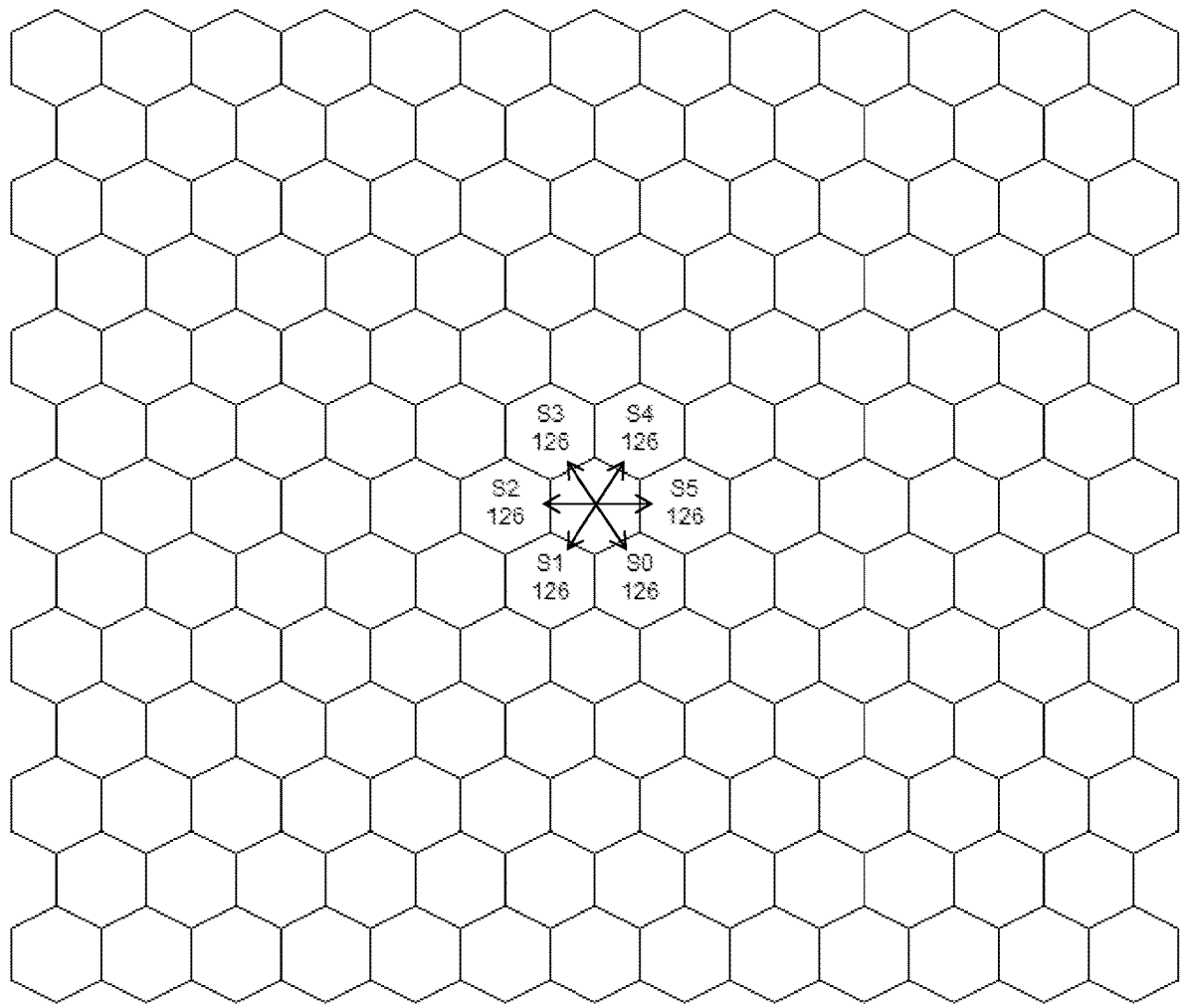
FIG. 6 shows how an initial input signal in the grid of FIG. 5 may propagate after a first time step.
Figure 7:
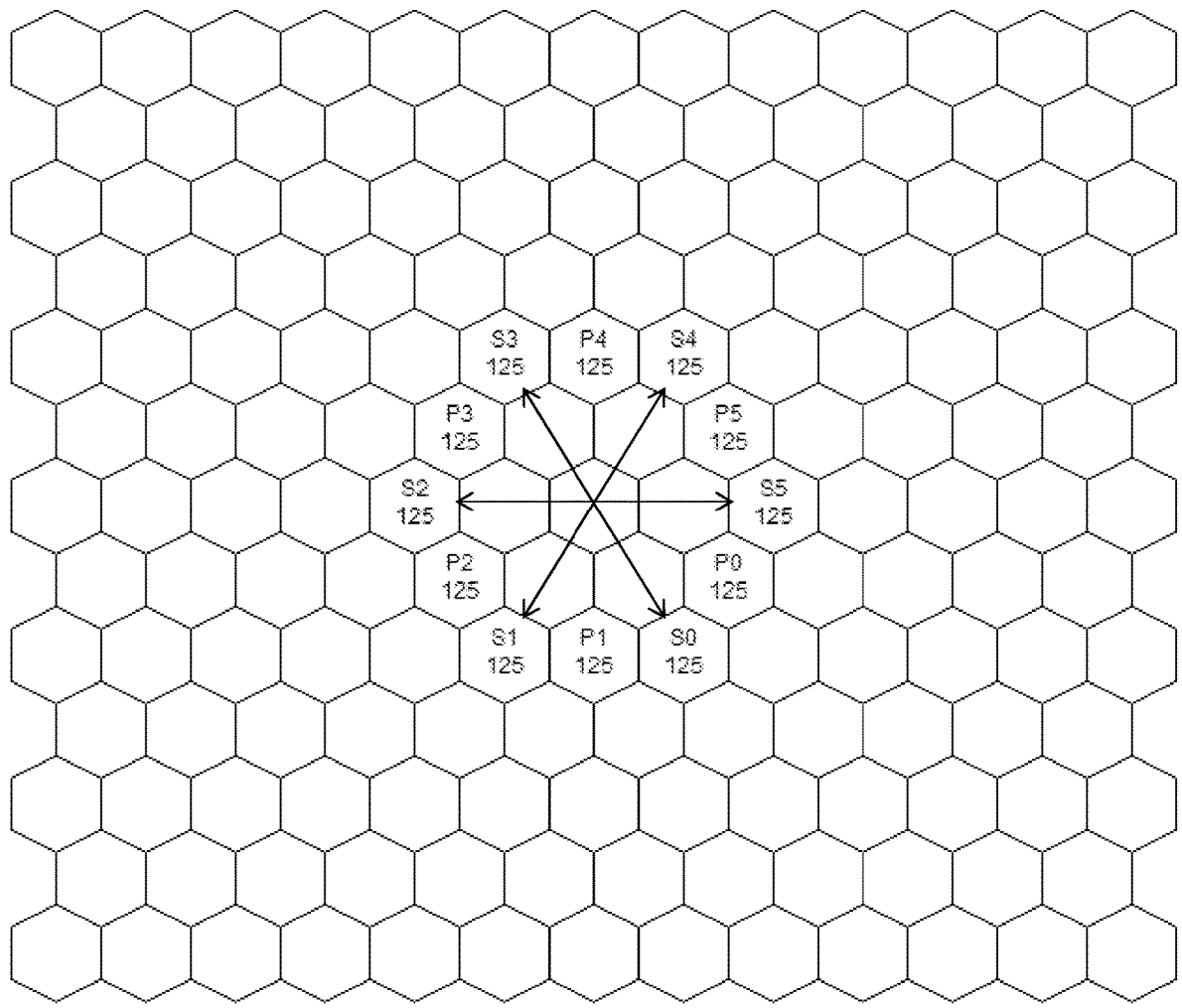
FIG. 7 shows how an initial input signal in the grid of FIG. 5 may propagate after a second time step.
Figure 8:
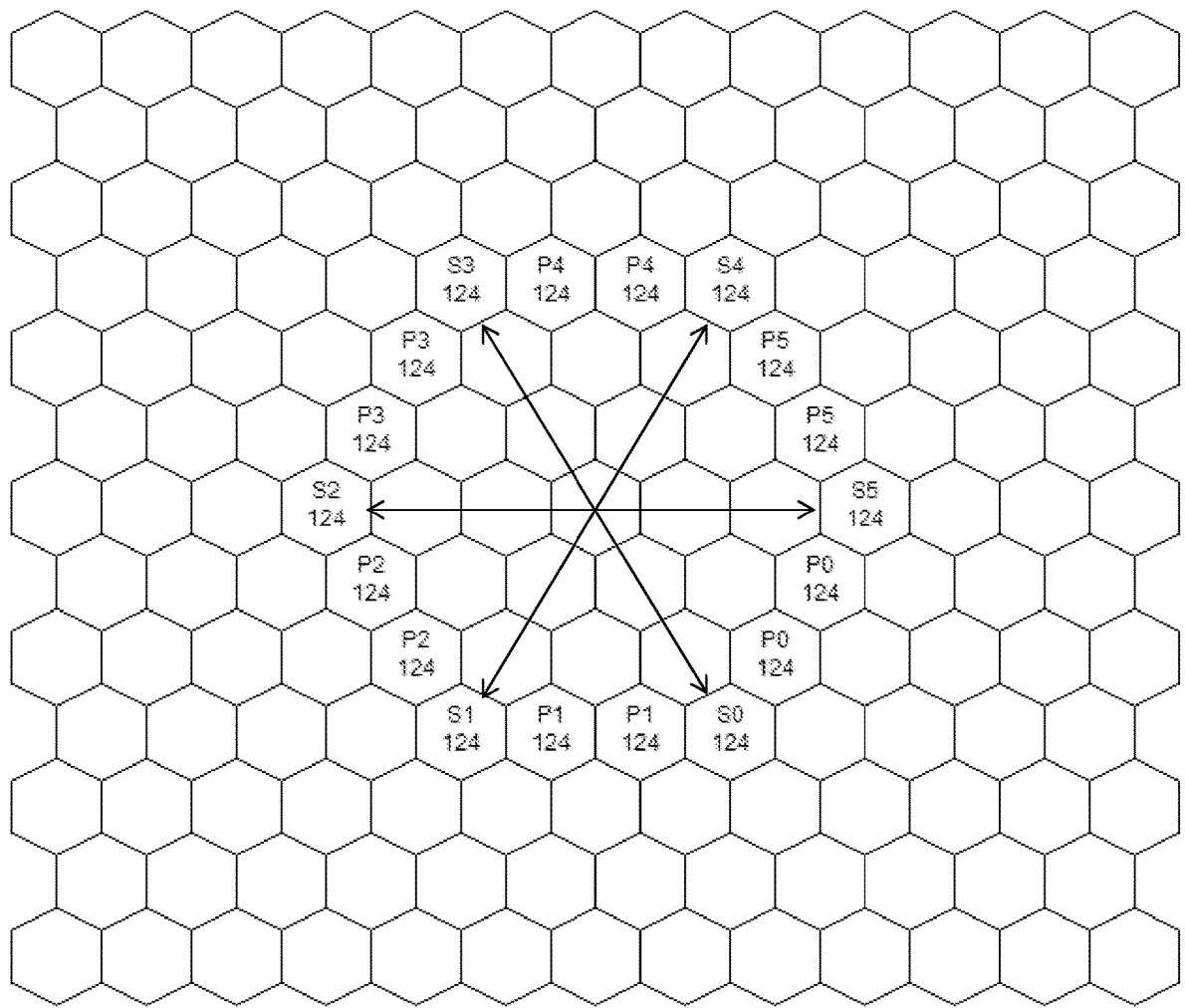
FIG. 8 shows how an initial input signal in the grid of FIG. 5 may propagate after a third time step.

To illustrate, consider FIGS. 5-8, which show how an input signal could be propagated using multiple signal types across four time steps. As shown in FIG. 5, initially, at time t=0 the input signal could be provided at its origin cell with an intensity of 127. On the next time step (i.e., t=1), a first type of signal (labeled as type S: S0 through S5) could be propagated to each of the origin cell's neighbors at an intensity of 126. This is shown in FIG. 6, with arrows used to indicate the path from the origin cell to its neighbors. On the next time step (i.e., t=2), the first type of signal would have been propagated at an intensity of 125 to each of the one step indirect neighbors of the origin cell (i.e., cells which are only one step away from the direct neighbors of the origin cell) which are colinear with the origin and its direct neighbors. Meanwhile the second type of signal (labeled as type P) would be propagated to each of the one step indirect neighbors of the origin cell which are not colinear with the origin cell's direct neighbors. This is shown in FIG. 7, with arrows used to indicate the cells through which the first type of signal was propagated. FIG. 8 illustrates how this process could continue by showing, at time t=3, how the first type of signal would have propagated with intensity 124 to each of the origin cell's two step indirect neighbors which are colinear with the origin cell and its direct neighbors, and how the signal of the second type would have propagated with intensity 124 to each of the origin cell's two step indirect neighbors which were not colinear with the origin cell and its direct neighbors. This could then continue as shown until the signals reached the end of the grid, or the attenuation which takes place on each time step caused their intensity to reach zero.

When implementing signal propagation logic as discussed above, individual cells in a processing grid 101 may utilize their connections to neighboring cells 205-210 to manipulate the individual memory elements of those cells. For example, to cause a cell which received an input signal (which, in some embodiments, could be positive or negative) of intensity I to propagate an S type signal at intensity $(|I|-M)*(|I|/I)$ (where M is the factor by which the intensity of the signal will be reduced on each time step and $(|I|/I)$ is defined as 0 if the intensity I of the input signal is equal to 0) to each of its neighbors on the next clock tick, the cells of a processing grid 101 may each be configured with the rule set forth below in table 1:

TABLE 1

Exemplary rule for initiating signals based on input.

IF input I is received, THEN:
    SET component $S_0$ of a first memory element 202 of the cell
    available through a first connection 205
    to $(|I| - M) * (|I| / I)$;
    SET component $S_1$ of a first memory element 202 of the cell
    available through a second connection
    206 to $(|I| - M) * (|I| / I)$;
    SET component $S_2$ of a first memory element 202 of the cell
    available through a third connection 207
    to $(|I| - M) * (|I| / I)$;
    SET component $S_3$ of a first memory element 202 of the cell
    available through a fourth connection
    208 to $(|I| - M) * (|I| / I)$;
    SET component $S_4$ of a first memory element 202 of the cell
    available through a fifth connection 209
    to $(|I| - M) * (|I| / I)$;
    SET component $S_5$ of a first memory element 202 of the cell
    available through a sixth connection 210
    to $(|I| - M) * (|I| / I)$.

Similarly, to cause each cell to continue propagating an S type signal while decreasing its intensity from the intensity at which it was received by $(|R|-M)*(|R|/R)$ (where $(|R|/R)$ is defined as 0 when the intensity of the signal is 0). on each clock tick, the cells of a processing grid 101 may each be configured with the rules set forth in table 2:

TABLE 2

Exemplary rules for propagating signals.

IF $S_0 <> 0$ then SET component $S_0$ of a first memory element 202 of the cell available through a first connection 205 to $(|R| - M) * (|R| / R)$;
IF $S_1 <> 0$ then SET component $S_1$ of a first memory element 202 of the cell available through a second connection 206 to $(|R| - M) * (|R| / R)$;
IF $S_2 <> 0$ then SET component $S_2$ of a first memory element 202 of the cell available through a third connection 207 to $(|R| - M) * (|R| / R)$;
IF $S_3 <> 0$ then SET component $S_3$ of a first memory element 202 of the cell available through a fourth connection 208 to $(|R| - M) * (|R| / R)$;
IF $S_4 <> 0$ then SET component $S_4$ of a first memory element 202 of the cell available through a fifth connection 209 to $(|R| - M) * (|R| / R)$;
IF $S_5 <> 0$ then SET component $S_5$ of a first memory element 202 of the cell available through a sixth connection 210 to $(|R| - M) * (|R| / R)$.

Initiation and propagation of P type signals could use rules similar to those discussed above for S type signals. For example, P type signals such as shown in FIGS. 7-8 could be created by rules which state, on each clock tick, a cell which is propagating an S type signal will initiate a P type signal in the closest right neighbor of the cell where it propagates an S type signal. These signals could then be propagated using rules similar to those set forth in table 2 for S type signals, resulting in the P type signals continuing linearly until they reached the edge of the processing grid or until their initial input was completely attenuated. Examples of these rules are set forth below in tables 3 and 4.

TABLE 3

Illustrative rules for initiating signals based on other signals.

IF $S_0 <> 0$ then SET component $P_1$ of a second memory element 203 of the cell available through a second connection 206 to $(|R| - M) * (|R| / R)$;
IF $S_1 <> 0$ then SET component $P_2$ of a second memory element 203 of the cell available through a third connection 207 to $(|R| - M) * (|R| / R)$;
IF $S_2 <> 0$ then SET component $P_3$ of a second memory element 203 of the cell available through a fourth connection 208 to $(|R| - M) * (|R| / R)$;
IF $S_3 <> 0$ then SET component $P_4$ of a second memory element 203 of the cell available through a fifth connection 209 to $(|R| - M) * (|R| / R)$;
IF $S_4 <> 0$ then SET component $P_5$ of a second memory element 203 of the cell available through a sixth connection 210 to $(|R| - M) * (|R| / R)$;
IF $S_5 <> 0$ then SET component $P_0$ of a second memory element 203 of the cell available through a first connection 205 to $(|R| - M) * (|R| / R)$.

TABLE 4

Illustrative rules for propagating signals initiated based on other signals.

IF $P_0 <> 0$ then SET component $P_0$ of a second memory element 203 of the cell available through a first connection 205 to $(|R| - M) * (|R| / R)$;
IF $P_1 <> 0$ then SET component $P_1$ of a second memory element 203 of the cell available through a second connection 206 to $(|R| - M) * (|R| / R)$;
IF $P_2 <> 0$ then SET component $P_2$ of a second memory element 203 of the cell available through a third connection 207 to $(|R| - M) * |(R| / R)$;
IF $P_3 <> 0$ then SET component $P_3$ of a second memory element 203 of the cell available through a fourth connection 208 to $(|R| - M) * (|R| / R)$;

TABLE 4-continued

Illustrative rules for propagating signals initiated based on other signals.

IF $P_4 <> 0$ then SET component $P_4$ of a second memory element 203 of the cell available through a fifth connection 209 to $(|R| - M) * (|R|/R)$;
IF $P_5 <> 0$ then SET component $P_5$ of a second memory element 203 of the cell available through a sixth connection 210 to $(|R| - M) * (|R|/R)$.

Variations on this type of signal propagation are also possible. For example, P type signals could be initiated on the closest left neighbor, rather than the closest right neighbor of a cell which is propagating an S type signal. Similarly, in an embodiment which provided only positive input signals, as opposed to positive or negative input signals, a function such as I-M, or R-M, may be used for attenuation rather than $(|I|-M)*(|I|/I)$ or $(|R|-M)*(|R|/R)$. As another example, some embodiments may include additional logic the explicitly address cases where multiple rules may overlap. For example, a rule may be implemented giving priority to values determined based on S type signals, such that in a case where the final rule of table 3 and the first rule of table 4 both provide a value for $P_0$ the value provided by the final rule of table 3 may take priority. In other cases, values provided by multiple rules may be added together, averaged, or combined in some other way. Alternatively, in some cases functionality may be implemented to avoid conflicts even when multiple rules give values for a single item. For example, in some embodiments, in a case where the final rule of table 3 and the first rule of table 4 both give a value for $P_0$, that $P_0$ value may be stored in a temporary memory buffer, effectively creating two parallel P type signals which could propagate together without interfering with one another.

Other types of signals may also be used. For example, in some cases, when a cell initiates a P-type signal, it may also send a third type of signal, referred to as a Y-type signal, along with it. This signal may communicate data about how information was propagated to any cell at the frontier of a ripple pattern. For instance, in some cases, when a cell initiates a P-type signal it may also initiate a Y-type signal which would accompany the P-type signal and travel with a constant value equal to the value of the S-type signal at the time the P-type signal was initiated. As discussed below in the context of FIGS. 11 and 12, this type of information may be used to determine the origin point for any P-type signal on the frontier of a ripple pattern, and that origin may, in turn, be used to identify correlations between cells in the processing grid 101. Other types of signals may also be propagated in some implementations. For example, in some cases, each cell may be uniquely identifiable such as through coordinates or other label, and, rather than sending a Y-type signal which includes S-type signal intensity when a P-type signal was initiated, a signal encoding the unique identification of the origin point may be sent from the initiation of a ripple pattern. Further, such a unique identification encoding may be propagated with both S- and P-type signals in the pattern, rather than only propagating with P-type signals as described above. Further variations are also possible, and will be immediately apparent to one of skill in the art in light of this disclosure. Accordingly, the above description of how signals may propagate in a ripple pattern should be understood as being illustrative only, and should not be treated as limiting.

Returning now to the discussion of FIG. 3, after a cell had determined 302 and sent 303 its signals, it could determine 304 whether it had experienced a collision—i.e., whether it had simultaneously received signals originating from two or more other cells in the processing grid 101. This may be done by, in an implementation such as described above which uses individual components of memory elements to propagate S type and P type signals, and which resets the values of its memory elements to 0 after sending signals to its neighbors, checking to see if more than one of the memory element components used to store S type and P type signals had a non-zero value. If it was determined 304 that a collision had taken place, a further determination 305 could be made as to whether the collision should be reported to the memory network 102. This determination 305 may be made using rules configured to ensure that, for any two ripple patterns (e.g., sets of propagating S type signals and P type signals—$W_0$ and $W_1$) initiated at two different cells ($O_1$ and $O_2$ at times $T_n$ and $T_m$) the collisions of those patterns (e.g., when a cell simultaneously detects signals from $W_0$ and $W_1$) will only be reported once, even though those patterns may cause collisions in many different cells at different times or simultaneously.

Figure 9:
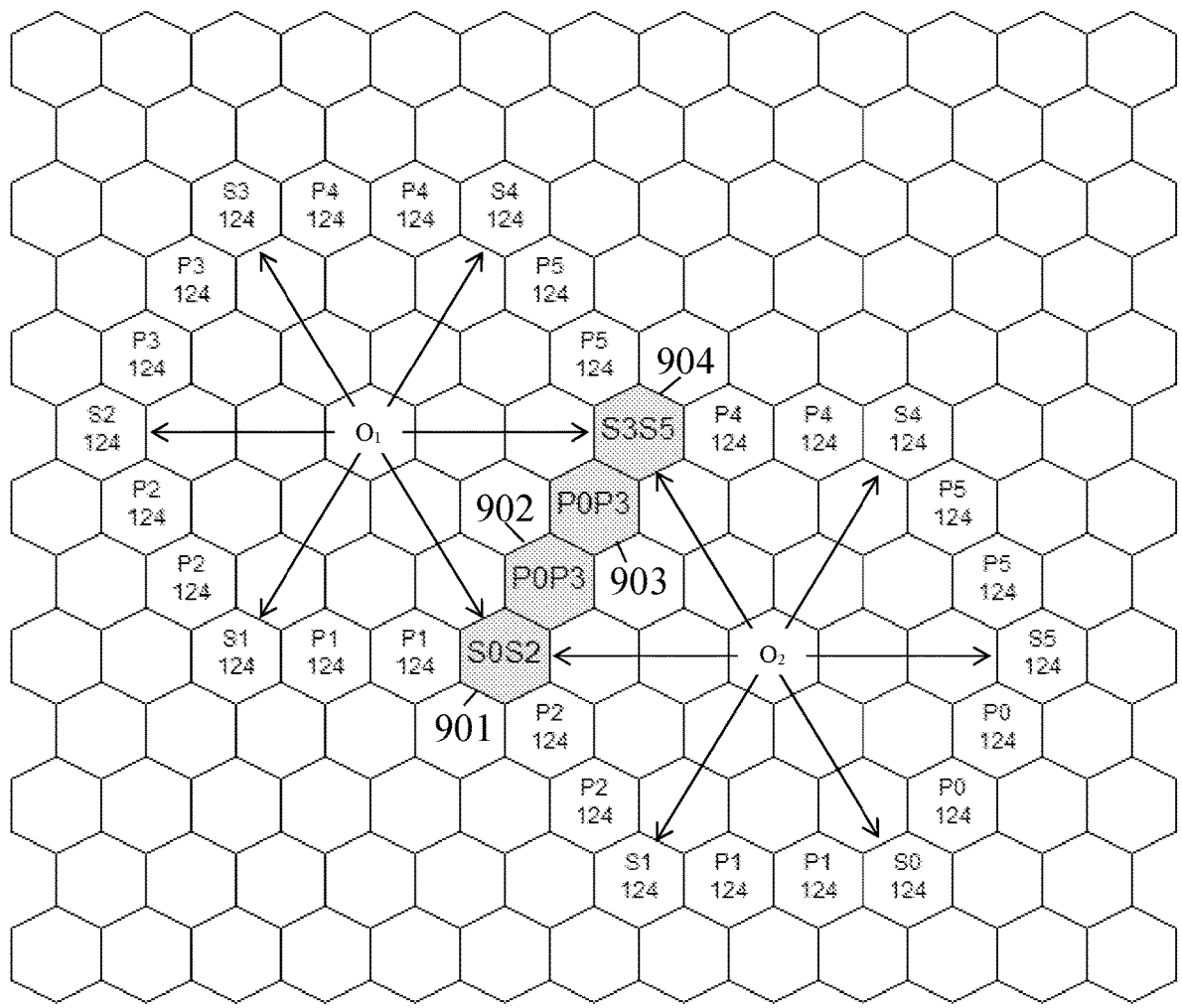
FIG. 9 illustrates a collision which could take place in a processing grid.

To illustrate how rules could allow a cell to determine 305 whether it should report a collision, consider FIG. 9, which illustrates a collision which could take place three time steps (i.e., at time t=3) after signals had originated at the cells labeled as $O_1$ and $O_2$. In that figure, the ripple patterns originating from $O_1$ and $O_2$ are illustrated based on their signal type (i.e., S or P type) and intensity (i.e., 124) with arrows showing the propagation of S type signals in the same manner as in FIGS. 7-8. The only exception to this is that the cells 901 902 903 904 where the signals from $O_1$ and $O_2$ collide (shaded for ease of reference) are labeled with the components of its memory elements which indicate the collision. For example, the first collision cell 901 is labeled $S_0S_2$, reflecting that it indicates a collision through non-zero values in the $S_0$ and $S_2$ components of its first memory element 202. To ensure that a scenario such as shown in FIG. 9 did not result in multiple cells reporting a collision, cells in a system implemented based on this disclosure may be configured with a first rule stating that if the cell determines there is a collision based on the intersection of multiple P type signals, the cell should not report that collision. In the scenario of FIG. 9, this rule would result in the second and third cells 902 903 not reporting the collision, since those cells detected the collision based on non-zero values in the $P_0$ and $P_3$ components of their second memory element 203. There may also be a second rule, which states that if the cell determines there is a collision based on the intersection of multiple S type signals, the cell should report the collision only if one of the signals was stored in component $S_0$, $S_1$ or $S_2$ of the first memory element 202, and the other of the signals was stored in a component with an index that was either two or three higher than that of the first signal. In the scenario of FIG. 9, this may result in the fourth cell 904 not reporting the collision, since neither of the S type signals which indicated the collision was stored in the $S_0$, $S_1$ or $S_2$ component of that cell's first memory element 202.

Figure 10:
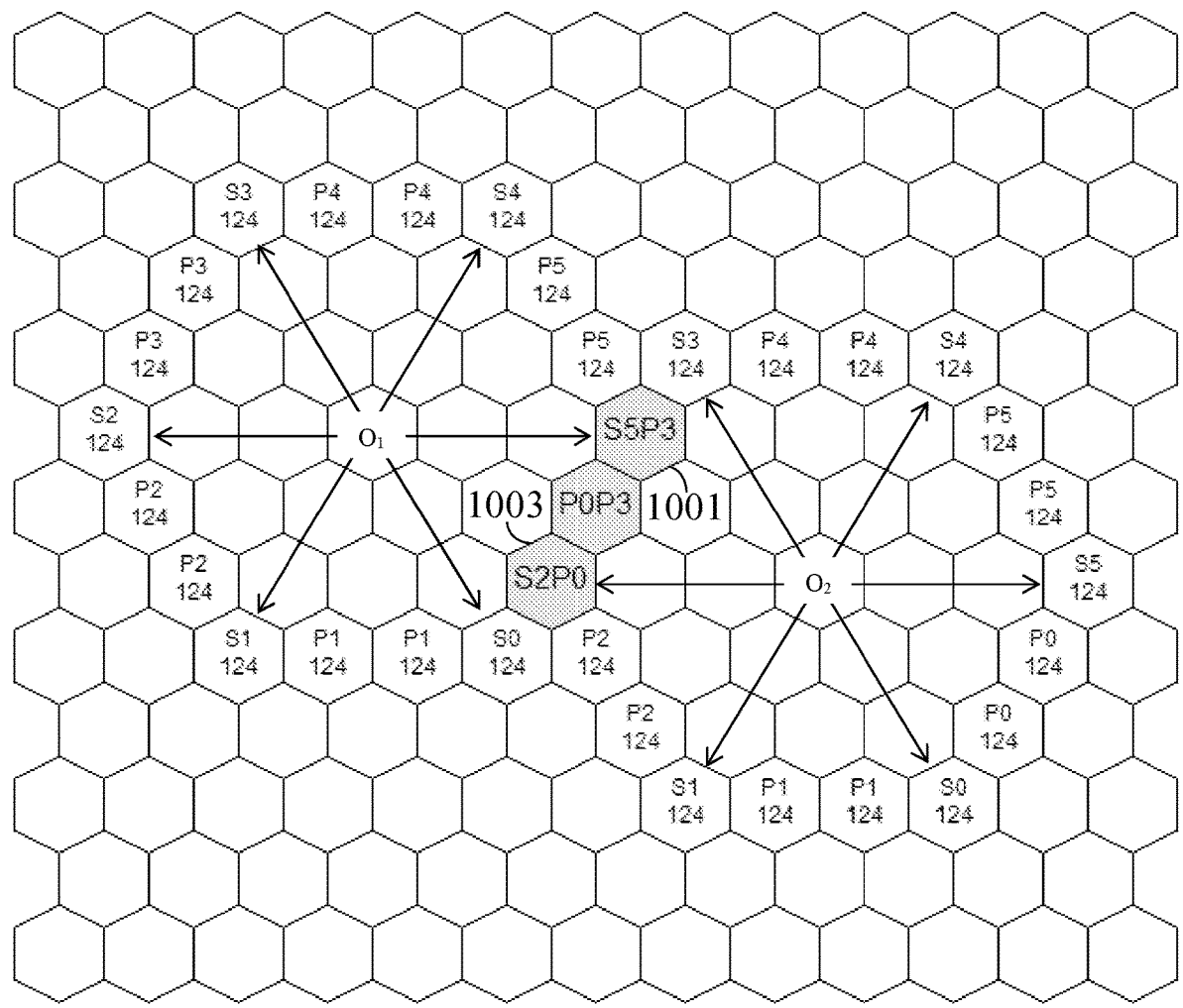
FIG. 10 illustrates a collision which could take place in a processing grid.

It should be understood that, while FIG. 9 illustrates a scenario in which a collision is detected at multiple cells, there are other collision scenarios which may take place, and various embodiments may have rules to address them. For example, in some cases, a collision may be caused by the intersection of an S type signal and a P type signal, such as shown in the first and third intersection cells 1001 1003 of FIG. 10. To address this, some cells in systems implemented based on this disclosure may include a rule saying that if the cell determines there is a collision based on the intersection of an S type signal and a P type signal, it should report that collision only if (1) the index of the component used to store the P type signal is less than or equal to 2, and the index of the component used to store the S type signal is two greater than that of the component used to store the P type signal; or (2) the index of the component used to store the P type signal is greater than or equal to 3, and the index of the component used to store the S type signal is three less than that of the component used to store the P type signal. Combining this rule with the rules described above in the context of FIG. 9 provides a set of three rules which address collision types between two S type signals, between S and P type signals, and between two P type signals, and which are expressed formally in table 5, below.

TABLE 5

Illustrative collision reporting rules.

| Collision Type | Reporting Rule |
| --- | --- |
| Two S type signals, stored in components $S_x$ and $S_y$, with x < y. | Report if x <= 2 && ((y == (x + 2)) \|\| (y == (x + 3))) |
| One S type signal and one P type signal, stored in components $S_x$ and $P_y$. | Report if (y <= 2 && (x == (y + 2))) \|\| (y >= 3 && (y == (x + 3))) |
| Two P type signals | Do not report. |

Other types of processing may also, or alternatively, be performed by a cell determining 305 whether to report a collision. To illustrate, consider the case where each cell in the processing grid only tracks collisions between signals from one other pair of cells. In such a case, when determining 304 whether to report a collision, the cell may perform a check to determine if it had already reported a collision before. If it had not, then the cell may determine that it should report the collision and may also store data identifying the collision it would report (e.g., the indices and values of the S and/or P type signals which had collided) in an internal memory element (not shown in FIG. 2). Alternatively, if the cell had already reported a collision, it could check if the most recently detected collision matched the collision it had previously reported. If the collisions matched, then the cell may determine that it should report the new collision based on the match. If the collisions did not match, then it could determine whether it should or should not report the new collision. This determination may be based on factors such as expected independence of pulse scores (e.g., the more clock ticks separating initiation of the colliding signals, the more they would be expected to be independent and so the less important a collision between them might be), the amount of data already gathered on the previously reported collision, and/or the result of data gathered on the previously reported collision (e.g., if only a small correlation had been identified between origins associated with a previously reported collision despite significant data being gathered, then the data on the previously reported collision may be seen as less important). If, based on the applicable factors, it was determined that the new collision should be reported, the information about the previously reported collision could be discarded, and the new collision could be treated as if it were the first collision detected by the cell.

It should be noted that, while the above description focused on the scenario in which a cell simultaneously detected two signals having nonzero values, the described approaches could be extended to situations where three (or more) signals were detected as well. For example, in some cases, when three or more signals collided at a single cell, each pair of signals may be treated as a single collision, and the processing described above may be applied to each pair of signals. In such a situation, if a collision of three (or more) signals resulted in multiple signals which would be reported using the two signal logic, then the multiple reporting may be handled in various ways, such as by selecting only a single collision to report (e.g., based on the collision reflecting a relationship which was most indicative of a correlation), or by reporting all of the collisions (e.g., using a buffer where collisions could be stored to be reported serially as the processing of each collision completes). Other variations are also possible, and will be immediately apparent to those of ordinary skill in the art in light of this disclosure. Accordingly, the description above should not be treated as implying limits on the determination of whether to report a collision in implementations where that type of determination is made.

However the determination 305 of whether to report a collision is made, after that determination, the collision may be reported 306 for recording by the memory network 102. As an example of how this may be done, consider a cell which is configured to determine the origination points of colliding patterns, and then report those origination points to a cell in the memory network 102 through its memory connection 211. To report 306 a collision in this manner a cell having the architecture shown in FIG. 2 may begin by using a process such as shown in FIG. 11, discussed below in the context of FIG. 12, to determine the origination points of the signals it detected as colliding.

Figure 11:
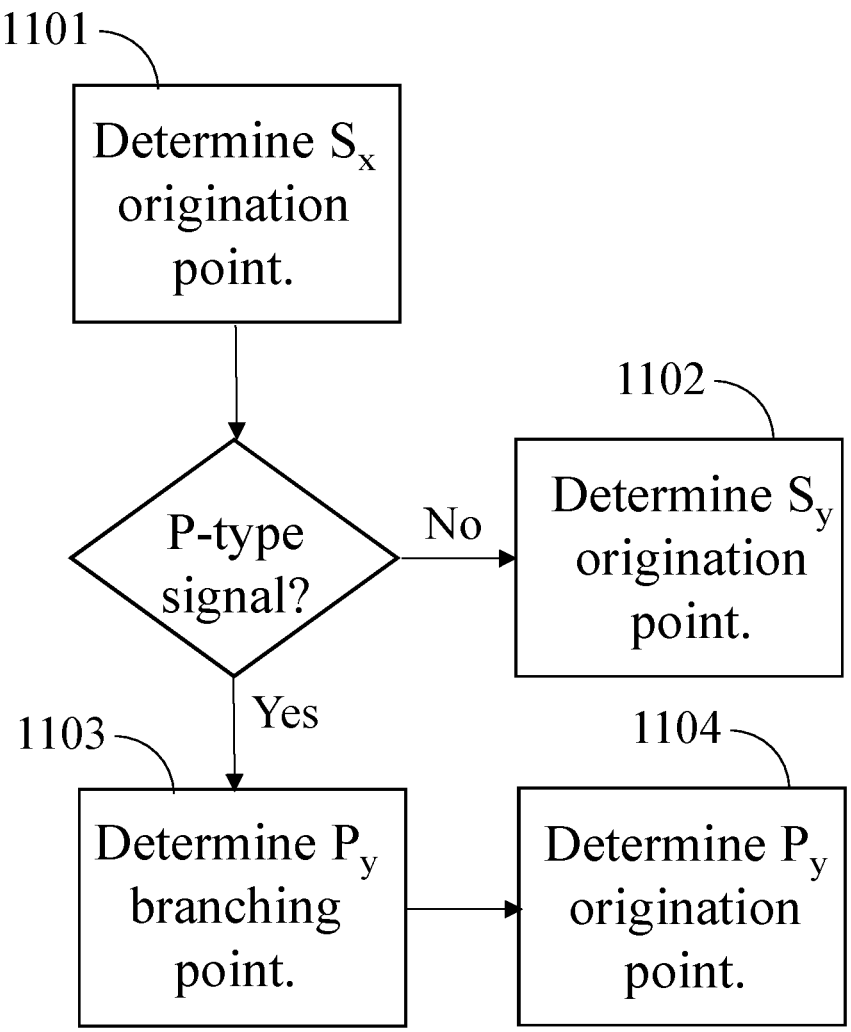
FIG. 11 illustrates an exemplary process for identifying the origin points of colliding signals.
Figure 12:
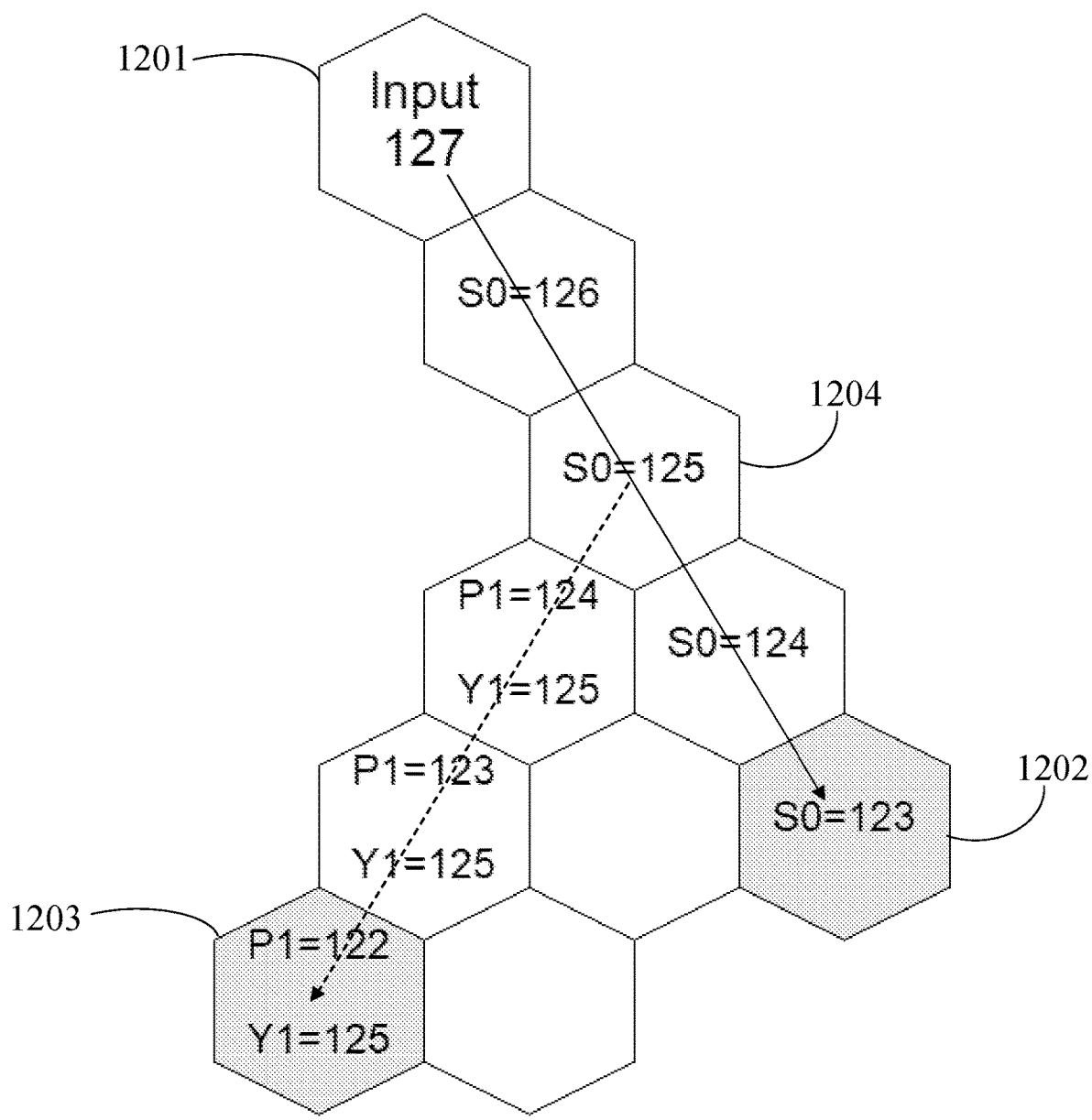
FIG. 12 shows paths for two types of signals as they travel from their origin point.

To illustrate the process of FIG. 11, FIG. 12 shows paths for an S type signal and a P type signal as they travel from an origin 1201 to two separate cells 1202 1203 which would report collisions with signals from other origins (other origins and signals not shown). While, in a real embodiment, the values of the S and P type signals may not persist, but instead may only be present at the frontier of a ripple pattern, for the sake of illustration, FIG. 12 shows the values that an S type signal and a P type signal would take on the entire path from the origin 1201 to cells 1202 1203 where collisions involving those signals are detected. As shown in FIG. 12, the S type signal would be stored in component $S_0$ of the memory elements through which it passed, and would decrease in intensity from a maximum intensity of 127 at the origin 1201, reaching an intensity of 123 at the cell 1202 reporting the collision based on the S type signal. Similarly, the P type signal branches off from the S type signal in a branching cell 1204 where the S type signal has an intensity of 125 by propagating to the nearest right neighbor at an intensity of 124. It would then continue propagating with its intensity decreasing with distance, reaching an intensity of 122 at the cell 1203 reporting the collision based on the P type signal. The P type signal would also be accompanied by a Y type signal which transmits the intensity of the parent S type signal at the branching cell 1204. As discussed below in the context of FIG. 11, this information transmitted in a Y type signal may be used to determine the branching cell 1204 when tracing a Y type signal back to the origin 1201.

Initially, a cell reporting a collision using the process of FIG. 11 would determine 1101 the origination point of the $S_x$ signal which, following the naming convention used in table 5, would be the S-type signal stored in the component of the first memory element 202 of the cell which detected signals $S_xP_y$ or $S_xS_y$. This may be done, for example, by comparing the value of $S_x$ as detected by the cell reporting the collision with a value assigned when an input is initially introduced into the processing grid 101. For instance, in the scenario of FIG. 12, where the S type signal was introduced with intensity 127 and detected with intensity 123 caused by application of a known attenuation factor of 1 intensity/cell, the first reporting cell 1202 could determine that it was four cells away from the origin of the signal stored in $S_0$, based on the difference between the initial introduction value and the detected value of that signal (i.e., 127–123=4). The first reporting cell 1202 could determine the direction of the signal's origin based on the index of the component used to store it. For example, in a case such as shown in FIG. 12 where an S type signal stored in component $S_0$ of the first memory element 202 propagates through the first connection 205, the reporting cell could trace the S type signal back through the fourth connections 208 of the intervening cells to the origin 1201, since the processing grid in this example is made up of hexagonal cells having first and fourth connections on opposite sides. The same approach could then be used to determine 1102 the origin of an $S_y$ signal in cases where the collision was caused by simultaneous detection of two S type signals, e.g., as shown in the first collision cell 901 FIG. 9. That is, the difference between the signal strength as detected and the original signal intensity could be used to determine the distance from the origin, and the direction in which the signal was propagated (which, as described, may be reflected in the component used to store the signal) could be used to determine the origin's direction.

Alternatively, as shown in FIG. 11, if the collision was caused by simultaneous detection of an S type signal and a P type signal, a different approach may be used to determine the P type signal's origin point. Initially, before determining 1104 the origin point of a P type signal, a cell following the process of FIG. 11 may determine 1103 the point at which the P type signal branched off of its parent S type signal—e.g., a branching cell 1204 such as shown in FIG. 12. This may be done using an approach which uses the Y type signal to determine the distance to the branching point, and the component used to store the P type signal to determine the direction to the branching point. For example, in the scenario shown in FIG. 12, at the second reporting cell 1203, the P type signal had an intensity of 122, and the Y type signal had an intensity of 125. Accordingly, the second reporting cell 1203 could subtract the value of the P type signal from the Y type signal to determine that the branching cell 1204 was three steps away. The direction to the branching cell 1204 may then be determined in a manner similar to that described for determining the direction to the origin for an S type signal. For example, in the scenario of FIG. 12, if each cell the P type signal passes through communicates its value using the second connection 206 because the signal is stored in the $P_1$ component of the second memory element 203, then the second reporting cell could trace the path of the P type signal back to the branching point using the opposite connection—i.e., the fifth connection 209. Thus, the difference between the P and Y type signal intensities, as well as the index of the component used to store the P type signal can be used to determine 1103 the branching point in a method such as shown in FIG. 11.

Continuing with the discussion of FIG. 11, after the branching point has been determined 1103, the process can conclude with determining 1104 the origin point of the P type signal. This may include determining the direction of the parent S type signal. For example, in a case where branching of a P type signal is controlled by rules such as shown in table 3, the direction of the parent S type signal can be determined by reversing those rules. For instance, in the illustration of FIG. 12, the P type signal is propagated through component $P_1$, and table 3 indicates that a signal will be initiated in component $P_1$ when an S type signal with a non-zero intensity is stored in component $S_0$. Accordingly, by reversing this rule, the second reporting cell can determine that the parent S type signal was propagated through component $S_0$. At this point, the direction and intensity of the parent S type signal at the branching cell 1204 can be used to trace the parent S type signal's path back to the origin in a manner similar to that described above for determining 1101 1102 the origin for the $S_x$ and $S_y$ signals, thereby allowing the origin for the $P_y$ signal to be determined 1104.

In an embodiment using the described procedure, once the origins of the colliding signals had been determined, those origins (potentially in combination with S, P and Y type signal values) could be reported to the memory network 102. In embodiments in which global coordinates are tracked for each cell in the processing grid, this may be done by converting the relative distance and direction values determined using the process of FIG. 11 to the global coordinate system and then sending the global coordinates to the memory network. Alternatively, in some embodiments, the origins of the colliding signals may be reported as positions relative to the reporting cell, which may be useful in cases where global coordinates are not maintained for individual cells in the processing grid. In either case, on the next clock tick, the process of FIG. 3 could repeat, with new inputs (if any) being provided and signals (if any) being propagated and analyzed as described.

Figure 13:
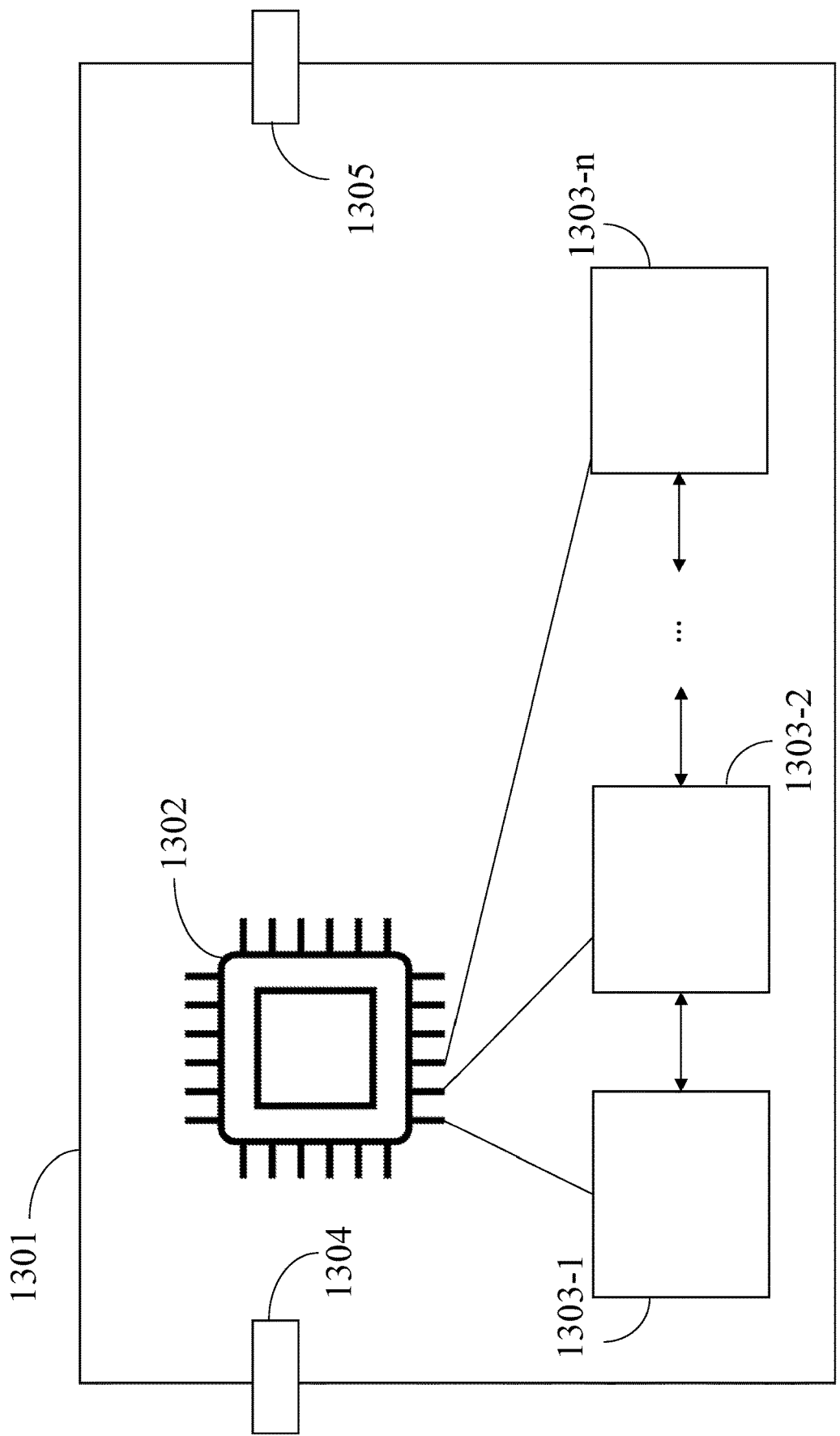
FIG. 13 provides a high level diagram that could be used to implement an element in a memory network.

Meanwhile, prior to the next iteration of the process of FIG. 3, the memory network 102 could determine what, if any, action should be taken based on the reported collision. To illustrate how this type of determination could be made, consider an implementation in which the memory network 102 comprises a set of memory elements, each of which corresponds to a single cell in the processing grid 101. In such an implementation, the memory elements may follow an architecture such as that shown in FIG. 13, with each element 1301 comprising a controller 1302 (e.g., a processor configured with appropriate instructions stored on a non-transitory computer readable medium) a plurality of storage modules 1303-1, 1303-2 to 1303-*n*, a processing grid connection 1304 and a connection system connection 1305. As discussed below in the context of FIG. 14, a memory element 1301 may use components such as shown in FIG. 13 to receive and track information from its corresponding cell on the processing grid, as well as to provide commands to the connection system to establish or break down connections representing relationships between cells in the processing grid.

Figure 14:
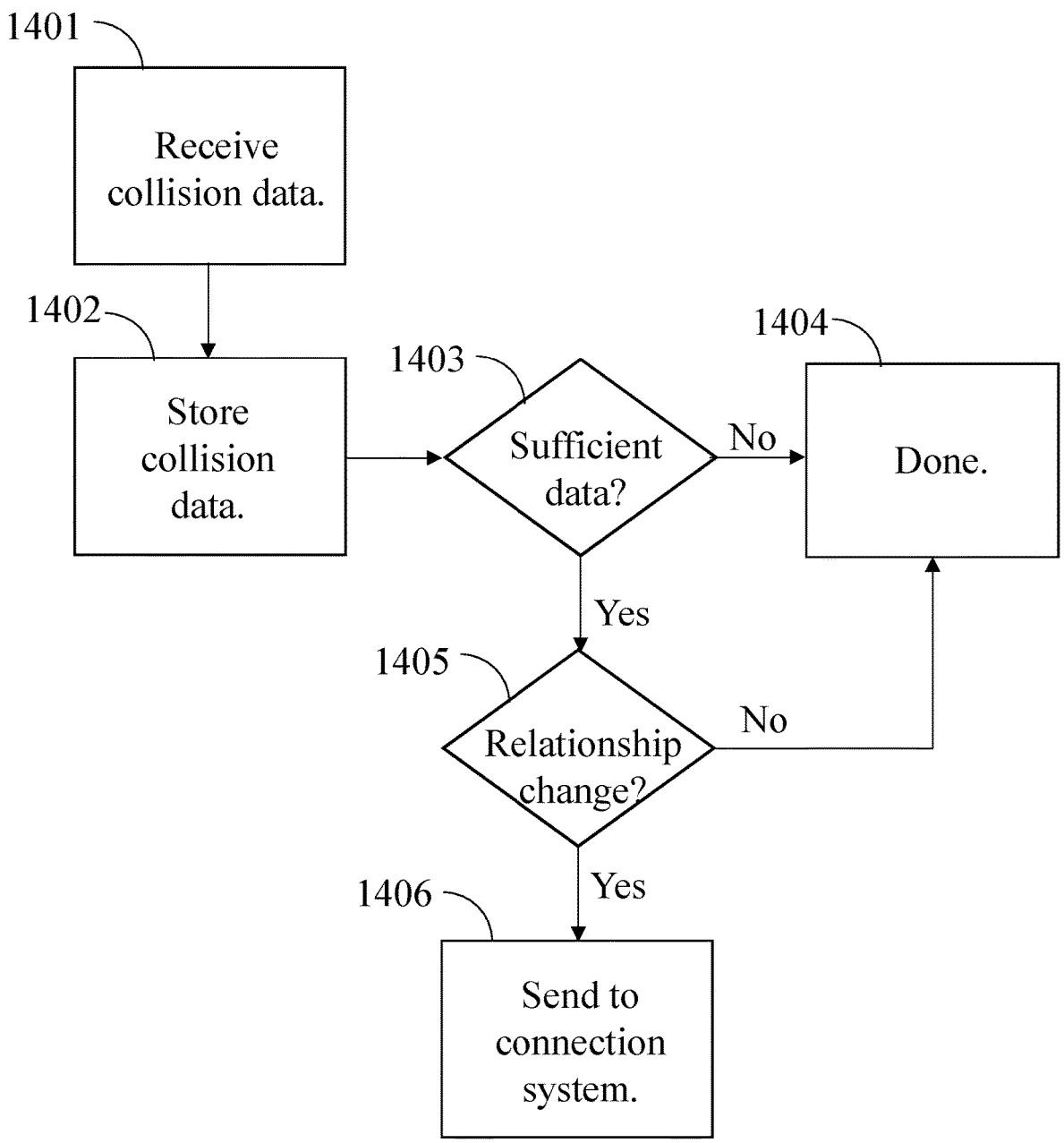
FIG. 14 provides a high level flowchart of a method which an element in a memory network may use to generate instructions for a connection system based on data from a processing grid.

Turning now to FIG. 14, that figure provides a high level flowchart of a method which an element 1301 in the memory network 102 may use to generate instructions for the connection system 103 based on data from the processing grid 101. Initially, an element performing a process such as shown in FIG. 14 would receive 1401 collision data from its corresponding cell in the processing grid. This may be done, for example, by the processing grid cell using its memory connection 211 to send the origin points (which, as noted above, may be represented in various manners, such as locally or as relative locations) of signals which it detected colliding, the relative times for those signals (e.g., a first colliding signal reflected an input which was provided four clock ticks before the input reflected in the second colliding signal), and the values for those signals (e.g., the first colliding signal reflected a positive input, while the second colliding signal reflected a negative input). Once received 1401, the memory element could store 1402 this data. This storage 1402 may be performed in various ways in various embodiments. For example, in a case where each cell on the processing grid was used to only track collisions between one pair of origin points at a time, the memory element may check if the received collision data was for a different set of origin points than previously stored collision data and, if it was, treat that as an indication that the previous collision data should be discarded as part of storing the newly received collision data. Alternatively, in an implementation where each cell of the processing grid could potentially track collisions between multiple pairs of origin points simultaneously, a memory element may check to see if received data corresponded to any collisions which were already being tracked. If it was, then the data for the appropriate collision could be updated. Otherwise, the memory element could allocate a new storage module for the new collision, and then use that storage module to store the received data.

In the process of FIG. 14, after collision data had been stored 1402, a determination 1403 may be made as to whether there was sufficient data to update a relationship as encoded by the connection system. For example, in an implementation where a correlation indicated by collisions detected in the processing grid would only be treated as real if it was supported by at least a threshold number of observations, the determination 1403 may be made by checking if the total number of observations had reached the threshold. If it not, then the process of FIG. 14 may simply terminate 1404, with the stored data potentially being subsequently communicated to the connection system 103 after more observations had been made. Alternatively, if there was sufficient data to update a relationship as encoded by the connection system, an additional determination 1405 could be made as to whether a relationship shown by the collected data represented a change from a relationship which had already been established with the connection system. This may be done using rules which are evaluated in a manner such as shown in the flowchart of FIG. 17.

Figure 17:
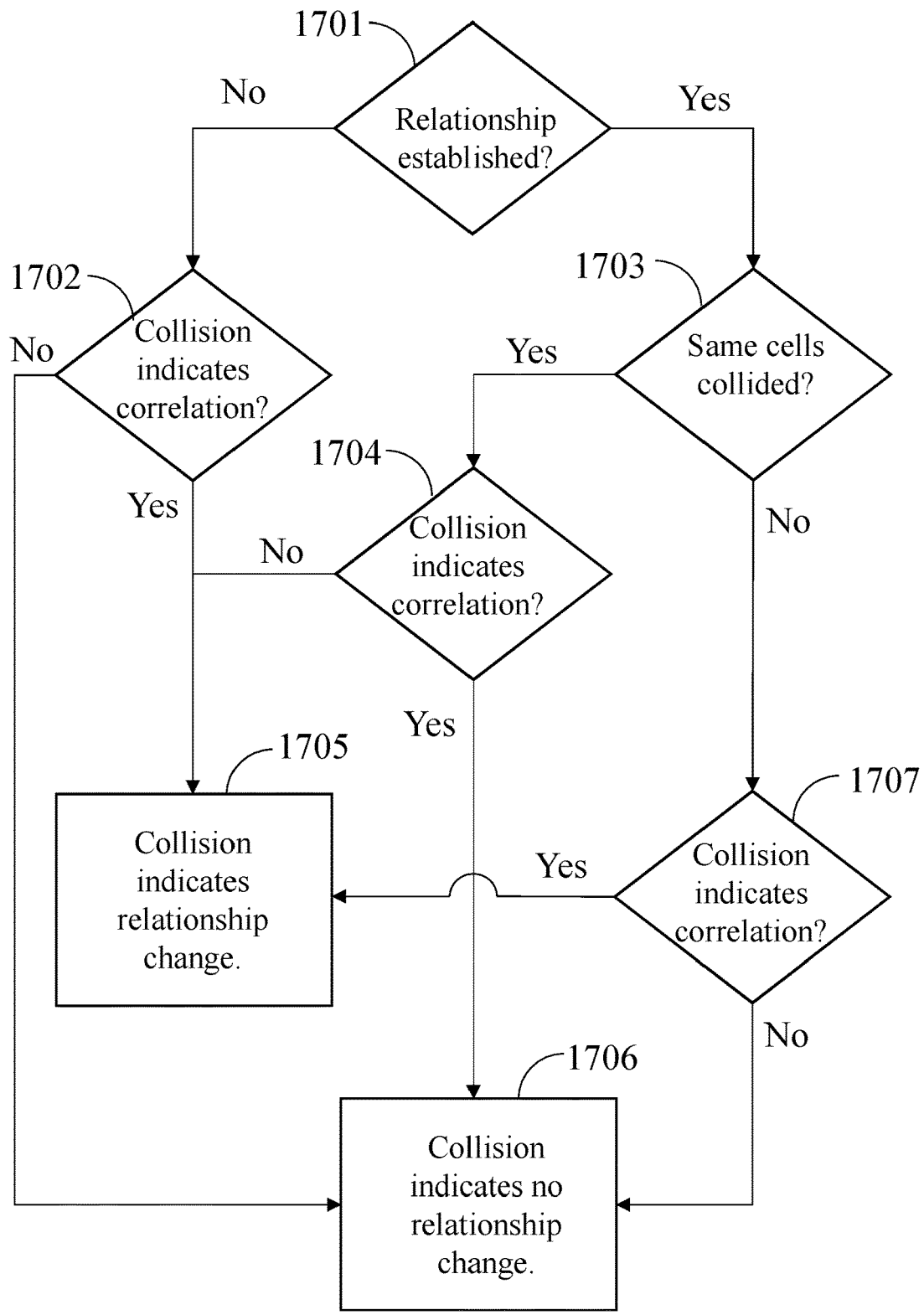
FIG. 17 depicts a flowchart indicating potential rules for determining if collision data indicates a change to an existing relationship.

In the flowchart of FIG. 17, if it is determined 1701 that a module in the connection system which corresponds to the cell in the processing system where a collision is detected has not already established a relationship, then whether the collision data should be treated as indicating a change in the relationship (in this case, from no relationship to a relationship corresponding to the collision) could be controlled by a determination 1702 of whether the collision data indicated a correlation between a pair of cells in the processing grid. Alternatively, if the corresponding module in the connection system had already established a relationship, then a determination 1703 may be made as to whether the relationship was between the cells whose collision triggered the process of FIG. 14, or if it was between a different pair of cells. If the cells whose collision triggered the process of FIG. 14 were the same as the cells for which a relationship had already been established, then, if it was determined 1704 that the collision data indicated that there was no correlation (e.g., because the previous relationship was based on a relatively weak correlation, and the collision data indicated that that correlation had actually been spurious), then the collision data could be treated 1705 as indicating a change in the relationship. Instead, if the cells whose collision triggered the process of FIG. 14 were the same as the cells for which a relationship had already been established, and the collision data indicated there was a correlation, then the collision data may be treated 1706 as not indicating a change in the relationship. Finally, if the cells whose triggered the process of FIG. 14 were determined 1703 not to be the same cells as those for which a relationship had already been established, then whether the collision data should be treated as indicating a relationship change could be controlled by a determination 1707 of whether the collision data indicated a correlation, with a correlation indicating a change to the existing relationship, and no correlation indicating no change in the existing relationship.

However, the determination 1405 of whether there was a change in an existing relationship was performed, if there was a change in an existing relationship, then data indicating that change (e.g., origin location and times for a newly identified correlation) could be sent 1406 to the connection system (e.g., using the connection system connection 1305). Otherwise, the process of FIG. 14 could terminate 1404 with no change having been made.

It should be understood that, while FIGS. 13 and 14 and the associated description provided examples of how various functionality of a memory network could be implemented, it is possible that various embodiments could diverge from those examples, both in terms of functionality provided and how such functionality may be implemented. To illustrate, consider an embodiment in which, once sufficient data had been collected to determine if there was a relationship between two cells in the processing grid, an element in the memory network could determine whether that data should be used to modify the processing grid, rather than simply to determine communications with the connection system as described. For example, in a case where an element in the memory network detects that a first and second cell in the processing grid are not correlated (e.g., because a signal at the first cell was likely to be associated with a signal at the second cell, but the first and second cells were equally likely to have the same or different inputs), it might send a message to a mapping module of the processing grid to allocate a set of multi-bit cells (e.g., four multi-bit cells corresponding to the four possible combinations of positive and negative inputs at the first and second cells, or two multi-bit cells, corresponding to the inputs on the first and second cells either having the same or different signs). Alternatively, rather than sending a message to a mapping module of the processing grid, in some cases a memory element could generate multi-bit cells by instructing the connection system to establish a high-speed connections between both the first and second cells and the new multi-bit cells, so that inputs provided to the first and second cells would automatically be replicated at the multi-bit cells. Other variations are also possible and will be immediately apparent to those of skill in the art in light of this disclosure. Accordingly, the above description of multi-bit cell generation functionality, like the preceding description of FIGS. 13 and 14, should be understood as being illustrative only, and should not be treated as limiting.

Turning now to the connection system 103, in an embodiment implemented using the architecture of FIG. 1, the connection system may use relationship information from the memory network 102 to form high-speed connections between cells in the processing grid 101. These high-speed connections may be connections which allow inputs to be propagated between cells in the processing grid 101 more quickly than the 1 cell/cycle propagation illustrated above in the context of FIGS. 6-8. For example, in some cases the connection system 103 may create connections which are capable of physically propagating signals between any two arbitrary cells in the processing grid in no more than a single clock cycle. This may be done, for example, by implementing the connection system as a set of cells having an architecture such as shown in FIG. 15, in which each cell in the connection system 103 would correspond to a cell in the processing grid 101.

Figure 15:
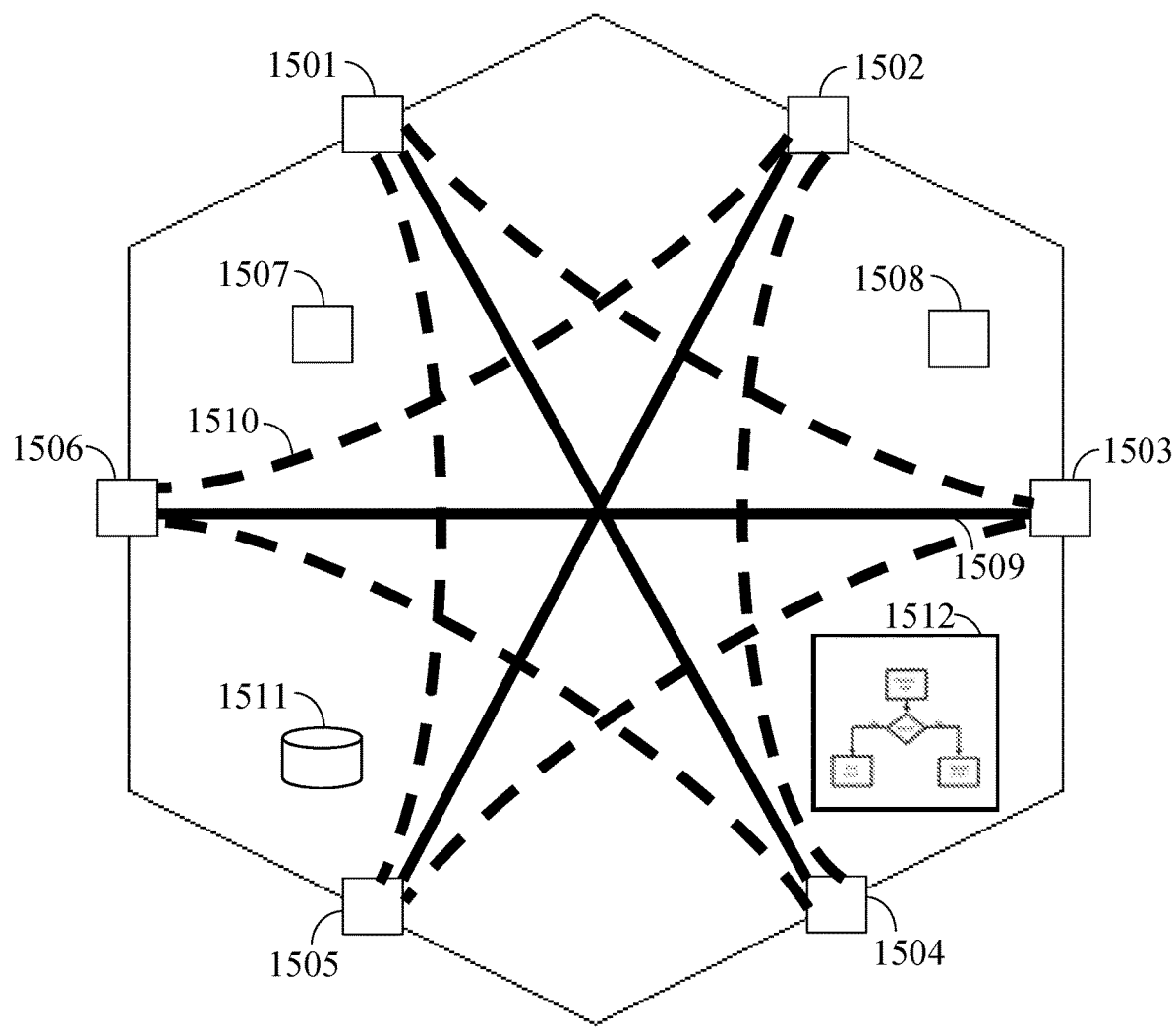
FIG. 15 depicts an exemplary architecture which could be used in implementing cells of a connection system.

As shown in FIG. 15, each cell in a connection system 103 may have a plurality of external connections 1501-1508, which could include connections 1501-1506 used to transfer signals to neighboring connection system cells, a connection 1507 used to communicate with the memory network, and connection 1508 used to communicate with the processing grid. These may be implemented in manners similar to those discussed previously in the context of the connections 205-213 in the illustrative architecture for a cell in the processing grid. For example, in a hardware implementation, these connections may be electrical connections, optical connections, or other types of connections adapted to transfer signals encoding digital information. In a software implementation, these connections may be pointers to data objects instantiated as the corresponding cells or elements in the connection system, memory network or processing grid, as appropriate.

In addition to the external connections 1501-1508, the architecture of FIG. 15 also includes a set of internal connections 1509-1510 between external connections 1501-1506 to neighboring cells in the connection system, as well as memory 1511 which could store data such as which of the internal connections are active, and a processing module 1512 (e.g., a processor coupled with a memory storing computer executable instructions) which could be configured with logic to enable the cells of the connection system 103 to work together to make and propagate data on high speed connections between cells in the processing grid 101. An example of this type of logic is provided in FIG. 16, discussed below.

Figure 16:
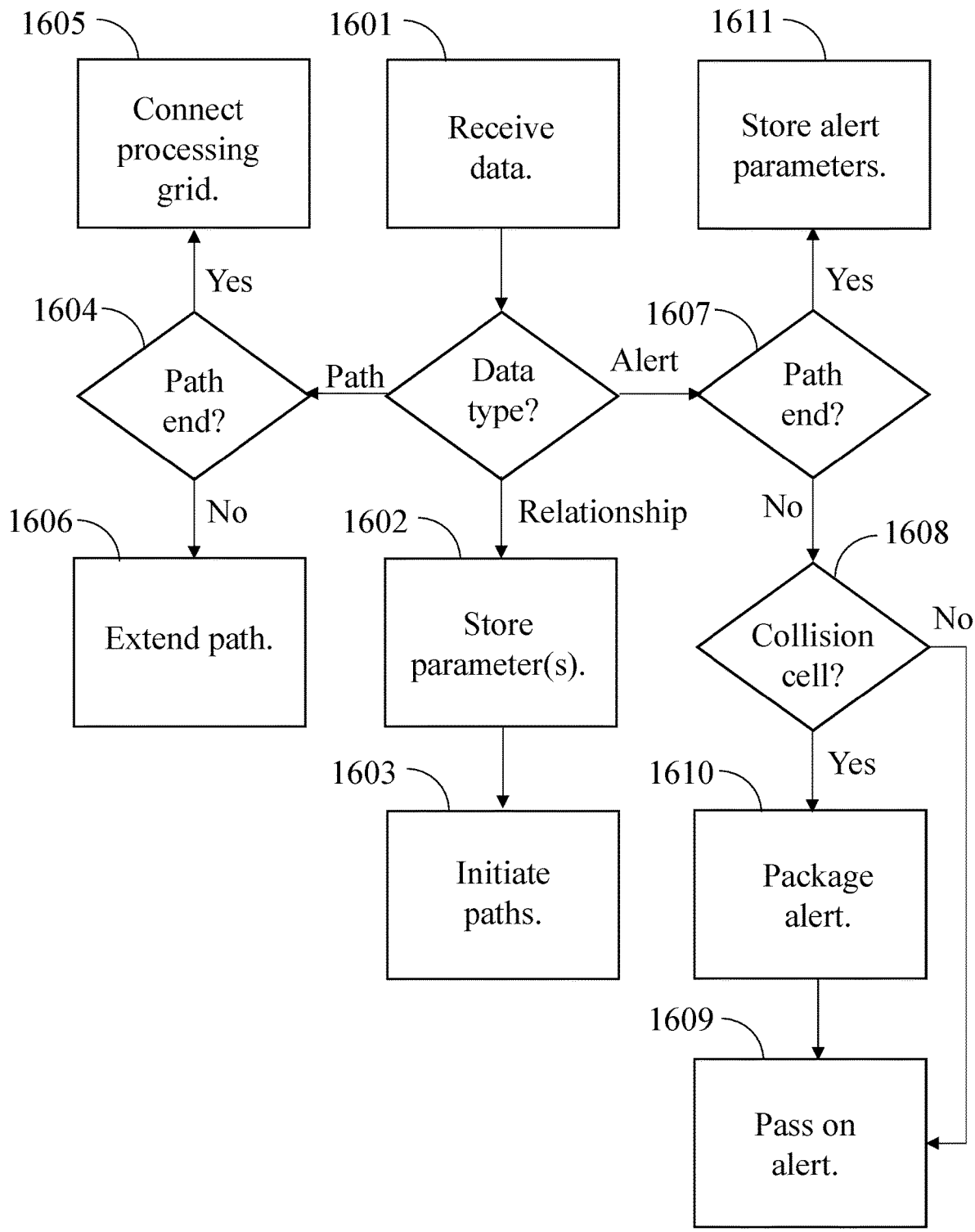
FIG. 16 depicts a method which could be used by a connection system to create and propagate signals over high speed connections between cells in a processing grid.

Turning now to FIG. 16, as shown in that figure, when a connection system cell receives 1601 data, that data may be handled differently depending on its nature. For example, if the connection system cell receives 1601 data from a memory element in the form of parameters encoding a relationship (e.g., S, P and Y values of a cell where there was a collision reflecting a correlation between cells in the processing grid), then the connection system cell may store 1602 those parameters in its memory 1511. Using those parameters, it may then initiate 1603 a path between the cells in the processing grid which the received data indicated were related to one another. This may include activating an internal connection between connections to neighboring cells between the cell performing the method of FIG. 16 and the cells in the connection system corresponding to the related cells in the processing grid. It may also include storing some additional data regarding the relationship between the relevant cells in the processing grid, such as how far in advance a signal on one cell will predict a signal on the other, and whether the signals in the two cells are of the same or opposite sign.

As a concrete illustration of how a connection system cell may initiate 1603 paths, consider a case where a cell in the connection system receives 1601 data indicating that a relationship in the processing grid is reflected in a collision at a processing cell which received an S type signal with a value of 125 on its first connection and P type signal with a value of 124 accompanied by a Y type signal with a value of 125 on its fourth connection. The cell in the connection grid may then create a path between its external connections corresponding to the connections of the processing cell which detected the collision where the colliding signals were received—i.e., its first 1501 and fourth 1504 external connections. This may be done, for example, by closing a switch comprised by its memory 1511 establishing a direct data connection (e.g., an electrical or optical connection) between the relevant external connections. Additionally, because the signal with the lower absolute value (in this case, the P type signal) was indicated as being received on the processing cell's fourth connection, the connection grid cell may store a time offset indicating that when it received an alert on its fourth external connection 1504, that alert would indicate that an input would be received one clock cycle later on a processing grid cell reachable through the first external connection 1501. Finally, the cell initiating 1603 the path may send data to its relevant neighboring cells indicating that they are part of a path connecting related cells in the processing grid (e.g., sending data reflecting an S type signal with a value of 126 to the neighbor on its first external connection 1501, and sending data reflecting a P type signal with a value of 125 accompanied by a Y type signal with a value of 125 to the neighbor on its fourth external connection 1504).

When a neighboring cell in the connection system receives this type of data (i.e., data indicating that it is part of a path connecting related cells in the processing grid), it may make a determination 1604 of whether it is at a terminal end of the path. This may be done, for example, by comparing a signal value received from its neighboring connection system cell with a maximum value for inputs to the processing grid. For example, if all inputs to the processing grid are initially reflected as having a value of 127, then if the information received from the neighboring connection system cell included a signal with a value of 127, this could be treated as indicating that the cell was at a terminal end of the path. In this case, the cell could connect 1605 to its corresponding cell in the processing grid. For example, it could send data to the corresponding processing grid cell (e.g., using its processing grid connection 1508) indicating that, whenever that processing grid cell received an input on its input connection 212, it should both use that input to create a ripple signal pattern as described previously, and also send an alert reflecting that input to the corresponding cell in the connection system. Alternatively, if the connection grid cell was not at a terminal end of the path, it could extend 1606 the path to its appropriate neighboring cell. For example, the cells of the connection system 103 could be configured with logic similar to that described in the context of FIGS. 11-12 for identifying the origins of colliding signals and could use that logic to identify the terminal points, establishing a connection each step of the way so that ultimately a continuous path was created between the related cells in the processing grid 101.

As described above, once a cell in the processing grid 101 is connected to the connection system 103, when that processing cell receives an input, it may generate an alert which it would send to its corresponding cell in the connection system 103. In a connection system cell configured to perform a process as shown in FIG. 16, when an alert is received, the cell could determine 1607 if it was the last cell in the path—i.e., the cell corresponding to the cell in the processing grid which was related to the cell that generated the alert. If the cell was not the last cell in the path, then a further check 1608 could be made if the cell was the collision cell—i.e., the cell corresponding to the cell in the processing grid where the collision of two signals indicated the relationship between the cell which generated the alert and its related cell. This could be done, for example, by checking if the cell had a stored time offset associated with the connection on which the alert was received. If it did not, then the cell would be determined not to be a collision cell for this alert, and so could simply pass 1609 the alert signal on to the neighboring cell which was connected to the external connection on which the alert had been received. Otherwise, if the cell was the collision cell, it could package 1610 the alert for use in generating a signal at the processing grid cell corresponding to the cell at the terminal end of the path. This packaging 1610 may include combining the alert signal with the time offset so that a signal corresponding to the alert can be generated at the appropriate time by the cell in the processing grid corresponding to the cell in the connection grid at the terminal end of the path then being traversed.

Finally, when an alert reaches a cell in the connection system 103 which is at the terminal end of the relevant path, that cell could store 1611 the parameters of the alert. To illustrate how this could be performed, consider a case where the alert had been repackaged with a time offset indicating that the cell in the processing grid 101 corresponding to the cell at the terminal end of the path in the connection system 103 should detect an input ten clock cycles after the alert was originally generated. In such a case, storing 1611 the parameters of the alert could include storing the time offset in the processing grid cell, so that that cell could count down on each clock cycle and, in the event that no input was received by that processing grid cell when the countdown timer reached zero a signal could nevertheless be generated based on the relationship represented by the alert (or, in some embodiments, if a signal was received that contradicted the signal predicted by the alert, the contradictory signal may be overridden).

Of course, variations on this example of storing 1611 parameters of the alert are also possible, and could be implemented in some cases. For example, in some cases, in addition to storing 1611 a time offset, storing parameters of an alert may include storing data indicating the nature of the relationship between the cells at the terminal ends of the path. For instance, if the data in the memory network 102 indicated that a signal in one cell was likely to be followed by a signal in the other cell with a probability of 75%, that probability may be stored 1611, and when the time offset reached zero, a new signal may be generated with a probability of 75%, rather than being generated unconditionally. This type of information may also be used in a case where a cell receives multiple alerts indicating signals that should be generated, in which case it may use probabilities associated with those alerts to determine which should control when generating a signal. Other parameters (e.g., data indicating the sign of a signal that should be generated when a time offset associated with an alert reaches 0) and will be immediately apparent to those of ordinary skill in the art in light of this disclosure. Accordingly, the above examples of storing 1611 parameters of an alert should be understood as being illustrative only, and should not be treated as implying limitations on the protection provided by this document or any related document.

Variations are also possible beyond simply what parameters are stored 1611 with a processing grid cell corresponding to a cell in the connection system at the terminal end of a path. For example, in some cases, the processing grid cell corresponding to the connection system cell at the terminal end of the path may not store any information related to an alert. To illustrate, consider an embodiment configured for a related cell in the processing grid to probabilistically generate its own signal if it doesn't receive an expected input. In some cases, this may be performed by sending an alert to the cell packaged with probability and timing information. However, it is also possible that, rather than packaging the alert with probability and timing information, a collision cell (or other cell upstream of the relevant cell in the processing grid) could use the probability information to determine whether a signal would be generated, and then only send the alert on to the processing grid cell if it determined that a signal should be generated. Similarly, in some cases, rather than relying on the processing grid cell corresponding to the connection system cell at the terminal end of a path to count down to determine when it would expect to receive an input, an upstream cell could count down to determine when the input should be expected to be received, and could send an alert when the necessary time had elapsed for the processing grid cell to use in generating a signal (assuming it had not received the expected input) immediately. Accordingly, the discussion above of storing parameters at the processing grid cell corresponding to the connection system cell at the terminal end of a path should be understood as being illustrative only, and should not be treated as limiting.

Variations are also possible in terms of how information such as alerts may be communicated in a system implemented based on this disclosure. For example, in some cases, rather than communicating alerts through connections which are physically designed to transmit signals faster than the 1 cell/cycle rate of the processing grid, even high speed connections of the connection system may transmit signals at a rate of 1 cell/cycle, but the connection system may have a faster clock than the processing grid, thereby allowing signals to be transmitted through the connection system at a rate higher than through the processing grid, even though both the processing grid and the connection system would transmit signals at a rate of 1 cell/cycle. As another example, consider a software based implementation which uses pointers to communicate information between related cells. In such an implementation, a connection system may provide a first cell in the processing grid a pointer to a second cell in the processing grid when it was determined that an input at the first cell was likely to be followed by an input at the second cell. With such a pointer, instead of (or in addition to) sending an alert to the connection system, a cell in the processing grid could send a signal directly to the cell it was identified as being related to, either when that related cell should expect to receive an input, or in advance so that the related cell could count down and generate an input as appropriate if it didn't receive one as expected.

Of course, it should be understood that the above variations on how the functionality described for the connection system 103 could be implemented are intended to be illustrative only, and that other types of variations may also be implemented in some cases. As an example, in some cases an implementation could include a connection system 103 which provides functionality not included in the above description. For instance, in some cases, functionality could be provided for tearing down connections previously established by the connection system, rather than simply creating and communicating data through connections between cells (e.g., if data maintained by the memory network indicated that a previously identified relationship was likely spurious, a signal to tear down the path corresponding to that relationship could be sent to the connection system, and the connection system could then trace the path to its terminal ends using logic similar to that described for initially creating the path, breaking connections until the path was completely torn down).

Variations in functionality are also possible for components other than the connection system. For instance, while some implementations may convert binary inputs to signals which dissipate from a uniform value (e.g., 127) as they spread through a processing grid, it is possible that other implementations may take or support propagation of other types of inputs. For instance, in some embodiments, a cell may take inputs in the form of integers (or floating points, or characters, or other types of values), and communicate those inputs through the processing grid as data passed along with signals that are propagated as described above. In such a case, when the signals collided, the input data passed from cell to cell with those signals could be used to determine the existence of a relationship, rather than relying on the values of the signals themselves. It is also possible that, rather than changing digital values as signals propagate from cell to cell, some embodiments may take advantage of attenuation which occurs naturally as signals travel. For instance, there may be a hardware implementation in which signals are transmitted in a manner which naturally radiates outward and attenuates with distance (e.g., as electromagnetic radiation), and the signal's origin may be determined based on the level of attenuation experienced by the signal when it is ultimately detected. In such a case, when an expanding ripple pattern is detected, a cell may store a value for the ripple pattern temporarily (e.g., for a preset period, such as five milliseconds), so that that it could be compared with, and potentially be used to identify relationships based on, other signals even if those other signals are not detected in the same instant.

Variations are also possible in values signals may take, and how those values may be modified over time. For instance, while several examples provided herein used negative signals which would decrease in intensity from −127 to 0, and positive signals which would decrease in intensity from 127 to 0, it is possible that signals may range from 1 to 255 instead of from −127 to 127. In such a case, negative signals could "decrease" in intensity from 1 to 128, and positive signals could "decrease" in intensity from 255 to 128. Similarly, in a hardware implementation, signal values may range from 2V to 6V, giving a minimum intensity of 4V in such implementations. As a similar example, in some implementations, signals may decrease in intensity by application of a function which may numerically jump around before reaching the applicable minimum intensity. For instance, a signal's intensity may change as it is propagated by applying a function which multiplies a first constant by a signal value and then mods the result by a second constant. As a concrete illustration (albeit one using much smaller constants than would likely be present in a real case) two constants, 10 and 7 could be used in an attenuation function. A signal which starts at 3 may attenuate to 2 (that is 30%7), then attenuate to 6 (that is 20%7), then attenuate to 4 (that is, 60%7), then attenuate to 5 (that is, 40%7), then attenuate to 1 (that is, 50%7), which could be considered the minimum intensity value. Additionally, it is also possible that different types of signals may have different minimum intensity values (i.e., one type of signal may have intensity values which converge on 1, while another may have intensity values that converge on 0), and/or different ways of converging on those values (e.g., one may use a function which jumps around before reaching the applicable minimum intensity, while another may simply reduce a signal's absolute value by a fixed increment as it propagates from cell to cell). Accordingly, the examples provided of input and signal values, as well as relationships between those values, should be understood as being illustrative only, and should not be treated as limiting.

As another alternative, in some cases, as signals are propagated through the processing grid, they may not dissipate with distance, but instead may remain constant, and the origins of those signals may be determined using other information (e.g., an origin point passed along with the signal) rather than working backwards as described. Additionally, in some cases, rather than passing additional data along with a signal, that data may be stored elsewhere in the system (e.g., in the cell from which the signal originated), and either the signal would be propagated with a pointer to that data, or the signal may not be propagated with that data at all, but instead the data would be retrieved from the signal's origin once a collision was detected and the origin was determined.

Variations are also possible in how components such as shown in FIG. 1 may relate to and interact with one another. For example, while the above description explained how a processing grid 101 could determine the origin points of colliding signals when reporting them to a memory network 102, this may not always take place. For instance, in some embodiments, when a cell in the processing grid was reporting a collision, it may simply report the raw data related to the collision (e.g., values for S, P and Y signals, and the connections on which those signals were received), and the memory network may then use that information to determine the origin points of the colliding signals. In some cases, this approach may be further extended, with a memory network storing data regarding a collision without necessarily determining the origin points of the colliding signals, passing on that data when the collision data indicated that there was a relationship, and the origin points only being determined by the connection system when it was establishing a connection (either though a path, pointers or some other approach) between related processing grid cells. Similarly, while it is possible that cells in a processing grid may store information used in determining 305 whether to report a collision, in some embodiments, rather than this information before stored in the processing grid, the information may be stored in the memory network, and the cells in the processing grid may be configured to retrieve this information from the memory network when determining 305 whether to report.

As a further example of a type of variation on how components as shown in FIG. 1 may relate to and interact with one another, it is also possible that artificial intelligence systems could be implemented based on this disclosure having organizations other than as shown in FIG. 1. For example, while the above discussion focused on scenarios in which the processing grid 101, the memory network 102 and the connection system 103 were implemented as different components, it is possible that some embodiments may combine one or more of those items. For instance, rather than having a separate connection system 103 with cells corresponding to cells in a processing grid 101, in some cases cells in a processing grid 101 may be configured to provide functionality of both identifying potential relationships and of establishing and transmitting data through high speed connections. Similarly, in some cases, rather than relying on a separate connection system 103, in some cases a memory network 102 may directly create connections between processing grid cells when a relationship is identified, such as by identifying the origins of the signals whose collision indicated the relationship and then providing one or both of the origin cells a pointer which could be used for high speed communications.

Organizational changes other than combining components are also possible and may be implemented in some cases. For example, based on this disclosure, a system could be implemented with multiple sets of processing grid cells operating in parallel, and the combined operation of these multiple sets of cells could be used for potentially more robust relationship identification. This may be achieved, for example by randomly creating associations between potential inputs and three separate sets of processing grid cells, and, when an input was received, having the mapping module send that input to the cell it associated with in each of the sets of processing grid cells. The signals generated by those inputs could then propagate through their respective sets of cells in the same manner as described above, and the inputs of all three sets of cells could be used to identify relationships that exist in the input data set (e.g., using a voting protocol). It is also possible that, in some implementations, signals could be allowed to wrap around to the opposite side of the processing grid once they reach the grid's edge, rather than terminating at the edge of the grid. Another type of organizational change which may be implemented based on this disclosure is changes in the shapes and configurations of cells. For example, rather than organizing the processing grid and/or other components out of hexagonal cells, rectangular cells could be used, with offsets between rows of cells used to allow each cell to have six neighbors despite only having four sides. Variations in numbers of neighboring cells are also possible. For example, in an implementation using rectangular cells, it is possible that such cells may be disposed without offsets between rows, and for each cell (or each non-edge cell, in the case of an implementation which does not allow signals to wrap around when they reach the edge of the grid) to be able to communicate with four or eight neighbors, rather than six.

Figure 18:
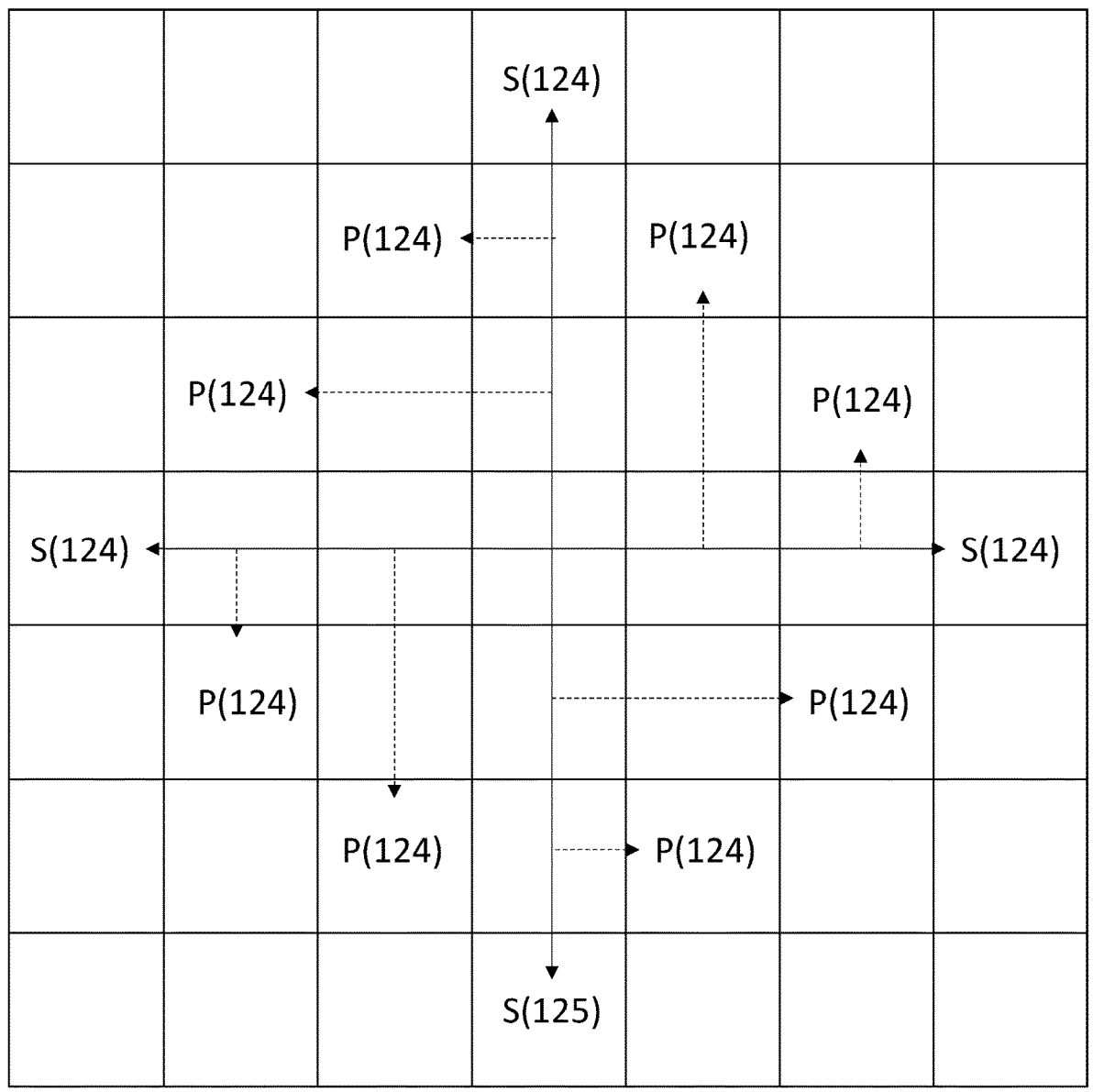
FIG. 18 depicts a first approach to signal propagation through a grid made up of square cells.
Figure 19:
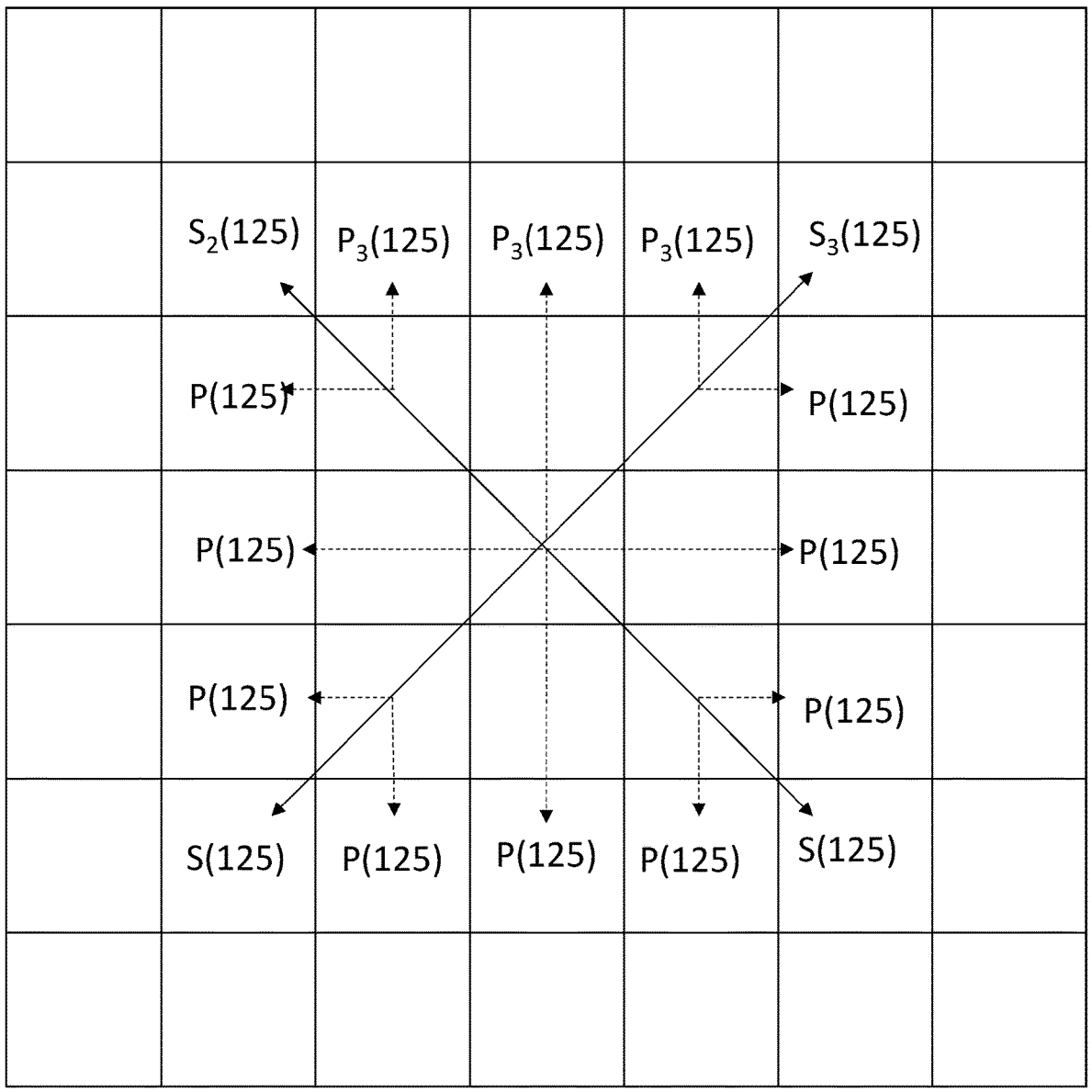
FIG. 19 depicts a second approach to signal propagation through a grid made up of square cells.

Combinations of different types of variations are also possible. To illustrate, consider FIGS. 18 and 19, which illustrate two approaches to propagating signals through a processing grid made up of square cells, with solid arrows showing the paths of values for S type signals, and dashed arrows showing the paths of values for P type signals. In the approach of FIG. 18, S type signals radiate out from a central point, spawning P type signals which move in straight lines at each time step. By contrast, in the approach of FIG. 19, S type signals radiate out from a central point, but spawn two P type signals at each time step. Further in the approach of FIG. 19, P type signals are also spawned from the central point, rather than all P type signals necessarily having to be spawned by S type signals as in an approach such as that of FIG. 18. However, despite the differences in signal generation and propagation shown in FIGS. 18 and 19, techniques described herein may still be applied in each case. For example, in an embodiment following the approach of FIG. 19, when a S type signal spawns two P type signals, the P type signal on the left of the S type signal's propagation axis may be spawned with a Y type signal that has its sign flipped. Then, when a collision is detected, the same type of back tracing algorithms described herein could be applied, with the question of how (and whether) to track back to the origin of an S type signal from a P type signal's origin point being determined by comparing the sign and intensity of the P type signal's accompanying Y type signal. Accordingly, differences in appearance and implementation details, including differences in signal generation and propagation, and differences in cell shape, should not be treated as moving an embodiment outside the scope of protection provided by this document or any related document.

Figure 20:
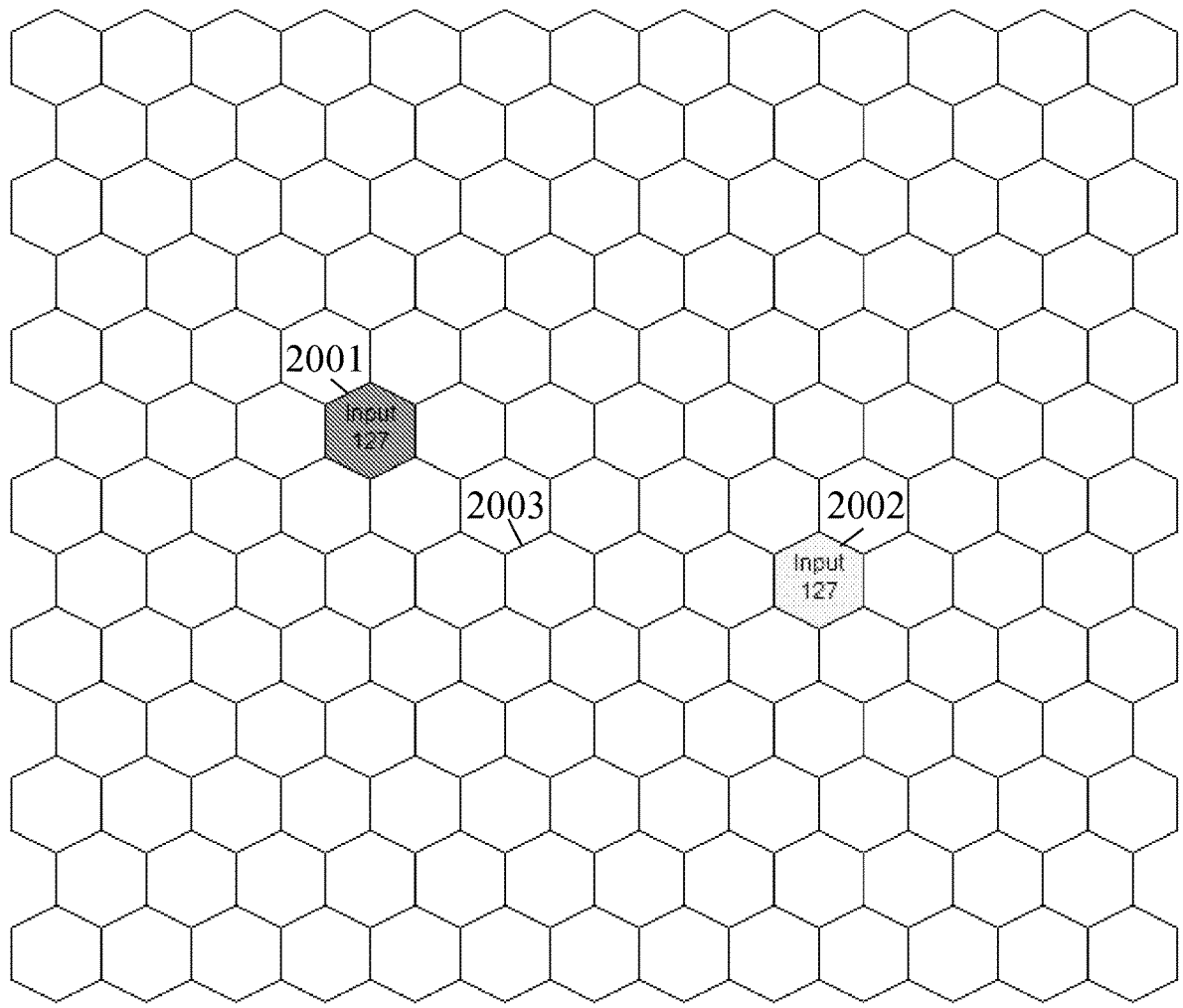
FIG. 20 shows a processing grid with two initial pulsating input signals.
Figure 21:
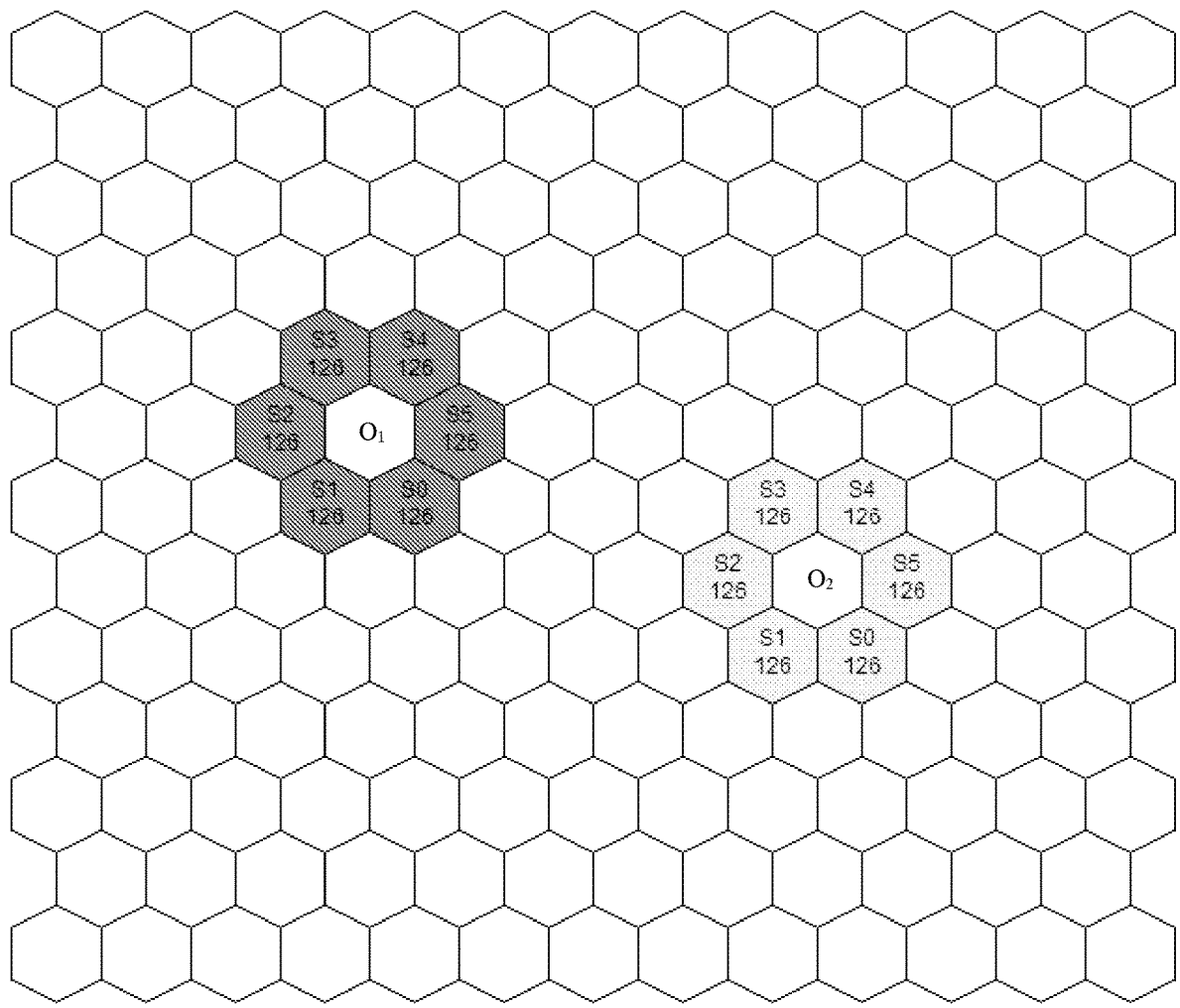
FIG. 21 shows how initial input signals in the grid of FIG. 20 may propagate after a first time step.
Figure 22:
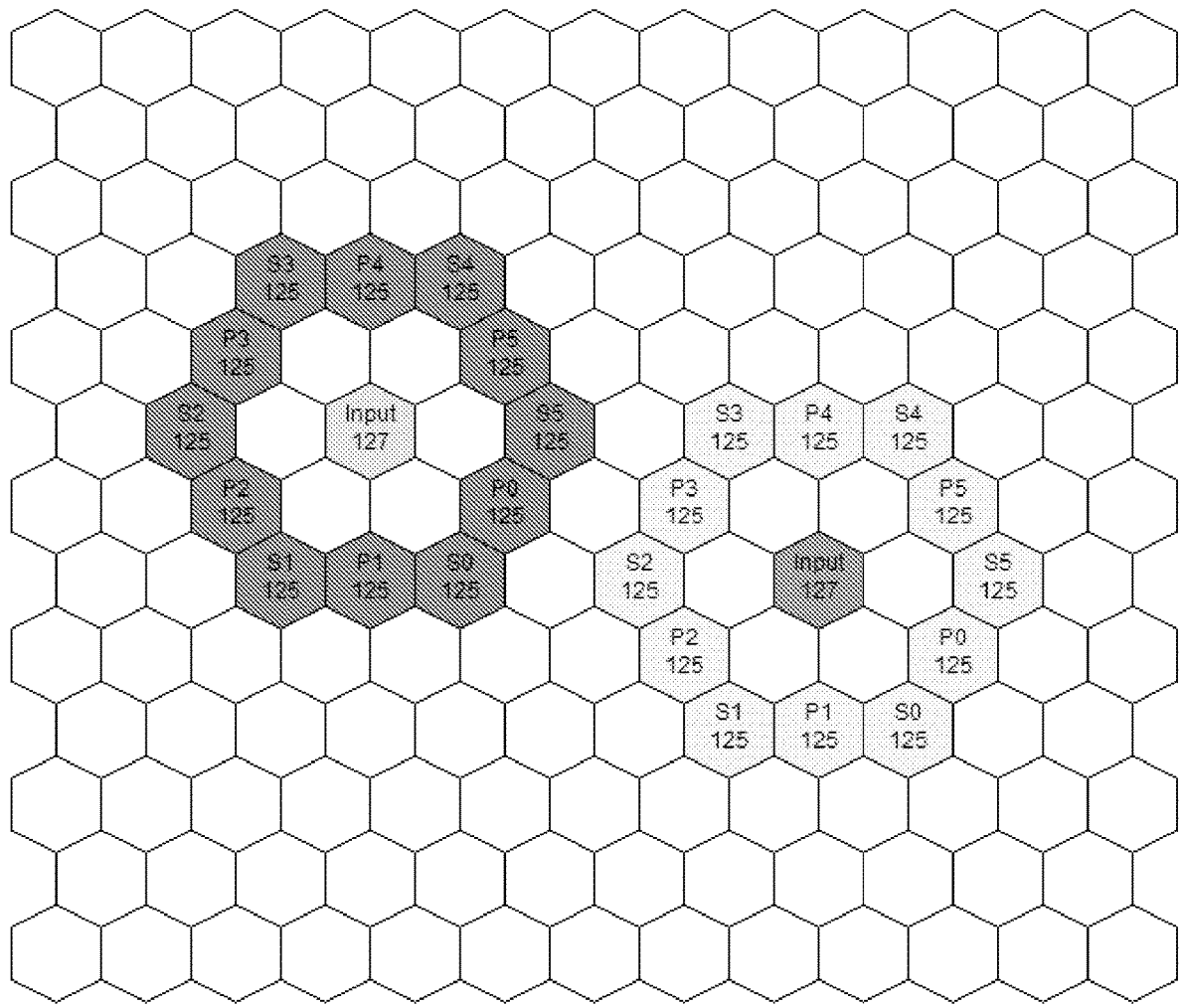
FIG. 22 shows how initial input signals in the grid of FIG. 20 may propagate after a second time step, with the introduction of new input signals.
Figure 23:
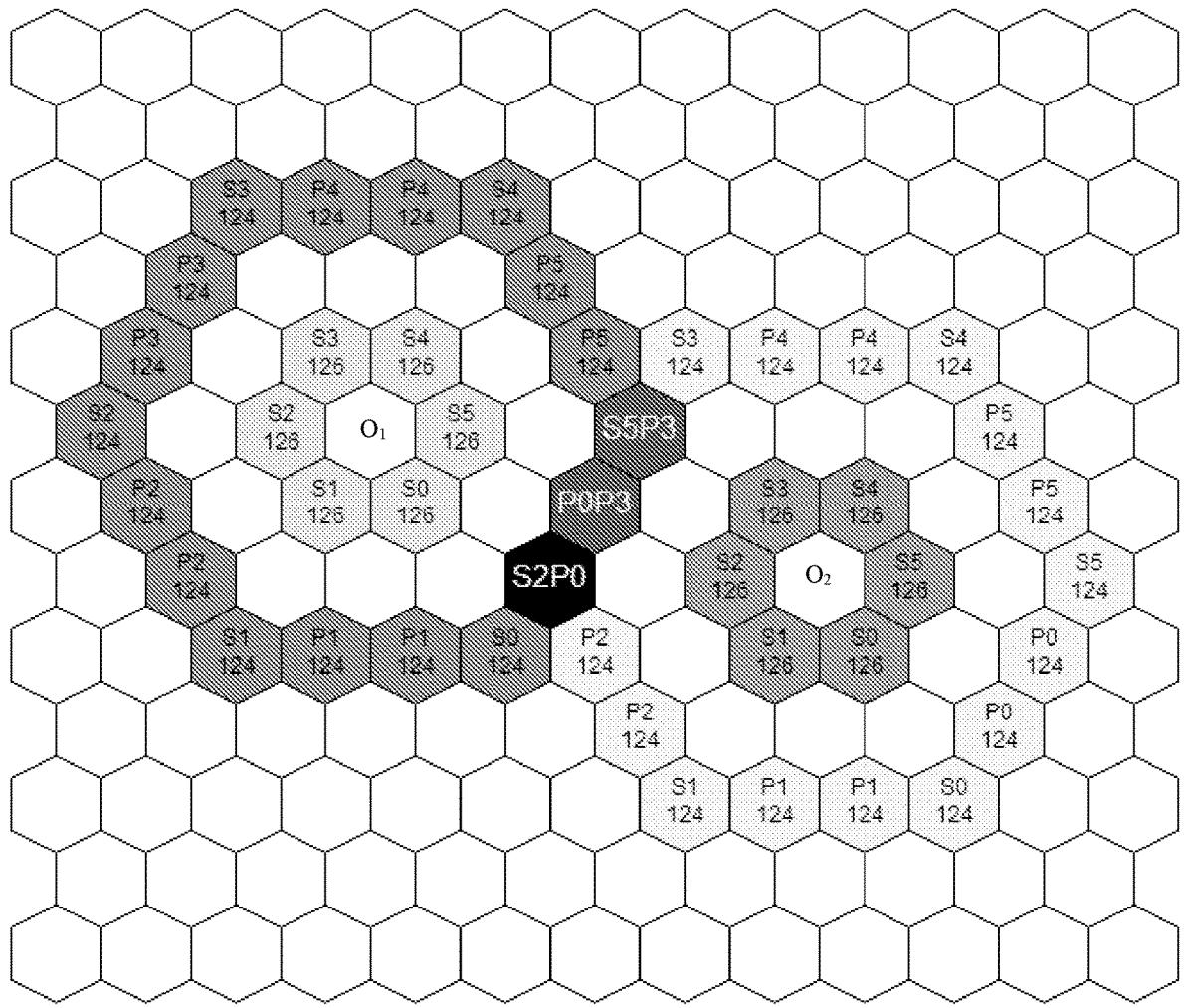
FIG. 23 shows how initial input signals in the grid of FIG. 20 and FIG. 22 may propagate after a third time step.

As a further illustration of potential variations on how the disclosed technology may be implemented, the discussion below provides an example of how various subsystems could communicate over time. In this example, the inputs are provided at two points of origin 2001 2002, shown in FIG. 20, and pulsate every two time steps. Two ripple patterns emerge, in a manner consistent with previous discussions. FIG. 21 shows how a processing grid may look after one time step. Ripple patterns are shaded differently for ease of reference. After the second time step, as shown in FIG. 22, the input points show third and fourth pulses, which will create two more ripple patterns, which have been shaded differently, again for ease of reference, and begin as two single cells at the points of origin. After a third time step, as shown in FIG. 23, two new ripple patterns emerge, which are wholly contained within the first two ripple patterns. FIG. 23 shows what a processing grid may look like after a third time step.

Figure 24:
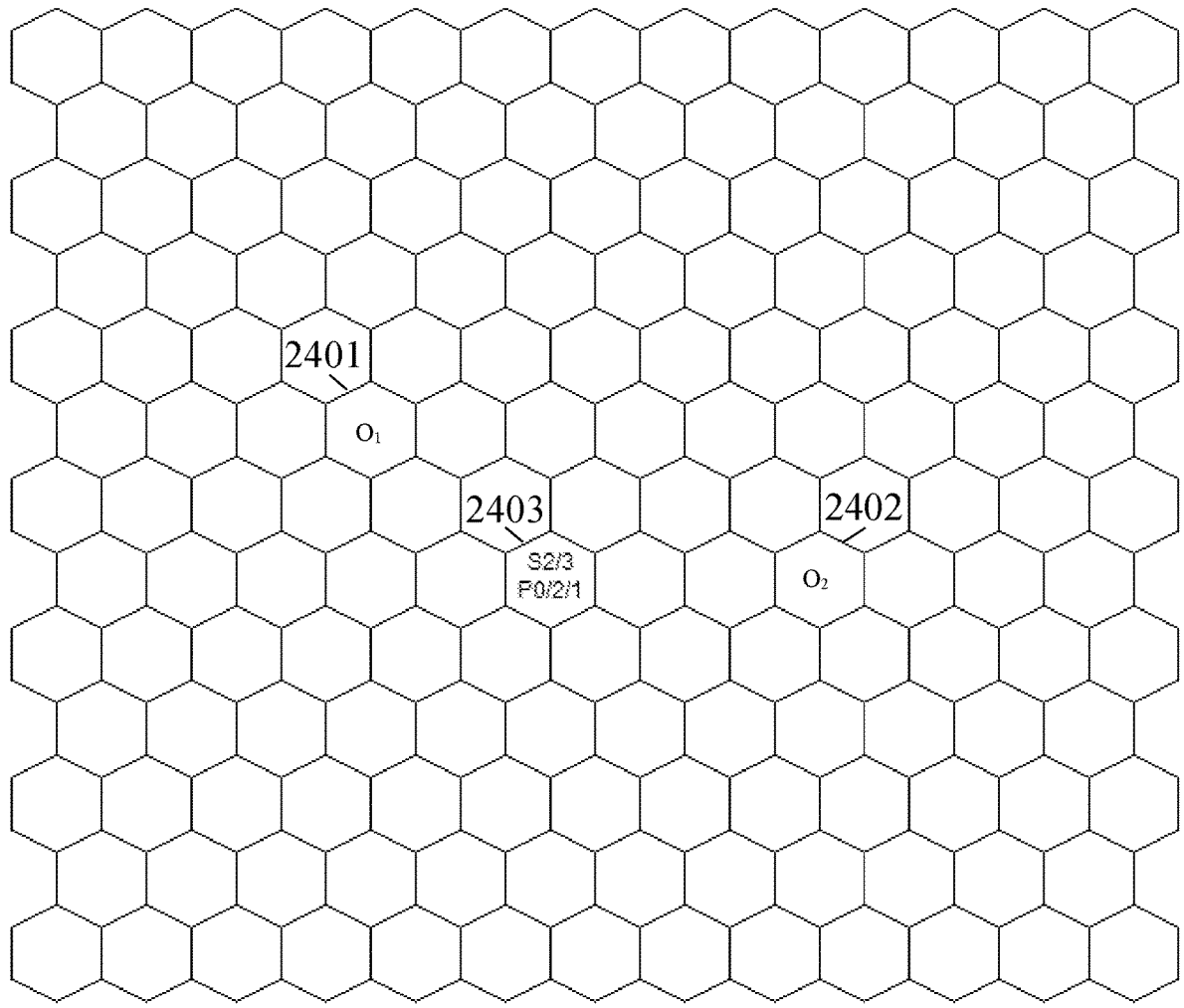
FIG. 24 shows how a memory network may track a reported collision from FIG. 23, after a third time step.

In addition, FIG. 23 shows a collision between the first two ripple patterns, as discussed previously, and shows cells where ripple patterns collide in a darker shade with white font, labeled S2P0, P0P3 and S5P3. The collision S2P0 meets the reporting requirements described in table 5. This could result in a report to a corresponding memory network cell 2403 in a memory network shown in FIG. 24, which is what the memory network could look like after the third time step. The memory network shown in FIG. 24 illustrates cells corresponding to the locations of the two points of origin 2401 2402, as $O_1$ and $O_2$, for ease of reference. The exemplary memory network shown in FIG. 24 aligns with the processing grid shown in FIG. 20 through FIG. 23, with individually aligned cells able to communicate to each other. Specifically, cell 2001 aligns with cell 2401, cell 2002 aligns with cell 2402, and cell 2003 aligns with cell 2403, and similar alignments exist for unnumbered cells. In this case, the memory network cell 2403 is tracking a collision of type S2P0, which was a collision shown in FIG. 23 and was reported by the processing grid, in the same manner as discussed previously.

The memory network cell 2403 may keep track of the particular collision parameters, such as "S2/3 P0/2/1", indicating that the collision was an intersection of two signals, one being an S type signal with an index of two, which originated from a cell three cells away, and the other was a P type of signal with an index of zero, which originated from a cell which can be found by tracing a path of two cells in one direction, and then turning left and proceeding one cell. These values could all be derived from the collection of signals received at the collision point using S, P, and Y values as described previously.

Figure 25:
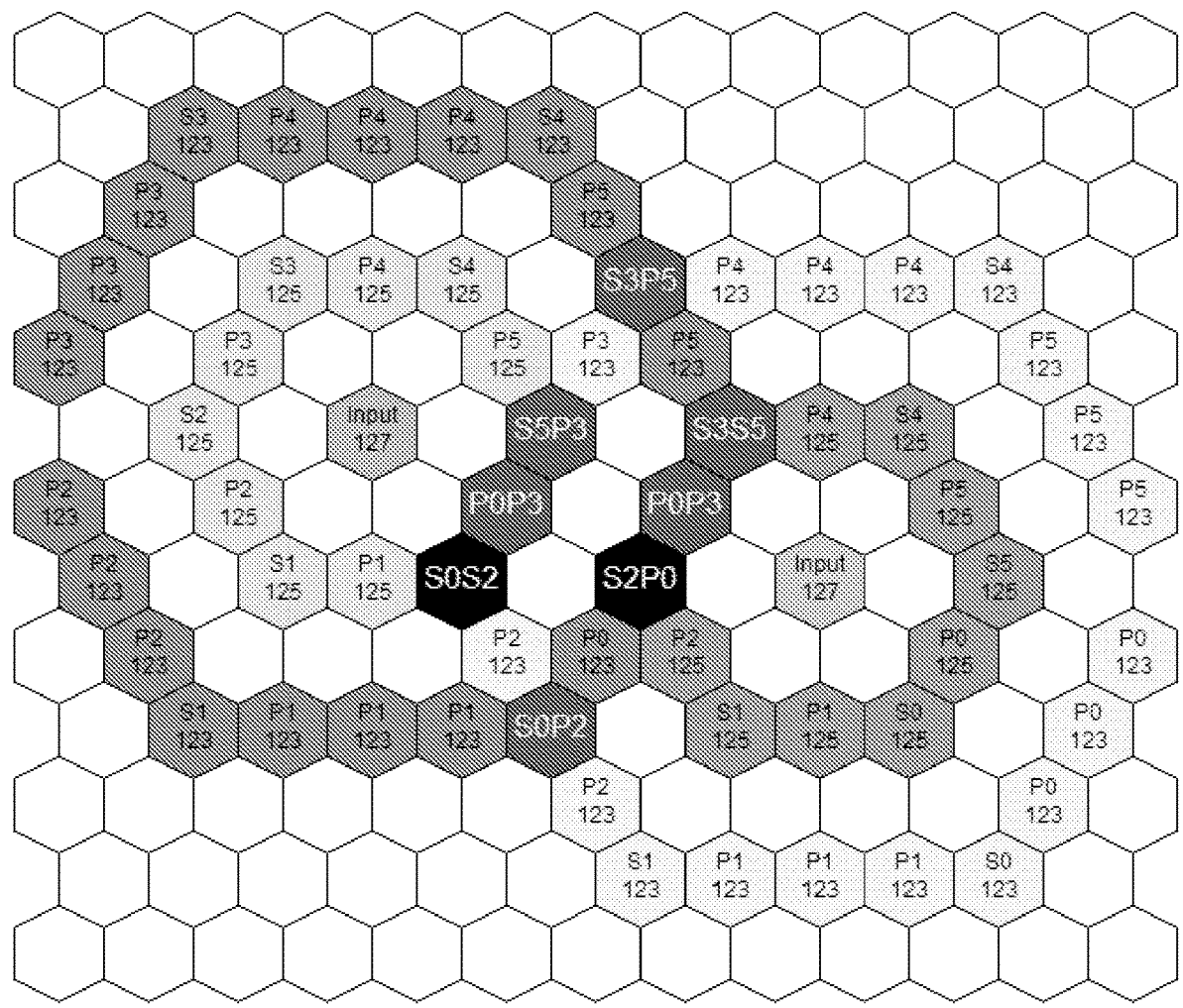
FIG. 25 shows how initial input signals in the grid of FIG. 20 and FIG. 22 may propagate after a fourth time step, with the introduction of new input signals.
Figure 26:
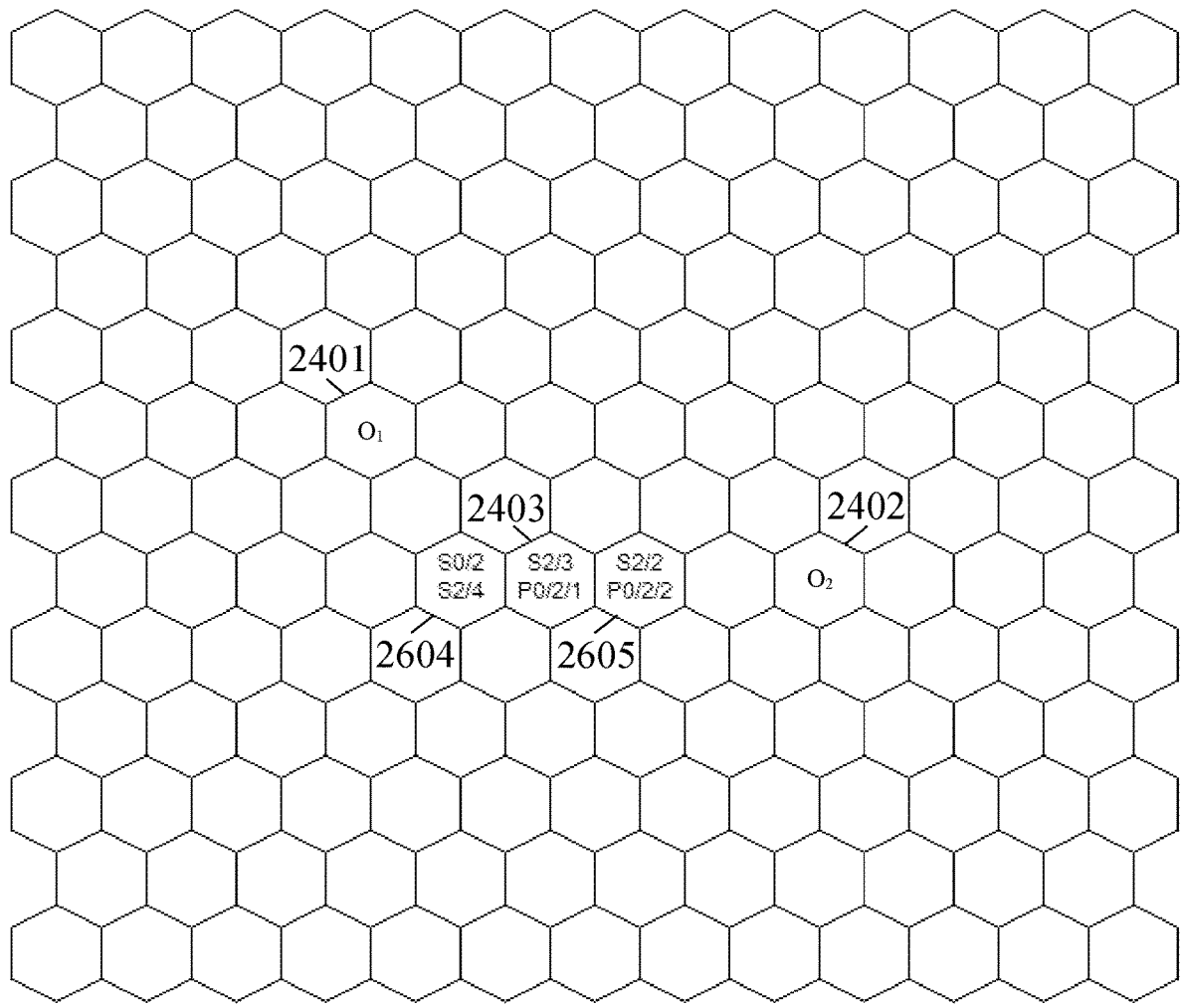
FIG. 26 shows how a memory network may track reported collisions from FIG. 23 and FIG. 25, after a fourth time step.

Turning back to the processing grid, FIG. 25 shows what the processing grid may look like after a fourth time step. Two more input signals have been generated, and several more collisions have occurred, two of which meet the reporting requirements previously discussed, and shown in table 5. The two new collisions which meet the table 5 reporting requirements can be identified by their corresponding memory network cells 2604 2605, shown on FIG. 26. One memory network cell 2403 shown on FIG. 26 was activated after the third time step (on FIG. 24.) and is in the middle of the path of collisions.

Figure 27:
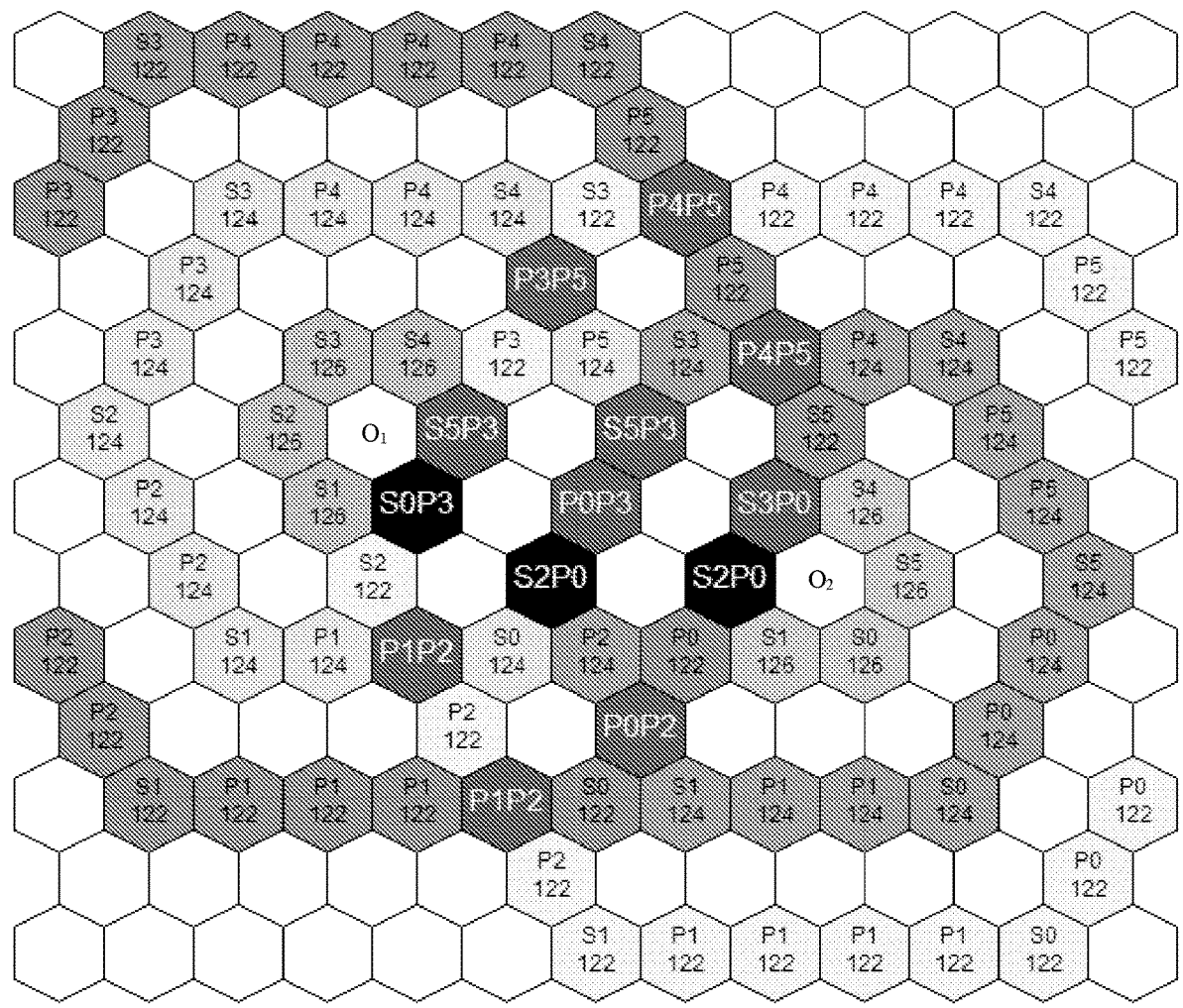
FIG. 27 shows how initial input signals in the grid of FIG. 20, FIG. 22, and FIG. 25 may propagate after a fifth time step.
Figure 28:
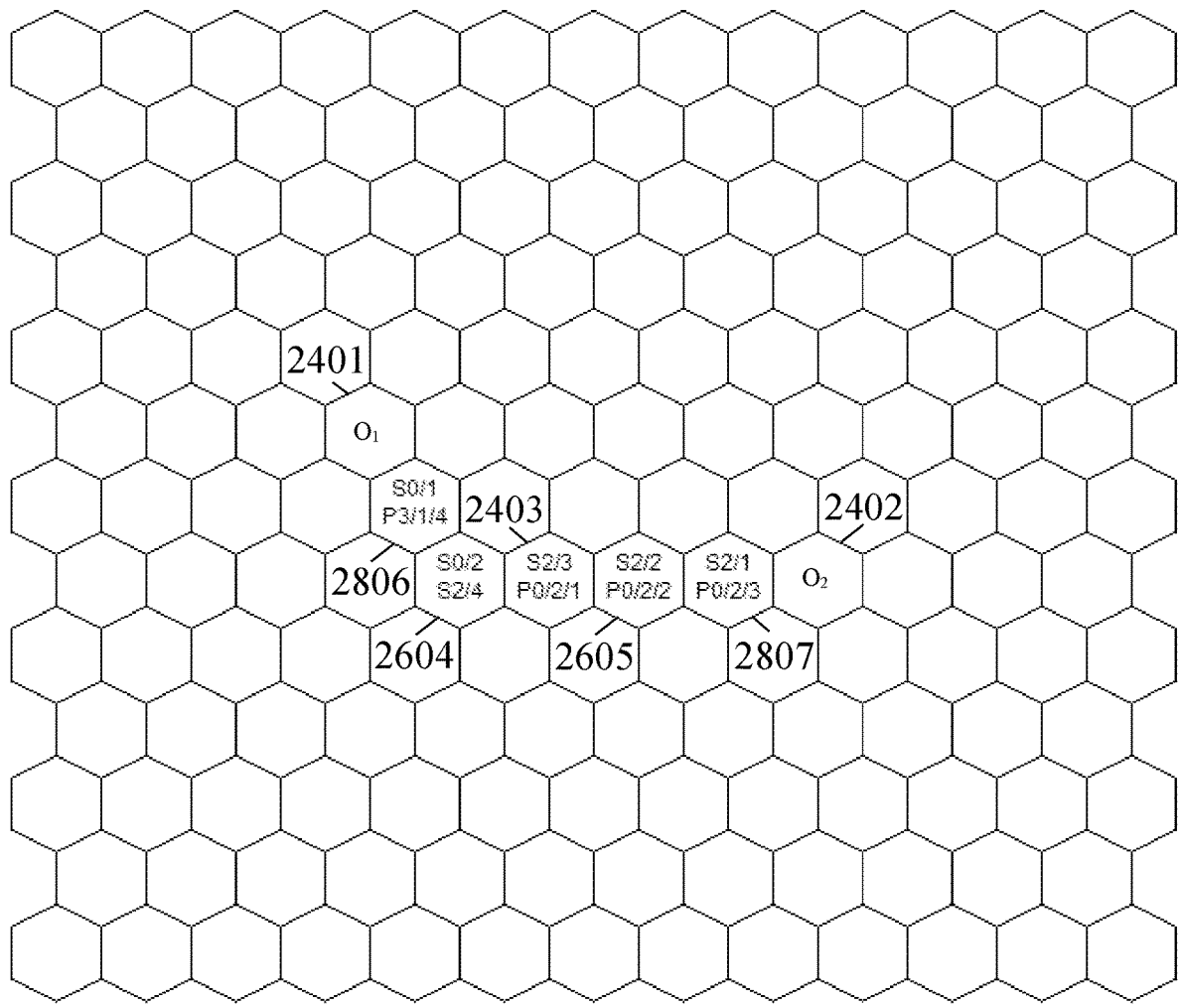
FIG. 28 shows how a memory network may track reported collisions from FIG. 23, FIG. 25, and FIG. 27 after a fifth time step.

After further time steps, a complete collision path could appear in the memory network, keeping the same memory network cell 2403 in the middle of the collision path. A potential collision path is a series of adjacent cells which connect two origin points that are possible candidates for receiving reports of collisions based on the reporting rules, such as those shown in table 5. In the example shown here, using two regularly pulsating inputs, the actual collision path is made up of three memory network cells 2604 2403 2605 shown in FIG. 26, and five memory network cells 2806 2604 2403 2605 2807 in FIG. 28. Alternate implementations could include the end points 2401 2402 in the collision path. Irregular pulses could generate actual collision paths that are not adjacent cells, but still lie on the potential collision path. A potential collision path could be a straight line between two cells, or it could have a bend in it. FIG. 27 shows the processing grid after a fifth time step, and FIG. 28 shows the corresponding state of the memory network after the fifth time step. At this point, five memory network cells 2806 2604 2403 2605 2807 shown on FIG. 28 represent the collision path, and it is not a straight line of cells, but rather has a bend, located at cell 2604.

One memory network cell 2403 remains at the midpoint of the collision path. Each of the memory network cells can track statistics about the collisions that are reported. The statistics create a predictive capability once correlations are discovered. For instance, the midpoint memory network cell 2403 can provide a prediction of what may happen simultaneously at one pulse origination point, given the state of the other pulse origination point. Memory network cells that are not at the midpoint, such as memory network cell 2807 can provide future (or lagging) predictions. They can utilize information provided by the distant pulse origination point to predict what a future pulse may be at the nearby pulse origination point.

Figure 29:
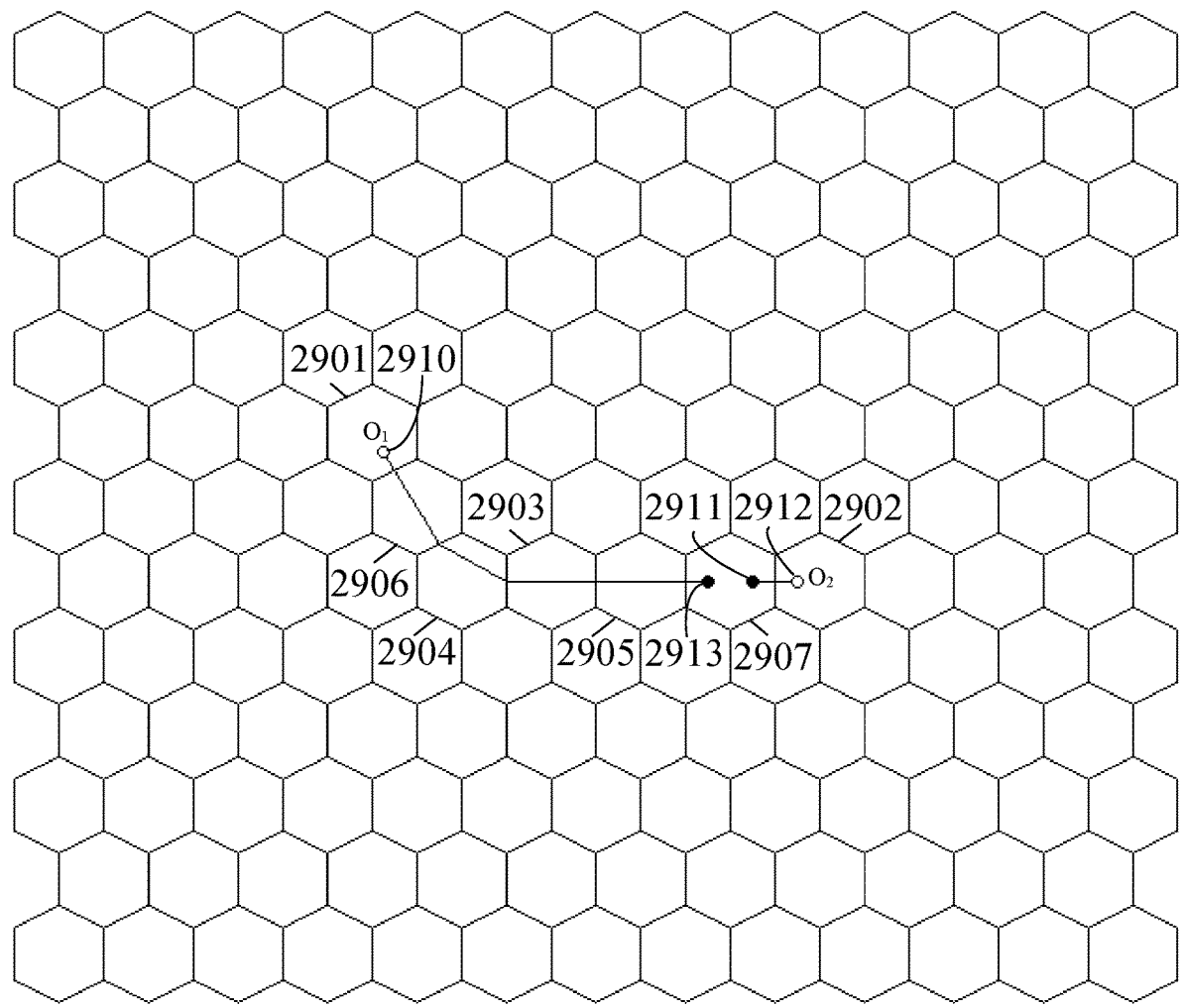
FIG. 29 depicts a first approach of how a connection system may store connections established by the ripple patterns shown in FIG. 27 at some point after a fifth time step.

Once a memory network cell detects a potential correlation between two pulse origination points, it could communicate to a connection system. FIG. 29 shows a first example of what a connection system may look like many time steps after the fifth time step, once sufficient observations have been made to detect a potential correlation between pulse origination points. Any cell on the memory network (of FIG. 28) along the collision path, such as memory network cell 2807, could communicate to its corresponding connection system cell, such as connection system cell 2907 (of FIG. 29), to request that connections be built between the two pulse origination points 2001 2002, corresponding to connection system cells 2901 and 2902. Two connections are shown; one connects connection system cell 2907 to one endpoint 2901, and the other connects connection system cell 2907 to the other endpoint 2902. Connectors 2910 2911 2912 2913 connect through to the other subsystems. Connector 2910 provides a connection from connection system cell 2901 to its corresponding processing grid cell 2001, and connector 2912 provides a connection from connection system cell 2902 to its corresponding processing grid cell 2002. Connectors 29112912 provide connections from 2907 to the corresponding cell 2807 on the memory network.

Once the connection system has the connection in place, high-speed communications between cells could be conducted. To continue with the example, in this case, memory network cell 2807 detected a potential correlation, based on the statistics that it was tracking. It requested that connections be established, as shown in FIG. 29. Now, any time an input is present on $O_1$, at the corresponding processing grid cell 2001, a notification of the incoming signal is sent to connection system cell 2901 via connector 2910, and it travels immediately to connection system cell 2907, and to its corresponding memory network cell 2807. The memory network can then utilize its stored statistics to predict a specific value of a future input at $O_2$, which will arrive at the corresponding processing grid cell 2002. In this specific example, based on the position of memory network cell 2807 relative to the origins ($O_1$ and $O_2$,) and their processing grid cells 2001 2002, the memory network cell 2807 is tracking the $O_1$ pulses, and their correlation to $O_2$ that results in a collision four time steps later. This could be calculated from the collision parameters at memory cell 2807, which are "S2/1 P0/2/3", meaning that the path to one of the origins has a length of one cell, while the path to the other is 2+3, or 5 cells. The difference between 5 and 1 accounts for the tracking of pulses that are temporally 4 time steps different. This provides a predictive capability: the ability to predict what $O_2$ will be in the future, four steps after the observation of $O_1$'s value.

Once the prediction is computed at memory network cell 2807, it could be communicated to its corresponding connection system cell 2907 via connector 2911, and then transmitted to connection system cell 2902 via the connection shown in FIG. 29 connecting 2911 and 2912, and then communicated to its corresponding processing grid cell 2002. Processing grid cell 2002 can utilize this prediction in many ways, not limited to (a) substituting for missing data, if no input signal arrives at the expected time, (b) over-riding a conflicting input signal, (c) notifying other cells of a conflicting input signal (e.g., that an unexpected condition occurred), or (d) increasing the confidence level of the system by validating an expected input signal.

Because the prediction is forward in time, in some implementations a buffer may be utilized to store the prediction until the appropriate time step arrived. A count down would commence, decrementing with each passing time step, until the appropriate time, which in this example would be four time steps. This buffer could be in various locations, including at the memory network cell that made the prediction (in this example, memory cell 2807), or at the endpoint processing grid cell (in this example, processing cell 2001). That is to say, the prediction could be stored first and transmitted second, or vice versa. Other implementations are also possible, including a dedicated prediction storage grid, not illustrated here. Accordingly, the descriptions of how the prediction storage and forwarding could be implemented should not be treated as implying limitations on the protection provided by this document or any other related document.

Figure 30:
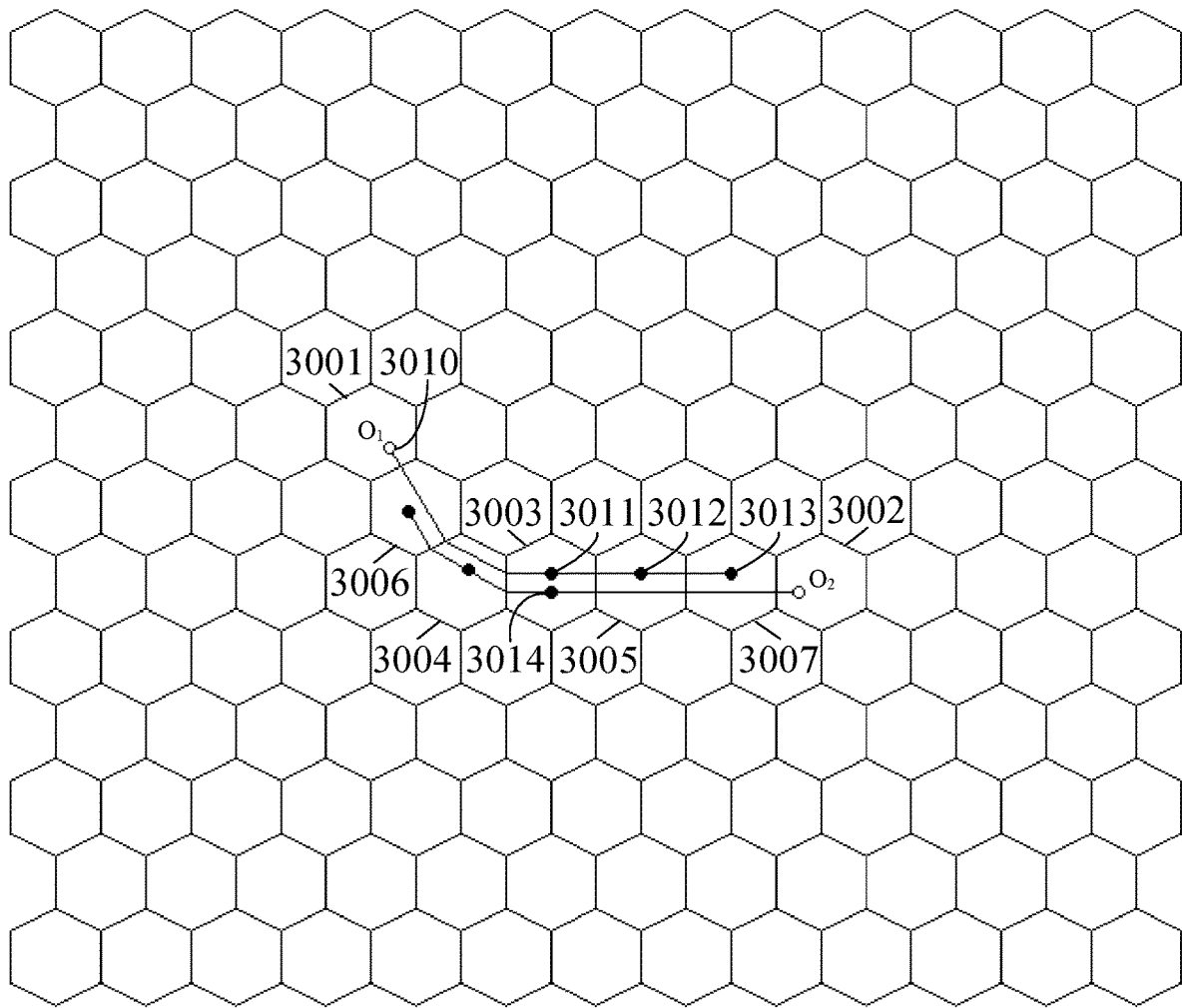
FIG. 30 depicts a second approach of how a connection system may store connections established by the ripple patterns shown in FIG. 27 at some point after a fifth time step.

FIG. 30 provides a second example of a connection system implementation. FIG. 30 also represents what a connection system may look like many time steps after the fifth time step once sufficient observations have been made to detect a potential correlation between pulse origination points. In this example, a cell along the collision path requests that connections be made, once that cell has observed a sufficient number of collisions, based on a threshold value, regardless of whether it has detected a potential correlation.

The cell making the connection request could utilize the propagation capability of the connection system grid, as explained in detail earlier with regard to the processing grid, to notify cells along the collision path of its request. As a concrete example, using the inputs and collisions shown in FIG. 20 through FIG. 27 and imagining continued pulsing for some time past a threshold value (for example, 30 collisions), memory network cell 2403 (initially shown on FIG. 24) could request that connections be established as shown in FIG. 30. Memory network cell 2403 could communicate with its corresponding connection system cell 3003, requesting the establishment of connections between itself and the specific endpoints, which in this example are connection system cells 3001 and 3002. Operating at the time scale of the processing grid (that is, signals moving one cell per time step), connection system cell 3003 could communicate with its neighboring connection system cells 3004 and 3005 during one time step, and connection system cells 3004 and 3005 communicate with their neighboring connection system cells 3006 and 3007 during a subsequent time step, and connection system cells 3006 and 3007 could communicate with the endpoint connection system cells 3001 and 3002, each requesting that an appropriate communication channel be established in the connection system as shown in FIG. 30.

Two communication channels could be established, as shown. One runs from connection system cell 3001 to connection system cell 3007 utilizing connector 3010, 3011, 3012, and 3013; the other runs from connection cell 3002 to 3006, utilizing four unnumbered connectors which perform similarly to connectors 3010, 3011, 3012, and 3013. Connection system cell 3003, which requested the communication channels, is the only cell which has two connectors, connector 3011 and connector 3014, though in other cases cells other than the cell which requests a communication channel may have two connectors. For example, in some cases, a communication channel may be requested by a cell adjacent to the midpoint of the collision path (e.g., the adjacent cell which includes connector 3012), and the cell at the midpoint of the collision path (e.g., midpoint cell 3003) may have two connectors as shown in FIG. 30.

Continuing with this example, all of the memory cells along the collision path (memory cells 2806 2604 2403 2605 2807), and possibly endpoint memory cells (memory cells 2401 2402) depending on the implementation, could be tracking statistics of how inputs generated at $O_1$ and $O_2$ appear together, by counting occurrences of both being positive at the same time, $O_1$ positive while $O_2$ is negative, $O_1$ negative while $O_2$ is positive, and both negative.

Because of the positioning of the cells relative to the end points (as shown on FIG. 28), memory cells 2605 2807 will have forward-looking statistics for $O_2$, given values of $O_1$. Memory cell 2403 will have statistics tracking simultaneous inputs. And memory cells 2806 2604 will have forward looking statistics for $O_1$, given values for $O_2$.

Later, if an input is received at $O_1$, at processing grid cell 2001, processing grid cell 2001 could immediately communicate the input value across a high-speed channel to memory cells 2403, 2605, and 2807, utilizing the established connection path, as follows: processing grid cell 2001 connects to connection system cell 3001 via connector 3010. A communications channel runs from connector 3010 to connector 3011, which facilitates communications to memory network cell 2403 via its aligned connection system cell 3003. The same communications channel that runs from connector 3010 to connector 3011 continues to connector 3012, which facilitates communications to memory network cell 2605, via its aligned connection system cell 3005. Similarly for communications with memory cell 2807 via connection system cell 3007 using connector 3013.

When memory cells 2403, 2605, and 2807 receive notification of an incoming signal at processing grid cell 2001, they can prepare predictions for simultaneous or future values of $O_2$. Memory cell 2403 can prepare a prediction for a simultaneous value of $O_2$, while memory cell 2605 can prepare a prediction for an upcoming value of $O_2$ to appear in two time steps, and memory cell 2807 can prepare a prediction for a value to appear four time steps into the future.

As a concrete example, say memory cell 2403 has accumulated the following statistics: when $O_1$ is positive, $O_2$ is negative 73% of the time, and positive 27% of the time a signal is present. And say it had made one thousand observations to arrive at those percentages. If memory network cell 2403 receives notification of an incoming positive signal on $O_1$, memory network cell 2403 can provide that information immediately to processing grid cell 2002, via connector 3014 and its communication channel to connecting system cell 3002 and its associated processing grid cell 2002. At that point, processing grid cell 2002 can utilize these statistics in a manner mentioned previously: as a replacement when no signal is present, or to over-ride an incoming contradictory signal, as examples. Processing grid cell 2002 can utilize these statistics in a probabilistic manner, such as over-riding a contradictory (positive) signal with a 73% expected negative signal, if a pseudo-random number is less than 0.73, for instance.

In a similar manner, memory cells 2605 and 2807 could prepare similar information, based on the statistics that they have been compiling. Say memory cell 2605 has statistics based on ten thousand observations that when $O_1$ is positive, $O_2$ is positive (looking ahead two time steps) 93% of the time, and negative 7% of the time a signal is present. This is a much stronger correlation than memory cell 2403 was able to detect, both in percentage and in number of observations.

This type of implementation may not store predictions in a dedicated buffer, then transmit to the end point (or vice versa). Rather, in this type of implementation, the predictions are transmitted away from their ultimate destination, and toward the midpoint, along the memory network, which acts as the buffer. Memory network cell 2605 uses the propagation techniques described earlier with regards to the processing grid to communicate the statistics to memory network cell 2403, for a forward-looking prediction. This communication can take two time steps, since that is when it will be needed by the end point. Accordingly, in some implementations the memory network may operate at half the speed of the processing grid and move signals from neighbor to neighbor every two time steps. In this way, predictions can travel across a large quantity of cells, and arrive at the end point at the time when the predicted input is due. Likewise, memory network cell 2605 may receive the forward-looking prediction for four steps in the future from its neighbor memory network cell 2807, which had the capability to make that prediction.

Continuing with the example, say that time passes two more steps, and processing grid cell 2001 receives another positive input. In the manner discussed previously, memory cells 2403, 2605, and 2807 may be immediately notified. Memory cell 2403 could have statistics similar to, or exactly the same as, those mentioned earlier: 73% observations of $O_2$ being negative, when $O_1$ is positive, given 1000 observations, but it also has the statistics that memory cell 2403 had provided, utilizing the memory network neighbor-to-neighbor information propagation. By combining these two values (73% negative out of 1000 and 93% positive out of 10,000), memory cell 2403 can provide a combined prediction of (270+9300)/11,000, or 87% positive with 11,000 observations. This information can be provided immediately to processing grid cell 2002, for uses as mentioned earlier. Note how the midpoint memory network cell 2403 in this case would have predicted only a 27% likelihood that $O_2$ would be positive, given no additional data, but instead was able to adjust its prediction drastically, to 87% positive, given additional prediction data from the neighbor memory network cell 2605. This is one example of how the statistics may be combined. Another variation for combining statistics would be to utilize Bayesian Inference to arrive at an updated prediction. Other variations of combining the statistics will be apparent to those skilled in the art. Accordingly, this description of how statistics are combined should be understood as being illustrative only, and should not be treated as limiting.

Variations on these implementations are also possible. For instance, the absence or presence of an input signal can be considered binary information as well and can be factored into the final use of the statistics. This could help to determine whether a substitute signal should or should not be provided, in the absence of an input signal. It could also help to determine whether an input signal should be suppressed. Variations are also possible in the way the connections are designed, and will be apparent to those skilled in the art. While FIG. 30 shows two primary connection paths, this is done for ease of explanation, but this could be done using less or more connection paths. It could be one communication channel with a message type and/or a destination address attached to each message. Or it could be implemented with a series of direct channels connecting each endpoint to each cell in the collision path. Accordingly, the above description of how the connections are formed should be understood as being illustrative only, and should not be treated as limiting.

To further illustrate how a connection path may be formed in some implementations, consider a case where a connection path is formed in a step by step manner, with transient values propagating from one cell to another and being used to generate persistent values which would define the connection path being created. An exemplary description of this type of case is provided below. Beginning with an illustration of the values that a connection system cell may contain, the description walks through how the connection system values may be updated to reflect the state of the connection path. At a high level, the process may be initiated by a memory network cell along the collision path, which may instruct its corresponding connection system cell to build a connection between the two points of origin. The connection system then may propagate transient signals in two directions using applicable cellular propagation techniques. During each time step, part of the connection path may get put in place, until finally the end-points are reached and the connection paths are fully in place.

Figure 31:
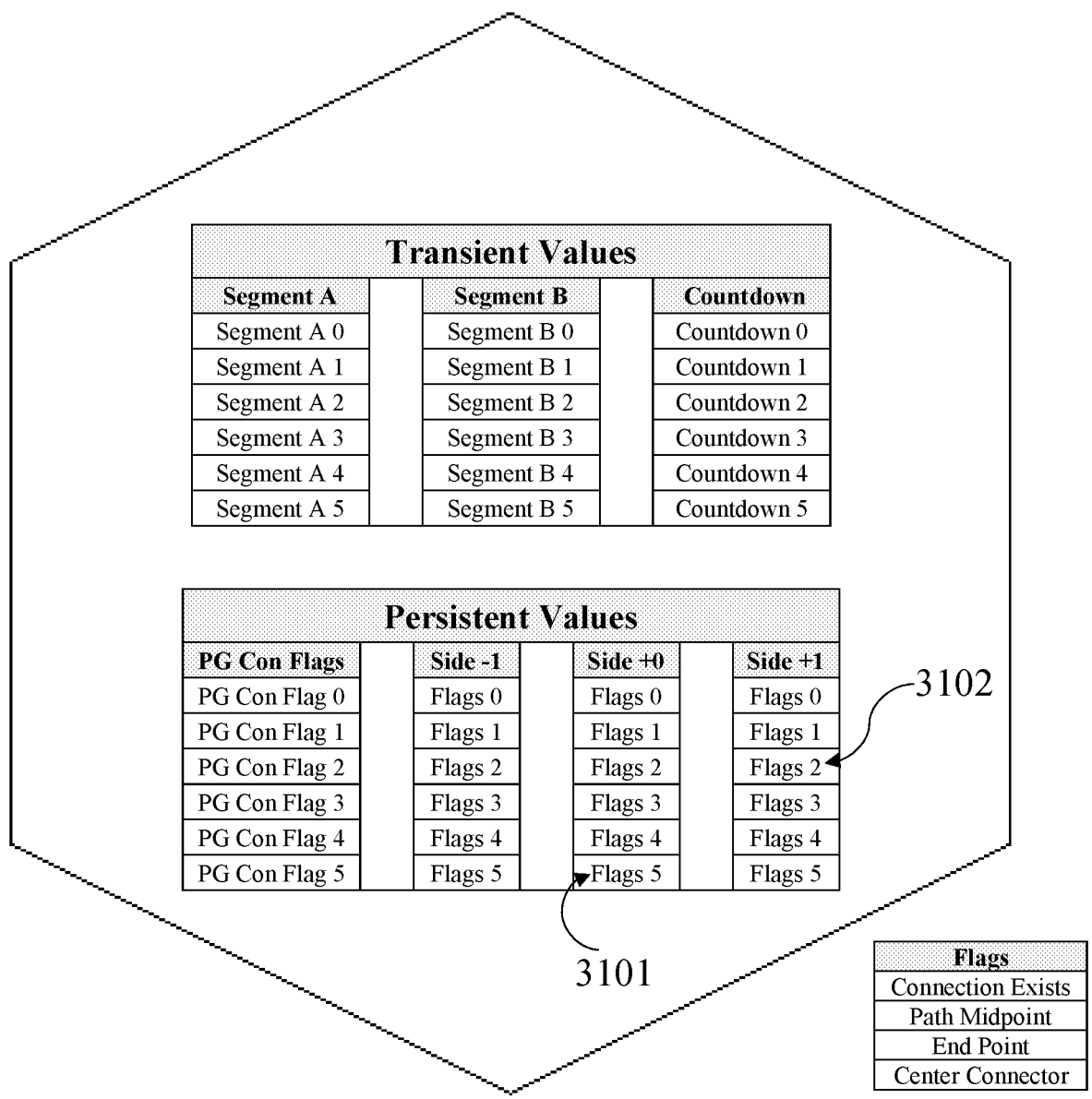
FIG. 31 depicts exemplary data structures which could be used in implementing cells of a connection system.

FIG. 31 illustrates how data might be stored in a cell of the connection system. This may be consistent with the view shown in FIG. 15, which illustrates the connections between various cells as lines; FIG. 31 illustrates these same lines as values and flags in arrays. There may be two general types of values stored in a connection system cell, transient values and persistent values. The transient values may traverse the connection system in a manner similar to the propagation of signals in the processing grid, in that values are passed to neighboring cells, sometimes with attenuation. The persistent values represent the connections which are established in the connection system.

For each of the six directions of a hexagonal connection system cell, the cell may contain transient values representing three types of information, listed in FIG. 31 as Segment A, Segment B, and Countdown. The Segment A and Segment B values may represent two segments of a path that the connection system is establishing, while the Countdown may represent a counter to the mid-point cell along this path. These signals may then be propagated from cell to cell in a communication system, such as using pseudocode as set forth below in table 6.

TABLE 6

Exemplary pseudocode for propagating signals of a connection system

```
DEFINE Sign (x):
    IF x == 0: return 0;
    ELSE: return (Absolute Value of x) / x.
DEFINE Attenuate (x):
    Return x − Sign (x).
Attenuate all six Segment A values into a Temporary array.
Copy all six Temporary values into an Outbound A array.
Copy all six Segment B values into an Outbound B array.
Attenuate all six Countdown values into an Outbound Countdown array.
FOR i in [0,1,2,3,4,5]:
    SET j to be one greater than i, mod 6.
    SET k to be one less than i, mod 6.
    IF Temporary [j] == 0 AND Outbound B [j] < 0:
        SET Outbound A[i] to the absolute value of Outbound B [j];
        SET Outbound B[j] to 0;
        SET Outbound Countdown [i] to Outbound Countdown [j];
        SET Outbound Countdown [j] to 0.
    ELSE IF Temporary [k] == 0 AND Outbound B [k] > 0:
        SET Outbound A[i] to the absolute value of Outbound B [k];
        SET Outbound B[k] to 0;
        SET Outbound Countdown [i] to Outbound Countdown [k];
        SET Outbound Countdown [k] to 0.
Once all outbound values have been calculated for all cells:
    FOR each cell:
        FOR d in [0,1,2,3,4,5]:
            IF this cell has a neighbor in direction d:
                SET neighbor in direction d's Segment A [d] to this cell's Outbound A [d];
                SET neighbor in direction d's Segment B [d] to this cell's Outbound B [d];
                SET neighbor in direction d's Countdown [d]
                    to this cell's Outbound Countdown [d].
```

In some embodiments, the values for Segment A, Segment B, and Countdown may be integers. Other values shown in FIG. 31 labeled as persistent values may be Boolean flags. For each of the six directions, a connection system cell may hold flags designating whether there is a connection to the processing grid. These are shown in FIG. 31 as PG Con Flags (an abbreviation for processing grid connection flags), of which there may be six. In addition, for each of the six directions, there may be sets of flags representing the three different potential connections across the cell, which are illustrated in FIG. 15 as dashed or continuous lines connecting various sides of the cell. The cell may contain an array of flags describing the connection directly across the cell, labeled on FIG. 31 as Side +0 flags (and shown in FIG. 15 as solid lines across the cell in various directions), and flags describing the connections offset by one in either direction, labeled on FIG. 31 as Side −1 and Side +1 (and shown in FIG. 15 as dashed lines connecting various sides of the cell). As an example, if one side is referred to as side 0, the side across from it, on a hexagon, may be side 3. And side 0 may have connections as illustrated in FIG. 15 to side 3, or side 2 or 4, represented in FIG. 31 as Side +0, Side −1, and Side +1 respectively. Side +0 refers to the cell directly across, while Side −1 and Side +1 refer to the sides directly across, with the index adjusted by one value in either direction, mod 6. The offset can also be considered to be a sub-index, locating the flags within the persistent values of a connection cell (with the index being the direction). As examples, the flags indicated by 3101 have an index of 5 and a sub-index of +0. The flags indicated by 3102 have an index of 2 and a sub-index of +1. The total count of Boolean flags in the persistent values of a connection cell may be 6 PG Con Flags, plus 3 sets of 6 groups of 4 other flags, totaling 78 flags.

Figure 54:
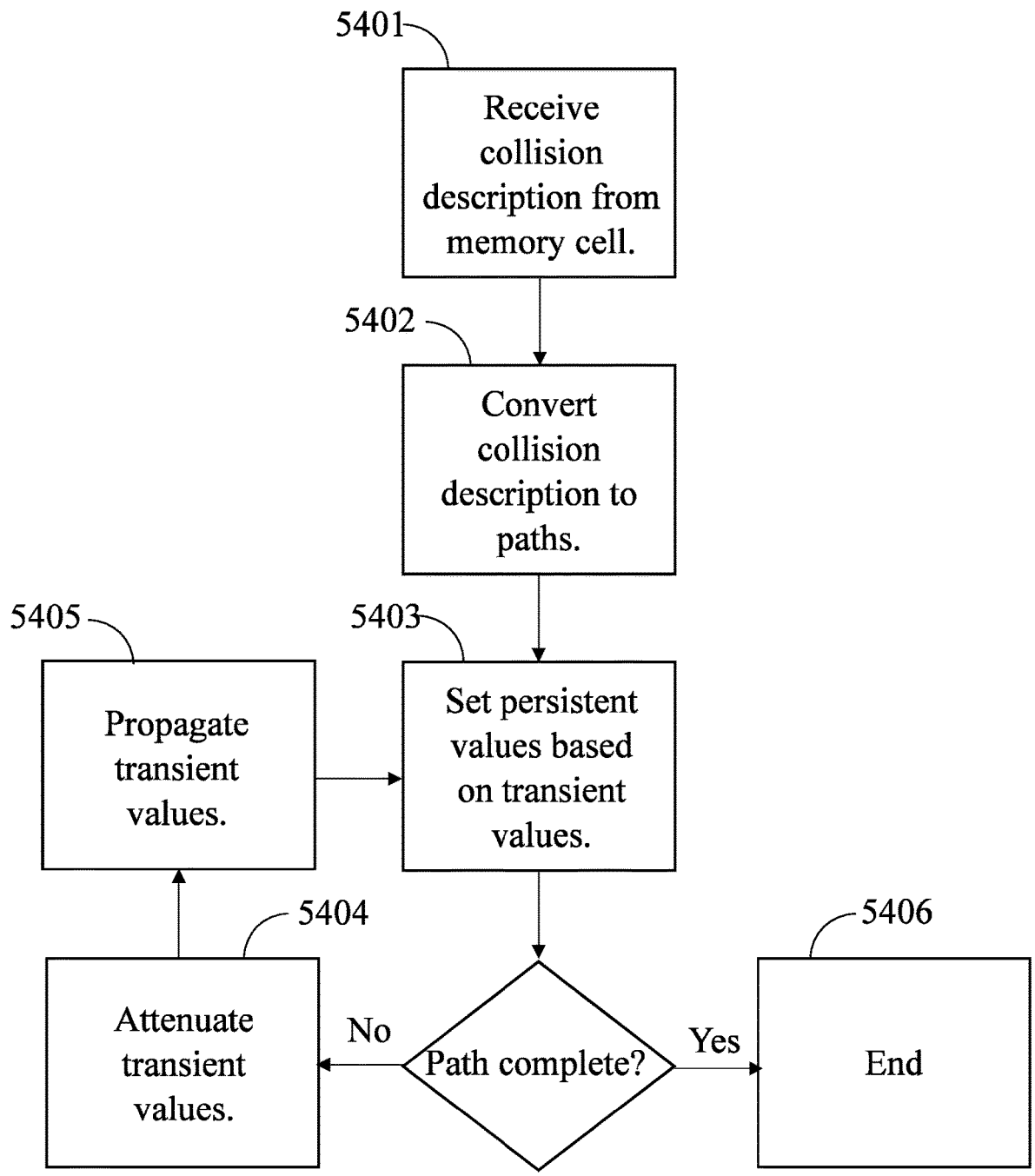
FIG. 54 depicts an illustrative process which may be used for establishing connections in a connection system.
Figure 55:
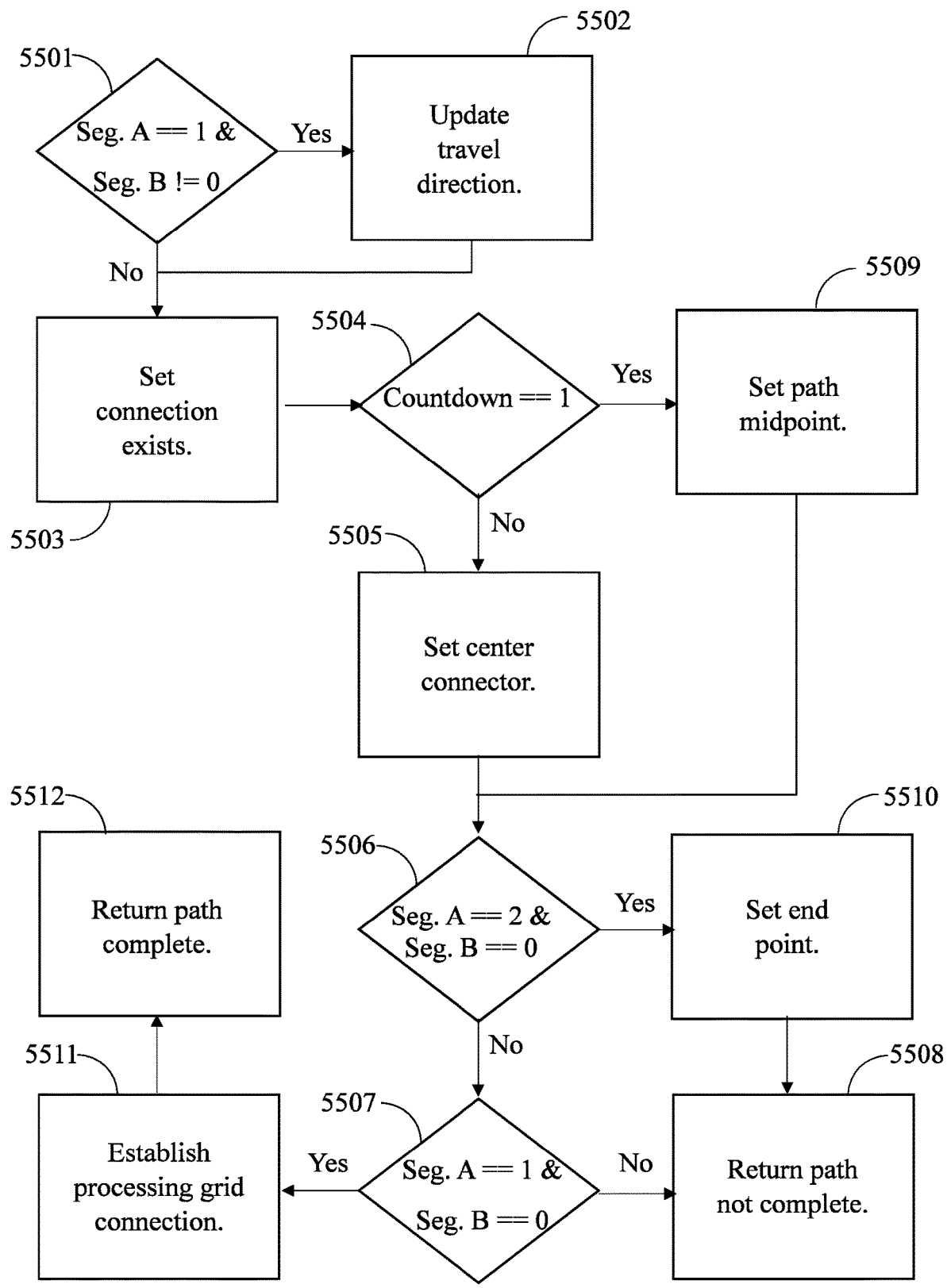
FIG. 55 depicts an exemplary process of setting persistent values based on transient values in a connection system.

The four flags that are repeated for each side and the sides that it may connect to, are listed as Connection Exists, Path Midpoint, End Point, and Center Connector. The Connection Exists flag may determine whether there is an active connection between these two sides. The Path Midpoint is a flag which may indicate whether this cell is a midpoint along a collision path which is connected between these two sides. The End Point flag may indicate whether this connection is an endpoint, thereby not passing through the cell. And the Center Connector indicates whether there is a connection from this cell to the Memory Network for distributing pulse values. This is further illustrated below in the discussion of FIG. 32 through FIG. 36, and the flowcharts on FIGS. 54-55. FIG. 54 depicts an exemplary propagation process of a connection system. FIG. 55 depicts an exemplary process of establishing (or potentially removing) connection lines and connectors, by setting flags. A typical process of setting up connections would be to propagate the signals (FIG. 54), then establish the connection paths and connectors (FIG. 55).

The above description is one example of how the transient and persistent values may be stored. One possible variation may be to store the direction of the bend in the path as a separate Boolean value, rather than storing it in the sign bit of the Segment B value. Other variations of the storage mechanism of the transient and persistent values are possible and will be apparent to those skilled in the art. Accordingly, this description of the storage mechanism of the transient and persistent values should be understood as being illustrative only, and should not be treated as limiting.

To further illustrate how cell by cell creation of a path through a connection system may take place, FIG. 54 provides a flowchart showing how values may propagate in a connection system, while FIGS. 32-36 provide step by step illustrations of a path as it is created. Turning now to FIG. 32, memory network 3201 illustrates a simplified version of the same memory network shown in FIG. 28, focusing on a subset of the same cells shown in FIG. 28. $O_1$ and $O_2$ are shown on 3201 for reference as to where the two pulses originated but may not represent any values stored in the memory network. The cells in 3201 which have labels other than $O_1$ and $O_2$ represent cells which are along the collision path and may be keeping statistics of reported collisions. In the following example, suppose memory network cell 2605 detects a potential correlation and notifies its corresponding connection system cell 3005, shown on FIG. 30. To further illustrate the interactions, FIG. 32 illustrates that the connection system may store transient values separately from its persistent values. The transient values of the connection system are illustrated on transient cell grid 3202, while the persistent values are shown in the form of the connections they represent on persistent cell grid 3203. Connection system cell 3005 from FIG. 30 is represented in FIG. 32 as being made up of the contents of both transient cell 3204 and persistent cell 3205.

As S and P values are received 5401 from memory cell 2605 at its associated connection system cell, shown as connection system cell 3005 in FIG. 30 and as the combination transient cell 3204 and persistent cell 3205 in FIG. 32, the system may convert 5402 them to two sets of transient values to reflect the two paths back to the two origin cells, along the collision path. An illustration of how the S and P values from memory cell 2605 can be converted to two sets of transient values (referred to below as segment values), and how the passing of those transient values from cell to cell in the connection system could establish high speed connections between the origin cells, is set forth below.

Initially, when converting S and P values to transient segment values, the length of the collision path may be calculated. This may be done, for example, by adding the values of all the segments in the S and P values passed from the memory network cell. To illustrate, in this case, the collision path length of 5 can be calculated from the values passed from memory network cell 2605 to its corresponding connection system cell in the following manner: the path designation "S2/2" indicates 2 cells in the collision path, while "P0/2/2" indicates 2+2 more cells in the collision path, totaling 6 cells in the collision path, but counting cell 2605 twice. Using the collision path length, the midpoint of the path can be calculated to be at the third position (that is, 6 divided in half). Using this information, a system implemented based on this disclosure may determine that the path back to the origin represented by "S2/2" will not cross the midpoint of the collision path, since two, the length of the path that is to be traversed, is less than three, the position of the midpoint cell. As this cell is positioned two units from the endpoint, a trip to that endpoint will not cross through the midpoint.

In this example, based on the above calculations, the value S2/2 could be converted 5402 to the transient values Segment A=3, Segment B=0, Countdown=0 for traversing back to origin $O_2$. The index value can be determined by taking the directional value (i.e., 2), adding 3, and applying a mod 6 operator to the result, thereby providing a value of (2+3) % 6=5. The Segment A value can be determined by taking the path length (i.e., 2), and converting it to 3 by adding 1 to account for the starting cell (i.e., the connection system cell shown in FIG. 30 as cell 3005, and in FIG. 32 as the combination of cells 3204 and 3205). The Segment B value can be determined to be 0 based on the fact that the path back to $O_2$ would follow an S signal, meaning that it did not include any bends. Finally, the Countdown value can be set at 0 because the midpoint is 3, and would not be crossed by retracing a path two steps to from memory cell 2605 to origin $O_2$. These values could then be stored at index 5 in their respective memory elements based on taking the direction of the S value (i.e., 2) adding 3 (to reach the opposite side of a hexagon), and applying a mod 6 operator to obtain index=(2+3) % 6. Thus, the values of 3, 0 and 0 can be stored at index 5 in the transient arrays of the connection system cell 3005 and passed (after attenuation) to the neighboring cell to the right, which is direction 5 throughout this example.

In a similar way, the values "P0/2/2", which is another path designation, may be converted 5402 to another set of transient values to reflect the path back to the other origin, in this case, $O_1$. In this case, the processing grid cell that corresponds to memory network cell 2605 was reached initially by a pulse propagating from $O_1$, first in the eastward direction (direction 5) by two cells, and then branching off to the slight right, turning toward the southeast (direction 0) for 2 cells, resulting in the "P0/2/2" designation for the path that was traveled. This value (i.e., P0/2/2) can then be converted 5402 to transient, Segment A, Segment B and countdown values using the following calculations. The Segment A value of three can be calculated by taking the number of cells the signal traveled before turning (i.e., the length traveled in direction 5, or 2) and adding 1 to account for the initial cell. The Segment B value of two can be determined using the number of cells the signal traveled after turning (i.e., the length traveled in direction 0, or 2). A countdown value of 2 can be calculated by subtracting the location of the midpoint (i.e. 3, which was calculated as half of all of the path lengths involved in the two paths, S2/2 and P0/2/2, so ((2)+(2+2))/2=3) from the combined Segment A and Segment B values (i.e., 3 (which is the Segment A value)+2 (which is the Segment B value)−3 (which is the location of the midpoint)=2 (the countdown value)). The index for storing this set of values can be determined by adding three to the direction of the P value (in this case, adding three to 0; the value of three is used to select the opposite side of a hexagon), and then subtracting 1 (mod 6) to reflect the original bend, to give an index value of 2). Thus, to create the path to origin $O_1$, the values of Segment A=3, Segment B=2, and countdown=2 could be stored at index 2 in the transient value arrays of connection system cell 3005, and passed (after attenuation) to the neighboring cell.

It should be noted that, in some embodiments, the procedure for reversing a P-type path, may vary slightly depending on where on the P-type path the cell lies which is requesting the connection. For instance, the example shown in the previous paragraphs begins at memory network cell 2605, which lies on the line segment past the bend, from the perspective of tracing a path from $O_1$ to $O_2$. Cells prior to the bend (such as the cell labeled in memory network grid 3201 as "S0/1 P3/1/4", which lies adjacent to $O_1$ and prior to the bend, if tracing a path from $O_1$ to $O_2$), may have a slightly different procedure (since the bend goes the other direction from that perspective). To explain further, cell 2605 and its corresponding connection cells 3204 and 3205 may connect to $O_1$ with a path which bends to the right and connects to $O_2$ with a straight path (which is similar to how the collision appeared in the first place—a bent path from $O_1$ and a straight path from $O_2$). Conversely, a cell on the other side of the bend, such as cell 3201 may connect to $O_1$ with a straight path and connect to $O_2$ with a path which bends to the left.

The persistent values grid 3203 is an illustration of certain persistent values of the connection system cell 3205 which may be set 5403 based on the transient values once the memory network has requested the connection. These persistent values represent connections being made. This is illustrated as connection lines in connection system cell 3205 but may also be represented by flags being set in Persistent Values arrays such as shown in FIG. 31. In this case, the top line shown in persistent connection system cell 3205 represents connection information stored at index value 2, in reference to its connection directly across the cell (side +0), which has the Connection Exists and Center Connector flag set. The lower line reflects the information stored at index value 5, in reference to its connection directly across the cell (side +0), which has the Connection Exists flag set. These settings may be derived entirely from the values passed to the connection system as shown above.

A process which can be used to set 5403 persistent values based on transient values is shown in FIG. 55. In some embodiments, each cell in a connection system 103 may be configured to perform this process upon receiving a set of transient values, either because they were propagated 5405 from another connection system cell, or because that cell had itself converted 5402 them from collision description information. It should be noted though, that while a process such as shown in FIG. 55 may be performed both on conversion 5402 and propagation 5405, there may be a slight variation in the performance for these two scenarios, since a cell which receives transient values through propagation 5405 will have only a single set of transient values (i.e., transient values representing one path to an origin), while a cell which receives transient values through conversion 5402 will have two sets of transient values (i.e., transient values representing paths to two different origins). Accordingly, in some embodiments, when a process such as shown in FIG. 55 is performed based on conversion 5402, that process may be performed for only one of the sets of transient values (e.g., the set representing the shorter path to the origin). By contrast, when a process such as shown in FIG. 55 is performed based on propagation 5405, it may simply be performed with the received set of transient values, since there would be no benefit to accounting for potentially redundant paths.

When a cell is performing a process such as shown in FIG. 55, a check 5501 may be performed on whether there is a bend at that cell in the path to the origin represented by the set of transient values. This may be done, for example, by checking if the Segment A value is equal to 1 (meaning it would attenuate to 0 if simply propagated to the next cell) and the Segment B value is not equal to 0 (meaning that the path should be extended after the Segment A value had reached 0). As discussed below in the context of FIG. 34, if there was a bend, then the direction in which connections are made and values are propagated based on that set of transient values may be updated 5502. Otherwise, connections could be made using the direction of travel for the set of transient values when that set of transient values was received. For instance, in an embodiment which uses index values to represent travel directions, then if the set of transient values was stored in index 2 when it was initially received, then it could be treated as still traveling from right to left (given the exemplary grids shown in FIGS. 32-36) if the direction of travel was not updated.

Continuing with the description of FIG. 55, after the direction of travel had been updated (or not, as appropriate), a connection exists flag could be set 5503 in the cell where the process was being performed. This may be done by setting a connection exists flag at the index representing the direction of travel at the time the set of transient values was received (e.g., index 2 when the transient values were being propagated from right to left, or index 5 when the transient values were being propagated from left to right). In some embodiments, the particular array in which the connection exists flag is set may be determined based on whether the travel direction was updated 5502. For example, in a cell where the travel direction was updated 5502 to bend the path to the right, the connection exists flag may be set in the side −1 array, if the travel direction was updated to bend the path to the left, the connection exists flag may be set in the side +1 array, while if the travel direction was not updated, then the connection exists flag may be set in the side +0 array. Additionally, in a scenario such as shown in FIG. 32 where multiple connections are created, setting 5503 the connection exists flag may also include setting the flag in the index that would correspond to the cross-direction—i.e., the direction of movement following the path in the opposite direction of propagation. For example, if there was no bend at the cell (e.g., as shown for cell 3205 in FIG. 32), and the transient values were being propagated from left to right (i.e., the direction corresponding to index 5), then the connection exists flag could be set at index 2 (i.e., (5+3) % 6) in the side +0 array. Alternatively, if the direction had been updated 5502 to bend to the right and the direction prior to the update corresponded to index 2 (e.g., as shown for cell 3411 in FIG. 34), then the direction which would be traveled when following the path opposite the direction of movement would be 0 (i.e., ((2+3)+1) % 6), and so the connection exists flag could be set at index 0 in the side −1 array.

Once the connection exists flag had been set 5503, the process of FIG. 55 continues with determining 5504 whether the cell performing the process was at the midpoint of the path. As shown in FIG. 55, this may be done by determining if the countdown value from the set of transient values was equal to one. Taking the example of FIG. 32, in that case, the countdown value for cell 3204 is not one for either set of transient values, and so the process of FIG. 55 would simply continue with setting 5505 a center connector. This may be done by setting the center connector flag at the same index and in the same array as described above for setting the connection exists flag for following the path opposite the direction of movement (e.g., in the case of cell 3205 at index 2 in the side +0 array). Additionally, in some cases this may involve a check as to whether a connection is being set for a path that will cross, but has not yet crossed, the midpoint (e.g., checking if countdown is >=1). In such a case, if a connection is being set for a path that crosses the midpoint, then the connection exists flag may be set in for the index in direction of movement until the midpoint is crossed, and may be set for the index opposite the direction of movement thereafter. A check 5506 may then be performed of whether the next cell on the path was an origin point. As shown in FIG. 55, in some embodiments, this may be done by checking of the Segment A value is equal to 2, and the segment B value is equal to 0. If this is not the case (and it would not be for cell 3205 in FIG. 32), a check 5507 may be performed to determine if the cell performing the process of FIG. 55 was an origin. As shown in FIG. 55, in some embodiments, this may be done by checking if the Segment A value is equal to 1, and the Segment B value is equal to 0. To continue with the discussion of FIG. 32, in that case, this check 5507 would be false for cell 3205, and so the process of FIG. 55 would terminate 5508, and the process of FIG. 54 could continue since the path represented by the set of transient values was not yet complete (i.e., had not yet reached the origin).

Returning now to the process of FIG. 54, once a cell's persistent values had been set 5403 based on a set of transient values (e.g., using a process such as illustrated in FIG. 55), if the path was not complete, then the cell which was processing those transient values could attenuate them 5404 in preparation for propagating 5405 them to the next cell on the path to the origin. This attenuation 5404 may be performed, for example, by subtracting 1 from the segment A value, and reducing the magnitude of the countdown value by 1 (assuming it was not already at 0, in which case it could remain at that value). Then if subtracting 1 from the Segment A value resulted in that value reaching 0, the Segment A and Segment B values could be swapped (an example of this is provided in the transition from the values of cell 3409 in FIG. 4 to the values of cell 3513 in FIG. 35). After the cells had been attenuated, they could then be propagated 5405 in the direction of movement for the set of transient values being processed. To illustrate, FIG. 33 shows the same transient cell grid 3202 and persistent cell grid 3203 as they may appear one time step later than FIG. 32. Memory network 3201 is omitted, as the focus of this discussion is on the interactions of the connection system. The memory network 3201 may continue to track collision statistics and may or may not remain at the same values as shown in FIG. 32, as time progresses.

The values shown in transient cell 3204 have attenuated appropriately 5404 and been propagated 5405 to transient cells 3305 3306. As described above, the Segment A and Countdown values have attenuated, reflecting the progression of one step in each of the two directions along the collision path. At this time step, the persistent grid 3203 of FIG. 33 reflects the additional connections in persistent connection system cells 3307 3308. Because transient connection cell 3305 has a Countdown value of one, the persistent connection system cell 3307 can determine 5504 that it is at the path midpoint, and can set 5509 the Midpoint flag for both directions (directions 2 and 5). The segment values may also be checked 5506 to determine if the midpoint happens to be a cell next to the origin (that is, a very short path length of 1), which is not the case here, but if it were, then End Point flags would also be set 5510.

By performing a process such as shown in FIG. 55, persistent connection system cell 3307 has Connection Exists and Path Midpoint flags set for both the index value 2 and 5, in reference to its connection directly across the cell (side +0) in both cases. Similarly, by performing that same process with its transient values, persistent connection system cell 3308 has the following flags set: Connection Exists, Center Connector, and Endpoint flags for index value 2, side +0. It only has the Connection Exists flag set for index value 5, side +0. These flag values may be calculated entirely from the data passed to the cell, as shown in transient cells 3305 3306. The Endpoint flag may be set 5510 because this cell, persistent connection system cell 3308, is near the end of the collision path, with values for Segment A and Segment B of 2 and 0 respectively, shown in its transient counterpart, transient cell 3306.

FIG. 34 illustrates the same transient cell grid 3202 and persistent cell grid 3203 as they may appear one time step later than FIG. 33. The values in transient cells 3305 and 3306 have appropriately attenuated 5404 and propagated 5405 to transient cells 3409 and 3410, respectively. Using the same logic described previously in the context of FIG. 55, the connectors to the memory network (indicated by the black dot in persistent cell 3411) will be set on left line 5505 from the perspective of the traveling signals which in this case are propagating from right to left (that is, from transient cell 3305 to transient cell 3409), and is shown in persistent cell 3411 as a connector dot—a connector to the memory network of that cell—on the lower connector line of persistent cell 3411. This is consistent with the procedure that caused the connector dot to appear on the upper line in persistent cell 3308 (in FIG. 33), as those signals were traveling left to right, and so the left line was the upper line.

And with the Segment A value of transient cell 3409 equaling 1 and attenuating to 0 coupled with a non-zero value in Segment B, the persistent cell 3411 determines 5501 that the path to the origin bends here and the bend is to the right since Segment B is a positive value. To facilitate this bend to the right, the index values are adjusted by one 5502, to propagate the signals at the oblique angle. Persistent cell 3411 has the Connection Exists and Center Connector flags set 5503 5505 for index value 0, side −1. This is pictorially represented in persistent cell 3411 by the lower line connecting the top left edge (edge 0) to the right edge (that is, directly across from edge 0, minus one side index value, which means the side that is one side counterclockwise from the lower right side which is directly across from edge 0, meaning the right side of persistent cell 3411). This lower line has a connector to the memory network represented by the black dot on the line. Persistent cell 3411 also has values set which represent the upper line. At index value 2, side +1, the Connection Exists flag is set 5503, representing that the right side of persistent cell 3411 (side 2) is connected at an angle directly across plus 1 (that is, side 0, computed as 2+3+1, mod 6).

At persistent cell 3412, one of the origins has been reached, as represented by the values in transient cell 3410; Segment A with a value of 1 represents the end of the segment, and Segment B with a value of 0 represents that there isn't another segment connected by a bend. In this case, a Processing Grid Connector is established 5511, which is represented by the white dot in persistent cell 3412 and stored at index 5 of the Processing Grid Connection Flags of FIG. 31, for persistent cell 3412 of FIG. 34. Then, once the processing grid connection is established 5511, the cell in which it was established (i.e., cell 3412 in FIG. 34) could terminate 5512, which, because that cell was at the end of a path to an origin, could also terminate 5406 the process of FIG. 54 for that set of transient values.

While the processing of one set of transient values may complete at cell 3412 in FIG. 34, the processing for the other set may continue, as the termination condition had not been reached for both sets of transient values. To illustrate the continued processing of the other set of values, the bend at transient cell 3409 determines that the attenuated values will be propagated via index 3 to the cell at direction 3, which is the northwestward direction, in the next time step. The values in transient cell 3410 will attenuate to all zeros at the next time step, and therefore will no longer propagate in any significant manner. That is to say that an implementation may stop propagation of those signals once they reach zero, or may propagate zero value signals, with equivalent results, and the choice may be made based on ease or cost of implementation. For example, in a software implementation, it may be easier to copy entire arrays, rather than adding logic to only copy if non-zero.

Figure 35:
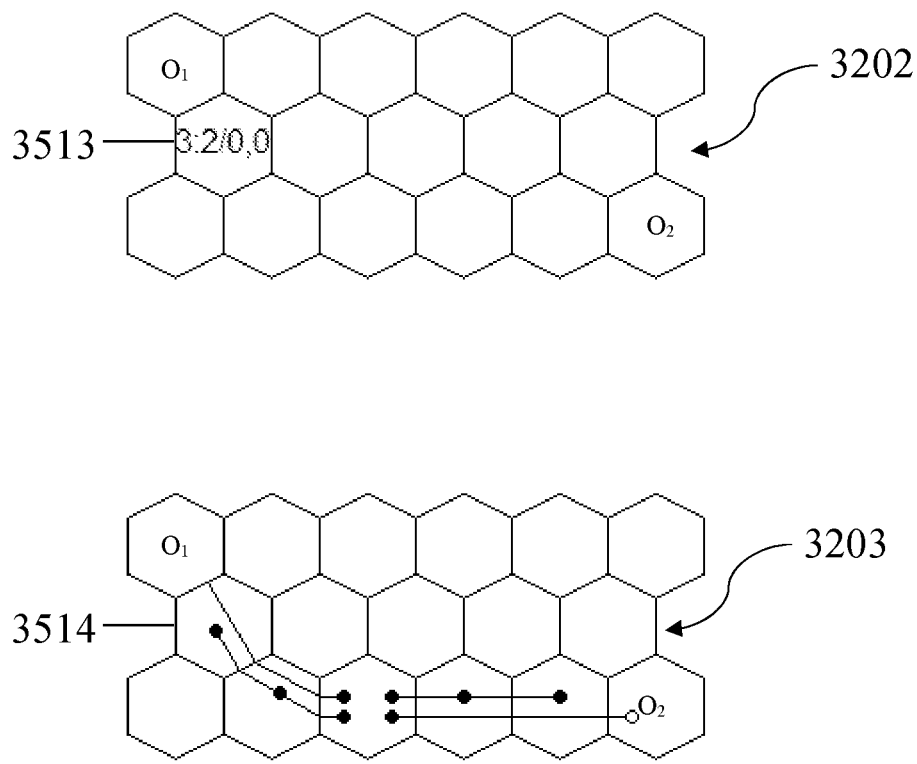
FIG. 35 shows how the transient part of a connection system and a persistent part of a connection system grid might appear one time step after FIG. 34.

FIG. 35 illustrates the same transient cell grid 3202 and persistent cell grid 3203 as they may appear one time step later than FIG. 34. The properly attenuated values appear in transient cell 3513, at index 3. The flags for the persistent cell 3514 are determined in a manner similar to the manner described above for persistent cell 3308, which is also a cell next to an origin cell.

Figure 36:
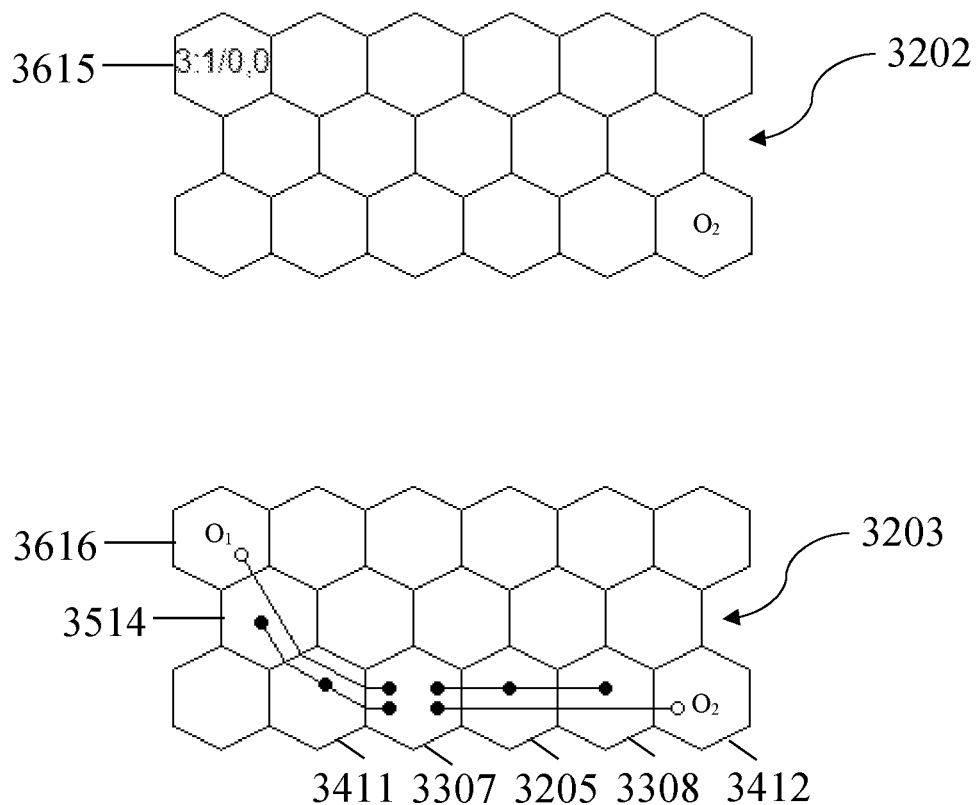
FIG. 36 shows how the transient part of a connection system and a persistent part of a connection system grid might appear one time step after FIG. 35.

Finally, FIG. 36 illustrates the same transient cell grid 3202 and persistent cell grid 3203 as they may appear one time step later than FIG. 35 and completes the connection path. The values in transient cell 3615 may be used to calculate the connections shown in persistent cell 3616 in a manner similar to the method used to calculate persistent cell 3412.

Once the connection path is established between origins, signals may flow directly and rapidly to the various cells as needed. In a software implementation, the flags in the persistent values portion of the connection system cell shown in FIG. 31 can facilitate both forward and backward traversal of the established path. In a hardware implementation, the flags and connectors may be implemented using transistors, enabling or disabling the flow of electrons across the length of the connection path. Variations of the implementation are possible and will be apparent to those skilled in the art. Accordingly, this description of the implementation including the attenuation and propagation methods presented herein should be understood as being illustrative only, and should not be treated as limiting.

Regardless of which cell along the collision path initiates the connection, the final configuration of the connections between the two origins may appear as shown in FIG. 36, persistent connection system grid 3203. Table 7 provides a summary of the flags that are set for each of the cells along the collision path. To further clarify table 7 and its relationship to FIG. 31, two of the rows in table 7 are examples containing references (in the last column) to the location of the flags within the connection cell's persistent values. The second entry in table 7 shows an index of 5 and a sub-index of +0, and would be stored in the flags shown at 3101 of cell 3205. The eighth entry shows an index of 2 and a sub-index of +1 and would be stored in the flags indicated by 3102 of cell 3411. Likewise, each row of table 7 that does not have a reference corresponds to some unmarked location of flags on FIG. 31. This combination of flag settings shown in table 7 represents the final disposition of the paths shown in the persistent connection system grid 3203, that is, the lower grid of cells, of FIG. 36, once the connections have been established along the collision path.

TABLE 7

Exemplary connection system persistent values

| Cell | Index representing direction | Sub-index representing cross-side | PG Con | Connection Exists | Path Midpoint | End Point | Center Connector | FIG. 31 Reference |
|---|---|---|---|---|---|---|---|---|
| 3205 | 2 | +0 | | Set | | | Set | |
| 3205 | 5 | +0 | | Set | | | | 3101 |
| 3307 | 2 | +0 | | Set | Set | | | |
| 3307 | 5 | +0 | | Set | Set | | | |
| 3308 | 2 | +0 | | Set | | Set | Set | |
| 3308 | 5 | +0 | | Set | | | | |
| 3411 | 0 | −1 | | Set | | | Set | |
| 3411 | 2 | +1 | | Set | | | | 3102 |
| 3412 | 5 | n/a | Set | | | | | |

TABLE 7-continued

Exemplary connection system persistent values

| Cell | Index representing direction | Sub-index representing cross-side | PG Con | Connection Exists | Path Midpoint | End Point | Center Connector | FIG. 31 Reference |
|---|---|---|---|---|---|---|---|---|
| 3514 | 0 | +0 |  | Set |  | Set | Set |  |
| 3514 | 3 | +0 |  | Set |  |  |  |  |
| 3616 | 3 | n/a | Set |  |  |  |  |  |

Table 8 provides an exemplary set of rules for determining the settings for the flags, based on information provided in the Segment A, Segment B, and Countdown arrays. It is this logic that was used to generate table 7, when walking through the previous example.

TABLE 8

Exemplary pseudocode depicting rules for a connection cell setting its connection flags

```
# Create a list of which directions have non-zero values for Segment A
SET the default value for the Nonzero list to an empty list.
FOR d in [0,1,2,3,4,5]:
  IF Segment A [d] != 0:
    APPEND [d, Segment A [d], Segment B [d], Countdown [d] ] to Nonzero list.
IF LEN(Nonzero) > 0:
  # In this situation, there is at least one non-zero entry.
  SET nz to be the first entry, Nonzero [0].
  SET direction to be nz [0].
  SET elbow to 0.
  SET direction_turn = +1 defaulting to right turns on the path back
  IF LEN(Nonzero) >1:
    # In this situation, there are at least two non-zero entries.
    # We examine the two entries, and deal with one of them, with a straight line, or
    # possibly a bend, to the other.
    SET other_direction to Nonzero [1][0], the stored direction of the second non-zero entry.
    IF (other_direction - direction) % 6 != 3:
      # In this situation, we may be at an SxSy collision like S0S2, or at an SxPy collision,
      # like S0P3, which may have previously been converted to directions 3 and 5.
      IF direction == 3:
        direction_turn = -1, since the current turn, if any, would be a left turn.
      IF nz [3] > 1:
        # In this situation, we are looking at a path that would cross the midpoint.
        # In this case, we'll deal with the path that does not cross the midpoint.
        SET nz to Nonzero [1]
        SET direction to nz [0]
        SET direction_turn to -direction_turn
      IF Nonzero [0] [2] == 0 and Nonzero [1] [2] == 0:
        # In this situation, we are at an SxSy type offset collision, so we treat it like a
        # SxPy type collision, where we are at the bend.
        SET elbow to -direction_turn
        SET direction to (direction - elbow) % 6
    ELSE:
      # In this situation, there we do not need to concern ourselves with an elbow. May be
      # a collision like S0S3 (no turns), or S2P0 (which comes in as directions 2 and 5), and
      # has a future turn, but not at this cell.
      IF nz[3] > 1:
        # As above, deal with the path that does not cross the midpoint.
        SET nz to Nonzero [1]
        SET direction to other_direction.
  SET seg1 to nz[1].
  SET seg2 to nz[2].
  SET countdown to nz[3].
  IF seg2 <0:
    SET direction_turn to -1.
  # Here we determine the connector lines
  IF seg1 == 1 AND seg2 != 0:
    SET elbow to direction_turn
  IF seg1 == 1 AND seg2 == 0;
    # This is an end node
    SET PG Connector flag, for index value of direction.
  ELSE:
    # This is either a straight path or an elbow.
    SET Connection Exists flag for index value of direction, sub-index of +elbow.
    SET Connection Exists flag for index value of (direction + 3 + elbow) % 6,
      Sub-index of -elbow.
```

TABLE 8-continued

Exemplary pseudocode depicting rules for a connection cell setting its connection flags

```
    IF seg1 == 2 AND seg2 == 0:
        # This indicates second from the end.
        SET Endpoint flag for index value of (direction + 3 + elbow) % 6,
            Sub-index of -elbow.
# Here we determine the connector dots
IF countdown == 1:
    # This is a midpoint
    SET Midpoint flag for index value of direction, sub-index of +elbow.
    SET Midpoint flag for index value of (direction + 3 + elbow) % 6,
        Sub-index of -elbow.
    IF seg1 == 2 AND seg2 == 0:
        # This cell is second from the end of the path
        SET Endpoint flag for index value of direction, sub-index of +elbow.
        SET Endpoint flag for index value of (direction + 3 + elbow) % 6,
            Sub-index of -elbow.
ELSE IF countdown > 1:
    # This is a path heading toward the midpoint
    SET Center Connector flag for index value of direction, sub-index of +elbow.
ELSE:
    # This is a path heading away from the midpoint
    SET Center Connector flag for index value (direction + 3 + elbow) % 6,
        Sub-index of -elbow.
```

Traversal of the connected paths shown in FIG. 36 may be conducted in a forward or reverse direction. The terms forward and reverse in this context refer to a direction when walking through the values of table 7. As the connection path was created using the procedure described above, paths were established which extend from each origin point to cells along the collision path. The paths as described above are optimized for the forward direction—that is, the direction from a cell along the collision path to one of the origins. The reverse direction may be slightly more difficult to compute the traversal—that is, the direction from an origin toward any other cell on the collision path. Note that the path pointers could be implemented in the opposite order, such that the opposite walkthrough is easier, or it could be created as a doubly linked list, which provides easier traversal in both directions. Variations such as these will be apparent to those skilled in the art. Accordingly, this description of how the list is stored should be understood as being illustrative only, and should not be treated as limiting.

As implemented above, the reverse direction may be utilized when an input signal arrives on the processing grid. Prior to the signal traversing the processing grid by way of the previously described processing grid propagation steps, the signal may traverse the connection system in the reverse direction for a high-speed (near instant) transmission from the pulse origin cell to distant cells. The forward direction may be utilized when a prediction is being sent from the midpoint cell back to an origin cell.

Reverse traversal can be achieved utilizing the flags and settings shown in table 7. As an example, if an input arrives on the processing grid at the location labeled $O_1$, the processing grid cell associated with $O_1$ and corresponding to persistent cell 3616 may initiate the alert across the connection shown in FIG. 36. Referring to table 7, the entry for cell 3616 shows a processing grid connector (PG Con flag set), with an index of 3. Reversing the direction (that is, adding 3, mod 6, arriving at a direction of 0, or southeast) may identify which cell the alert is to be sent. Cell 3514 is the cell that is southeast of cell 3616, as FIG. 36 illustrates. If implemented in hardware, determining the cell in a particular direction is a matter of physical placement. If implemented in software, each cell may have a list identifying its neighboring cells for each direction.

The entries in table 7 for cell 3514 may help to guide the reverse (i.e. in the direction from an origin to a cell along the collision path) traversal. The entry which matches the direction of the reverse traversal has the index of 3 and a sub-index of +0. This is shown pictorially as the straight line (without the dot connector) in persistent cell 3514 of FIG. 36. Note that in a reverse traversal, the movement is in the opposite direction of the associated index; in this example, movement was to cell 3514, which was in direction 0, but the index value used is 3. Since the sub-index is +0, the path continues straight through to the cell to the southeast, which is cell 3411.

Neither of the entries for table 7 for cell 3411 match the reverse direction of 3. However, by summing the index and sub-index, the entry for index of 2, sub-index of +1 sums to 3 (mod 6), so this provides the continuation path for the reverse traversal and corresponds pictorially to the upper line in persistent cell 3411 of FIG. 36. The sub-index of +1 may be indicative of a right-turn bend in the path from the perspective of travel from the midpoint of the collision path (cell 3307) to the origin (cell 3616). Since this example is performing a reverse traversal, the next step is to turn left, or subtract 1 from the direction, mod 6. When the prior direction of 0, meaning southeast, is reduced by 1 (mod 6), a new direction of 5 may be the result, completing the left turn, shown in cell 3411 of FIG. 36. The next step in the reverse traversal may be to look at the cell to the east (direction 5) of cell 3411, which is cell 3307, for entries with an index and sub-index that sum to 2.

Table 7 contains an entry for cell 3307 with an index of 2, sub-index of +0, which may be the entry that guides the next step in the reverse traversal. With the path midpoint flag set, this may cause the high-speed alert to be transmitted to the memory network, via the connector illustrated as the upper left connector dot in cell 3307 of FIG. 36. Cell 3307 may also continue with the reverse traversal, by sending the signal to its neighboring cell, via the connector illustrated as the upper right connector dot in cell 3307 of FIG. 36, bridging the gap between these two connectors. The memory network may then process this alert by updating its prediction for $O_2$, which may result in a second, different signal being sent toward $O_2$ (cell 3412 of FIG. 36) via the lower right connector dot in cell 3307 of FIG. 36. This signal will perform a forward traversal to $O_2$, which is described shortly.

Continuing with the reverse traversal, cell 3307's sub-index of +0 in this case indicates that the next neighbor to pass the signal to is again in the direction of 5 (that is, east), based on cell 3307's index of 2. The cell which is to the east of cell 3307 is cell 3205. The appropriate entry in table 7 to continue the path will have an index and sub-index that sum to 2 (that is, 5+3, mod 6), which is the opposite direction of direction 5. The entries in table 7 for cell 3205 with an index and sub-index that sum to 2 is the index=2, sub-index +0 entry, which also has its center connection flag set, and is illustrated in FIG. 36 as the top line, with a connector dot, in cell 3205.

Cell 3205 may send the alert to the memory network via the connector, which will cause an update to a future prediction for an input to $O_2$. Since it is a future prediction, and not a current prediction as the midpoint cell 3307 has, this future prediction may traverse the memory network via the memory network propagation steps, which are described later. Cell 3205 may also facilitate the continued rapid reverse traversal along the connection system. The cell which is to the east (direction 5) of cell 3205 is cell 3308. Again, table 7 can be utilized, using the entry for cell 3308 which has an index and sub-index that sum to 2. This entry has index=2, sub-index +0, and it shows a center connector and an endpoint, which is illustrated as the top line in cell 3308 of FIG. 36, with the center connector dot to the memory network.

Cell 3308 may also send the alert to the memory network via its connector, which will also cause an update to a future prediction for an input to $O_2$. Because of the relative positioning of cell 3308 as compared to the pulse's origin, its corresponding memory network cell may be tracking collisions with a different time offset between pulses, and therefore this prediction may be for a time step that is even further into the future than the prediction that cell 3205 generated in its corresponding memory network cell. Its prediction, like cell 3205's prediction, may also traverse the memory network via the memory network propagation steps. Both this prediction and the prediction caused by cell 3205 described in the previous paragraph may travel through the memory network toward the midpoint memory cell corresponding to connection system persistent cell 3307, traveling one cell per two time steps, in a manner such that the prediction caused by cell 3205 will arrive first at the memory network cell corresponding to midpoint cell 3307, and then possibly be modified based on the statistics of that memory cell, and then be sent as a prediction via a forward traversal to $O_2$, utilizing the direct connection between the midpoint cell 3307 and the origin $O_2$, cell 3412, illustrated as the lower line connecting cell 3307 and cell 3412 on FIG. 36.

In other words, the prediction which was described several paragraphs previously that cell 3307's corresponding memory cell made may have been a modification of a prediction provided at an earlier time by the memory cell corresponding to cell 3205, which propagated to memory cell corresponding to cell 3307 in an earlier time step. The input pulse at $O_1$ may generate alerts to cells 3307 3205 and 3308, which may generate predictions for $O_2$. The prediction made at midpoint cell 3307 immediately traverses in a forward traversal through the connection system, while the other two predictions stay in the memory network, advancing toward the midpoint cell 3307, effectively in a single file queue. When each forward prediction reaches the midpoint cell 3307, cell 3307 may move it to the connection system for rapid forward traversal to $O_2$, potentially adjusting the prediction in the process. The queueing in the memory network paces the predictions such that they may reach the midpoint during the time step that the prediction applies, at which time they may be adjusted and sent rapidly to the endpoint origin for which the prediction applies.

Like reverse traversal, forward traversal may also be accomplished utilizing the flags stored in the cells and shown in table 7. When the memory network cell corresponding to cell 3307 has a prediction for $O_2$, it may utilize the connector illustrated as the lower right connector of cell 3307 of FIG. 36. The entry in table 7 which describes the lower line of cell 3307 has an index of 2, which is indicative of traveling east (direction 5). The cell to the east of midpoint cell 3307 is cell 3205. Since this is a forward traversal, the appropriate entry in table 7 for the next step in the traversal is cell 3205 with an index of 5, regardless of the sub-index. Forward traversals may not need to consider the sub-index of the neighboring cell but may use the sub-index of their own cell when determining which neighbor to pass to.

Cell 3205's entry in table 7, with an index of 5 shows no center connector, and is illustrated on FIG. 36 as the lower line of cell 3205. Since its sub-index is +0, the neighboring cell to the east (direction 5) may be determined to be next, which, in this example is cell 3308. Cell 3308's entry in table 7, with an index of 5 (regardless of sub-index) may utilized and is illustrated in FIG. 36 as the lower line in cell 3308. Since its sub-index is +0, the neighboring cell to the east (direction 5) may be determined, and in this example is cell 3412, which is the origin cell $O_2$. The table 7 entry for cell 3412, index 5, shows a processing grid connection flag set (PG Con Flag). The prediction signal would then travel to the processing grid.

Exemplary traversal rules may be summarized as shown in table 9. These rules facilitate reverse traversals which could branch, spreading alerts in additional directions not demonstrated in the previous example, since the reverse lookup may potentially find up to three instances in a neighbor cell's values that have index+sub-index equal to the present cell's index.

TABLE 9

| Exemplary connection system traversal rules |
| --- |
| Forward Traversal: |
| Set the direction of traversal equal to the index plus the sub-index, mod 6. Look to the neighbor in that direction, with the index value of the direction. Pass alert using that index value. |
| Reverse Traversal: |
| Look to the neighbor in the direction of the opposite side of the present cell's index: index + 3, mod 6. Look for that neighbor's index + sub-index, mod 6 equal to the present cell's index. Pass alert using the neighbor cell's index. |

Some implementations may have a plurality of connection systems implemented in the same Artificial Intelligence system. An implementation utilizing multiple connection systems may allow more overlapping or crossing connection pathways without interference among them. Accordingly, this description of the implementation using a single connection system should be understood as being illustrative only, and should not be treated as limiting.

The preceding discussion regarding the set up of connections shown in FIG. 32 through FIG. 36 may apply directly to the teardown of existing connections. A connection may be established because a correlation was suspected. Later, after additional inputs and additional collisions, the statistics may show that the earlier correlation was spurious. In this situation, a memory cell may instruct its corresponding connection cell to tear down the connection that was previously built. This step-by-step process that was detailed in above discussion can be applied, with instructions to "unset" the appropriate flags, removing the connection.

Turning now to the memory network, the functions of the memory network may be to (A) store collision information and statistics, (B) evaluate the statistics identifying correlations, (C) request connections between cells so that pulses can travel quicker, (D) calculate and relay predictions, and (E) establish multi-bit cells. The preceding discussion concerning FIG. 20 through FIG. 36 walked through an example of functions (A), (B), and (C). This discussion will continue the examples shown above, by describing what may happen once the connection system has established connections as shown in FIG. 36.

Figure 37:
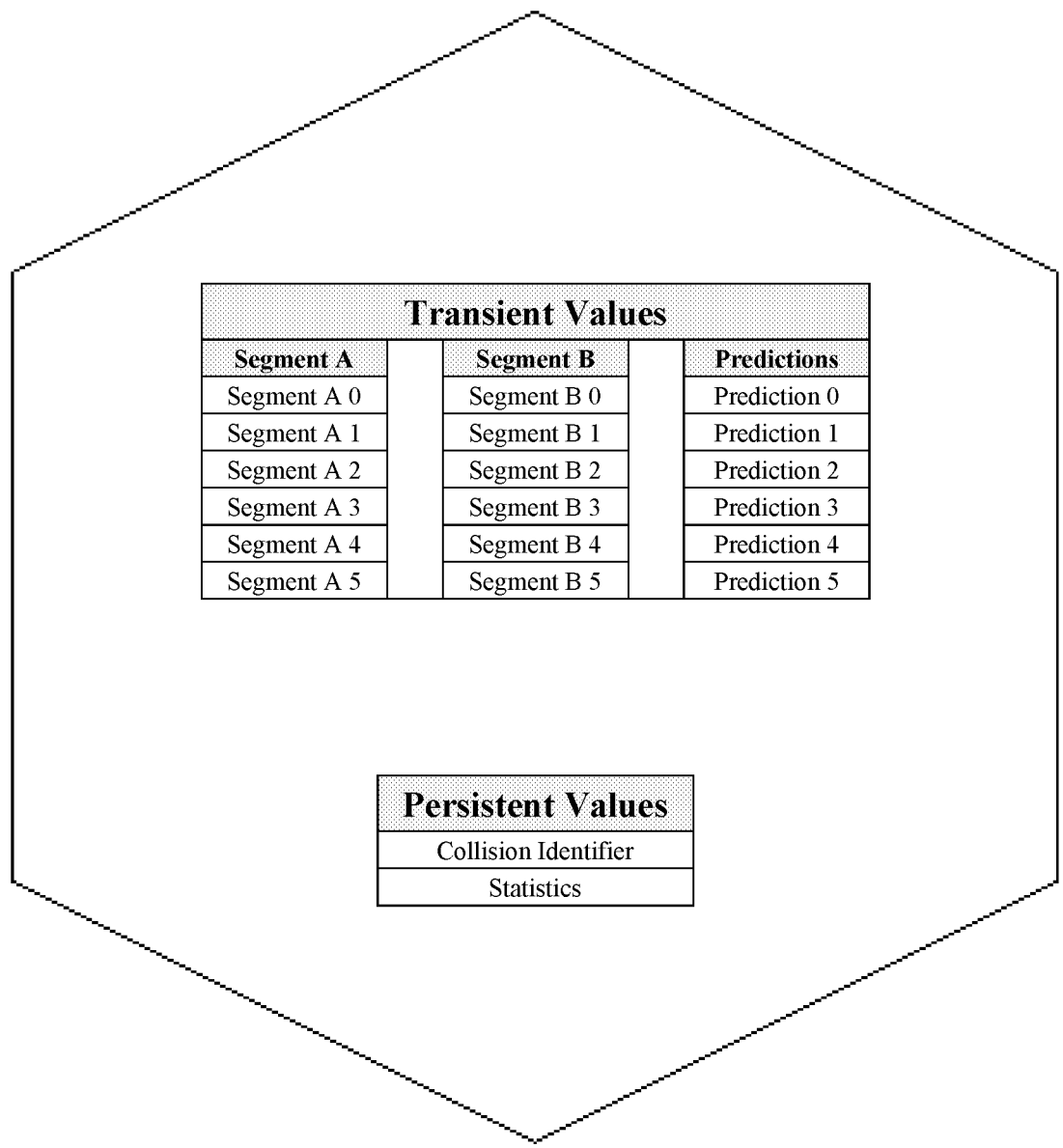
FIG. 37 depicts exemplary data structures which could be used in implementing cells of a memory network.

FIG. 37 illustrates an example of the information that a memory network cell may hold. Like the connection system cells, a memory network cell may hold both transient values and persistent values. The persistent values may include information about the collision that is being tracked by this memory network cell (labelled "Collision Identifier" on FIG. 37), as well as the statistics tracking the observed results of the collisions.

The collision identifier may uniquely identify the location of the pulse origination points, relative to this memory network cell. This may be in a variety of formats. For example, the collision information may be stored as is shown in FIG. 32 for memory network cell 2605, which stores the collision information in a format such as "S2/2 P0/2/2". Another variation may be to store intensities of the S, P, and Y values at the time of the collision. Another variation may be to store the information in a form of Segment A, Segment B and countdown values that could be used to trace paths to the origin points of colliding signals. Other variations exist, and will be apparent to those skilled in the art.

The statistics may be stored in a variety of formats as well. An implementation may store the statistics as a group of four integer values representing counters of the observed data. Each collision may involve a pair of pulses, and the statistics may track counts of the various possibilities of the signs of those pulses—either both are positive, the first is positive while the second is negative, the first is negative, while the second is positive, or both are negative (where the terms "first" and "second" may be designations which are arbitrarily but consistently assigned to the two pulse origins, and may not necessarily refer to when the pulse was emitted, since the pulses may be simultaneous). Utilizing four counters, a complete probability table may be inferred, which may be mathematically examined for correlations. Statistics may also be held in approximating devices, called estimators, which are discussed in detail later.

In some implementations a plurality of persistent values may be present, as each memory cell may track a plurality of collisions. Each collision to be tracked may require information identifying the collision as well as the statistics pertaining to that collision.

FIG. 37 also shows transient values, and an array of six values, labeled Prediction 0 through Prediction 5. These may represent signals which may traverse the memory network, propagating across the grid in a manner similar to the propagation methods which have been described for both the processing grid and the connection system, with some variations. The prediction values are used to pass predictions in the memory network. Accordingly, they may be values whose sign represents the prediction, and whose intensity represents a certainty level of that prediction. Or each individual Prediction value may be an object containing a collection of values, such as a Boolean value representing the sign of the prediction, a second value representing a probability of that prediction, and a third value representing the number of observations that this prediction is based on, or other measurements of confidence, such as a confidence interval. As a concrete example, one of the prediction values, say Prediction 4, may contain a prediction that a pulse in the northeast direction (direction 4) will be of the positive polarity, with a 70% likelihood, based on 10,000 past observations. The values passed in Prediction 4 in this example may be [True, 70, 10,000]. Or [+1, 70, 10,000]. In other implementations, the sign of the prediction may be inferred. For example, if the implementation specifies that negative is the implied sign, then equivalent values in Prediction 4 to the preceding example may be [30, 10,000], since 70% positive implies 30% negative. Other variations are possible, and will be apparent to those skilled in the art.

Prediction values may not attenuate as they traverse the memory network. Rather, each memory cell may adjust the prediction passed to them by a neighbor cell based on statistics held in that memory cell and pass along an updated prediction to the neighboring cell along the same trajectory, or the trajectory specified in the routing arrays, Segment A and Segment B (and, potentially, a Countdown array, not shown in FIG. 37).

The Segment A and Segment B values of the memory network cell, shown in FIG. 37, function in a similar manner as those similarly named values in the connection system cell, shown in FIG. 31. These values may be used to route the prediction to a specific destination cell. The ultimate destination location may be the origin cell of the prediction. However, in some implementations, the midpoint cell may be utilized as part of a buffering strategy, and so the values in Segment A and Segment B of the memory network cell may reflect that the midpoint is the destination cell.

To summarize, predictions may be initiated at the time step of a pulse appearing at an origin point, and, prior to that pulse propagating across the processing grid, the pulse may trigger an alert in the connection system, which may notify a plurality of cells along the collision path, including the midpoint cell and those cells further from the pulse origination point than the midpoint. When the alert travels across the connection system, it may route to a plurality of cells in the memory network, which may trigger memory cells to make predictions which may be based on several factors, including, but not limited to, the following: (A) the statistics of previous collisions that were reported to the cell in the memory network by its corresponding processing grid cell, (B) any prediction that was previously provided to the memory cell by a neighboring cell using memory network propagation techniques, and (C) the value contained in the alert.

Any prediction made by the midpoint cell may be immediately routed via the connection system to the other origin cell, where it may be utilized in a variety of ways, including replacing a missing signal or over-riding a contradictory signal. Predictions that are made by cells which are not the midpoint cell may get routed to the midpoint cell along the memory network (which may mean that these predictions initially travel away from their target), utilizing the propagation techniques of the memory network, and potentially adjusted by each cell along the way, until the time step when the adjusted prediction reaches the midpoint, at which time it may be adjusted by the midpoint cell, and routed to the target origin as mentioned above. Predictions propagating away from their ultimate destination origin, and toward the midpoint, may facilitate multiple cells adjusting the predictions as they propagate, and may delay the predictions, acting as a buffer, until the time step arrives for which the prediction pertains. This may facilitate predictions that have been adjusted by a plurality of cells arriving at the midpoint via the memory network propagation, and then being transmitted at a high speed across the connection system to an origin point at the time step directly applicable to that prediction.

Turning now to FIG. 38, this figure depicts the same exemplary connection system grid 3203 which appeared in FIG. 35 and continues with that same example. Recall that both origins were pulsing every other time step. At the time step shown in FIG. 35, and repeated in FIG. 38, the connections between the two origins are nearly, but not quite completely, in place, as the final processing grid connector at connection system cell 3616 hasn't yet been placed. At this time step, both origins receive an input pulse in this example.

$O_2$ has a connection to the processing grid, depicted as the white circle in connection cell 3412. At this time, an alert may be sent across the connection system from connection cell 3412, to connection cells 3411 3514, via midpoint connection cell 3307. This alert may reach the memory network via the connector dots shown in cells 3411 3514. The corresponding memory network cells 3811 3814, shown on transient memory grid 3801, receive this alert, and may utilize this information (that is, the state of the input pulse, whether positive or negative), to create or update a future prediction for origin cell $O_1$. Additionally, in some embodiments the memory network cell 3807 corresponding to the cell 3307 at the midpoint of the path between $O_1$ and $O_2$ may also create a prediction, and this prediction may be combined with predictions Q201 and Q101 in the same manner described below for combining Q201 and Q101 themselves. However, for the sake of simplicity, this example focuses on a case where only predictions Q101 and Q201 are combined, rather than also combining a prediction from the midpoint memory network cell 3807.

The transient values contained in memory cells 3811 3814 correspond to those values listed in FIG. 37 and are shown in transient memory network grid 3801. For example, memory network cell 3814 is shown to contain "0: 2/-1 Q101" on FIG. 38, which is meant to depict that in the array items indexed with a 0, the Segment A value is 2, the Segment B value is -1, and the prediction field is represented as Q101 for purposes of this illustration, so that it can be tracked in this example. In an implementation, the prediction field may contain a prediction value for an upcoming pulse at origin $O_1$, which may be a binary value representing a positive or a negative prediction. The prediction field may also contain information regarding the confidence level of the prediction, such as a percentage and/or an expression of the number of observations that this prediction is made from. Likewise, memory cell 3811 is able to make a prediction, which is labeled as Q201. The other information in cells 3814 3811 is routing information, which will guide these predictions to the midpoint cell 3807.

FIG. 39 shows what may happen one time step (e.g., after one further clock tick on the processing grid) later. The upper diagram, connection system persistent grid 3203 shows that the connection between $O_1$ and $O_2$ is complete, consistent with FIG. 36, as now connection system cell 3616, representing origin point $O_1$, has a processing grid connector shown by the white circle. The transient memory network grid 3801 may propagate values every other time step, and the result of this propagation can be seen in FIG. 39. The prediction labeled Q101 has traveled from memory cell 3814 to memory cell 3811, as have the values for Segment A and Segment B (although Segment A has been attenuated, designating that the movement is one step closer to the midpoint). The prediction information labeled Q201 has traveled from cell 3811 to the collision path midpoint memory cell 3807, and its routing information, collectively Segment A and Segment B, has attenuated to 1 and 0 respectively, representing the arrival at the collision path midpoint. The collision path midpoint is the final step in the queue process, prior to transmission to the origin endpoint, in this case $O_1$.

During the next time step, midpoint cell 3307, which previously (i.e., at the time step shown in FIG. 39) held prediction Q201 will update that prediction based on receiving prediction Q101 from cell 3811, and will immediately pass that updated prediction to its target origin point $O_1$. At the target origin point $O_1$, the updated prediction can be used for purposes such as overriding any input that is otherwise received (or not received) by the processing grid cell at the target origin point at the time step to which the prediction pertained. For example, if a prediction made based on an input received at $O_2$ includes information indicating that it pertains to a time step which has not arrived by the time the prediction arrives at $O_1$, then, as described previously, that prediction could potentially be buffered at $O_1$ until the relevant time step had arrived. Alternatively, in some cases a prediction may made based on an input at $O_2$ may be implemented immediately as it arrives at $O_1$, with no buffering being used beyond that inherent in the prediction being passed through the memory network as described above.

Simultaneously, as shown in FIG. 40, input pulses again arrive at the origin points $O_1$ and $O_2$, consistent with previous steps throughout this example—input pulses arriving every other time step. The pulse arriving at processing grid cell $O_1$ results in an alert at connection cell 3616, which immediately (i.e., on the same clock tick as registered by the processing grid) travels to cells 3307 3205 and 3308. The pulse arriving at processing grid cell $O_2$ results in an alert at connection cell 3412, which immediately transmits to cells 3307 3411 and 3514. Each of these cells passes the alert on to their corresponding memory network cells. The memory network cells could then create and propagate appropriate predictions using the same approach described above. In particular, transient memory cells 3814 3805, and 3808 make new predictions for future values of the origin pulses. Memory cell 3814 creates the prediction labeled Q102, which is a future prediction of $O_1$'s state, while memory cells 3805 and 3808 make predictions Q401 and Q501, respectively, which are future predictions of $O_2$'s state.

Transient memory cell 3811, which had received prediction Q101 in a previous step, utilizes the alert information, as well as its own statistics and the Q101 prediction, to create a new prediction, depicted as Q101* (the asterisk representing that this is a modified version of Q101, but a prediction for the same time step and origin point as the original Q101 was intended for).

FIG. 41 illustrates what may happen a time step later, when the values in the transient memory grid 3801 propagate. Each prediction moves one cell closer to the midpoint cell 3807. FIG. 42 shows another advancement of time, which includes pulses like shown in FIG. 40, alerts to all cells on the collision path, an update of each prediction, and predictions sent from the midpoint to the respective endpoint origin cells, thereby being removed from the transient memory grid.

In the earlier discussion of FIG. 37, it was mentioned that memory network cells may store persistent values of a collision identifier and statistics pertaining to that collision. The collision identifier may be an identifier which specifies a relative position of the two origins which generate the colliding pulses being tracked. The statistics may be counters which track occurrences of various combinations from the two origins: both positive, both negative, one positive while the other is negative, and one negative while the other is positive. By storing counts of the observations of four of the values in the probability table, the entire table can be inferred, so that correlations can be determined. Table 10 shows an example of one implementation.

TABLE 10

Exemplary probability table storage strategy

|  |  | Signal B | | |
| --- | --- | --- | --- | --- |
|  |  | − | + | Total |
| Signal A | − | Derive (nn) | Store (np) | Store (n1) |
|  | + | Derive (pn) | Store (pp) | Store (p1) |
|  | Total | Derive (n2) | Derive (p2) | Derive (total) |

For instance, table 10 shows a strategy of storing a count marked "np" of the occurrences of Signal A being negative, while Signal B is positive, and a count marked "n1" of the total occurrences of Signal A being negative, regardless of whether Signal B is positive or negative. With these two counter values, the count (nn) of Signal A being negative while signal B is negative can be derived through subtraction, since n1−np=nn.

Correlations can be spotted by comparing, for example, the ratios of np/n1 and pp/p1, as well as comparing pn/n2 vs. pp/p2. If pn/n2 varies widely from pp/p2 after sufficient total observations, then a prediction for the sign of Signal B can be created if given the sign of Signal A.

As a concrete example, suppose Signal A is positive. Signal B may then be predicted positive if pp/p1>pn/p1, which also means that pp/p1>50%. The confidence of the prediction may be based on the value of pp/p1 as well as the number of observations (p1) where Signal A has been positive in the past.

The total counts (n1, p1, n2, p2, and total) may be particularly useful in calculating a confidence level of a prediction, while the ratios (for example, pp/p1) may be useful in determining the prediction itself. In some implementations, it may be desirable to sacrifice precision of these counters in the interest of reducing the number of components necessary to implement, particularly because the components get repeated for each cell in the cellular automaton. An example of how this may be done is through the use of a component referred to herein as an estimator, discussed below.

FIG. 43 illustrates an estimator 4301, which may be made up of a plurality of estimator modules 4302. For illustrative purposes, the estimator modules are shown here in a horizontal configuration, with the left-most estimator module tracking a high-order bit of an estimate, while the right-most estimator module is tracking a low-order bit of an estimate. The positional references (left and right) used in the following description are for illustrative purposes only, and it is understood that the estimator modules may be positioned differently. Estimator modules which make up estimators may act as a simple cellular automaton within each cell of a larger cellular system.

The function of an estimator is to track a ratio by observing instances of a binary event, storing information about both the estimate of the ratio of occurrences and the number of observations. As a concrete example, an estimator may track a series of coin flips, keeping running estimates of both the number of heads observed and the total number of flips, but storing these two estimates in one estimator comprising a plurality of estimator modules. Relative to simply keeping two counters, estimators may have the advantage of requiring fewer components to implement, and may provide direct access to the estimated ratio, rather than having to rely on an arithmetic component (ALU and/or CPU in a traditional computer system architecture) to perform a division operation or other mathematical operations.

In the context of the memory network of an artificial intelligence system implemented as described herein, estimators may be used in the tracking of statistics, as shown in FIG. 37 in the persistent values of a memory network cell. Rather than storing actual counts of occurrences, such as the four counters of "np", "n1", "pp", and "p1", two estimators may be used. One estimator may be used to track the ratio of np to n1 (that is occurrences of Signal A being negative and Signal B being positive, as a ratio of all occurrences of Signal A being negative), while the other tracks the ratio of pp to p1 (that is occurrences of Signal A being positive and Signal B being positive, as a ratio of all occurrences of Signal A being positive). In traditional statistical terminology, the former of these two statistics can be thought of as P(B=positive|A=negative), or the probability of B=positive given A=negative, while the latter can be thought of as P(B=positive|A=positive). Other variations of tracking specific ratios such that the entire probability table can be derived are also possible, and will be apparent to those skilled in the art. Accordingly, this description of how estimators can be utilized to track the statistics should be understood as being illustrative only, and should not be treated as limiting.

An exemplary design of an estimator module 4303 is shown in FIG. 43. It is depicted having ten data connections comprising five connections for receiving input signals (that is, four from the left, and one from the right), and five connections for receiving output signals, and three internal state values. Tables 11, 12 and 13 describe each of these values in an exemplary design.

TABLE 11

| Exemplary estimator module input signals | |
| --- | --- |
| EXT IN | "Extends In" is a line in from the estimator module to the left, specifying if the estimator extends to this estimator module. |
| OBS IN | "Observation In" is a line in from the estimator module to the left, passing a binary observation which is to be tracked. |
| CLK IN | "Clock In" is an oscillating clock line in from the left, which triggers action in the estimator module. |
| ADJ IN | "Adjust In" is a line in from the left, specifying that an adjustment of the estimator is in process if equal to one. If zero, an extension is being considered. |

TABLE 11-continued

Exemplary estimator module input signals

| | |
|---|---|
| C/B IN | "Carry/Borrow In" is a line in from the right, specifying that a carry or borrow operation is in process. |

TABLE 12

Exemplary estimator module stored values

| | |
|---|---|
| EXT and EXT' | "Extends" is an internal binary state tracking whether estimator extends to the neighbor to its right. EXT' represents the changed value of EXT, once the estimator module has completed its logic, and is outputted on the line "EXT OUT". |
| SB and SB' | "Stored Bit" is an internal binary value representing a single bit of the estimation. SB' represents the changed value of the stored bit, once the estimator module has completed its logic. |
| RND | "Random Bit" is a single binary value that is randomly or pseudo-randomly generated during each clock cycle. |

TABLE 13

Exemplary estimator module output signals

| | |
|---|---|
| EXT OUT | "Extends Out" is an output line to the right, specifying if the estimator extends to the estimator module to the right. As described, once an estimator module has finished its processing on any particular clock cycle, this will preferably reflect the value of EXT. |
| OBS OUT | "Observation Out" is a line out to the estimator module to the right, passing a binary observation which is to be tracked. As described, once and estimator module has finished its processing on any particular clock cycle, this will preferably reflect the value of OBS IN, for any active estimator modules. |
| CLK OUT | "Clock Out" is an oscillating clock value outputted to the right, which triggers action at the estimator to the right. |
| ADJ OUT | "Adjust Out" is a line out to the right which specifies whether an adjustment is in process, if equal to one. If zero, an extension is being considered. This value may be determined by the estimator module and is not necessarily the ADJ IN value passed through. |
| C/B OUT | "Carry/Borrow Out" is a line out to the left, which specifies whether a carry or borrow operation is in process. This value may be determined by the estimator module and is not necessarily the C/B IN value passed through. |

An estimator may track a ratio of observations by having the observations fed in serially into the OBS IN line of the left-most estimator module. Utilizing the logic specified in the flowchart on FIGS. 44A-C, and detailed in FIGS. 45A-B and FIGS. 46A-B, the estimator tracks an estimate of the ratio of ones observed in a binary stream as well as an estimate of the count of the observations. The values of these two estimates can be easily calculated based on the values of the stored bits (SB) which are stored in each estimator module. Perhaps more importantly in the cellular automaton, actions can be taken by the memory network based on the values of the estimator, without requiring hardware to perform calculations such as a divide operation.

Figure 44A:
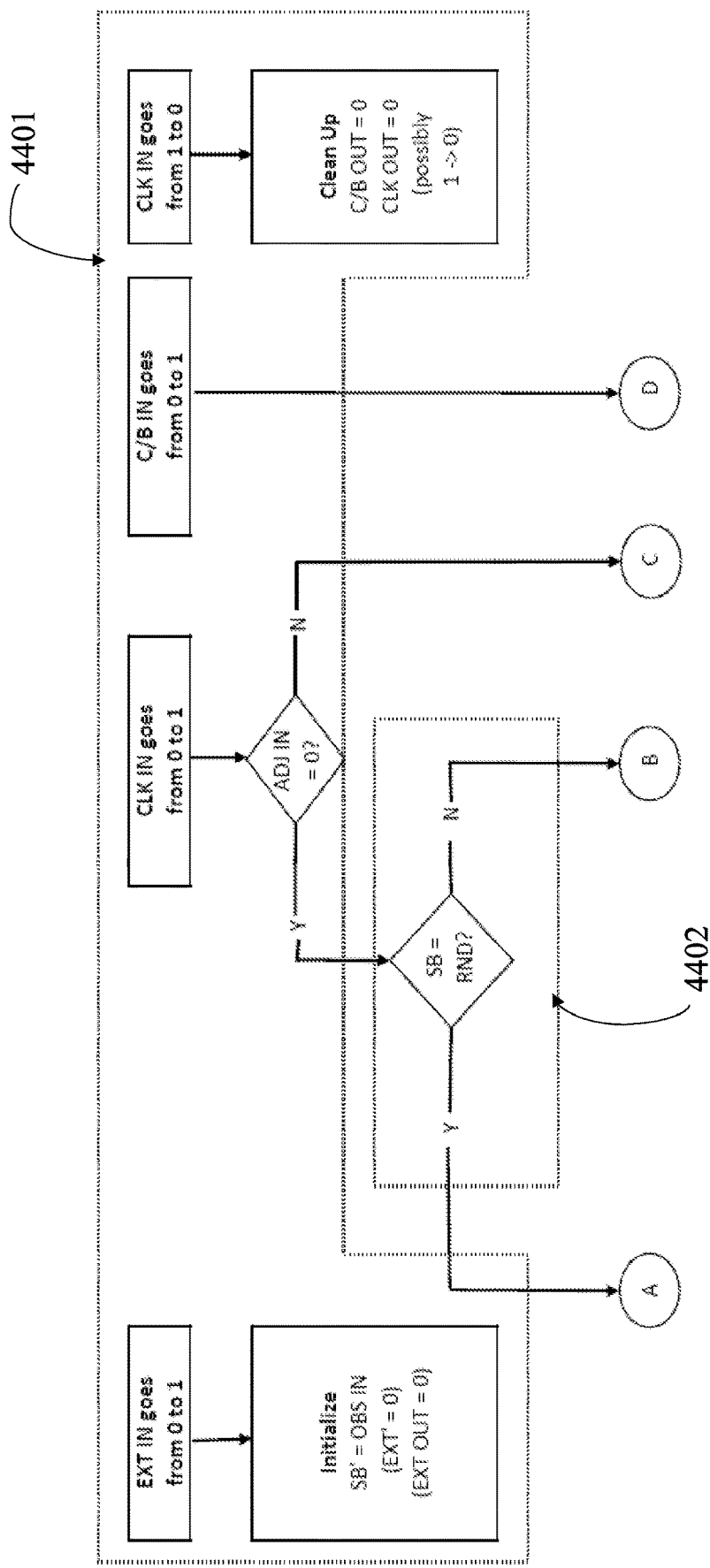
FIGS. 44A-44C depict an exemplary process in which estimator modules may be extended or adjusted based on observed values and their current state.
Figure 44B:
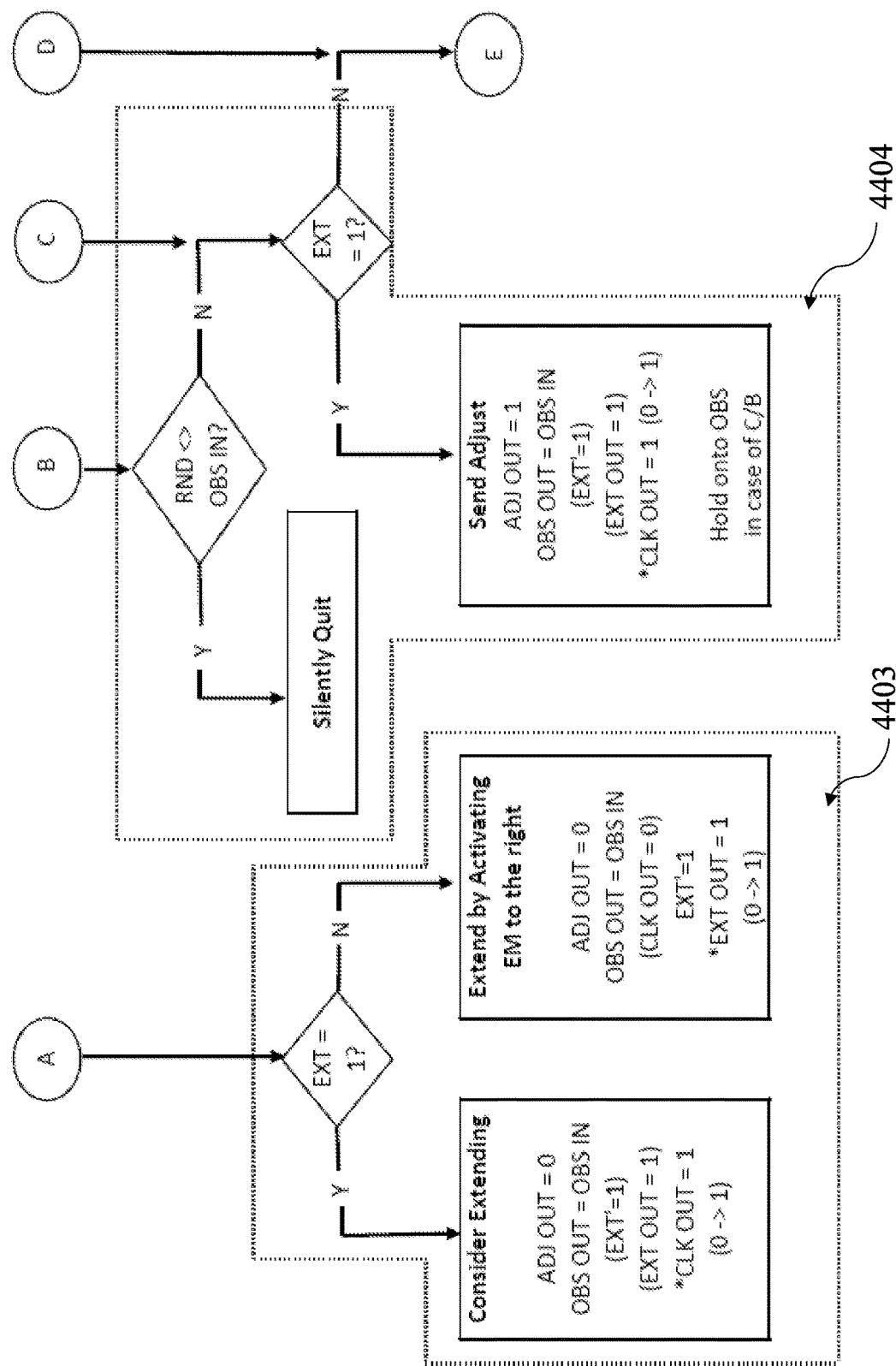
Figure 44C:
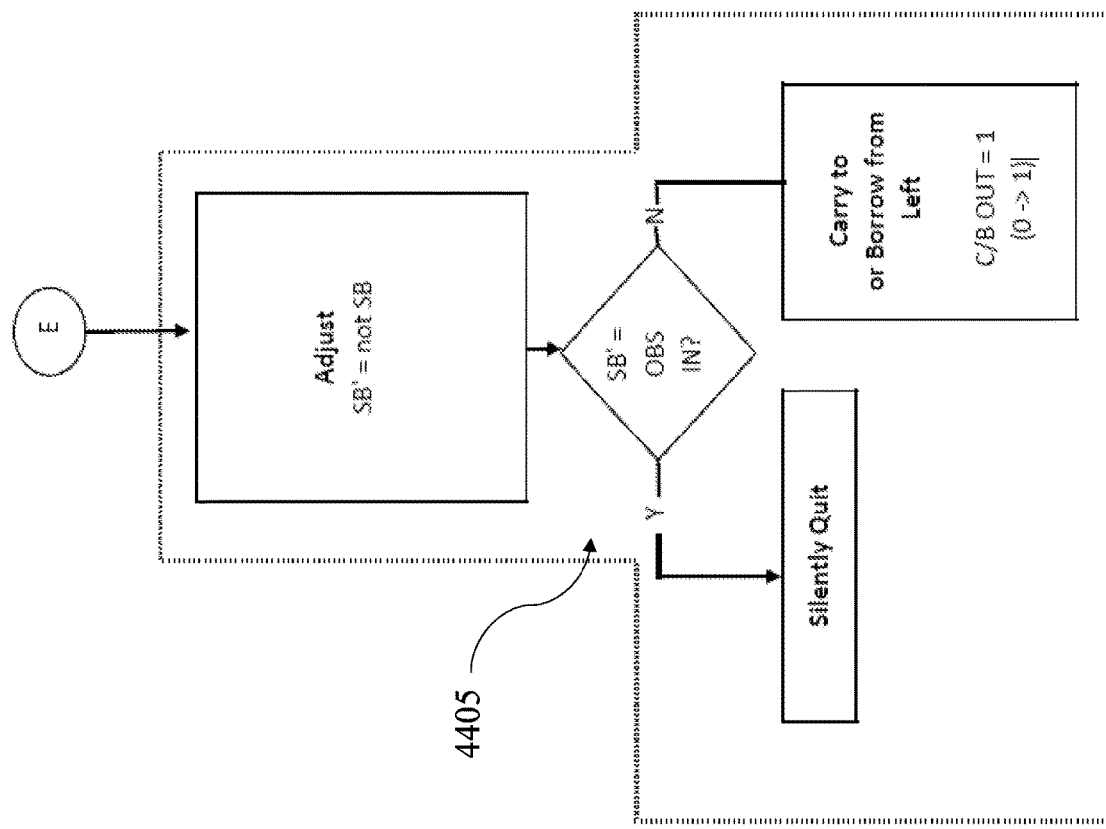

The flowchart on FIGS. 44A-C illustrates the basic operations which may be included in some implementations of an estimator module. The operations can be divided into five separate aspects. A first aspect 4401 specifies the starting point for the operations, which include the incoming disposition and instruction, as listed on the leftmost column 4601 of FIGS. 46A-B. Estimator modules may be edge-triggered, such that their logic is triggered in a change in an input line. The first aspect 4401 shows that four line changes may trigger action in an estimator module: EXT IN rising edge (from 0 to 1), CLK IN rising edge (from 0 to 1), C/B IN rising edge (from 0 to 1) or CLK IN falling edge (from 1 to 0).

EXT IN rising edge triggers an initialization of the estimator module. This occurs as an estimator module is put into service as part of an estimator. In other words, an estimator may grow in length over time, putting additional estimator modules into service via an "extend" process—with one estimator module raising the EXT OUT line, which is connected to the right-neighbor estimator module's EXT IN line, thereby putting that right neighbor estimator module into service. When being put into service, the estimator module sets its stored bit to the observed value, passed in OBS IN. This operation is shown in the left portion of the first aspect 4401, labeled "Initialize". The EXT internal state, and the EXT OUT line will both be zero, as the estimator may only grow by a maximum of one estimator module per clock cycle.

During normal operations of the estimator, as it pertains to the memory network, a collision will be observed between two ripple patterns. The collision will be two binary values, each represented as either positive or negative. The estimator which is tracking the ratio of P(B=positive|A=negative) will be supplied with a value based on Signal B if Signal A is negative, while the estimator which is tracking the value of P(B=positive|A=positive) will be supplied with a value based on Signal B if Signal A is positive. These values are supplied to the left-most estimator module on the line called OBS IN, that is, the observed value input line.

Once the observed value is in place on the OBS IN line, the CLK IN line is raised from 0 to 1, triggering action in the left-most estimator module. The left-most estimator module then follows the flowchart on FIGS. 44A-C, processing the observation, and potentially extending or adjusting the ratio estimate. This flow is depicted starting with the second top box in the first aspect 4401 labeled "CLK IN goes from 0 to 1".

An estimator may use random values to determine whether it will extend to additional estimator modules. With random values RND supplied at an equal probability of zeros vs. ones (or at different ratios of zeros and ones, depending on the implementation and the circumstances in which the estimator is used), the number of estimator modules will grow proportional to the log base 2 of the number of observations. In other words, the number of estimator modules in service may provide an unbiased estimate of the number of observations, using a formula such as shown in table 14. The logic in function 4402, and the corresponding second column 4602 in FIG. 46A labeled "Extend Check" pertains to the function of determining whether the estimator will grow, via extension to additional estimator modules.

The collective stored bits in an estimator may be utilized as an estimate of a ratio, computed as shown in table 14, part 2.

TABLE 14

Computation for estimator's estimated ratio and estimated number of observations 1) The number of observations can be estimated using the number of active estimator modules, m, where the estimated number of observations equals $2^{\wedge}(m + 1)-2$.
Example: an estimator holding the value 10111 has 5 active estimator modules – it is 5 bits long.
So, an estimate of the number of observations is $2^{\wedge}(5 + 1)-2$, or 62.
2) The ratio can be estimated using m (above), and b, the binary value of the stored bits, b. An estimate of the ratio is $(b*2 + 1)/(2^{\wedge}(m + 1))$
Example: an estimator holding the value of 10111, when converted from binary to decimal, equals 23. Therefore, b = 23, and m = 5 as shown above.
Estimated ratio = $(23*2 + 1)/(2^{\wedge}(5 + 1)) = 47/64 = 0.734375$.

The left-most estimator module will compare its stored bit (SB) to a random value (RND), and it is expected that 50% of the time, the left-most estimator will determine that it will "possibly extend" if the two bits match, as described in 4602. This does not imply that the estimator will extend; rather just that it looks good from the perspective of the first estimator module. The second estimator module (if there is one that is active) will reduce the probability of extending to 25%, and the third (if there is one active) will reduce the probability of extending to 12.5%, and so on. The longer the chain of active estimator modules, the less likely it is to extend. This demonstrates how an estimate of the number of observations may be reflected by the number of active estimator modules.

If the Extend Check in function 4402 fails (that is, if SB is not equal to RND) for any of the estimator modules, then the estimator begins a process of considering an adjustment, and extending is no longer under consideration during this observation cycle. For all estimator modules to the right of the estimator module that failed the Extend Check, upon a CLK IN going from 0 to 1, their ADJ IN flag will be set, signifying that an adjustment is being performed, and that an extension is no longer an option during this cycle (although in some cases, the CLK IN for such modules does not go from 0 to 1, as the estimator has determined that it also is not going to adjust, and silently quits). The adjustment process will be detected in the flow chart in the first aspect 4401, in the decision box leading to a second aspect 4402, which reads "ADJ IN=0?". That is, once one estimator module fails its extend check, no estimator modules to its right will perform an extend check, and second aspect 4402 will be bypassed for those estimator modules.

Following the extend check in the second aspect 4402 to the left, in the case where the stored bit (SB) is equal to the random value (RND), the flow moves to a third aspect 4403 and its corresponding narrative 4603 on FIGS. 46A-B, labeled "Extend Action". The action taken at this point depends on whether this estimator module is the right-most active estimator module (in which case, EXT will be 0, and it will extend by activating an estimator module (EM) to the right). If EXT=1, then there are additional estimator modules to the right, and the estimator module to the right is notified that extending is still a possibility, by way of ADJ OUT=0.

In addition to tracking the number of observations by way of the number of active estimator modules, the estimator is also tracking an estimate of the ratio of ones in the observation stream. If the extend check in the second aspect 4402 fails or is bypassed, then the logic may flow into a fourth aspect 4404, where an adjustment is considered. The same random value (RND) may be compared to the observation (OBS IN), and if they are equal, then the estimator begins a process of adjustment. The adjustment is similar to adding or subtracting one from a binary value, in that inverting the right-most zero and all one-bits to the right of the right-most zero will increment a binary value, while inverting the right-most one and all zero-bits to the right of it will decrement a binary value. The adjustment will pass the observation all the way to the right-most active estimator module, which will invert its stored bit, and then begin a process of carry/borrow, if necessary, until it finds the right-most stored bit that is equal to the observation once inverted. This can be seen in the fifth aspect 4405 and its associated narrative 4605.

Figure 47:
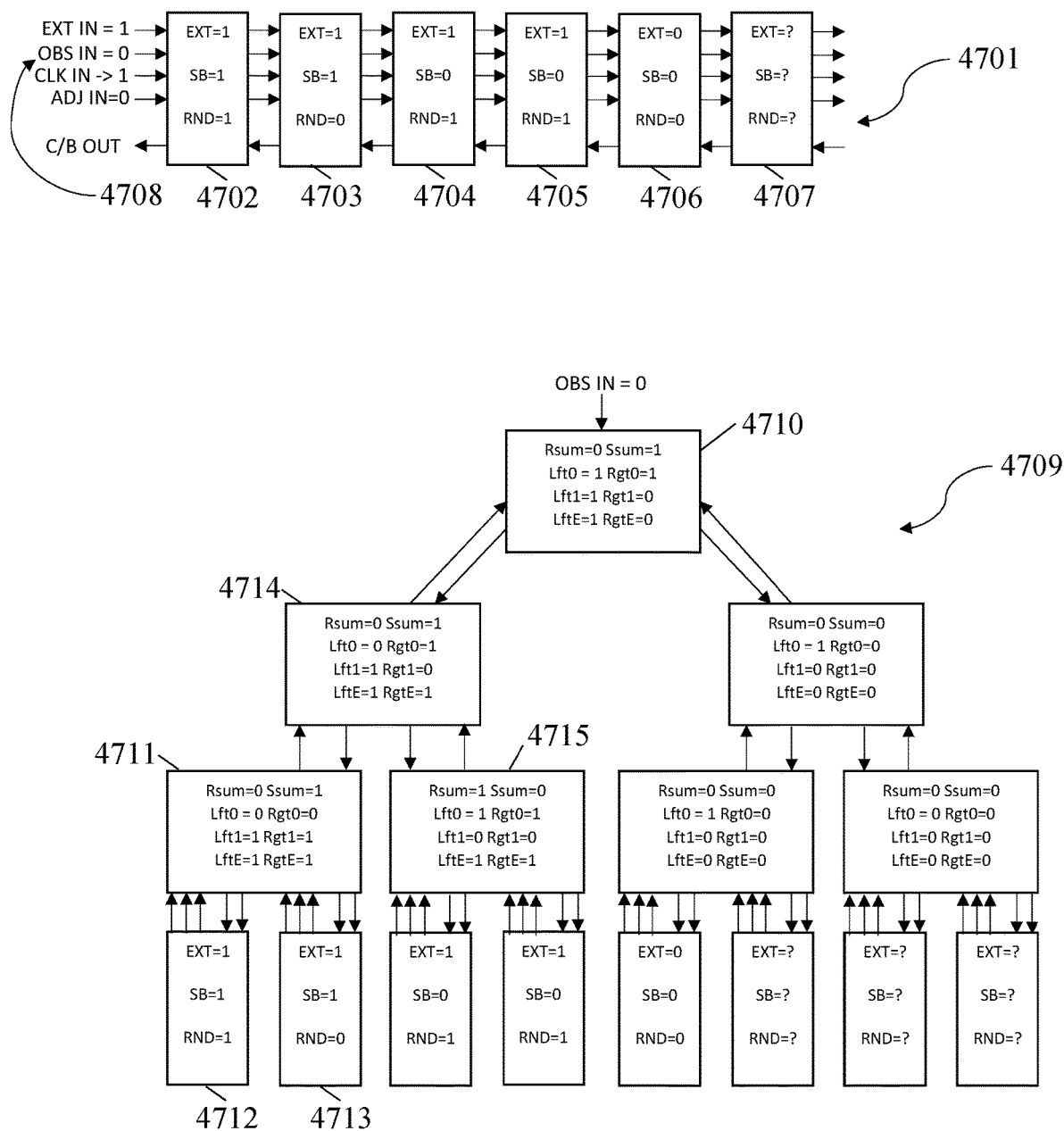
FIG. 47 shows two exemplary architectures for estimator modules.

FIG. 47 illustrates an example of the process by which estimators may be updated, as observations are made. For purposes of the example, suppose a memory network cell had been monitoring collisions for some time, and had an estimator which is tracking the ratio of P(B=positive|A=negative) set to the values shown in estimator 4701, which is made up of estimator modules 4702 4703 4703 4705 4706 and 4707. This estimator 4701 is tracking the occurrences of Signal B being positive, when it collides with another signal, Signal A, and Signal A is negative. The current state of the estimator shown in 4701 indicates that there are 5 active estimator modules, which can be determined by looking at the EXT values and recognizing that the EXT value in the fifth estimator module 4706 is a zero, which indicates that the estimator does not extend beyond the fifth estimator module 4706.

The stored bits in estimator 4701 collectively read 11000, which can be determined by examining the SB (stored bit) values in the active estimator modules 4702 4703 4704 4705 and 4706. The number of active estimator modules, five, provide us with a way to estimate the number of observations that have been made, using the formula in table 14. The collective value of the stored bits, 11000, provide a way to estimate the proportion of positive observations of Signal B, given Signal A as negative, which is the statistic that is being tracked with this estimator. The computation for this proportion is also described in table 14.

Proceeding with the example in which a collision occurs in the processing grid which is communicated to the memory network, this example collision is between two signals, Signal A and Signal B in this case, which originated at some origin points that are being tracked. In this example collision, Signal A is negative and Signal B is also negative. Since Signal A is negative, the estimator 4701 is notified with the value of "negative" for Signal B, represented as a binary value zero. So, in this example, the observation for estimator 4701 is a zero.

Looking to inputs 4708, the memory network interface has set the inputs for estimator module 4708 to the following values: EXT IN=1, by convention, this will always be 1, once an estimator module is in use; OBS IN=0, reflecting the negative observation for Signal B; ADJ IN=0, again by convention, feed the left-most estimator module a 0 in ADJ IN, to trigger an attempt to extend; and then, once those values are stably loaded, raise the CLK IN to 1, triggering action by estimator module 4702.

At a high level, this scenario shows a collective stored bit value of 11000, with a collective random bit value of 10110, as can be seen by concatenating the respective SB and RND values across 4702 4703 4704 4705 4706. A collective stored bit value of 11000, being greater than 10000, indicates a better than 50% probability (expectation) of a positive Signal B, given a negative Signal A, based on past observations, which will be explained in further detail in a bit. But, given that the expectation is more likely positive than negative, and that the estimator 4701 observed a negative, then this may be an opportunity to reduce the expectation slightly.

If the collective stored bit value equaled the collective random bit value, then the estimator 4701 would extend to include estimator module 4707. This has a 1 in 32 probability since each of five bits in the stored bit value needs to match the random bit value. The likelihood of the estimator extending reduces by half each time the number of active estimator modules grows by one.

Consider that the collective stored bit value in this example, at this time is a 5-bit binary value. The closer the value is to 11111, the higher the expectation of seeing a positive observation, which can be calculated using the formula in table 14. Considering the case of a very high expectation of a positive, then observing a negative (which is the case in this example) will be more likely to reduce the expectation of a positive in the future, than if the expectation is closer to 50/50 and a negative were observed. The estimator compares the collective random bit value to the collective stored bit value, and since it is less and the collision observation involved a negative signal, while the estimator expected a positive, the ratio estimate is reduced. In other words, future expectations, stored in the revised estimator, are potentially tweaked with each observation, based on how likely the current observation matches the current expectation. The estimator modules execute this tweaking through a series of comparisons and inversions described in the flowchart of FIGS. 44A-C.

Estimator module 4702 begins its way through the flowchart due to the rising edge of CLK IN, which is mentioned in the second box in the first aspect 4401. ADJ IN is compared to zero, and it is 0, so the left ("Y") path is taken, resulting in the movement in the flow chart into the second aspect 4402. This means that the estimator is amenable to extending, because it collectively hasn't yet encountered a situation where the stored bit (SB) was different from the respective random bit (RND)—it hasn't yet checked any. In the second aspect 4402 for estimator module 4702, SB (with a value of 1) is compared to RND (which also has a value of 1). This means that the first bit of the collective stored bit value has been compared to the first bit of the random bit value, and in this example they are equal, so the estimator is still amenable to extension at this point, as all bits must match for an extension to occur, and at this point, only the first bits have been checked. This corresponds to the twelfth row 4512 on FIG. 45A; the narrative on FIG. 46A for that row 4512 says to instruct the neighbor to the right to consider extending. And the flowchart describes the procedure for instructing right neighbor in the third aspect 4403 in the box labeled "Consider Extending". The final step in that box is to raise CLK OUT to 1, which is a signal on estimator module 4702 that aligns with estimator module 4703's CLK IN, and whose rising edge triggers estimator module 4703 to begin down the flowchart at the first aspect 4401.

Estimator module 4703 receives the following values from estimator module 4702: EXT IN=1, ADJ IN=0, OBS IN=0, and then CLK IN rising to 1. Following the flow chart, estimator module 4703 works its way to the second aspect 4402, where it determines that SB is not equal to RND, which send the flow into the fourth aspect 4404. This means that extending the estimator is no longer considered, as it found a difference between the bits in the collective stored bit value and the collective random bit value. At this point, estimator module 4703 determines whether the estimator (as a whole) will be adjusted, by comparing the same RND to the observed value, OBS IN. In this example, they are both zero, which determines the fate of the estimator: it will be adjusted. And the observed value (negative; OBS IN=0) determines that this adjustment will be downward.

At this point, the estimator needs to "subtract one" from the entire estimator and can accomplish this by inverting the right-most one-bit of the stored bit (SB) values, and every zero-bit to the right of it. Note that this may or may not involve inverting the stored bit at estimator module 4703, and in this case it doesn't immediately do any inversion at estimator module 4703. Instead, the estimator module 4703 sets up the appropriate outputs, which become inputs to estimator module 4704, and raises the CLK OUT, which becomes the CLK IN for estimator module 4704, which triggers estimator module 4704 to begin down the flowchart. Note that ADJ IN will be 1, which bypasses the check at the second aspect 4402, and goes directly to the fourth aspect 4404, in search of the right most estimator module of the estimator, where EXT=0. The estimator modules effectively pass information down the line, from left to right, from estimator module 4703 to estimator module 4706, that an adjustment is in process, which will involve finding the right-most estimator module, and inverting its store bit, and every stored bit to the left of it, until it finds the right most stored one bit and inverts it.

This process will continue until estimator module 4706 detects that it is the right-most bit, with EXT=0, and it will then invert its stored bit (SB), in this case from 0 to 1, in a fifth aspect 4405. And since it's in search of the right-most one-bit—and hasn't found it—this triggers a series of carry or borrow (C/B) events (in this case, a borrow, since it is subtracting one), where the estimator modules ripple from right to left, inverting each stored bit from right to left, until it finds one that inverts from a 1 to a 0.

The result of this process, when all steps are complete for all estimator modules is that the estimator 4701 will perform logic steps (comparisons) from left to right until it reaches the fifth estimator module 4706, at which time, it will reverse course and perform logic steps (inversions) from right to left until estimator module 4703 inverts, at which time, the process will complete, with the step "Silently Quit" in the fifth aspect 4405. The resultant collective value of the stored bits will be 10111, which in binary terms, is one less than the starting value of 11000, and is reflective of the estimated ratio being tweaked slightly downward.

As described above, an estimator module may be implemented to package a stored bit with a random bit and use a plurality of estimator modules to track estimates of a ratio as well as a total count of observations. One possible variation from the description above would combine the Stored Bit and the Extends Bit into a single tri-state field. For instance, a positive or negative value or voltage of the combined field could represent what was described earlier as the binary value of the Stored Bit, and a zero value or voltage in the combined field could represent that the estimator module is inactive. Other variations are possible, and will be apparent to those skilled in the art. Accordingly, this description of the packaging of the estimator module should be understood as being illustrative only, and should not be treated as limiting.

One example of a variation of the potential implementation of an estimator using a plurality of estimator modules is the organization of estimator modules in a tree structure. In some implementations of such a tree structure, the issue of carry/borrow can be handled in one pass, rather than in two passes as described above. The tree structure can store descriptors of the underlying estimators, such that the right-most one-bit and the right-most zero-bit can be readily identified, and all bits from there to the right can be inverted. Each node of the tree may store values describing a left and right branch, and their relation to each other. Then the observations may be fed into the top node of the tree, and processed downward. It can be determined at the top of the tree what operation will take place on the estimator, based on the observation, whether it be an extension, an adjustment, or silently doing nothing. The rightmost active estimator module can be quickly determined (for extension) as well as the right-most zero-bit or one-bit (for adjustment). An example of this architecture is illustrated in the tree structure 4709 of FIG. 47.

The values of the nodes in the tree structure, such as the root node 4710, are based upon the values in the nodes and estimator modules beneath it. In the example the tree structure 4709 shown in FIG. 47, eight summary values are shown at each non-leaf node, reflecting the values beneath that node. The tree can be built from the bottom, by pairing off estimator modules. For example, the values at a first branch node 4711 can be determined by the pair of estimator modules beneath it 4712 4713. The "Rsum" and "Ssum" values are the respective summaries of the RND and SB bits beneath it; collectively if RND is a greater binary value than the collective value of the stored bits SB, then Rsum will be greater than Ssum (that is, Rsum will be set to 1, and Ssum will be set to 0). Conversely, if the collective random values RND is less than the collective SB, then Rsum will be set to 0 and Ssum will be set to 1. And if the collective RND equals the collective SB, then the two values Rsum and Ssum will be set to that common value. In this way, every node tracks whether the random values on that part of the tree are less than, equal to, or greater than the collective SB values of that part of the tree.

For the lowest level branch nodes in the tree, such as first branch node 4711 and those horizontal to it, Rsum and Ssum can be determined directly from the estimator modules beneath them. Rsum of the first branch node 4711 is set to the RND value of estimator module 4713 if the SB and RND values of estimator module 4712 are equal; otherwise, it is set to the RND value of 4712. Likewise, Ssum of the first branch node 4711 is set to the SB value of estimator module 4713 if the SB and RND values of estimator module 4712 are equal; otherwise, it is set to the SB value of estimator module 4712. Using these calculations, Rsum and Ssum can be compared at any node, which effectively compares the collective values of RND and SB for that part of the tree. This comparison is utilized in the update process of an estimator, to determine whether the estimator will be extended or adjusted or neither.

Moving up the tree, the Rsum and Ssum of a second branch node 4714 can be determined from the Rsum and Ssum values in the branch nodes 4711 4715 underneath it. If the left node (in this case the first branch node 4711) has Rsum and Ssum values that are equal, then the second branch node 4714 copies the Rsum and Ssum values from the right node 4715; otherwise, it copies from the left node 4711.

Other values within the nodes may also be determined from the bottom up. The first branch node 4711 has values for Lft0, Rgt0, Lft1, Rgt1, LftE, and RgtE. These represent the various states of the nodes beneath it, whether there are any zeros on the left (in the stored bit values beneath the node), zeros on the right, ones on the left, ones on the right, extension bits set on the left, and extension bits set on the right, respectively. For example, the first branch node 4711 has Lft0 equal to zero, representing "False", which is determined from the fact that the leftmost leaf estimator module 4712 does not have a zero in its stored bit, SB. Further up the tree, second branch node 4714 has a Lft0 value of 0 (meaning False) because the first branch node 4711 (the node on the left, from the perspective of the second branch node 4714) has no zeros in the SB values beneath it (as represented by the first branch node 4711 having both Lft0=0 and Rgt0=0).

The values in the second branch node 4714 can be interpreted as follows: Lft0=0 means that there are no SB=0 values in the two estimator modules to the left beneath that node 4714, that is, at the estimator modules beneath the left node 4711. Rgt0=1 means that there is at least one SB=0 values going down the right side of the tree from the second branch node 4714. Lft1=1 in the second branch node 4714 means that there are some SB=1 values beneath that node 4714 going down the left side of the tree, and so on. LftE=1 and RgtE=1 in the second branch node 4714 means that all four estimator modules beneath the second branch node 4714 are active and have their EXT bits set (that is, they are extended to their right neighbor). This is helpful in finding the last active estimator module, so that the estimator can be extended to additional estimator modules.

The process to create and walk a tree structure such as this will be apparent to one skilled in the art. If an observation is made which is negative, as the previous example discussed, it may be fed into the node at the top of the tree, at the root node 4710, which can immediately determine that the collective RND values are less than the collective SB values (because Rsum<Ssum at the root node 4710). This means that the estimator represented in the tree structure 4709 will not be extended. And since the observed value is equal to the Rsum value at the top of the tree, the root node 4710, the determination can be made to adjust the estimator's stored bit value downward, based on the same rules as specified in the flowchart on FIGS. 44A through 44C. To adjust the estimator downward, the right-most one-bit in the stored bit values (SB) must be identified, and an inversion process will be undertaken of that bit and all of the zero-bits in stored bit values to the right of it. The tree structure facilitates that.

At the root node 4710, the value of Rgt1=0 means that there are no one-bits to the right. This means a) to search for the right-most one-bit by traveling down the left branch from the root node 4710 to the second branch node 4714, and b) to invert the stored bits (SB) values on the right side of the tree from root node 4710. A similar walk can continue down the tree, and the right-most SB=1 value will be located at the right hand estimator module 4713 under the first branch node 4711, and the SB value in that estimator module 4713 and the three active estimator modules to the right of that module 4713 may be inverted, to complete the adjustment process, effectively in one pass through the tree. At the same time, the node values can be updated in preparation for the next observation.

In the context of a memory network implemented in an artificial intelligence cellular automata system, the estimators may provide an alternative to traditional counters, which can facilitate the cells operating autonomously without having the overhead of a separate CPU or ALU for each cell, and without requiring that each cell communicate to a central CPU or ALU for statistical analysis. Statistics stored in estimators may be used to check correlations simply by bit comparisons. Estimators such as described may also be used in other contexts in which there is an application for probabilistically tracking numbers and values of a stream of observations.

Figure 48:
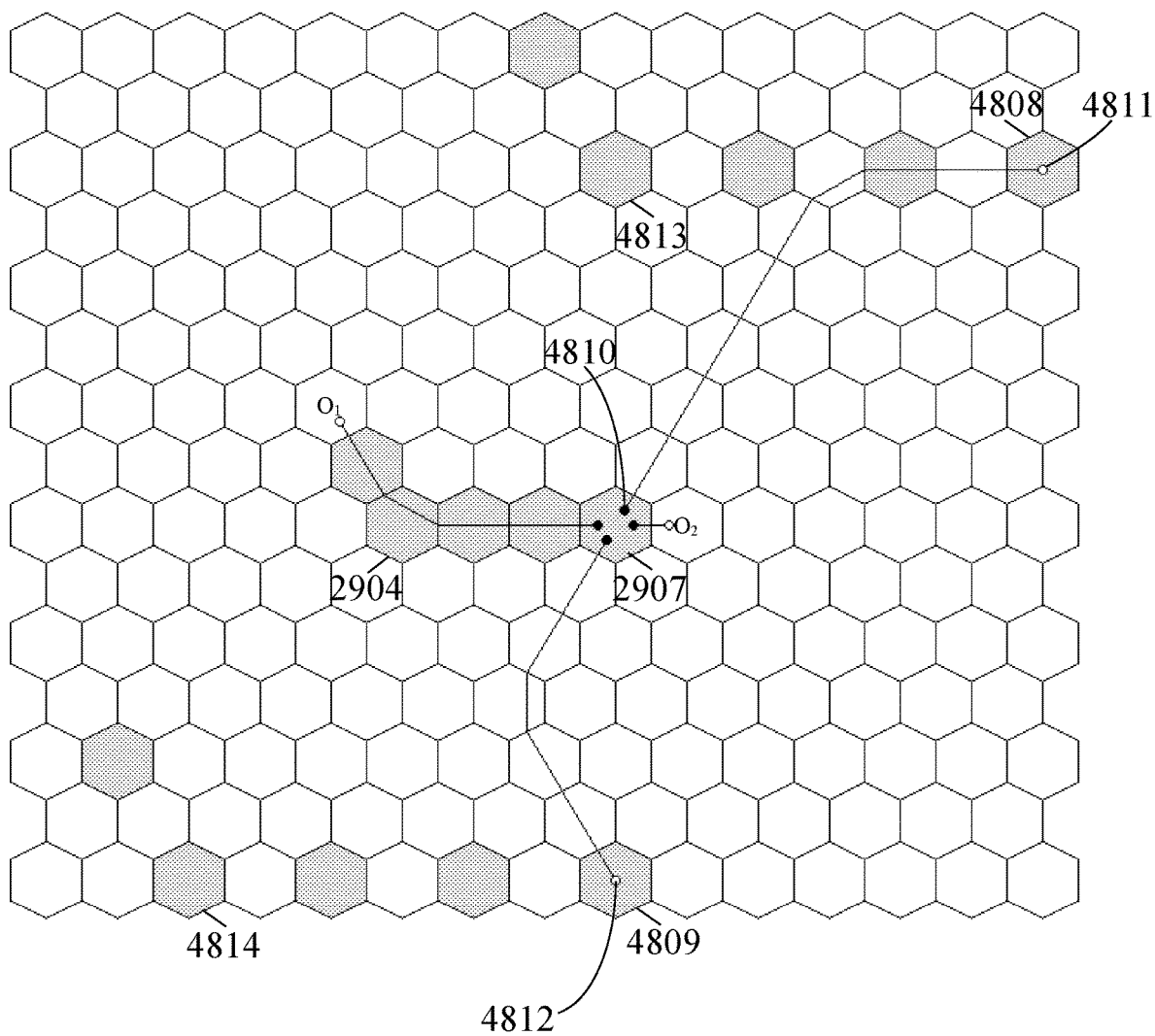
FIG. 48 depicts an exemplary architecture which could be used in implementing a multi-bit system on a connection grid.

Turning now to FIG. 48, that figure provides an illustration of how multi-bit cells may be implemented using a connection system (e.g., as opposed to requiring a mapping module such as described previously). FIG. 48 is based on the connection system shown in FIG. 29, where connection system cell 2907, and its associated memory network cell 2807 are along a collision path. At some point, which may be based on the observations that memory network cell 2807 has made and the statistics it has compiled, memory network cell 2807 may communicate to its associated connection system cell 2907 to create multi-bit cells. The connection system cell 2907 communicates with its neighbors, using signal propagation techniques discussed above, to create two connections to distant cells, as illustrated by the connections to connection system cells 4808 and 4809.

Once the connection system has established the communication channels between connection system cells 2907 and 4808, and between connection system cells 2907 and 4809, the multi-bit cells are in place. At every collision thereafter that is reported to memory network cell 2807 (until such time as the connections are removed), memory network cell 2807 will report information to one of the two multi-bit cells 4808 4809. One method to determine which to report to could simply be based on one of the input signals. For example, if the input signal from $O_1$ is negative, report to multi-bit cell 4808; if the input signal from $O_1$ is positive, report to multi-bit cell 4809. The value reported could be a binary value. One method to determine the binary value would be to utilize the value from the other signal, $O_2$. Variations are possible, such as reporting the opposite of $O_2$, or reporting based on whether $O_1$ and $O_2$ are the same sign, or reporting which is the larger value.

Once the signal is sent from memory network cell 2807 to one of the multi-bit cells 4808 4809, the signal gets passed to the processing grid at the associated processing grid cell, via either connectors 4810 4811, or connectors 4812 4813. At the processing grid, the signal acts as a new input, and ripple patterns form from that point associated to the particular multi-bit cell, 4808 or 4809, that received the signal. This facilitates combining two signals such that they can be correlated to a third (not shown), and ultimately combining any number of signals, for detecting complex patterns involving any number of signals.

The multi-bit cells may be established at a distance from the collision path, in two opposite initial directions. The directions may be chosen based on the type of collision that the initiating memory cell is tracking. Table 15 provides details for the directions of the multi-bit cells, and is an extension of table 5's collision reporting rules.

TABLE 15

Direction selection for multi-bit cell.

| Collision Type | Reporting Rule | Multi-bit Directions |
|---|---|---|
| Two S type signals, stored in components $S_x$ and $S_y$, with x < y. | Report if x <= 2 and either y == x + 2 or y == x + 3 | (x + 1)%6, (x + 4)%6<br>(x + 1)%6, (x + 4)%6 |
| One S type signal and on P type signal, stored in components $S_x$ and $P_y$. | Report if either y <= 2 &&(x == y + 2) or y >=3 && (y == x + 3) | (x + 5)%6, (x + 2)%6<br>(x + 1)%6, (x + 4)%6 |
| Two P type signals | Do not report. | Not applicable. |

As described herein, multi-bit cells may be established by an initiating memory network cell communicating with its corresponding connection system cell, specifying two paths that it wants to establish. The connection system may then utilize the connection path set-up procedure described previously in the context of FIGS. 32-36. The values passed from the memory network to the connection system specify the set-up path. Segment A and Segment B may be calculated to place the multi-bit cells on specific locations distant from the collision path, in the directions specified in table 15. The mid-point countdown value may not be used and in some cases will instead be set to zero for the path set-up procedure.

To determine the appropriate values for Segment A and Segment B, the memory network cell may use the collision information that it has. The collision information values allow the cell to determine the overall length of the collision path, and this cell's position along the path. It can also determine the location of the bend in the path, if there is one.

Since each cell along the collision path can initiate multi-bit cells, a placement algorithm may be used to position each multi-bit cell in a specific place, distant from the collision path. To illustrate, consider the cases where a collision path is either a straight-line path, or a path with one bend in it. The path of multi-bit cells that the placement algorithm determines may be two paths parallel to the collision path—for example, one above and one below the collision path, or one to the left and the other to the right of the collision path. Such a placement algorithm may be designed to select cells that are an even number of cells in any direction from the origins that were involved in the collision.

A "key point" cell 2904 along the collision path is first calculated. This may be at or near the bend, if any, or at or near the mid-point if there is no bend in the collision path. The key point may be adjusted by one cell (along the collision path) if the path length, mod 4, is not 1. In the example shown in FIG. 48, the key point is not adjusted by one cell, as the collision path length is 5. The direction of the adjustment may be toward the origin that is further away, or if the two origins are equidistant, then a convention may be used to always travel one cell along the collision path in the direction of 4, 5, or 0 (that is, northeast, east, or southeast), choosing the first direction of the three that lies along the collision path. Other conventions are certainly possible. After the adjustment, the key point may be an even number of cells from both origin points, as cell 2904 is, relative to $O_1$ and $O_2$. Multi-bit cells 4813 4814 that are potentially spawned from the key point cell 2904 may be a straight line away, in the two directions specified in table 15, at a distance away from the collision path based on the path length itself. For example, where the path length is an odd number greater than three, the placement algorithm may use the integer portion of the path length plus an even number plus one, divided by 4, and then doubled, to ensure we have an even number. That is: int((path_length+2i+1)/4)*2, for some positive integer value of i. This provides a straight-line distance for any multi-bits cells spawned by the key cell. Or the placement algorithm may use some other algorithm to ensure that the placement of the theoretical multi-bit cells for the key cell are an even number of cells from the key cell. Multi-bit cells that are spawned by other cells along the path may adjust their associated Segment A and Segment B values such that their multi-bit cells are in a position relative to the key cell's multi-bit cell, relative to the position this cell is to the key cell.

As an example, if the path length is 5, as in the example on FIG. 48, and the key cell 2904 is three cells to the left of the cell 2907 spawning the multi-bit cells, then the spawning cell 2907 can calculate that a theoretical multi-bit cell spawned from the key cell 2904 might be 6 cells away from the key cell (using int((5+2*3+1)/4)*2), and the spawning cell's multi-bit cell may be the cell 6 cells to the right of the key cell's spawned multi-bit cell (that is, doubling 3, the distance from 2904 to 2907, because the algorithm keeps the multi-bit cells an even number of cells apart from each other and from the origins). The result is that a potential path of spawned multi-bit cells may be "roughly parallel" to the collision path, to either side of (or above and below, as in FIG. 48) the collision path, only spaced out to be approximately twice as long, as shown by the shaded cells on FIG. 48. And any multi-bit cells may be an even number of cells from each other, in any direction, and from the origin cells. Since the collision path may be a bent line, made up of two line segments, "roughly parallel" in this context is intended to convey that the theoretical line of multi-bit cells that could be spawned may be similarly bent, and approximately twice as long.

Of course, it should be understood that the above description of placing multi-bit cells at locations which are an even number of cells from each other is intended to be illustrative only, and that a system could be implemented based on this disclosure in which multi-bit cells were placed different numbers of cells from each other, such as adjacent to each other, separated by odd numbers of cells, or separated by random numbers of cells. Similarly, while pulse points (i.e., points in a processing grid where input signals can be provided) will preferably be separated from each other by even numbers of cells, it is possible that some embodiments implemented based on this disclosure may separate pulse points by different numbers of cells, such as adjacent, separated by odd numbers of cells, or separated by random numbers of cells. Accordingly, the above discussion of cell spacing, as well as the examples showing how cells can be spaced herein, should be understood as being illustrative only, and should not be treated as limiting.

Turning now to a discussion of how an artificial intelligence system such as described herein may interface with external devices, the design supports external devices injecting values into the system via direct input connections as shown on 212. In addition, utilizing the connection system, devices external to the grid which can alter the transient values of cells on the grid can establish connections with cells elsewhere in the system by instructing the edge cell to build a connection to a distant cell.

Using this mechanism, an external device may interface with a fresh grid which has no pre-set values in the arrays, and pre-load the grid with settings in the persistent values. One way that this could be achieved is for the external device to first build connections to various internal cells, by setting the transient values in the connection system's edge cells. The external device could then feed input pulses into the connections that were built, such that the internal cells create pulses, collisions, and ultimately persistent values among themselves. In this way, external devices can train fresh grids to build connections and train the AI system with pre-existing knowledge.

A system implemented based on this disclosure may also support the concept of stored programs. The persistent values in the connection system and the memory network may represent connections and statistics between binary data which may be stored or copied to other cells within the same Artificial Intelligence system, or to other systems. Stored programs may contain the connection system persistent values and may also contain the memory network persistent values.

Revisiting the processing grid propagation method described in FIG. 5 through FIG. 8, it should be noted that the propagation method described above for the memory network 102 and the connection system 103, utilizing the Segment A, Segment B approach could also be implemented in the processing grid 101, with just slightly different results than those described in the earlier discussion. This variation may provide a simpler implementation, since there is one less array: rather than three arrays for S, P, and Y values, two arrays may be used for Segment A and Segment B, which always provide information that tracks the path back to the origin. As a concrete example, the processing grid propagation rules could specify that Segment A and Segment B should be used to create the ripple patterns emanating from the pulse points, with cells along the vertices containing a value in Segment A, and Segment B being zero. Then, the oblique propagation could set Segment B to a non-zero value, such that Segment A and Segment B always store values that reflect a path back to the origin which initially caused the ripple pattern. The cells showing values in FIG. 7 may then contain slightly different values: those with S values would instead show Segment A values of 125 and Segment B values of 0, while those with P values would instead show values in both Segment A and Segment B, reflecting a path back to the origin, such as 126 and 126. And then the propagation rules may just attenuate the Segment A value, once there's a value in Segment B.

An alternate implementation may use Segment A and Segment B such that the total of Segment A and Segment B is the same for every cell in the expanding hexagon ripple patterns. For instance, in FIG. 7, the vertices with S-values of 125 could instead be stored with Segment A of 125 and Segment B of 127, while the edges have values of Segment A being 126 and Segment B as 126. The sums of Segment A and Segment B for all cells with values would be equal (that is, 125+127=126+126), representing that each is part of the same ripple pattern, and each would be encoding a path back to the cell that originated the ripple pattern. Other variations are possible, and will be apparent to those skilled in the art. Accordingly, the above description of propagation rules should be understood as being illustrative only, and should not be treated as limiting.

Figure 49:
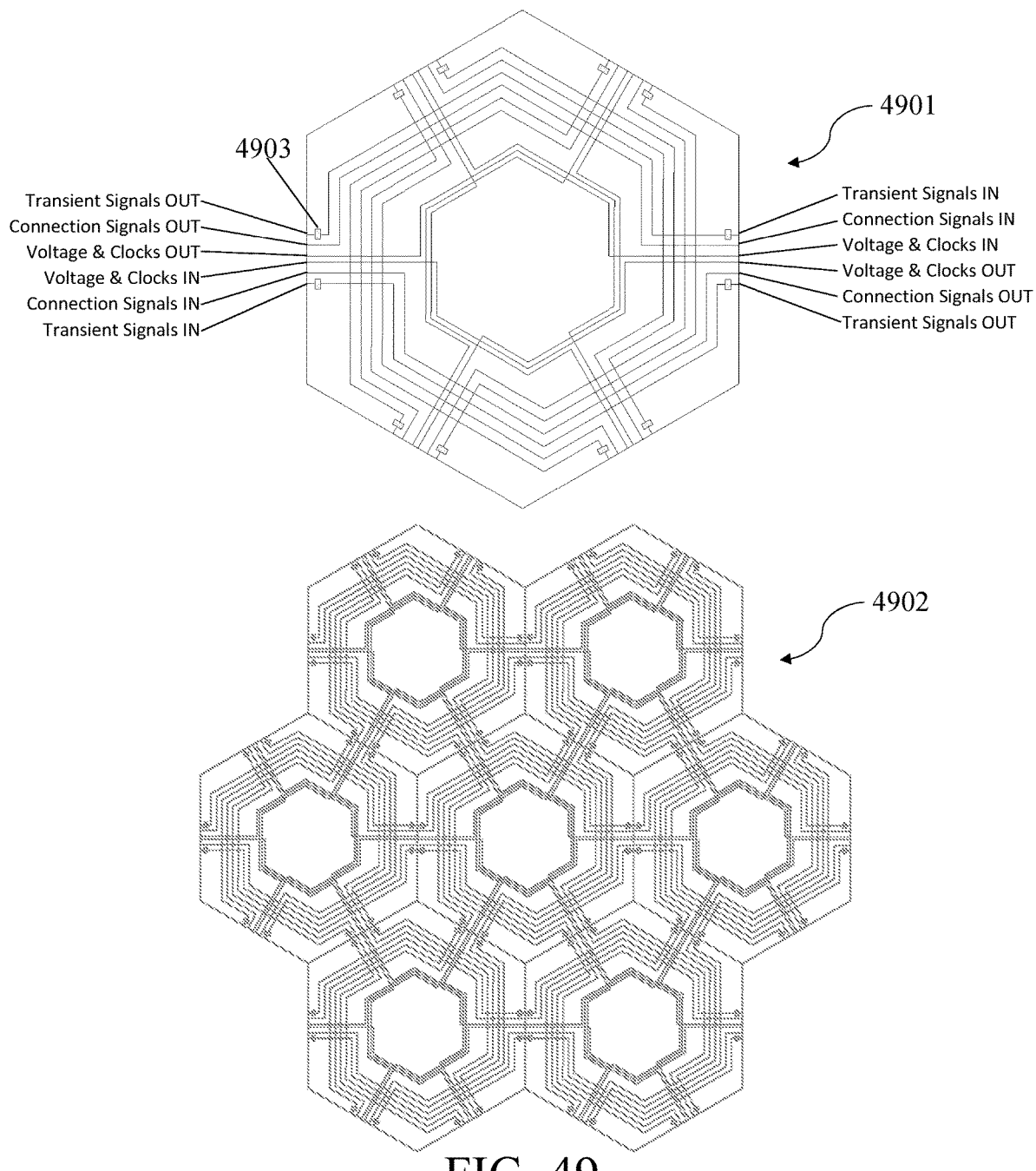
FIG. 49 depicts a high-level exemplary hardware implementation of a hexagonal cell combining functionality of cells from a processing grid, memory network and connection system.

The following paragraphs present an exemplary hardware implementation of a cellular automata system in greater detail, where the three subsystems (processing grid, memory network, and connection system) are combined into a single cell, which is replicated many times across a grid. Turning to FIG. 49, simplified cell 4901 depicts how the transient signals, connection signals, voltage supply and clocks may have inputs and outputs on each of the six sides (two of which are labeled). The inputs and outputs are positioned such that when placed in a tessellation, as shown in grid 4902, the inputs from one cell line up with the outputs of its neighbor.

Each of the lines shown in simplified cell 4901 and grid 4902 may represent multiple physical lines in an electrical circuit. For example, the Transient Signals (both IN and OUT) may represent lines for carrying transient signals of the processing grid, memory network, and connection system, each of which may be a plurality of signal paths. The lines marked Voltage & Clocks (both IN and OUT) may represent a voltage supply line as well as another signal line for a main clock and a third for clock/2 (a clock that pulses at half the pace of the main clock signal). Other lines related to supply voltage, such as ground, may also be represented with the Voltage & Clocks signal. In a subsequent figure (FIG. 51), Voltage & Clocks is abbreviated as "V&C".

The primary paths of the signals in FIG. 49, shown both in the simplified cell 4901 and the tessellation in grid 4902, travel counterclockwise in this example configuration, and travel from one side of the cell to the opposite side. These primary paths may be used to propagate signals, including clock signals, as well as voltage in a straight line across the grid of hexagons. The transient signals are stored in a buffer 4903 on each line in and line out, while the connection signals (that is, the alerts), and the voltage supply and clock signal(s) may flow relatively unimpeded with no buffering. The buffered transient signals may include transient signals from all three sub-systems: the processing grid (e.g., for passing ripple patterns throughout the cellular automata), the memory network (e.g., for passing predictions toward the midpoint), and the connection system (e.g., for setting up and tearing down connections between cells).

During operation of the cellular automaton, an oscillating clock pulse (contained as one of the signals of Voltage & Clocks IN) may trigger propagation events. During one part of the oscillation—perhaps the edge of the clock signal changing from zero voltage to positive voltage—each cell may transfer its outbound buffer contents to each of its neighboring cell's inbound buffer. And then during a second part of the clock pulse—perhaps the downward edge of the clock signal changing from positive voltage back to zero voltage—each cell may process its inbound buffer through the cell, ultimately updating each of its outbound buffers in preparation for the next clock cycle.

Figure 50:
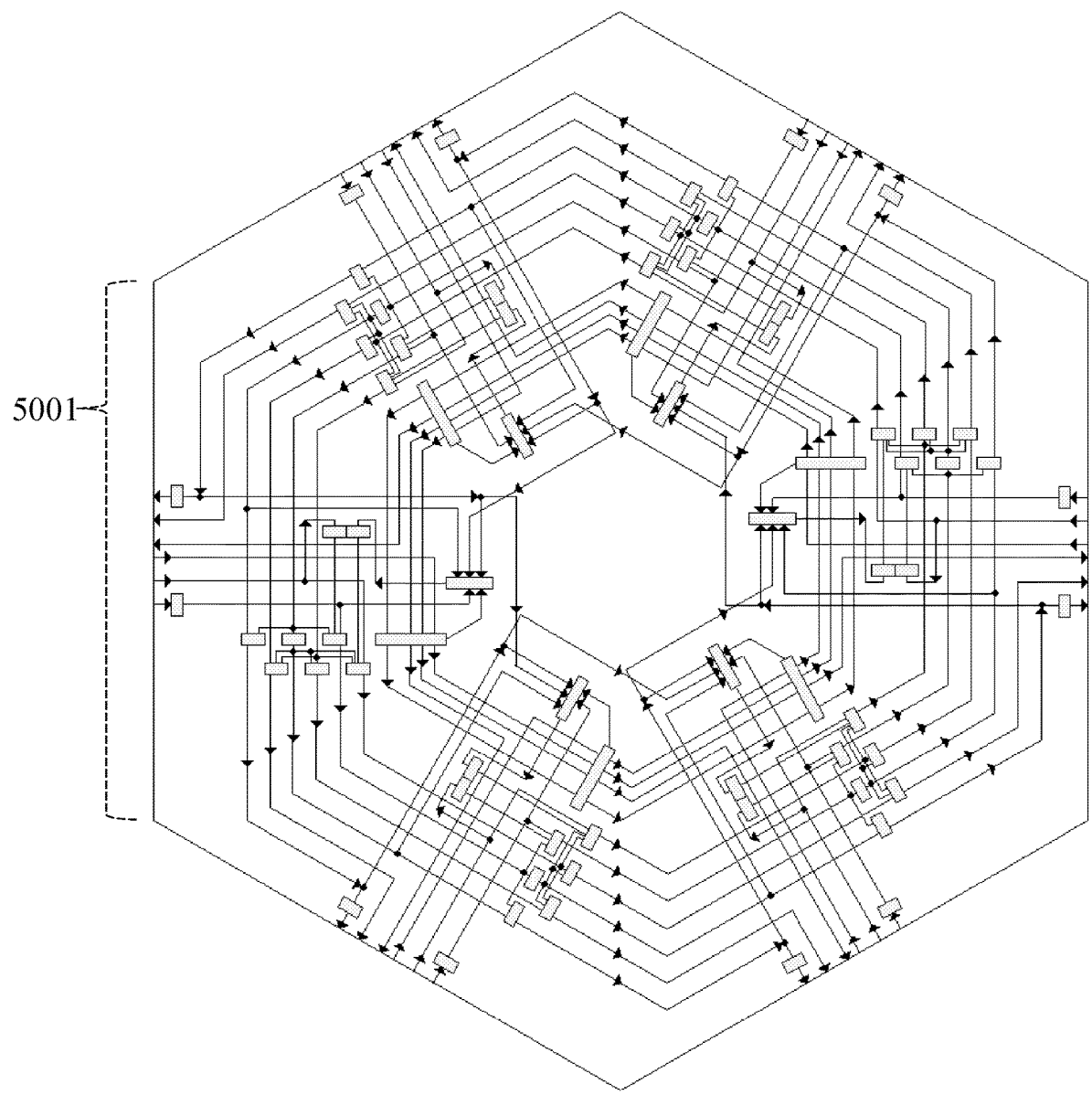
FIG. 50 depicts a detailed hardware implementation of a hexagonal cell shown in FIG. 49.
Figure 51:
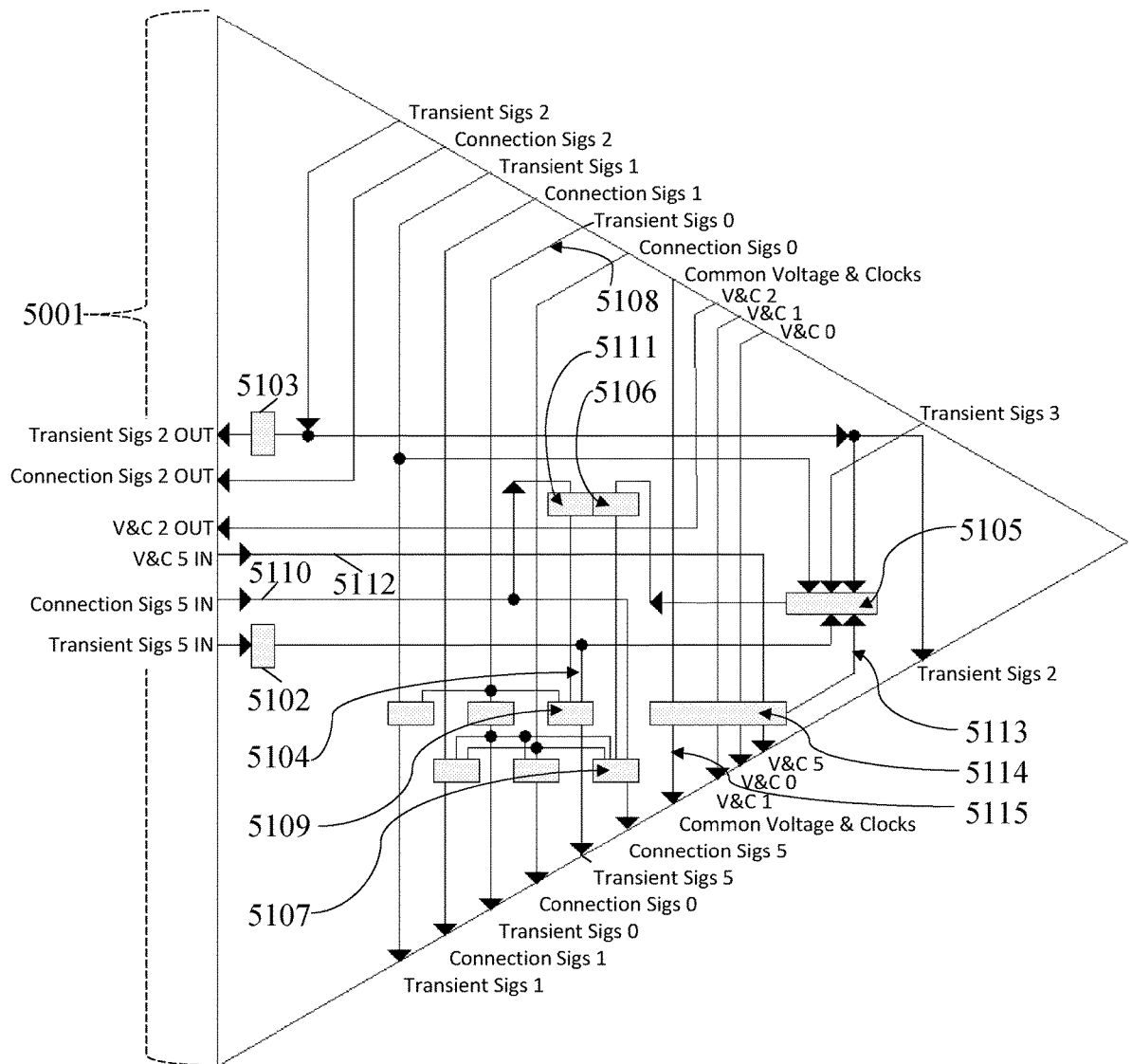
FIG. 51 depicts one sixth of the hexagonal cell shown in FIG. 50.

FIG. 50 depicts a more detailed drawing of an example cell in a hardware implementation. The primary paths shown in simplified cell 4901 connect to additional components shown in FIG. 50, which may facilitate all the functions and procedures described in this disclosure. Note that the detailed hexagonal cell shown in FIG. 50 is made up of six identical equilateral triangle segments, each positioned at a different 60-degree angle, and meeting in the center of the hexagonal cell. FIG. 51 shows one of those six triangle segments, which is showing the same area as the left side of FIG. 50. Side 5001 appears in both FIG. 50 and FIG. 51, to reinforce the connection between the two figures, and that FIG. 51 is a zoomed-in version of a section of FIG. 50. FIG. 51 is described in detail below, describing how each of the functions and procedures discussed in this disclosure may be implemented in hardware.

Each of the six triangle segments may be configured with identical components. There is one function that is dependent on relative positioning, and it pertains to the collision reporting rules and may be subject to special handling so that it can perform differently, depending on the triangle segment involved, and ultimately which part of the overall hexagonal cell is involved. As an example, a hexagonal cell may observe a collision of two ripple patterns, as shown in FIG. 9, and both the $S_0S_2$ and $S_3S_5$ cells have triangle segments noticing the collision of two ripple patterns whose directions are two apart (that is, 2 minus 0 is 2, and 5 minus 3 is also 2). The cell may determine autonomously which collision it is witnessing, and this may require directional orientation.

The relative positioning of the triangle segment, and therefore the relative positioning of the hexagonal cell, can be determined by the triangle segment itself if the voltage supply of the entire system comes from one direction only and is distributed throughout the grid of hexagonal cells consistently from that direction. For example, in a case where collision reporting rules utilize the direction of the pulse, with 0, 1, and 2 being of a different class than 3, 4, and 5 (e.g., the collision reporting rules described in table 5), an artificial intelligence system implemented based on this disclosure may, for example, distribute supply voltage through the "four direction", that is, direction=4, which, within the examples throughout this disclosure, has been a direction traveling from the southwest to the northeast. A hexagonal grid of cells can be supplied voltage at the edge cells of the grid of hexagons, each at their southwest edge. And each cell may pass the supply voltage to their neighbor to the northeast, such that every cell in the grid receives its supply voltage from the same general direction and therefore can determine its orientation. If it is convenient for design or manufacturing purposes to have every triangle segment be identical, then there may be voltage supply lines on every side of the hexagon, with voltage only supplied on one of the six voltage supply lines, to serve as both a power supply and an orientation mechanism.

The triangle segment on the southwest side of the hexagon can then supply a signal to each of its two neighbor triangles, with information that those triangles are also part of the [3, 4, 5] class, so that these triangle segments may handle the collision reporting rules slightly differently than the other three triangle segments. In other words, the hardware for each triangle segment may be identical, and differences in behavior may be achieved due to the direction of the voltage supply. Voltage may then be supplied to each of the components in each of the triangle segments of the hexagonal cell, with differences in behavior thanks to that initial direction detection of the supply voltage.

Turning now to the detailed triangle segment diagram of FIG. 51, since the side 5001 represents the left side of the hexagonal cell, signals traveling in the direction of west to east (direction=5) may enter the hexagonal cell on side 5001, while signals traveling in the direction of east to west (direction=2) may travel outward on side 5001, consistent with the directions used in other examples in this disclosure. On the upward edge of the clock signal, the transient signals may be copied from the neighboring hexagonal cell on the left (not shown) and placed into buffer 5102. Simultaneously, the transient signals may be copied from buffer 5103 to the buffer in the hexagonal neighboring cell on the left (not shown). Connection signals may flow freely without buffering.

On the downward edge of the clock signal, the triangle segment may perform logic on the buffered inputs, sending results to neighboring triangle segments of the same hexagonal cell, and arriving at the various other buffers in preparation for the next clock cycle.

The transient signals held in buffer 5102 consist of transient signals from the three subsystems: the processing grid (for example, an S-value, a P-value and a Y-value, or a Segment A, Segment B pair), as well as transient signals from the memory network (for example, a Segment A, Segment B pair and a Countdown value), and transient signals from the connection system (for example, a Segment A, Segment B pair and a prediction). Note that in a case where cells comprise triangular components such as shown in FIG. 51, the values stored in the triangular components may be a single value, rather than an array of length six such as shown in FIG. 2, FIG. 31, and FIG. 37. The transient signals may be groups of digital lines representing binary values, for example 8 lines, each representing one bit of a signal value ranging from −127 to 127, or 16 lines representing a larger range of integers. In the digital signal method, attenuation may be achieved by subtracting one from the intensity of the signal value. Or the transient signals may be single data lines storing values in an analog manner, with voltage representing the value, and attenuation performed using attenuation circuitry such as is commonly used in electronic devices.

One of the paths for the transient signal held at buffer 5102 is to 5104, where it may be processed (as discussed below) and ultimately exit the lower part of the triangle on the outbound line labeled "Transient Sigs 5", following the primary signal path as shown in FIG. 49: counterclockwise around the hexagon, to the next triangle segment.

The transient processing grid signal held at buffer 5102 may also be routed to collision detection and reporting module 5105, where it is compared to other signals which correspond to potential reportable collisions in the processing grid. In the case of processing grid transient signal with an index of 5 in the example of FIG. 51, based on the rules in table 5, reportable collisions may have an index of 2 (which is the opposite side of a hexagon from side 5), or also either of the sides adjacent to side 2 (which are sides 1 and 3). The signals entering the top of the collision detection and reporting module 5105 are the processing grid transient signals from sides 1, 3, and 2, respectively, reading from left to right in FIG. 51.

Collision detection and reporting module 5105 has an additional input, a class specification 5113, which may be determined by voltage distributor 5114. The class specification may allow the triangle segment to determine whether it is in the [0, 1, 2] class or [3, 4, 5] class, which is a factor in determining whether a collision is reportable, as specified in table 5. If the collision detection and reporting module 5105 determines that a reportable collision has occurred, (e.g., using the reporting rules of table 5) and with the knowledge that this triangle segment is processing direction=5 due to the direction of the supply voltage, then a signal may be passed to statistics module 5106, which may track statistics, such as by incrementing counters or utilizing estimators.

Based on the statistics compiled in statistics module 5106, a signal may be sent to connection combination module 5107 to establish a multi-bit cell. There are three connection combination modules, shown in a horizontal row on FIG. 51, including connection combination module 5107. Their function may be to combine the inputs coming into the top of the specific connection combination module 5107 and produce an outbound connection signal which will be passed to the next triangle segment. The connection system flags (shown as persistent values on FIG. 31) may reside in each of the connection combination modules 5107—one set of flags for each cross direction, and three sets of four flags total in the three connection combination modules 5107. These three sets of four flags may appear in each of the six triangle segments in their respective connection combination modules, representing the persistent value flags shown on FIG. 31.

The signal propagation processes for all three transient sub-systems may occur in the second triangle segment counterclockwise from where the transient signals initially enter the hexagonal cell. As was mentioned, transient signals 5 may flow from buffer 5102 to 5104, and ultimately out of the bottom of the triangle segment and into a second triangle segment not shown on FIG. 51. Likewise, transient signals 0 may flow into the top of the triangle segment depicted on FIG. 51, shown as Transient Sigs 0 5108, since the triangle segment shown in FIG. 51 is the second triangle segment from where transient signals 0 entered the hexagonal cell. These signals may flow down from 5108 and branch to three transient combination modules 5109 shown in a horizontal row on FIG. 51, where the routing logic and attenuation may occur for the various transient signals. Transient signals 0 (which enter the triangle segment at 5108) may propagate straight through when appropriate and may also propagate to direction 1 and 5, via the three transient combination modules 5109, two of which propagate signals at oblique angles, as specified by the propagation rules of the processing grid, memory network, and connection system.

Transient signals 0, which may enter the triangle segment at 5108 may also flow into each of three connection combination modules 5107, which is where the persistent value of the connection to the processing system flag may reside, labeled as "PG Con Flag 0" on FIG. 31. This facilitates alerts which may contain predictions. Connection modules 5107 may use these predictions to override a contradictory signal or as a replacement for a missing signal, as mentioned earlier in this disclosure.

Alerts may arrive on the Connection Sigs 5 IN line 5110. The various flags may control the path that the connection signals take. They may follow the primary counterclockwise signal path (shown in 4901) to connection combination module 5107 and out the bottom of this triangle segment, to the neighboring triangle segment. They may also branch off to prediction module 5111, where the statistics from statistics module 5106 can be combined with the alert signal value (positive or negative) to create a prediction. The prediction then flows to the right-most of the three transient combination modules 5109, where it may be combined with other information to create an outbound transient signal, in this case, transient signals 5, which is being processed in this triangle segment.

Similar to Transient signals 0, which enter the triangle segment at 5108, and potentially route straight through or at oblique angles via transient combination modules 5109, the Connection signals 0 also enter the top of the triangle segment, and also may route straight through or at oblique angles, via the three connection combination modules 5107.

As described earlier, voltage to the entire hexagonal cell may be initially supplied on only one of the six Voltage & Clocks IN lines shown in the simplified cell 4901 of FIG. 49. This may be done for directional orientation. The initially supplied voltage will follow its primary path around the hexagon (as shown on FIG. 49), flowing through three voltage distributors 5114 (on a different line as it passes through each voltage distributor) and flow out of the hexagonal cell on the opposite side.

Power also travels around the hexagon through the Common Voltages and Clocks 5115, to reach every triangle segment. The three triangle segments which have initially supplied voltage flowing through their voltage distributors 5114 may behave differently than the three that do not. This provides orientation to the cell and therefore enables collision detection rules such as those specified in table 5, which treat three triangle segments [0, 1, 2] differently than the other three [3, 4, 5].

In the example of FIG. 51, the voltage is supplied on the V&C 5 IN line 5112, and therefore would not be supplied on other voltage input lines of this hexagonal cell (not shown) such as V&C 0 IN, V&C 1 IN, V&C 2 IN, V&C 3 IN, or V&C 4 IN. Several of those lines, however, travel into the triangle segment shown in FIG. 51: V&C 0, V&C 1, and V&C 2, each of which may not provide supply voltage. The voltage supply provided by the V&C 5 IN line 5112 may travel to voltage distributor 5114, along with lines V&C 0 and V&C 1 which would not have voltage supplied.

If any of the three voltage supply lines flowing into the voltage distributor 5114 have non-zero voltage, this is an indication that this triangle segment is of the [3, 4, 5] class, which may affect the collision detection mechanism of collision detection and reporting module 5105. In the case of the triangle segment shown in FIG. 51, the three voltage supply lines flowing into the voltage distributor 5114 are, from right to left, V&C 5, V&C 0, and V&C 1, and, in this example, since voltage is only supplied into the hexagonal cell from west to east (that is, direction=5 of the hexagonal grid), of those three lines, only V&C 5 may contain supply voltage. As V&C 5 travels its primary path counterclockwise around the hexagonal cell, it may pass through three voltage distributors: the voltage distributor 5114 shown in FIG. 51, and the two voltage distributors of the next two neighboring triangles counterclockwise around the hexagonal cell. Each voltage distributor such as distributor 5114, may determine that each of these three triangle segments is a member of the [3, 4, 5] class thanks to voltage on V&C 5, and may pass that information via class specifier 5113 to the collision detection and reporting module 5105.

Another function of the voltage distributor 5114 may be to pass the voltage and clocks to the to the Common Voltage and Clocks 5115, so that voltage and clocks can be supplied to all components of all triangle segments of the hexagonal cell. A diode (or multiple diodes for multiple signals) within voltage distributor 5114 may be used to connect V&C 5 to Common Voltage and Clocks 5115, such that voltage and clock signals can flow one way, from the incoming supply, V&C 5, to Common Voltage & Clocks 5115. Such diodes may be configured to provide power to the Common Voltage and Clocks 5115 from the cell which initially receives power from an external source (e.g., when a cell receives power on the V&C 5 IN line 5112, then a diode in its voltage distributor 5114 would connect and provide power to the Common Voltage & Clocks 5115), or from other connected segments (e.g., cells could be configured so that the diodes in the voltage distributor 5114 would provide power to the Common Voltage and Clocks 5115 when those cells received power over a specific input to the voltage distributor 5114, such as V&C 5, V&C 0 or V&C 1).

Note that the Common Voltage and Clocks line is slightly different than other lines in the triangle segment shown in FIG. 51: most of the signals that enter the top of the triangular segment (such as Transient Sigs 0 5108) enter the top at a slight angle and then exit the bottom in a vertical line, to create a primary path that passes through the hexagonal cell, but Common Voltage & Clocks 5115 is an exception, and is simply a vertical line. This may allow the supply voltage and clocks to reach every triangle segment of the hexagonal cell. Although it is not labeled on FIG. 50, Common Voltage & Clocks 5115 shown in the triangle segment of FIG. 51 can be seen on FIG. 50 appearing in all six triangles of the hexagonal cell, and it is a continuous supply line reaching all six triangle segments, forming an inner hexagon within the hexagonal cell, traveling through six voltage distributors, one of which may provide the externally supplied voltage and clocks to the common voltage and clocks line, which reaches every triangle segment.

The above description is one example of a hardware design which may facilitate each function of the cellular automata based artificial intelligence system. Certain details have been omitted to communicate the high-level design more clearly. For example, the detailed designs of the specific components (such as buffer 5102 5103, collision detection and reporting module 5105, statistics module 5106, connection combination module 5107, transient combination module 5109, prediction module 5111, and voltage distributor 5114) have been omitted, but such designs will be apparent to those skilled in the art. Likewise, certain signals such as voltage, ground, clock, and clock/2 (for the memory network's every-other-pulse propagation) may be a part of the design, but are consolidated for clarity, and their implementation would be apparent to those skilled in the art. Further variations are also possible, and will be immediately apparent to one of skill in the art in light of this disclosure. Accordingly, the above description of an example hardware design should be understood as being illustrative only, and should not be treated as limiting.

Figure 52:
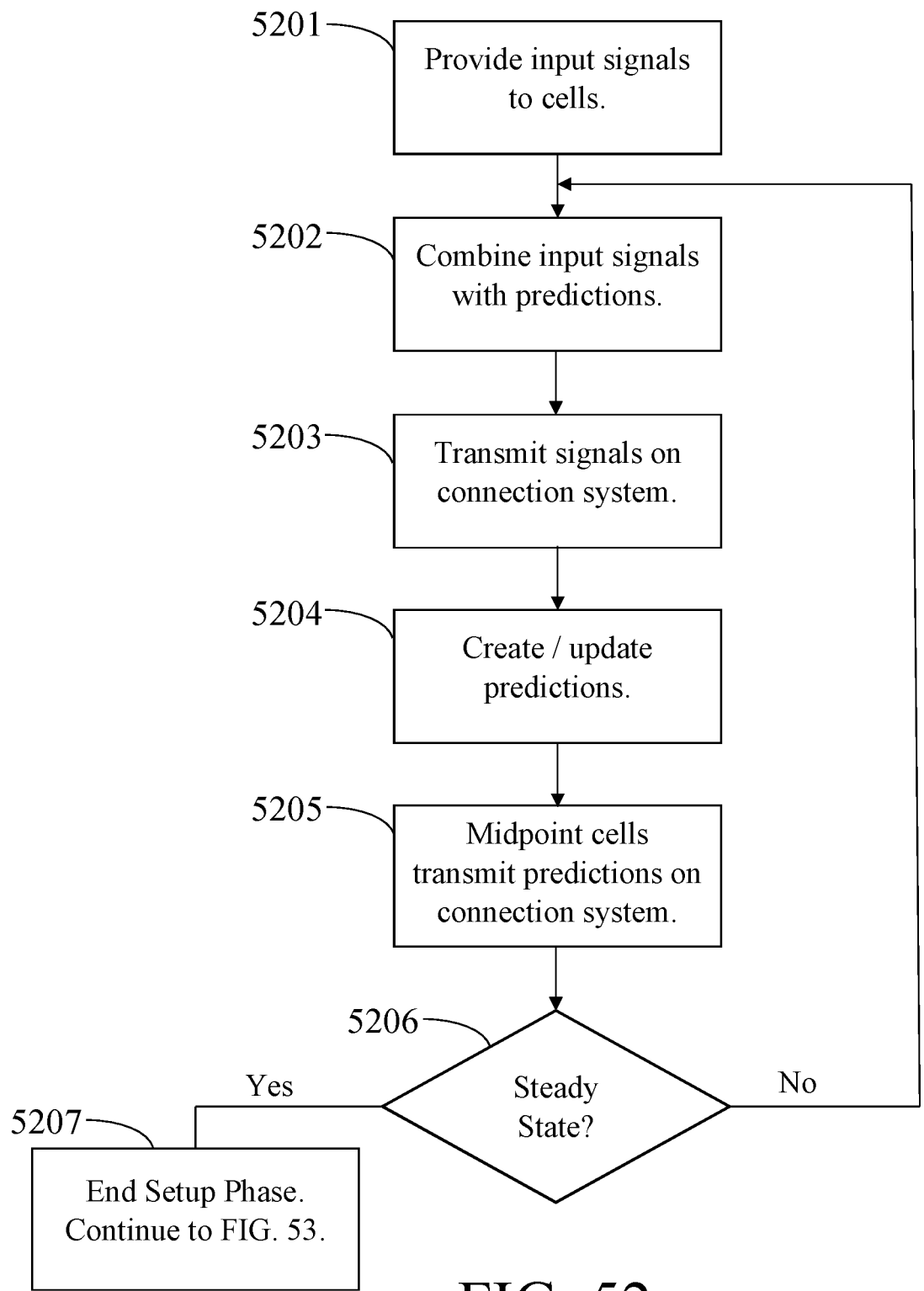
FIG. 52 depicts an illustrative process which may be a setup step for the overall Artificial Intelligence system, as input is received.
Figure 53:
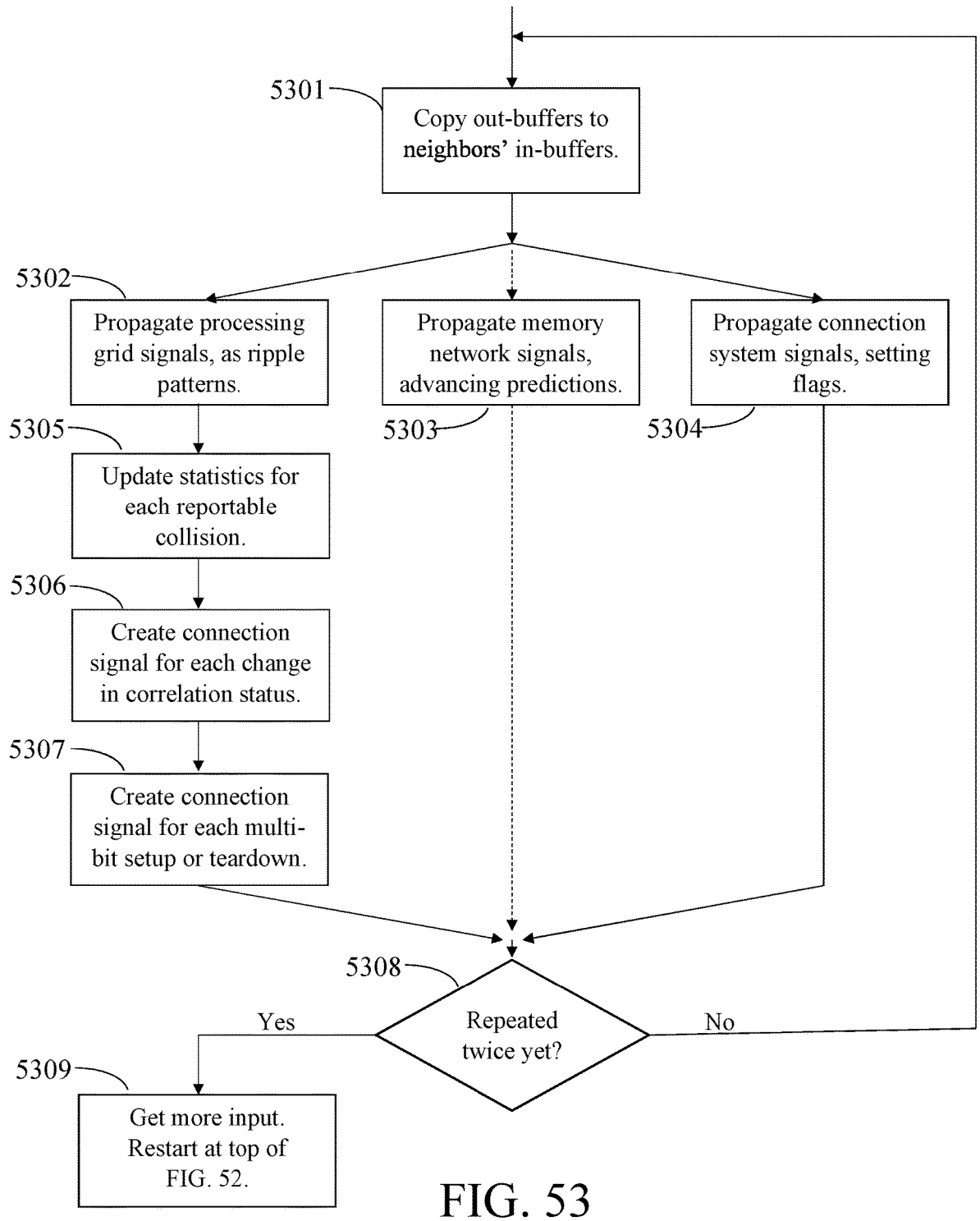
FIG. 53 depicts an illustrative process which may be used for propagation and prediction.

FIG. 52 and FIG. 53 provide a summary of a process of how a system may be implemented which propagates signals across multiple sub-systems (e.g., a processing grid, a memory network, and a connection system) resulting in statistics being gathered and connections being established. FIG. 52 illustrates a process of a setup phase. While the steps in the flowchart appear to be serial, these steps can be thought of as near instantaneous, similar to a hypothetical flowchart showing a first step of turning on a light switch on a wall, and a second step of the ceiling light turning on. When the setup steps are complete, the system arrives at an equilibrium (non-fluctuating) state.

Signals are provided to the cells of the system 5201, which is consistent with step 403 of FIG. 4. (FIG. 52 specifies input signals, just to further emphasize that these are the signals of the processing grid, and not signals of other sub-systems.) The signals provided at 5201 may be binary values and may be represented as either positive or negative. This may be a plurality of signals across the entire system. These signals are combined 5202 with predictions, which may override the input signal, or may provide a signal on the processing grid in cells that have not received an input signal, providing adjusted signals.

The adjusted signals are then transmitted on the connection system 5203, if there are connections located at the same cells as the adjusted signals. This allows the adjusted signals to arrive at other cells via the connection system, where they may generate new or updated predictions 5204. These predictions occur because of previously detected statistical correlations between the values of the adjusted signal and other cells within the system. If the predicting cell is a midpoint cell along a collision path, it may immediately transmit 5205 its prediction to the cell for which the prediction is relevant. This prediction can be combined immediately with an input signal or replace an input signal where none is present, causing a cascading effect 5206 where other cells are notified, which is why the flowchart is shown as a loop.

Once a steady state is achieved 5206 5207 in the setup phase, the process shown in FIG. 53 may be executed. Most of the steps in FIG. 53 may be executed twice, before returning to FIG. 52 for additional input data. The steps in FIG. 53 may start based on a clock pulse, where the first step 5301 is executed on the rising edge of the clock pulse. Step 5301 copies each cell's output buffers to its neighbors' input buffers, passing the transient values from cell to cell. Upon completion of this step, the data in the output buffers is no longer needed, and the cells may process all the transient data in their input buffers to reload the output buffers for the next time step.

The next three steps 5302, 5303, and 5304 may happen simultaneously. Step 5303 may only be executed every other time step, depicted with a dashed line. In step 5302, the signals for the processing grid may be propagated and attenuated appropriately as previously described. The result of this propagation may be a ripple pattern emerging from the input point, with the size growing and the intensity reducing, each time step. This may result in collisions of ripple patterns. Step 5305 updates the statistics for each reportable collision, using algorithms such as those described earlier to identify reportable collisions.

When statistics are updated, new correlations and suspected correlations which now appear spurious may be detected. In each case, a signal may be created for the connection system 5306, to set up or tear down a connection respectively.

Connection signals may also be generated to create or tear down connections to multi-bit cells 5307. These connections may enable the system to detect more complex patterns, which involve more than two bits.

Step 5303 propagates the transient memory network signals. The transient signals of the memory network may contain predictions. Each prediction is advanced toward the midpoint of the collision path one cell per every two time steps. Once the prediction arrives at the midpoint, it is immediately transmitted to the relevant cell via the connection system, as mentioned earlier 5205.

Step 5304 propagates the transient connection system signals, which may be used for setting up or tearing down connections. The connections are represented by a collection of flags stored in the cell, as shown in FIG. 31.

The steps 5301 through 5307 shown on FIG. 53 may be repeated twice 5308 (except for the propagation of the transient memory network signals 5303). Once the steps have been completed twice, the system is ready to process additional input 5309, and the setup steps of FIG. 52 can begin again.

To further illustrate potential variations on the ways the disclosed technology could be implemented, the below examples specify various non-exhaustive ways in which the teachings herein may be combined or applied. It should be understood that the following examples, like the other examples and variations set forth herein, are not intended to restrict the coverage of any claims that may be presented at any time in this document or any related document. No disclaimer is intended. The following examples are being provided for nothing more than merely illustrative purposes. It is contemplated that the various teachings herein may be arranged and applied in numerous other ways. It is also contemplated that some variations may omit certain features referred to in the below examples. Therefore, none of the aspects or features referred to below should be deemed critical unless otherwise explicitly indicated as such at a later date by the inventor or by a successor in interest to the inventor. If any claims are presented in this document or a related document that include additional features beyond those referred to below, those additional features shall not be presumed to have been added for any reason relating to patentability.

Example 1

A machine comprising a plurality of processing cells, wherein each cell from the plurality of processing cells is configured to: a) based on receiving an input signal, perform a set of input acts comprising sending a ripple pattern outward from that cell; b) receive ripple patterns sent from other cells comprised by the plurality of processing cells; c) determine that a signal collision has taken place based on simultaneously receiving a plurality of ripple patterns sent from other cells comprised by the plurality of processing cells; d) based on determining that the signal collision has taken place, determine whether to report the signal collision; and e) based on determining to report the signal collision, send signal collision information for the signal collision to a memory element.

Example 2

The machine of example 1, wherein: a) each cell from the plurality of processing cells: i) has a plurality of neighboring cells; ii) is configured to store a plurality of values for a first type of signal, wherein each value from the plurality of values for the first type of signal has a corresponding cell from the plurality of neighboring cells; iii) is configured to store a plurality of values for a second type of signal, wherein each value from the plurality of values for the second type of signal has a corresponding cell from the plurality of neighboring cells; iv) is configured to, upon receiving an update signal, perform propagation acts comprising: A) for each of a set of values stored by that cell for the first type of signal: I) sending the first type of signal to a neighboring cell which is colinear with that cell and with the neighboring cell which corresponds to that value for the first type of signal; II) sending the second type of signal to a neighboring cell which is not colinear with that cell and with the neighboring cell which corresponds to that value for the first type of signal; B) for each of a set of values stored by that cell for the second type of signal, sending the second type of signal to a neighboring cell which is colinear with that cell and with the neighboring cell which corresponds to that value for the second type of signal; and b) for each cell from the plurality of processing cells: i) sending the ripple pattern outward from that cell comprises sending the first type of signal to each neighboring cell corresponding to a value from the plurality of values of the first type of signal that that cell is configured to store; ii) that cell is configured with a first minimum intensity value for values stored by that cell for the first type of signal, and a second minimum intensity value for values stored by that cell for the second type of signal; and iii) determining that the signal collision has taken place based on simultaneously receiving the plurality of ripple patterns sent from other cells comprised by the plurality of processing cells comprises determining whether the total of: A) a number of values stored by that cell for the first type of signal which are not equal to the first minimum intensity value; and B) a number of values stored by that cell for the second type of signal which are not equal to the second minimum intensity value; is greater than one.

Example 3

The machine of example 2, wherein, for each cell from the plurality of processing cells: a) that cell is configured to, for each of the set of values stored by that cell for the first type of signal which is not equal to the first minimum intensity value, send the first type of signal to the neighboring cell which is colinear with that cell and with the neighboring cell which corresponds to that value for the first type of signal at an intensity obtained by applying a first modification to that value; b) that cell is configured to, for each of the set of values stored by that cell for the second type of signal which is not equal to the second minimum intensity value, send the first type of signal to the neighboring cell which is colinear with that cell and with the neighboring cell which corresponds to that value for the second type of signal at an intensity obtained by applying a second modification to that value; c) for each of the set of values stored by that cell for the first type of signal which is not equal to the first minimum intensity value, there exists a number of applications of the first modification to that value which results in an intensity equal to the first minimum intensity value; and d) for each of the set of values stored by that cell for the second type of signal which is not equal to the second minimum intensity value, there exists a number of applications of the second modification to that value which results in an intensity equal to the second minimum intensity value.

Example 4

The machine of any of examples 2-3, wherein: a) each cell from the plurality of processing cells is configured to store a plurality of values for a third type of signal, wherein each value from the plurality of values for the third type of signal corresponds to a cell from that cell's plurality of neighboring cells; and b) for each cell from the plurality of processing cells, the propagation acts comprise: i) in the event that that cell stores any values for the first type of signal which are not equal to the first minimum intensity value, for each of those values, sending the third type of signal to the neighboring cell which is not colinear with that cell and with the neighboring cell which corresponds to that value for the first type of signal; and ii) in the event that that cell stores any values for the second type of signal which are not equal to the second minimum intensity value, for each of those values, sending the third type of signal to the neighboring cell which is colinear with that cell and with the neighboring cell which corresponds to that value for the second type of signal.

Example 5

The machine of example 4, wherein, for each cell from the plurality of processing cells, the propagation acts comprise: a) when sending the third type of signal based on that cell storing a value for the first type of signal not equal to the first minimum intensity value, sending the third type of signal with a value based on the value for the first type of signal not equal to the first minimum intensity value; and b) when sending the third type of signal based on that cell storing a value for the second type of signal not equal to the second minimum intensity value, sending the third type of signal with the value based on the value for the first type of signal not equal to the first minimum intensity value.

Example 6

The machine of any of examples 1-5, wherein: a) each cell from the plurality of processing cells is configured to store data indicating if input to that cell is correlated with subsequent input at a different cell from the plurality of processing cells; b) each cell from the plurality of processing cells is configured to, based on receiving the input signal: i) determine whether input to that cell is correlated with simultaneous or subsequent input at the different cell; and ii) in the event that input to that cell is correlated with simultaneous or subsequent input at the different cell, send an alert to the different cell.

Example 7

The machine of any of examples 1-6, wherein: a) the cells from the plurality of processing cells are organized in an array consisting of edge cells and non-edge cells; b) each of the non-edge cells in the array has six neighboring cells; and c) each of the edge cells in the array has less than six neighboring cells.

Example 8

The machine of example 7, wherein each of the cells from the plurality of processing cells is a hardware element having a hexagonal body.

Example 9

The machine of any of examples 1-8, wherein, for each cell from the plurality of processing cells, that cell is configured to send signal collision information for the signal collision to the memory element by sending the signal collision information to a memory element which is comprised by that cell.

Example 10

The machine of any of examples 1-9, wherein, for each cell from the plurality of processing cells, that cell is configured to send signal collision information for the signal collision to the memory element by sending the signal collision information to a cell which is not comprised by the plurality of processing cells.

Example 11

The machine of any of examples 1-10, wherein: a) the plurality of processing cells comprises a set of single bit cells and a set of multi-bit cells; b) for each cell from the set of single bit cells, the machine comprises a connection between that cell and a corresponding binary value from a set of binary values; and c) for each cell from the set of multi-bit cells: i) that multi-bit cell is associated with a first cell from the plurality of processing cells, and a second cell from the plurality of processing cells; ii) the machine comprises logic configured to: A) maintain an association between that multi-bit cell and a trigger condition, and an association between that multi-bit cell and an input function; and B) only in the event that the trigger condition associated with that multi-bit cell is satisfied, provide that multi-bit cell an input signal defined based on the input function associated with that multi-bit cell.

Example 12

The machine of example 11, wherein the machine comprises new multi-bit cell definition logic configured to: a) determine whether data from a plurality of collisions between ripple patterns originating from a first origin cell from the plurality of processing cells and ripple patterns originating from a second origin cell from the plurality of processing cells satisfies a multi-bit cell creation condition; and b) based on determining that data from the plurality of collisions between ripple patterns originating from the first origin cell and ripple patterns originating from the second origin cell satisfies the multi-bit cell creation condition, expanding the set of multi-bit cells to include a plurality of new multi-bit cells by performing multi-bit cell definition acts comprising: i) defining a plurality of new trigger conditions, wherein each new trigger condition is based on an input signal provided to the first origin cell; and ii) defining a set of new input functions, wherein each new input function is based on an input signal provided to the second origin cell; and iii) for each of the plurality of new multi-bit cells, establishing an association between that new multi-bit cell and: A) the first origin cell as the first cell associated with that multi-bit cell; B) the second origin cell as the second cell associated with that multi-bit cell; C) a new trigger condition from the plurality of new trigger conditions; and D) a new input function from the set of new input functions.

Example 13

The machine of example 12, wherein defining the plurality of new multi-bit cells comprises: a) associating a first new multi-bit cell with: i) a first new trigger condition, wherein the first new trigger condition is satisfied when the input signal provided to the first origin cell is greater than a threshold, and is not satisfied when the input signal provided to the first origin cell is less than the threshold; and ii) a new input function which defines the input signal to that multi-bit cell as being equal to the input signal provided to the second origin cell; and b) associating a second new multi-bit cell with: i) a second new trigger condition, wherein the second new trigger condition is satisfied when the input signal provided to the first origin cell is less than the threshold, and is not satisfied when the input signal provided to the first origin cell is greater than the threshold; and ii) the new input function which defines the input signal to that multi-bit cell as being equal to the input signal provided to the second origin cell.

Example 14

The machine of any of examples 11-13, wherein, for at least one multi-bit cell from the set of multi-bit cells, at least one of: a) the first cell associated with that multi-bit cell; and b) the second cell associated with that multi-bit cell is comprised by the set of multi-bit cells.

Example 15

The machine of any of examples 12-14, wherein: a) the plurality of processing cells are comprised by a grid; and b) the multi-bit cell definition acts comprise, for each of the plurality of new multi-bit cells, determining a location for that multi-bit cell in the grid, wherein the location is offset an even number of cells from a path between the first origin cell and the second origin cell.

Example 16

The machine of any of examples 12-15, wherein, for each multi-bit cell from the set of multi-bit cells, the logic configured to maintain the association between that multi-bit cell and the trigger condition associated with that multi-bit cell and the association between that multi-bit cell and the input function associated with that multi-bit cell is encoded in a triggering cell associated with that multi-bit cell: a) having a connection to that multi-bit cell; and b) being configured to, based on signal collision information being sent to a memory element comprised by the triggering cell associated with that multi-bit cell: i) determining whether the trigger condition associated with that multi-bit cell is satisfied; and ii) only in the event that the trigger condition associated with that multi-bit cell is satisfied, send the input signal defined based on the input function associated with that multi-bit cell to that multi-bit cell via the connection to that multi-bit cell comprised by that triggering cell.

Example 17

The machine of example 16, wherein the new multi-bit cell definition logic is implemented based on, for each cell comprising a memory element to which a cell from the plurality cells is configured to send signal collision information, that cell being configured to: a) store the data from the plurality of collisions between ripple patterns originating from the first origin cell and the second origin cell; b) determine whether the data from the plurality of collisions between ripple patterns originating from the first origin cell and the second origin cell satisfies the multi-bit cell creation condition; c) performing the multi-bit cell definition acts; and d) when expanding the set of multi-bit cells to include the plurality of new multi-bit cells by performing the multi-bit cell definition acts, establishing that cell as the triggering cell for each of the plurality of new multi-bit cells.

Example 18

The machine of any of examples 12-17, wherein determining whether data from the plurality of collisions between ripple patterns originating from the first origin cell from the plurality of processing cells and ripple patterns originating from the second origin cell from the plurality of processing cells satisfies the multi-bit cell creation condition is based on an absolute value of a correlation between ripple patterns from the first origin cell and ripple patterns from the second origin cell being less than a correlation threshold.

Example 19

The machine of example 18, wherein the new multi-bit cell definition logic is configured to determine the correlation threshold based on a number of reported signal collisions which are detected based on simultaneously receiving: a) a ripple pattern originating from the first origin cell; and b) a ripple pattern originating from the second origin cell.

Example 20

The machine of example 19, wherein the number of reported signal collisions is an estimated number of reported signal collisions.

Example 21

The machine of any of examples 12-20, wherein determining whether data from the plurality of collisions between ripple patterns originating from the first origin cell from the plurality of processing cells and ripple patterns originating from the second origin cell from the plurality of processing cells satisfies the multi-bit cell creation condition is based on a random value.

Example 22

The machine of example 21, wherein determining whether data from the plurality of collisions between ripple patterns originating from the first origin cell from the plurality of processing cells and ripple patterns originating from the second origin cell from the plurality of processing cells satisfies the multi-bit cell creation condition based on the random value comprises: a) determining a correlation threshold based on the random value; and b) determining whether an absolute value of a correlation between ripple patterns from the first origin cell and ripple patterns from the second origin cell is less than the correlation threshold.

Example 23

The machine of any of examples 11-22, wherein for each cell from the set of multi-bit cells: a) the trigger condition for that cell is based on an input signal provided to a first origin cell; b) the input function for that cell is based on an input signal provided to a second origin cell; and c) the machine comprises multi-bit cell removal logic configured to: i) determine whether data from a plurality of collisions between ripple patterns originating from the first origin cell and ripple patterns originating from the second origin cell satisfy a multi-bit cell removal condition; and ii) based on determining that the data from the plurality of conditions between ripple patterns originating from the first origin cell and ripple patterns originating from the second origin cell satisfy the multi-bit cell removal condition, remove that multi-bit cell from the set of multi-bit cells.

Example 24

The machine of example 23, wherein determining whether data from the plurality of collisions between ripple patterns originating from the first origin cell and ripple patterns originating from the second origin cell satisfy the multi-bit cell removal condition is based on an absolute value of a correlation between ripple patterns from the first origin cell and ripple patterns from the second origin cell being greater than a tear down threshold.

Example 25

The machine of any of examples 11-24, wherein: a) the machine comprises a mapping module; b) the mapping module comprises: i) for each cell from the plurality of processing cells, the connection between that cell and the corresponding binary value from the set of binary values; and ii) for each cell from the set of multi-bit cells: A) the association between that cell and the associated trigger condition; B) the association between that cell and the associated input function; C) the logic configured to, only in the event that the trigger condition associated with that cell is satisfied, provide that cell the input signal defined based on the input function associated with that cell.

Example 26

The machine of any of examples 1-25, wherein: a) the machine comprises a plurality of memory cells; b) for each processing cell from the plurality of processing cells: i) that processing cell is configured to determine whether a relationship has been established for that processing cell, wherein the relationship is a relationship between input signals received by that processing cell and input signals received by another processing cell from the plurality of processing cells; ii) the set of input acts comprises, in the event it is determined that the relationship has been established, send an input signal communication to a memory cell from the plurality of memory cells; and c) for each memory cell from the plurality of memory cells, that memory cell is configured to: i) maintain relationship data comprising data identifying: A) a first processing cell; B) a second processing cell; and C) a time offset, wherein the time offset is a length of time between input signals received at the first processing cell and subsequent input signals received at the second processing cell; and ii) send a predicted input signal to the second processing cell for receipt after the time offset has elapsed, based on the input signal communication.

Example 27

The machine of example 26, wherein, for each memory cell from the plurality of memory cells, that memory cell is configured to determine a value for the predicted input signal to send to the second processing cell based on: a) a value of the input signal communication; and b) the relationship data.

Example 28

The machine of any of examples 26-27, wherein, for each memory cell from the plurality of memory cells, that memory cell is configured to send the predicted input signal to the second processing cell for receipt after the time offset has elapsed by performing acts comprising: a) using a counter to determine when a countdown period has elapsed, wherein the countdown period is a period equal to the time offset and starting on receipt of the input signal by the first processing cell; and b) upon elapse of the countdown period, sending the predicted input signal to the second processing cell.

Example 29

The machine of any of examples 26-28, wherein, for each memory cell from the plurality of memory cells, that memory cell is configured to send the predicted input signal to the second processing cell for receipt after the time offset has elapsed by sending the predicted input signal to the second processing cell with information indicating when a period equal to the time offset and starting on receipt of the input signal by the first processing cell will have elapsed.

Example 30

The machine of any of examples 26-29, wherein, for each memory cell from the plurality of memory cells, that memory cell is configured to send the predicted input signal to the second processing cell for receipt after the time offset has elapsed probabilistically, based on confidence data comprised by the relationship data.

Example 31

The machine of any of examples 26-30, wherein, for each processing cell from the plurality of processing cells: a) that processing cell is configured to receive a repeating clock signal; and b) upon receiving both the input signal and the predicted input signal on a single repetition of the clock signal, that processing cell is configured to discard the input signal and send the ripple pattern outward based on the predicted input signal.

Example 32

The machine of any of examples 26-31, wherein: a) the machine comprises a plurality of connection cells; and b) for each processing cell from the plurality of processing cells: i) that processing cell has a corresponding connection cell from the plurality of connection cells; ii) that processing cell is configured to determine whether the relationship has been established for that processing cell by determining if that processing cell has a connection to its corresponding connection cell; iii) the relationship has been established for that processing cell if that processing cell has the connection to its corresponding connection cell; and iv) that processing cell is configured to send the input signal communication to the memory cell by providing the input signal communication on the connection to its corresponding connection cell.

Example 33

The machine of example 32, wherein: a) the machine comprises a plurality of multi-purpose cells; b) each cell from the plurality of multi-purpose cells comprises a cell from the plurality of processing cells, a cell from the plurality of memory cells, and a cell from the plurality of connection cells, wherein the cell from the plurality of processing cells is the same cell as the cell from the plurality of memory cells, the cell from the plurality of memory cells is the same cell as the cell from the plurality of connection cells, and the cell from the plurality of connection cells is the same cell as the cell from the plurality of processing cells.

Example 34

The machine of any of example 32-33, wherein: a) for each processing cell from the plurality of processing cells: i) that processing cell has a corresponding memory cell from the plurality of memory cells; ii) the memory element to which that processing cell is configured to send signal collision information is comprised by that processing cell's corresponding memory cell; iii) that processing cell is configured to send signal collision information to the memory element by sending the signal collision information to that processing cell's corresponding memory cell; b) for each memory cell from the plurality of memory cells, that memory cell has a corresponding connection cell from the plurality of connection cells; c) the machine is configured to establish connections between related processing cells from the plurality of processing cells based on: i) upon a memory cell determining that a connection creation condition is satisfied, that memory cell sending collision description information to its corresponding connection cell; and ii) each connection cell being configured to: A) upon receiving collision description information identifying from its corresponding memory cell, wherein the collision description information defines a first target origin and a second target origin: I) propagate a first set of transient values to a first neighboring connection cell; and II) propagate a second set of transient values to a second neighboring connection cell; wherein each of the first set of transient values and the second set of transient values has a target origin and a direction of travel, wherein the first target origin is the target origin for the first set of transient values, and wherein the second target origin is the target origin for the second set of transient values; and B) based on receiving a propagated set of transient values which indicates further propagation is necessary to reach a target origin for that propagated set of transient values: I) determine persistent values for that connection cell based on that propagated set of transient values; II) attenuate that propagated set of transient values; and III) propagate that propagated set of transient values to another neighboring connection cell.

Example 35

The machine of example 34, wherein, for each connection cell, that connection cell is configured to, upon receiving a propagated set of transient values which indicates that that connection cell is the target origin for that propagated set of transient values, establish a connection between that connection cell and the corresponding processing cell for that connection cell.

Example 36

The machine of example 35, wherein, for each connection cell, that connection cell is configured to: a) upon receiving the propagated set of transient values which indicates that that connection cell is the target origin for that propagated set of transient values, propagate that set of transient values with a value indicating that the target origin for that set of transient values has already been reached; and b) upon receiving the propagated set of transient values with the value indicating that the target origin for that set of transient values has already been reached, propagate that set of transient values to another neighboring connection cell without determining persistent values for that connection cell based on that set of transient values.

Example 37

The machine of any of examples 34-36, wherein, for each connection cell, that connection cell is configured to, based on receiving the propagated set of transient values which indicates further propagation is necessary to reach the target origin for that propagated set of transient values: a) determine whether a path to the target origin for that propagated set of transient values should change to a new direction of travel at that connection cell; b) based on determining that the path from the target origin for that propagated set of transient values should not change to the new direction of travel at that connection cell, propagate that propagated set of transient values to another neighboring connection cell by propagating that propagated set of transient values to a neighboring connection cell in the direction of travel for that propagated set of transient values; and c) based on determining that the path from the target origin for that propagated set of transient values should change to the new direction of travel at that connection cell, propagate that propagated set of transient values to a neighboring connection cell in the new direction of travel for that propagated set of transient values.

Example 38

The machine of example 37, wherein the first set of transient values and the second set of transient values comprises: a) a first value indicating a straight line distance on the path to the target origin for that set of transient values in the direction of travel for that set of transient values; and b) a second value indicating: i) whether the path to the target origin for that set of transient values changes to the new direction of travel; and ii) when the path to the target origin for that set of transient values changes to the new direction of travel, both the new direction of travel and a straight line distance on the path to the target origin for that set of transient values in the new direction of travel.

Example 39

The machine of example 38, wherein the first set of transient values and the second set of transient values each comprise a third value indicating: a) whether the path to the target origin for that set of transient values crosses a midpoint, wherein the midpoint is the midpoint of a second path, wherein the second path is a path between the target origin for the first set of transient values and the target origin for the second set of transient values; and b) when the path to the target origin for that set of transient values crosses the midpoint, a distance to the midpoint on the path to the target origin for that set of transient values.

Example 40

The machine of example 39, wherein the first value, the second value and the third value are all integer values.

Example 41

The machine of any of examples 38-40, wherein, for each connection cell, that connection cell is configured to, based on determining that the path from the target origin for that propagated set of transient values should change to the new direction of travel at that connection cell, determine the new direction of travel based on the direction of travel for that propagated set of transient values and a sign of the second value.

Example 42

The machine of any of examples 38-41, wherein, for each connection cell, that connection cell is configured to, based upon receiving the propagated set of transient values which indicates further propagation is necessary to reach the target origin for that propagated set of transient values: a) determine whether the path to the target origin for that propagated set of transient values should change to the new direction of travel at that connection cell by determining whether both of the following statements are true: i) attenuating the first value results in the first value having an absolute value of zero; ii) the second value does not have an absolute values of zero; and b) attenuating that propagated set of transient values comprises reducing the absolute value of the first value by one.

Example 43

The machine of any of examples 38-42, wherein, for each connection cell, that connection cell is configured to, based on receiving the propagated set of transient values which indicates further propagation is necessary to reach the target origin for that propagated set of transient values and on determining that the path to the target origin for that propagated set of transient values should change to the new direction of travel at that connection cell, before propagating that set of transient values to a neighboring cell: a) setting the first value equal to the absolute value of the second value; b) setting the second value equal to zero.

Example 44

The machine of any of examples 38-43, wherein, for each connection cell, that connection cell is configured to determine, based on receiving the propagated set of transient values, that that propagated set of transient values indicates further propagation is necessary to reach the target origin for that propagated set of transient values by determining whether the sum of: a) an absolute value of the first value after attenuation; and b) an absolute value of the second value before attenuation; is equal to zero.

Example 45

The machine of any of examples 37-44, wherein, for each connection cell, determining persistent values for that connection cell based on receiving the propagated set of transient values which indicates further propagation is necessary to reach the target origin for that propagated set of transient values comprises: a) based on determining that the path from the target origin for that propagated set of transient values should change to the new direction of travel at that connection cell, establish a connection between neighboring connection cells by establishing a connection between: i) the connection cell from which that set of transient values was propagated; and ii) the neighboring connection cell in the new direction of travel for that propagated set of transient values; and b) based on determining that the path from the target origin for that propagated set of transient values should not change to the new direction of travel at that connection cell, establish a connection between neighboring connection cells by establishing a connection between: i) the connection cell from which that set of transient values was propagated; and ii) the neighboring connection cell in the direction of travel for that propagated set of transient values.

Example 46

The machine of example 45, wherein, for each connection cell, establishing a connection between neighboring connection cells comprises closing a switch in that connection cell establishing a direct communication path between the neighboring connection cells.

Example 47

The machine of any of examples 32-46, wherein: for each memory cell: i) that memory cell has a corresponding connection cell from the plurality of connection cells; ii) the corresponding connection cell for that memory cell is on a corresponding collision path, wherein the corresponding collision path is a path between: A) the corresponding connection cell for the first processing cell identified in the relationship data maintained by that memory cell; and B) the corresponding connection cell for the second processing cell identified in the relationship data maintained by that memory cell; b) for every memory cell in a collision set, the corresponding collision path for that memory cell is the same as the corresponding collision path for every other memory cell from the collision set, wherein the collision set is all memory cells: i) whose first processing cell is the same as the first processing cell for all other memory cells in the collision set; and ii) whose second processing cell is the same as the second processing cell for all other memory cells in the collision set.

Example 48

The machine of example 47, wherein, for each memory cell from the plurality of memory cells, that memory cell is configured to send the predicted input signal to the second processing cell by sending the predicted input signal to the corresponding connection cell for that memory cell.

Example 49

The machine of example 48, wherein: a) the machine comprises a set of collision sets; b) for each collision set from the set of collision sets: i) one memory cell from that collision set is a terminal memory cell; ii) the connection cell corresponding to the terminal memory cell from that collision set is configured to send the predicted input signal from the terminal memory cell to the connection cell corresponding to the second processing cell identified in the relationship data maintained by the terminal memory cell; and iii) the connection cell corresponding to the second processing cell identified in the relationship data maintained by the terminal memory cell is configured to send the predicted input signal received from the connection cell corresponding to the terminal memory cell to the second processing cell identified in the relationship data maintained by the terminal memory cell.

Example 50

The machine of example 49, wherein, for each collision set from the set of collision sets, for each memory cell in that collision set other than the terminal memory cell, the connection cell corresponding to that memory cell is configured to: a) send the predicted input signal received from its corresponding memory cell to a neighboring connection cell which corresponds to a different memory cell from the collision set; and b) send, to that memory cell, the predicted input signal received from another connection cell corresponding to another memory cell from that collision set.

Example 51

The machine of example 50, wherein, for each collision set from the set of collision sets: a) that collision set comprises an initial memory cell; and b) for each memory cell in that collision set, that memory cell is configured to: i) send the predicted input signal to the second processing cell for receipt after the time offset has elapsed based on the input signal communication by: A) generating the predicted input signal that memory cell is configured to send based on the relationship data maintained by that memory cell; and B) sending the generated predicted input signal to the corresponding connection cell for that memory cell; ii) based on receiving an incoming predicted input signal from the connection cell corresponding to that memory cell, generating the predicted input signal that memory cell is configured to send based on the relationship data maintained by that memory cell by generating the predicted input signal that memory cell is configured to send based on both: A) the relationship data maintained by that memory cell; and B) the incoming predicted input signal received from the connection cell corresponding to that memory cell.

Example 52

The machine of example 51, wherein for each collision set from the set of collision sets, for each memory cell in that collision set: a) the predicted input signal that memory cell is configured to send comprises a predicted input signal confidence and a predicted input signal value; b) generating the predicted input signal that memory cell is configured to send comprises determining both the predicted input signal confidence and the predicted input signal value based on: i) the relationship data maintained by that memory cell; ii) a predicted input signal value of the incoming predicted input signal; and iii) the predicted input signal confidence of the incoming predicted input signal.

Example 53

The machine of any of examples 50-52, wherein, for each collision set from the set of collision sets: a) for each memory cell from that collision set, the corresponding connection cell for that memory cell is separated from the corresponding connection cell for the second processing cell identified in the relationship data maintained by the terminal memory cell by a corresponding distance along the corresponding collision path; b) the corresponding distance for the connection cell corresponding to the terminal memory cell is greater than the corresponding distance for the connection cell corresponding to any other memory cell in that collision set; and c) for each memory cell in that collision set other than the terminal memory cell, the neighboring connection cell to which the connection cell corresponding to that memory cell is configured to send the predicted input signal has a greater corresponding distance than the connection cell corresponding to that memory cell.

Example 54

The machine of any of examples 1-53, wherein, for each cell from the plurality of processing cells, the memory element that cell is configured to send signal collision information to based on determining to report the signal collision is a means for probabilistically tracking a ratio of observations.

Example 55

A machine comprising a set of estimator modules, wherein each estimator module comprises: a) a random number generator; b) an observation input connection; c) circuitry configured to determine, based on an output of the random number generator, whether an observation signal on the observation input connection should be ignored for purposes of adjusting a number of observations associated with that estimator module; and d) circuitry configured to determine, based on the output of the random number generator, whether the observation signal on the observation input connection should be ignored for purposes of adjusting an observation value associated with that estimator module.

Example 56

The machine of example 55, wherein the machine comprises a set of estimators, wherein, for each estimator: a) that estimator comprises one or more estimator modules from the set of estimator modules; b) each estimator module comprised by that estimator is part of a chain which connects each estimator module comprised by that estimator and which does not include any estimator modules comprised by any other estimator; and c) for each estimator module comprised by that estimator: i) the number of observations associated with that estimator module is a number of observations corresponding to that estimator; and ii) the observation value associated with that estimator module is an observation value corresponding to that estimator.

Example 57

The machine of example 56, wherein the machine comprises circuitry configured to determine, for each estimator, the number of observations corresponding to that estimator based on how many estimator modules are comprised by that estimator.

Example 58

The machine of claim 57, wherein, for each estimator from the set of estimators: a) each estimator module comprised by that estimator comprises: i) an extends in connection; ii) an extends out connection; iii) an extends out storage element, wherein the extends out storage element stores a value indicating if that estimator module is connected to another estimator module via the extends out connection; b) for each estimator module comprised by that estimator except for a head estimator module, that estimator module is connected to another estimator module comprised by that estimator via the extends in connection; and c) for each estimator module comprised by that estimator except for a tail estimator module, that estimator module is connected to another estimator module comprised by that estimator via the extends out connection.

Example 59

The machine of example 58, wherein, for each estimator from the set of estimators, for each estimator module comprised by that estimator, that estimator module comprises circuitry for determining, based on the output of the random number generator, whether the observation signal on the observation input connection should be ignored for purposes of adjusting the number of observations associated with that estimator module by determining whether to prevent a connection from being established from the tail estimator module comprised by that estimator to another estimator module via the extends out connection of the tail estimator module comprised by that estimator.

Example 60

The machine of example 59, wherein, for each estimator from the set of estimators, for each estimator module comprised by that estimator: a) that estimator module is configured to determine that it is the tail estimator module based on the extends out storage element storing a value indicating that estimator module is not connected to another estimator module via the extends our connection; b) that estimator module is configured to, based on: i) determining that the observation signal on the observation input connection should not be ignored for purposes of adjusting the number of observations associated with that estimator module; and ii) determining that that estimator module is the tail estimator module; connect to another estimator module via the extends out connection.

Example 61

The machine of any of examples 58-60, wherein, for each estimator, for each estimator module comprised by that estimator: unless that estimator module is the tail estimator module, that estimator module is configured to: i) based on determining that the observation signal on the observation input connection should be ignored for purposes of adjusting the number of observations associated with that estimator module, send a no extend signal to the estimator module connected via the extends out connection, wherein the no extend signal indicates that the observation signal on the observation input connection should be ignored for purposes of adjusting the number of observations associated with that estimator module; and ii) based on receiving the no extend signal, send the no extend signal to the estimator module connected via the extends out connection; and b) that estimator module is configured to ignore the observation signal on the observation input connection for purposes of adjusting the number of observations associated with that estimator module based on receiving the no extend signal.

Example 62

The machine of any of examples 57-61, wherein the circuitry configured to determine, for each estimator from the set of estimators, the number of observations corresponding to that estimator based on the number of estimator modules comprised by that estimator, is configured to, for each estimator from the set of estimators, calculate the number of observations corresponding to that estimator as an estimate equal to $2^{(m+1)}-2$, wherein m is a cardinality value of a set consisting of the one or more estimator modules comprised by that estimator.

Example 63

The machine of any of examples 56-62, wherein: a) each estimator module from the set of estimator modules comprises an observation memory element; and b) the machine comprises circuitry configured to determine, for each estimator, the observation value corresponding to that estimator based on values stored in the observation memory elements comprised by that estimator.

Example 64

The machine of example 63, wherein: a) for each estimator module from the set of estimator modules, the observation memory element comprised by that estimator module stores a binary value having a length equal to a uniform length; b) the circuitry configured to determine, for each estimator, the observation value corresponding to that estimator, is configured to make that determination by: i) defining a highest order portion of a binary representation of the observation value corresponding to that estimator as equal to a value stored in the observation memory element of a head estimator module comprised by that estimator; and ii) for each estimator module comprised by that estimator other than the head estimator module, defining a portion associated with that estimator module as equal to the value stored in the observation memory element of that estimator module, wherein the portion associated with that estimator module is a portion of the binary representation of the observation value corresponding to that estimator which is separated from the highest order portion by a product of the uniform length and a number of estimator modules separating that estimator module from the head estimator module in the chain which connects each estimator module comprised by that estimator.

Example 65

The machine of example 64, wherein the uniform length is one bit.

Example 66

The machine of any of examples 64-65, wherein for each estimator, for each estimator module comprised by that estimator: a) that estimator module is configured to update the value stored in the observation memory element by making that value equal to observation signal on the observation input connection when that estimator module is first added to that estimator by being connected to another estimator module which is part of the chain connecting each estimator module comprised by that estimator; b) that estimator module comprises circuitry configured to update the value stored in the observation memory element by performing an inversion operation based on: i) receiving a signal from another estimator module comprised by that estimator indicating that no other estimator module had determined that the observation signal on the observation input connection should be ignored for purposes of adjusting the observation value associated with that estimator module; ii) that estimator module determining that the observation signal on the observation input connection should not be ignored for purposes of adjusting the observation value associated with that estimator module; and iii) that estimator module determining that it is a tail estimator module in the chain connecting each estimator module comprised by that estimator; wherein the inversion operation changes the value stored in the observation memory element from an original value to an updated value by inverting the original value; c) that estimator module comprises circuitry configured to update the value stored in the observation memory element by performing the inversion operation based on receiving a carry signal from another estimator module comprised by the chain which connects each estimator module comprised by that estimator; and d) that estimator module comprises circuitry configured to send the carry signal to a higher order estimator module based on: i) completing the inversion operation; and ii) the original value of the value stored in the observation memory element not being equal to the observation signal on the observation input connection, wherein the higher order estimator module is comprised by the chain which connects each estimator module comprised by that estimator, and is separated from the tail estimator module by more estimator modules than that estimator module.

Example 67

The machine of any of examples 65-66, wherein, for at least one estimator from the set of estimators: a) that estimator has an associated tree structure which comprises a set of nodes, wherein: i) the set of nodes comprises a subset of nodes, ii) for each node from the subset of nodes, that node is connected to a terminal set of estimator modules, wherein each estimator module from the terminal set of estimator modules connected to that node is comprised by that estimator; b) for each node from the set of nodes: i) except for a root node, each node from the set of nodes is connected to one parent node in the set of nodes; and ii) that node is connected to a set of children, wherein: A) for each node from the set of nodes, the set of children for that node comprises a first subset of children and a second subset of children, wherein the first subset of children and the second subset of children are disjoint; B) for each node from the subset of nodes, the set of children for that node comprises the set of estimator modules connected to that node; and C) for each node from the set of nodes other than nodes in the subset of nodes, the set of children for that node consists of other nodes from the set of nodes; and c) the machine comprises circuitry configured to, for any node on a shortest path between the root node and a target estimator module, based on one or more values stored by that node, identify a child of that node which is also on the shortest path between the root node and the target estimator module, for each of the following target estimator modules: i) an estimator module which stores a value representing a lowest order portion of the binary representation of the observation value corresponding to that estimator; ii) an estimator module which stores a value representing a lowest order 0 in the binary representation of the observation value corresponding to that estimator; and iii) an estimator module which stores a value representing a lowest order 1 in the binary representation of the observation value corresponding to that estimator.

Example 68

The machine of any of examples 63-67, wherein: a) for each estimator module from the set of estimator modules, the observation memory element comprised by that estimator module is a tri-state memory element having a first state, a second state, and a third state; and b) the circuitry configured to determine, for each estimator, the observation value corresponding to that estimator, is configured to, for each estimator module which is part of the chain that connects each estimator module comprised by that estimator: i) treat the value stored in the observation memory element comprised by that estimator module as part of the observation value for that estimator when the observation memory element comprised by that estimator module is in the first state or the second state; ii) treat that estimator module as not part of that estimator when the observation memory element comprised by that estimator module is in the third state.

Example 69

A machine comprising a set of segment cells, wherein each segment cell from the set of segment cells comprises: a) a set of power connections, wherein the set of power connections comprises first and second power connections, wherein each of the first and second power connections is configured to act as a power source for that segment cell; b) a set of signal connections; and c) circuitry configured to provide a set of output signals over the set of signal connections based on: i) a set of input signals received over the set of signal connections; and ii) which one or more power connections from the set of power connections are receiving power from outside of that segment cell.

Example 70

The machine of example 69, wherein the machine comprises a set of processing cells, wherein, for each processing cell from the set of processing cells: a) that processing cell comprises a plurality of segment cells from the set of segment cells; and b) for each segment cell comprised by that processing cell: i) the first power connection is configured to receive power from a source exterior to that processing cell; and ii) other than the first power connection, each power connection which is configured to act as the power source for that segment cell is configured to receive power from a neighboring segment cell comprised by that processing cell.

Example 71

The machine of example 70, wherein: a) the set of processing cells comprises a set of edge processing cells, wherein, for each processing cell from the set of edge processing cells, that processing cell comprises a segment cell whose first power connection is connected to an overall power source which is external to the set of processing cells; and b) for each processing cell from the set of processing cells, each segment cell comprised by that processing cell is configured to determine an orientation of that segment cell relative to the overall power source based on which one or more power connections from the set of power connections are receiving power.

Example 72

The machine of example 71, wherein, for each processing cell from the set of processing cells, for each segment cell comprised by that processing cell: a) the circuitry comprises first logic configured to generate the set of output signals based on the set of input signals, and second logic configured to generate the set of output signals based on the set of input signals; and b) the circuitry configured to provide the set of output signals over the set of signal connections is configured to base the set of output signals on which one or more power connections from the set of power connections are receiving power from outside of that segment cell by selectively applying the first logic or the second logic to generate the set of output signals based on the orientation of that segment cell relative to the overall power source.

Example 73

The machine of example 72, wherein, for each processing cell from the set of processing cells, for each segment cell comprised by that processing cell, that segment cell is configured to: a) when the first power connection is acting as the power source for that segment cell, provide power to two neighboring segment cells comprised by that processing cell; b) when two power connections from the set of power connections are acting as the power source for that segment cell, provide power to a neighboring processing cell from the set of processing cells; and c) when only one power connection other than the first power connection is acting as the power source for that segment cell, provide power only to one neighboring segment cell comprised by that processing cell.

Example 74

The machine of example 73, wherein, for each processing cell from the set of processing cells: a) that processing cell is a hexagonal processing cell; b) that processing cell comprises a first region and a second region, wherein each segment cell comprised by the first region of that processing cell is less separated from the overall power source than any segment cell comprised by the second region of that processing cell; c) for each segment cell comprised by that processing cell, that segment cell comprises circuitry configured to: i) determine the orientation of that segment cell relative to the overall power source by determining the orientation of that segment cell corresponds to the first region when the first power connection is acting as the power source for that segment cell; ii) when the first power connection is acting as the power source for that segment cell, send a first region signal to two neighboring segment cells comprised by that processing cell; iii) when that segment cell receives the first region signal, send a second region signal to only one neighboring segment cell comprised by that processing cell; iv) when that segment cell receives the second region signal from only one neighboring segment cell comprised by that processing cell, send the second region signal to only one neighboring segment cell comprised by that processing cell; and v) determine the orientation of that segment cell relative to the overall power source by determining: A) the orientation of that segment cell corresponds to the first region when that segment cell receives the first region signal; B) the orientation of that segment cell corresponds to the second region when that segment cell receives the second region signal.

Example 75

The machine of any of examples 72-74, wherein, for each processing cell from the set of processing cells, for each segment cell comprised by that processing cell: a) the second power connection of that segment cell is a common power input connection; b) the neighboring segment cell that the common power input connection is configured to receive power from is a first neighboring segment cell; c) that segment cell comprises a common power output connection and a power transmission line from the common power input connection to the common power output connection; and d) that segment cell is configured to provide power on the second power connection of a neighboring segment cell other than the first neighboring segment cell in the event that that segment cell receives power on the common power input connection, wherein the neighboring segment cell other than the first neighboring segment cell is a second neighboring segment cell.

Example 76

The machine of example 75, wherein, for each processing cell from the set of processing cells, for each segment cell comprised by that processing cell: a) that segment cell comprises a voltage distributor, wherein the voltage distributor has a sequence of inputs; b) the first power connection is configured to receive power from a source exterior to that processing cell; c) that segment cell is configured to, in the event the first power connection is acting as the power source for that segment cell, provide power to an initial input from the sequence of inputs; and d) that segment cell is configured to, in the event it receives power on an input from the sequence of inputs: i) unless the input from the sequence of inputs is a final input from the sequence of inputs, provide power to a neighboring segment cell on a next input of from the sequence of inputs of the voltage distributor comprised by that neighboring segment cell; and ii) in the event that the input from the sequence of inputs is the final input from the sequence of inputs, provide power to a neighboring processing cell from the set of processing cells.

Example 77

The machine of example 76, wherein, for each processing cell from the set of processing cells: a) that processing cell comprises a first region and a second region; b) for each segment cell comprised by that processing cell, that segment cell comprises circuitry configured to: i) determine the orientation of that segment cell relative to the overall power source by determining the orientation of that segment cell corresponds to the first region when the first power connection is acting as the power source for that segment cell; ii) determine the orientation of that segment cell relative to the overall power source by determining the orientation of that segment cell corresponds to the first region when that segment cell receives power on an input from the sequence of inputs other than the final input from the sequence of inputs; iii) determine the orientation of that segment cell relative to the overall power source by determining the orientation of that segment corresponds to the second region when that segment cell receives power on the final input from the sequence of inputs; and iv) determine the orientation of that segment cell relative to the overall power source by determining the orientation of that segment corresponds to the second region when that segment cell does not receive power on any of the sequence of inputs.

Example 78

The machine of any of examples 76-77, wherein, for each processing cell from the set of processing cells, for each segment cell comprised by that processing cell: a) the sequence of inputs comprises an activation input; and b) that segment cell is configured to, in the event that that segment cell receives power on the activation input, provide power on that segment cell's common power output connection to the common power input connection of the second neighboring segment cell.

Example 79

The machine of example 78, wherein the activation input is selected from a group consisting of: a) the initial input from the sequence of inputs; and b) a second input from the sequence of inputs.

Example 80

The machine of any of examples 75-79, wherein, for each processing cell from the set of processing cells, for each segment cell comprised by that processing cell, that segment cell is configured to, in the event that that segment cell receives power on the first power connection, provide power on that segment cell's common power output connection to the common power input connection of the second neighboring segment cell.

Example 81

A machine comprising: a) a processing grid comprising a plurality of processing cells, wherein each cell from the plurality of processing cells is a cellular automaton configured to propagate signals through the processing grid at a first speed; b) a connection grid comprising a plurality of connection cells, wherein each cell from the plurality of connection cells is a cellular automaton configured to propagate signals through the connection grid at a second speed, wherein the second speed is greater than the first speed; and c) circuitry configured to recognize relationships between data items based on collisions of signals corresponding to those data items in the processing grid, and to generate new signals and propagate them through the connection grid based on recognized relationships between data items.

Example 82

The machine of example 81, wherein: a) for each cell from the plurality of processing cells: i) the processing grid comprises a plurality of neighboring processing cells for that processing cell; and ii) that processing cell is configured to propagate signals through the processing grid at the first speed by, based on a first clock signal: A) determining a set of processing output signals based on application of processing logic to a set of processing input signals, wherein each processing output signal from the set of processing output signals corresponds to a neighboring processing cell for that processing cell; and B) providing each processing output signal from the set of processing output signals to the corresponding neighboring processing cell; iii) the processing logic that processing cell is configured to apply to the set of processing input signals is identical to the processing logic which each other processing cell from the plurality of processing cells is configured to apply to the set of processing input signals; b) the first clock signal provides a plurality of instances of a first periodic feature over time; and c) the first speed is one cell per instance of the first periodic feature of the first clock signal.

Example 83

The machine of example 82, wherein: a) for each cell from the plurality of connection cells: i) that cell is configured to propagate signals through the connection grid at the second speed by, based on a second clock signal: A) determining a set of connection output signals based on application of communication logic to a set of connection input signals, wherein each connection output signal from the set of connection output signals corresponding to a neighboring connection cell for that connection cell; and B) providing each connection output signal from the set of connection output signals to the corresponding neighboring connection cell; ii) the communication logic that connection cell is configured to apply to the set of connection input signals is identical to the communication logic which each other connection cell from the plurality of connection cells is configured to apply to the set of connection input signals; b) the second clock signal provides a plurality of instances of a second periodic feature over time; and c) the second speed is one cell per instance of the second periodic feature of the second clock signal.

Example 84

The machine of example 83, wherein the first periodic feature is a transition edge (e.g., a rising edge) of the first clock signal, and the second periodic feature is a transition edge of the second clock signal.

Example 85

The machine of any of examples 83-84, wherein the machine comprises: a) a master clock configured to generate a master clock signal, wherein the master clock signal provides a plurality of a third periodic feature over time; and b) circuitry configured to generate the first clock signal based on the master clock signal based on including, in the first clock signal, instances of the first periodic feature simultaneous with a first subset of instances of the third periodic feature being provided by the master clock signal.

Example 86

The machine of example 85, wherein the master clock signal is the same as the second clock signal, and wherein the third periodic feature is the same as the second periodic feature.

Example 87

The machine of any of examples 81-86, wherein, for each cell from the plurality of connection cells, that cell is configured to propagate signals through the connection grid at the second speed by establishing direct communication connections with neighboring cells from the connection grid, wherein a continuous chain of direct communication connections is operable to propagate a signal between any two cells in the connection grid in a single instance of the first periodic feature of the first clock signal.

Example 88

The machine of claim 87, wherein, for each cell from the plurality of connection cells: a) that cell comprises a plurality of switches; and b) that cell is configured to establish direct communication connections with neighboring cells through closing switches from the plurality of switches.

Example 89

A method for detecting patterns in input signals, wherein the method comprises each of a set of processing cells performing acts comprising: a) based on receiving an input signal, performing a set of input acts comprising sending a ripple pattern outward from that cell; b) receiving ripple patterns sent from other cells comprised by the plurality of processing cells; c) determining that a signal collision has taken place based on simultaneously receiving a plurality of ripple patterns sent from other cells comprised by the plurality of processing cells; d) based on determining that the signal collision has taken place, determining whether to report the signal collision; and e) based on determining to report the signal collision, sending signal collision information for the signal collision to a memory element.

Example 90

The method of example 89, wherein: a) each cell from the plurality of processing cells: i) has a plurality of neighboring cells; ii) is configured to store a plurality of values for a first type of signal, wherein each value from the plurality of values for the first type of signal has a corresponding cell from the plurality of neighboring cells; iii) is configured to store a plurality of values for a second type of signal, wherein each value from the plurality of values for the second type of signal has a corresponding cell from the plurality of neighboring cells; iv) is configured to, upon receiving an update signal, perform propagation acts comprising: A) for each of a set of values stored by that cell for the first type of signal: I) sending the first type of signal to a neighboring cell which is colinear with that cell and with the neighboring cell which corresponds to that value for the first type of signal; II) sending the second type of signal to a neighboring cell which is not colinear with that cell and with the neighboring cell which corresponds to that value for the first type of signal; B) for each of a set of values stored by that cell for the second type of signal, sending the second type of signal to a neighboring cell which is colinear with that cell and with the neighboring cell which corresponds to that value for the second type of signal; and b) for each cell from the plurality of processing cells: i) sending the ripple pattern outward from that cell comprises sending the first type of signal to each neighboring cell corresponding to a value from the plurality of values of the first type of signal that that cell is configured to store; ii) that cell is configured with a first minimum intensity value for values stored by that cell for the first type of signal, and a second minimum intensity value for values stored by that cell for the second type of signal; and iii) determining that the signal collision has taken place based on simultaneously receiving the plurality of ripple patterns sent from other cells comprised by the plurality of processing cells comprises determining whether the total of: A) a number of values stored by that cell for the first type of signal which are not equal to the first minimum intensity value; and B) a number of values stored by that cell for the second type of signal which are not equal to the second minimum intensity value; is greater than one.

Example 91

The method of claim 90, wherein, for each cell from the plurality of processing cells: a) that cell is configured to, for each of the set of values stored by that cell for the first type of signal which is not equal to the first minimum intensity value, send the first type of signal to the neighboring cell which is colinear with that cell and with the neighboring cell which corresponds to that value for the first type of signal at an intensity obtained by applying a first modification to that value; b) that cell is configured to, for each of the set of values stored by that cell for the second type of signal which is not equal to the second minimum intensity value, send the first type of signal to the neighboring cell which is colinear with that cell and with the neighboring cell which corresponds to that value for the second type of signal at an intensity obtained by applying a second modification to that value; c) for each of the set of values stored by that cell for the first type of signal which is not equal to the first minimum intensity value, there exists a number of applications of the first modification to that value which results in an intensity equal to the first minimum intensity value; and d) for each of the set of values stored by that cell for the second type of signal which is not equal to the second minimum intensity value, there exists a number of applications of the second modification to that value which results in an intensity equal to the second minimum intensity value.

Example 92

The method of any of examples 90-91, wherein: a) each cell from the plurality of processing cells is configured to store a plurality of values for a third type of signal, wherein each value from the plurality of values for the third type of signal corresponds to a cell from that cell's plurality of neighboring cells; and b) for each cell from the plurality of processing cells, the propagation acts comprise: i) in the event that that cell stores any values for the first type of signal which are not equal to the first minimum intensity value, for each of those values, sending the third type of signal to the neighboring cell which is not colinear with that cell and with the neighboring cell which corresponds to that value for the first type of signal; and ii) in the event that that cell stores any values for the second type of signal which are not equal to the second minimum intensity value, for each of those values, sending the third type of signal to the neighboring cell which is colinear with that cell and with the neighboring cell which corresponds to that value for the second type of signal.

Example 93

The method of example 92, wherein, for each cell from the plurality of processing cells, the propagation acts comprise: a) when sending the third type of signal based on that cell storing a value for the first type of signal not equal to the first minimum intensity value, sending the third type of signal with a value based on the value for the first type of signal not equal to the first minimum intensity value; and b) when sending the third type of signal based on that cell storing a value for the second type of signal not equal to the second minimum intensity value, sending the third type of signal with the value based on the value for the first type of signal not equal to the first minimum intensity value.

Example 94

The method of any of examples 89-93, wherein: a) each cell from the plurality of processing cells is configured to store data indicating if input to that cell is correlated with subsequent input at a different cell from the plurality of processing cells; b) each cell from the plurality of processing cells is configured to, based on receiving the input signal: i) determine whether input to that cell is correlated with simultaneous or subsequent input at the different cell; and ii) in the event that input to that cell is correlated with simultaneous or subsequent input at the different cell, send an alert to the different cell.

Example 95

The method of any of examples 89-94, wherein: a) the cells from the plurality of processing cells are organized in an array consisting of edge cells and non-edge cells; b) each of the non-edge cells in the array has six neighboring cells; and c) each of the edge cells in the array has less than six neighboring cells.

Example 96

The method of example 95, wherein each of the cells from the plurality of processing cells is a hardware element having a hexagonal body.

Example 97

The method of any of examples 89-96, wherein, for each cell from the plurality of processing cells, that cell is configured to send signal collision information for the signal collision to the memory element by sending the signal collision information to a memory element which is comprised by that cell.

Example 98

The method of any of examples 89-97, wherein, for each cell from the plurality of processing cells, that cell is configured to send signal collision information for the signal collision to the memory element by sending the signal collision information to a cell which is not comprised by the plurality of processing cells.

Example 99

The method of any of examples 89-98, wherein: a) the plurality of processing cells comprises a set of single bit cells and a set of multi-bit cells; b) for each cell from the set of single bit cells, that cell is connected to a corresponding binary value from a set of binary values; and c) for each cell from the set of multi-bit cells: i) that multi-bit cell is associated with a first cell from the plurality of processing cells, and a second cell from the plurality of processing cells; ii) the method comprises: A) maintaining an association between that multi-bit cell and a trigger condition, and an association between that multi-bit cell and an input function; and B) only in the event that the trigger condition associated with that multi-bit cell is satisfied, providing that multi-bit cell an input signal defined based on the input function associated with that multi-bit cell.

Example 100

The method of example 99, wherein the method comprises executing instruction encoding new multi-bit cell definition logic, wherein the instructions encoding the new multi-bit cell definition logic are configured to: a) determine whether data from a plurality of collisions between ripple patterns originating from a first origin cell from the plurality of processing cells and ripple patterns originating from a second origin cell from the plurality of processing cells satisfies a multi-bit cell creation condition; and b) based on determining that data from the plurality of collisions between ripple patterns originating from the first origin cell and ripple patterns originating from the second origin cell satisfies the multi-bit cell creation condition, expanding the set of multi-bit cells to include a plurality of new multi-bit cells by performing multi-bit cell definition acts comprising: i) defining a plurality of new trigger conditions, wherein each new trigger condition is based on an input signal provided to the first origin cell; and ii) defining a set of new input functions, wherein each new input function is based on an input signal provided to the second origin cell; and iii) for each of the plurality of new multi-bit cells, establishing an association between that new multi-bit cell and: A) the first origin cell as the first cell associated with that multi-bit cell; B) the second origin cell as the second cell associated with that multi-bit cell; C) a new trigger condition from the plurality of new trigger conditions; and D) a new input function from the set of new input functions.

Example 101

The method of example 100, wherein defining the plurality of new multi-bit cells comprises: a) associating a first new multi-bit cell with: i) a first new trigger condition, wherein the first new trigger condition is satisfied when the input signal provided to the first origin cell is greater than a threshold, and is not satisfied when the input signal provided to the first origin cell is less than the threshold; and ii) a new input function which defines the input signal to that multi-bit cell as being equal to the input signal provided to the second origin cell; and b) associating a second new multi-bit cell with: i) a second new trigger condition, wherein the second new trigger condition is satisfied when the input signal provided to the first origin cell is less than the threshold, and is not satisfied when the input signal provided to the first origin cell is greater than the threshold; and ii) the new input function which defines the input signal to that multi-bit cell as being equal to the input signal provided to the second origin cell.

Example 102

The method of an of examples 99-101, wherein, for at least one multi-bit cell from the set of multi-bit cells, at least one of: a) the first cell associated with that multi-bit cell; and b) the second cell associated with that multi-bit cell is comprised by the set of multi-bit cells.

Example 103

The method of any of examples 100-102, wherein: a) the plurality of processing cells are comprised by a grid; and b) the multi-bit cell definition acts comprise, for each of the plurality of new multi-bit cells, determining a location for that multi-bit cell in the grid, wherein the location is offset an even number of cells from a path between the first origin cell and the second origin cell.

Example 104

The method of any of examples 100-103, wherein, for each multi-bit cell from the set of multi-bit cells, the logic configured to maintain the association between that multi-bit cell and the trigger condition associated with that multi-bit cell and the association between that multi-bit cell and the input function associated with that multi-bit cell is encoded in a triggering cell associated with that multi-bit cell: a) having a connection to that multi-bit cell; and b) being configured to, based on signal collision information being sent to a memory element comprised by the triggering cell associated with that multi-bit cell: i) determining whether the trigger condition associated with that multi-bit cell is satisfied; and ii) only in the event that the trigger condition associated with that multi-bit cell is satisfied, send the input signal defined based on the input function associated with that multi-bit cell to that multi-bit cell via the connection to that multi-bit cell comprised by that triggering cell.

Example 105

The method of example 104, wherein the new multi-bit cell definition logic is implemented based on, for each cell comprising a memory element to which a cell from the plurality cells is configured to send signal collision information, that cell being configured to: a) store the data from the plurality of collisions between ripple patterns originating from the first origin cell and the second origin cell; b) determine whether the data from the plurality of collisions between ripple patterns originating from the first origin cell and the second origin cell satisfies the multi-bit cell creation condition; c) performing the multi-bit cell definition acts; and d) when expanding the set of multi-bit cells to include the plurality of new multi-bit cells by performing the multi-bit cell definition acts, establishing that cell as the triggering cell for each of the plurality of new multi-bit cells.

Example 106

The method of any of examples 100-105, wherein determining whether data from the plurality of collisions between ripple patterns originating from the first origin cell from the plurality of processing cells and ripple patterns originating from the second origin cell from the plurality of processing cells satisfies the multi-bit cell creation condition is based on an absolute value of a correlation between ripple patterns from the first origin cell and ripple patterns from the second origin cell being less than a correlation threshold.

Example 107

The method of example 106, wherein the new multi-bit cell definition logic is configured to determine the correlation threshold based on a number of reported signal collisions which are detected based on simultaneously receiving: a) a ripple pattern originating from the first origin cell; and b) a ripple pattern originating from the second origin cell.

Example 108

The method of example 107, wherein the number of reported signal collisions is an estimated number of reported signal collisions.

Example 109

The method of any of examples 100-108, wherein determining whether data from the plurality of collisions between ripple patterns originating from the first origin cell from the plurality of processing cells and ripple patterns originating from the second origin cell from the plurality of processing cells satisfies the multi-bit cell creation condition is based on a random value.

Example 110

The method of example 109, wherein determining whether data from the plurality of collisions between ripple patterns originating from the first origin cell from the plurality of processing cells and ripple patterns originating from the second origin cell from the plurality of processing cells satisfies the multi-bit cell creation condition based on the random value comprises: a) determining a correlation threshold based on the random value; and b) determining whether an absolute value of a correlation between ripple patterns from the first origin cell and ripple patterns from the second origin cell is less than the correlation threshold.

Example 111

The method of any of examples 99-110, wherein for each cell from the set of multi-bit cells: a) the trigger condition for that cell is based on an input signal provided to a first origin cell; b) the input function for that cell is based on an input signal provided to a second origin cell; and c) the method comprises executing instructions encoding multi-bit cell removal logic, wherein the instructions encoding the multi-bit cell removal logic are configured to: i) determine whether data from a plurality of collisions between ripple patterns originating from the first origin cell and ripple patterns originating from the second origin cell satisfy a multi-bit cell removal condition; and ii) based on determining that the data from the plurality of conditions between ripple patterns originating from the first origin cell and ripple patterns originating from the second origin cell satisfy the multi-bit cell removal condition, remove that multi-bit cell from the set of multi-bit cells.

Example 112

The method of example 111, wherein determining whether data from the plurality of collisions between ripple patterns originating from the first origin cell and ripple patterns originating from the second origin cell satisfy the multi-bit cell removal condition is based on an absolute value of a correlation between ripple patterns from the first origin cell and ripple patterns from the second origin cell being greater than a tear down threshold.

Example 113

The method of any of examples 89-112, wherein: a) for each processing cell from the plurality of processing cells: i)

that processing cell is configured to determine whether a relationship has been established for that processing cell, wherein the relationship is a relationship between input signals received by that processing cell and input signals received by another processing cell from the plurality of processing cells; ii) the set of input acts comprises, in the event it is determined that the relationship has been established, send an input signal communication to a memory cell from a plurality of memory cells; and b) the method comprises, for each memory cell from the plurality of plurality of memory cells, that memory cell: i) maintaining relationship data comprising data identifying: A) a first processing cell; B) a second processing cell; and C) a time offset, wherein the time offset is a length of time between input signals received at the first processing cell and subsequent input signals received at the second processing cell; and ii) sending a predicted input signal to the second processing cell for receipt after the time offset has elapsed, based on the input signal communication.

Example 114

The method of example 113, wherein, for each memory cell from the plurality of memory cells, that memory cell is configured to determine a value for the predicted input signal to send to the second processing cell based on: a) a value of the input signal communication; and b) the relationship data.

Example 115

The method of any of examples 113-114, wherein, for each memory cell from the plurality of memory cells, that memory cell is configured to send the predicted input signal to the second processing cell for receipt after the time offset has elapsed by performing acts comprising: a) using a counter to determine when a countdown period has elapsed, wherein the countdown period is a period equal to the time offset and starting on receipt of the input signal by the first processing cell; and b) upon elapse of the countdown period, sending the predicted input signal to the second processing cell.

Example 116

The method of any of examples 113-115, wherein, for each memory cell from the plurality of memory cells, that memory cell is configured to send the predicted input signal to the second processing cell for receipt after the time offset has elapsed by sending the predicted input signal to the second processing cell with information indicating when a period equal to the time offset and starting on receipt of the input signal by the first processing cell will have elapsed.

Example 117

The method of any of examples 113-116, wherein, for each memory cell from the plurality of memory cells, that memory cell is configured to send the predicted input signal to the second processing cell for receipt after the time offset has elapsed probabilistically, based on confidence data comprised by the relationship data.

Example 118

The method of any of examples 113-117, wherein, for each processing cell from the plurality of processing cells: a) that processing cell is configured to receive a repeating clock signal; and b) upon receiving both the input signal and the predicted input signal on a single repetition of the clock signal, that processing cell is configured to discard the input signal and send the ripple pattern outward based on the predicted input signal.

Example 119

The method of any of examples 113-118, wherein, for each processing cell from the plurality of processing cells: a) that processing cell has a corresponding connection cell from a plurality of connection cells; b) that processing cell is configured to determine whether the relationship has been established for that processing cell by determining if that processing cell has a connection to its corresponding connection cell; c) the relationship has been established for that processing cell if that processing cell has the connection to its corresponding connection cell; and d) that processing cell is configured to send the input signal communication to the memory cell by providing the input signal communication on the connection to its corresponding connection cell.

Example 120

The method of example 119, wherein: a) the plurality of processing cells, the plurality of connection cells, and the plurality of memory cells are comprised by a plurality of multi-purpose cells; b) each cell from the plurality of multi-purpose cells comprises a cell from the plurality of processing cells, a cell from the plurality of memory cells, and a cell from the plurality of connection cells, wherein the cell from the plurality of processing cells is the same cell as the cell from the plurality of memory cells, the cell from the plurality of memory cells is the same cell as the cell from the plurality of connection cells, and the cell from the plurality of connection cells is the same cell as the cell from the plurality of processing cells.

Example 121

The method of any of examples 119-120, wherein: a) for each processing cell from the plurality of processing cells: i) that processing cell has a corresponding memory cell from the plurality of memory cells; ii) the memory element to which that processing cell is configured to send signal collision information is comprised by that processing cell's corresponding memory cell; iii) that processing cell is configured to send signal collision information to the memory element by sending the signal collision information to that processing cell's corresponding memory cell; b) for each memory cell from the plurality of memory cells, that memory cell has a corresponding connection cell from the plurality of connection cells; c) the method comprises establishing connections between related processing cells from the plurality of processing cells based on: i) upon a memory cell determining that a connection creation condition is satisfied, that memory cell sending collision description information to its corresponding connection cell; and ii) each connection cell being configured to: A) upon receiving collision description information identifying from its corresponding memory cell, wherein the collision description information defines a first target origin and a second target origin: I) propagate a first set of transient values to a first neighboring connection cell; and II) propagate a second set of transient values to a second neighboring connection cell; wherein each of the first set of transient values and the second set of transient values has a target origin and a direction of travel, wherein the first target origin is the target origin for the first set of transient values, and wherein the second target origin is the target origin for the second set of transient values; and B) based on receiving a propagated set of transient values which indicates further propagation is necessary to reach a target origin for that propagated set of transient values: I) determine persistent values for that connection cell based on that propagated set of transient values; II) attenuate that propagated set of transient values; and III) propagate that propagated set of transient values to another neighboring connection cell.

Example 122

The method of example 121, wherein, for each connection cell, that connection cell is configured to, upon receiving a propagated set of transient values which indicates that that connection cell is the target origin for that propagated set of transient values, establish a connection between that connection cell and the corresponding processing cell for that connection cell.

Example 123

The method of example 122, wherein, for each connection cell, that connection cell is configured to: a) upon receiving the propagated set of transient values which indicates that that connection cell is the target origin for that propagated set of transient values, propagate that set of transient values with a value indicating that the target origin for that set of transient values has already been reached; and b) upon receiving the propagated set of transient values with the value indicating that the target origin for that set of transient values has already been reached, propagate that set of transient values to another neighboring connection cell without determining persistent values for that connection cell based on that set of transient values.

Example 124

The method of any of examples 121-123, wherein, for each connection cell, that connection cell is configured to, based on receiving the propagated set of transient values which indicates further propagation is necessary to reach the target origin for that propagated set of transient values: a) determine whether a path to the target origin for that propagated set of transient values should change to a new direction of travel at that connection cell; b) based on determining that the path from the target origin for that propagated set of transient values should not change to the new direction of travel at that connection cell, propagate that propagated set of transient values to another neighboring connection cell by propagating that propagated set of transient values to a neighboring connection cell in the direction of travel for that propagated set of transient values; and c) based on determining that the path from the target origin for that propagated set of transient values should change to the new direction of travel at that connection cell, propagate that propagated set of transient values to a neighboring connection cell in the new direction of travel for that propagated set of transient values.

Example 125

The method of example 124, wherein the first set of transient values and the second set of transient values comprises: a) a first value indicating a straight line distance on the path to the target origin for that set of transient values in the direction of travel for that set of transient values; and b) a second value indicating: i) whether the path to the target origin for that set of transient values changes to the new direction of travel; and ii) when the path to the target origin for that set of transient values changes to the new direction of travel, both the new direction of travel and a straight line distance on the path to the target origin for that set of transient values in the new direction of travel.

Example 126

The method of example 125, wherein the first set of transient values and the second set of transient values each comprise a third value indicating: a) whether the path to the target origin for that set of transient values crosses a midpoint, wherein the midpoint is the midpoint of a second path, wherein the second path is a path between the target origin for the first set of transient values and the target origin for the second set of transient values; and b) when the path to the target origin for that set of transient values crosses the midpoint, a distance to the midpoint on the path to the target origin for that set of transient values.

Example 127

The method of example 126, wherein the first value, the second value and the third value are all integer values.

Example 128

The method of any of examples 125-127, wherein, for each connection cell, that connection cell is configured to, based on determining that the path from the target origin for that propagated set of transient values should change to the new direction of travel at that connection cell, determine the new direction of travel based on the direction of travel for that propagated set of transient values and a sign of the second value.

Example 129

The method of any of examples 125-128, wherein, for each connection cell, that connection cell is configured to, based upon receiving the propagated set of transient values which indicates further propagation is necessary to reach the target origin for that propagated set of transient values: a) determine whether the path to the target origin for that propagated set of transient values should change to the new direction of travel at that connection cell by determining whether both of the following statements are true: i) attenuating the first value results in the first value having an absolute value of zero; ii) the second value does not have an absolute values of zero; and b) attenuating that propagated set of transient values comprises reducing the absolute value of the first value by one.

Example 130

The method of any of examples 125-129, wherein, for each connection cell, that connection cell is configured to, based on receiving the propagated set of transient values which indicates further propagation is necessary to reach the target origin for that propagated set of transient values and on determining that the path to the target origin for that propagated set of transient values should change to the new direction of travel at that connection cell, before propagating that set of transient values to a neighboring cell: a) setting the first value equal to the absolute value of the second value; b) setting the second value equal to zero.

Example 131

The method of any of examples 125-130, wherein, for each connection cell, that connection cell is configured to determine, based on receiving the propagated set of transient values, that that propagated set of transient values indicates further propagation is necessary to reach the target origin for that propagated set of transient values by determining whether the sum of: a) an absolute value of the first value after attenuation; and b) an absolute value of the second value before attenuation; is equal to zero.

Example 132

The method of any of examples 124-131, wherein, for each connection cell, determining persistent values for that connection cell based on receiving the propagated set of transient values which indicates further propagation is necessary to reach the target origin for that propagated set of transient values comprises: a) based on determining that the path from the target origin for that propagated set of transient values should change to the new direction of travel at that connection cell, establish a connection between neighboring connection cells by establishing a connection between: i) the connection cell from which that set of transient values was propagated; and ii) the neighboring connection cell in the new direction of travel for that propagated set of transient values; and b) based on determining that the path from the target origin for that propagated set of transient values should not change to the new direction of travel at that connection cell, establish a connection between neighboring connection cells by establishing a connection between: i) the connection cell from which that set of transient values was propagated; and ii) the neighboring connection cell in the direction of travel for that propagated set of transient values.

Example 133

The method of example 132, wherein, for each connection cell, establishing a connection between neighboring connection cells comprises closing a switch in that connection cell establishing a direct communication path between the neighboring connection cells.

Example 134

The method of any of examples 119-133, wherein: a) for each memory cell: i) that memory cell has a corresponding connection cell from the plurality of connection cells; ii) the corresponding connection cell for that memory cell is on a corresponding collision path, wherein the corresponding collision path is a path between: A) the corresponding connection cell for the first processing cell identified in the relationship data maintained by that memory cell; and B) the corresponding connection cell for the second processing cell identified in the relationship data maintained by that memory cell; b) for every memory cell in a collision set, the corresponding collision path for that memory cell is the same as the corresponding collision path for every other memory cell from the collision set, wherein the collision set is all memory cells: i) whose first processing cell is the same as the first processing cell for all other memory cells in the collision set; and ii) whose second processing cell is the same as the second processing cell for all other memory cells in the collision set.

Example 135

The method of example 134, wherein, for each memory cell from the plurality of memory cells, that memory cell is configured to send the predicted input signal to the second processing cell by sending the predicted input signal to the corresponding connection cell for that memory cell.

Example 136

The method of example 135, wherein for each collision set from a set of collision sets: a) one memory cell from that collision set is a terminal memory cell; b) the connection cell corresponding to the terminal memory cell from that collision set is configured to send the predicted input signal from the terminal memory cell to the connection cell corresponding to the second processing cell identified in the relationship data maintained by the terminal memory cell; and c) the connection cell corresponding to the second processing cell identified in the relationship data maintained by the terminal memory cell is configured to send the predicted input signal received from the connection cell corresponding to the terminal memory cell to the second processing cell identified in the relationship data maintained by the terminal memory cell.

Example 137

The method of example 136, wherein, for each collision set from the set of collision sets, for each memory cell in that collision set other than the terminal memory cell, the connection cell corresponding to that memory cell is configured to: a) send the predicted input signal received from its corresponding memory cell to a neighboring connection cell which corresponds to a different memory cell from the collision set; and b) send, to that memory cell, the predicted input signal received from another connection cell corresponding to another memory cell from that collision set.

Example 138

The method of example 137, wherein, for each collision set from the set of collision sets: a) that collision set comprises an initial memory cell; and b) for each memory cell in that collision set, that memory cell is configured to: i) send the predicted input signal to the second processing cell for receipt after the time offset has elapsed based on the input signal communication by: A) generating the predicted input signal that memory cell is configured to send based on the relationship data maintained by that memory cell; and B) sending the generated predicted input signal to the corresponding connection cell for that memory cell; ii) based on receiving an incoming predicted input signal from the connection cell corresponding to that memory cell, generating the predicted input signal that memory cell is configured to send based on the relationship data maintained by that memory cell by generating the predicted input signal that memory cell is configured to send based on both: A) the relationship data maintained by that memory cell; and B) the incoming predicted input signal received from the connection cell corresponding to that memory cell.

Example 139

The method of example 138, wherein for each collision set from the set of collision sets, for each memory cell in that collision set: a) the predicted input signal that memory cell is configured to send comprises a predicted input signal confidence and a predicted input signal value; b) generating the predicted input signal that memory cell is configured to send comprises determining both the predicted input signal confidence and the predicted input signal value based on: i) the relationship data maintained by that memory cell; ii) a predicted input signal value of the incoming predicted input signal; and iii) the predicted input signal confidence of the incoming predicted input signal.

Example 140

The method of any of examples 137-139, wherein, for each collision set from the set of collision sets: a) for each memory cell from that collision set, the corresponding connection cell for that memory cell is separated from the corresponding connection cell for the second processing cell identified in the relationship data maintained by the terminal memory cell by a corresponding distance along the corresponding collision path; b) the corresponding distance for the connection cell corresponding to the terminal memory cell is greater than the corresponding distance for the connection cell corresponding to any other memory cell in that collision set; and c) for each memory cell in that collision set other than the terminal memory cell, the neighboring connection cell to which the connection cell corresponding to that memory cell is configured to send the predicted input signal has a greater corresponding distance than the connection cell corresponding to that memory cell.

Example 141

A method comprising, at each of a set of estimator modules: a) determining, based on an output of a random number generator, whether an observation signal received on an observation signal input connection comprised by that estimator should be ignored for purposes of adjusting a number of observations associated with that estimator module; and b) determining, based on the output of the random number generator, whether the observation signal on the observation input connection should be ignored for purposes of adjusting an observation value associated with that estimator module.

Example 142

The method of example 141, wherein, for each of the set of estimator modules: a) the number of observations associated with that estimator module is a number of observations corresponding to an estimator which comprises that estimator module, wherein the estimator which comprises that estimator module is comprised by a set of estimators; b) that estimator module is part of a chain which: i) connects each estimator module comprised by the estimator which comprises that estimator module, and ii) does not include any estimator modules comprised by any estimator other than the estimator which comprises that estimator module; and c) the observation value associated with that estimator module is an observation value corresponding to the estimator which comprises that estimator module.

Example 143

The method of example 142, wherein the method comprises determining, for each estimator from the set of estimators, the number of observations corresponding to that estimator based on how many estimator modules are comprised by that estimator.

Example 144

The method of example 143, wherein, for each estimator from the set of estimators: a) each estimator module comprised by that estimator comprises: i) an extends in connection; ii) an extends out connection; iii) an extends out storage element, wherein the extends out storage element stores a value indicating if that estimator module is connected to another estimator module via the extends out connection; b) for each estimator module comprised by that estimator except for a head estimator module, that estimator module is connected to another estimator module comprised by that estimator via the extends in connection; and c) for each estimator module comprised by that estimator except for a tail estimator module, that estimator module is connected to another estimator module comprised by that estimator via the extends out connection.

Example 145

The method of example 144, wherein, for each estimator from the set of estimators, for each estimator module comprised by that estimator, that estimator module comprises circuitry for determining, based on the output of the random number generator, whether the observation signal on the observation input connection should be ignored for purposes of adjusting the number of observations associated with that estimator module by determining whether to prevent a connection from being established from the tail estimator module comprised by that estimator to another estimator module via the extends out connection of the tail estimator module comprised by that estimator.

Example 146

The method of example 145, wherein, for each estimator from the set of estimators, for each estimator module comprised by that estimator: a) that estimator module is configured to determine that it is the tail estimator module based on the extends out storage element storing a value indicating that estimator module is not connected to another estimator module via the extends our connection; b) that estimator module is configured to, based on: i) determining that the observation signal on the observation input connection should not be ignored for purposes of adjusting the number of observations associated with that estimator module; and ii) determining that that estimator module is the tail estimator module; connect to another estimator module via the extends out connection.

Example 147

The method of any of examples 144-146, wherein, for each estimator from the set of estimators, for each estimator module comprised by that estimator: a) unless that estimator module is the tail estimator module, that estimator module is configured to: i) based on determining that the observation signal on the observation input connection should be ignored for purposes of adjusting the number of observations associated with that estimator module, send a no extend signal to the estimator module connected via the extends out connection, wherein the no extend signal indicates that the observation signal on the observation input connection should be ignored for purposes of adjusting the number of observations associated with that estimator module; and ii) based on receiving the no extend signal, send the no extend signal to the estimator module connected via the extends out connection; and b) that estimator module is configured to ignore the observation signal on the observation input connection for purposes of adjusting the number of observations associated with that estimator module based on receiving the no extend signal.

Example 148

The method of any of examples 143-147, wherein determining, for each estimator from the set of estimators, the number of observations corresponding to that estimator based on the number of estimator modules comprised by that estimator, comprises, for each estimator from the set of estimators, calculating the number of observations corresponding to that estimator as an estimate equal to $20^{(m+1)}-2$, wherein m is a cardinality value of a set consisting of one or more estimator modules comprised by that estimator.

Example 149

The method of any of examples 142-148, wherein: a) each estimator module from the set of estimator modules comprises an observation memory element; and b) the method comprises determining, for each estimator from the set of estimators, the observation value corresponding to that estimator based on values stored in the observation memory elements comprised by that estimator.

Example 150

The method of example 149, wherein a) for each estimator module from the set of estimator modules, the observation memory element comprised by that estimator module stores a binary value having a length equal to a uniform length; b) determining, for each estimator from the set of estimators, the observation value corresponding to that estimator, comprises: i) defining a highest order portion of a binary representation of the observation value corresponding to that estimator as equal to a value stored in the observation memory element of a head estimator module comprised by that estimator; and ii) for each estimator module comprised by that estimator other than the head estimator module, defining a portion associated with that estimator module as equal to the value stored in the observation memory element of that estimator module, wherein the portion associated with that estimator module is a portion of the binary representation of the observation value corresponding to that estimator which is separated from the highest order portion by a product of the uniform length and a number of estimator modules separating that estimator module from the head estimator module in the chain which connects each estimator module comprised by that estimator.

Example 151

The method of example 150, wherein the uniform length is one bit.

Example 152

The method of any of examples 150-151, wherein for each estimator from the set of estimators, for each estimator module comprised by that estimator: a) that estimator module is configured to update the value stored in the observation memory element by making that value equal to observation signal on the observation input connection when that estimator module is first added to that estimator by being connected to another estimator module which is part of the chain connecting each estimator module comprised by that estimator; b) that estimator module comprises circuitry configured to update the value stored in the observation memory element by performing an inversion operation based on: i) receiving a signal from another estimator module comprised by that estimator indicating that no other estimator module had determined that the observation signal on the observation input connection should be ignored for purposes of adjusting the observation value associated with that estimator module; ii) that estimator module determining that the observation signal on the observation input connection should not be ignored for purposes of adjusting the observation value associated with that estimator module; and iii) that estimator module determining that it is a tail estimator module in the chain connecting each estimator module comprised by that estimator; wherein the inversion operation changes the value stored in the observation memory element from an original value to an updated value by inverting the original value; c) that estimator module comprises circuitry configured to update the value stored in the observation memory element by performing the inversion operation based on receiving a carry signal from another estimator module comprised by the chain which connects each estimator module comprised by that estimator; and d) that estimator module comprises circuitry configured to send the carry signal to a higher order estimator module based on: i) completing the inversion operation; and ii) the original value of the value stored in the observation memory element not being equal to the observation signal on the observation input connection, wherein the higher order estimator module is comprised by the chain which connects each estimator module comprised by that estimator, and is separated from the tail estimator module by more estimator modules than that estimator module.

Example 153

The method of any of examples 151-152, wherein, for at least one estimator from the set of estimators: a) that estimator has an associated tree structure which comprises a set of nodes, wherein: i) the set of nodes comprises a subset of nodes, ii) for each node from the subset of nodes, that node is connected to a terminal set of estimator modules, wherein each estimator module from the terminal set of estimator modules connected to that node is comprised by that estimator; b) for each node from the set of nodes: i) except for a root node, each node from the set of nodes is connected to one parent node in the set of nodes; and ii) that node is connected to a set of children, wherein: A) for each node from the set of nodes, the set of children for that node comprises a first subset of children and a second subset of children, wherein the first subset of children and the second subset of children are disjoint; B) for each node from the subset of nodes, the set of children for that node comprises the set of estimator modules connected to that node; and C) for each node from the set of nodes other than nodes in the subset of nodes, the set of children for that node consists of other nodes from the set of nodes; and c) the method comprise for a node on a shortest path between the root node and a target estimator module, based on one or more values stored by that node, identifying a child of that node which is also on the shortest path between the root node and the target estimator module, for each of the following target estimator modules: i) an estimator module which stores a value representing a lowest order portion of the binary representation of the observation value corresponding to that estimator; ii) an estimator module which stores a value representing a lowest order 0 in the binary representation of the observation value corresponding to that estimator; and iii) an estimator module which stores a value representing a lowest order 1 in the binary representation of the observation value corresponding to that estimator.

Example 154

The method of any of examples 149-154, wherein: a) for each estimator module from the set of estimator modules, the observation memory element comprised by that estimator module is a tri-state memory element having a first state, a second state, and a third state; and b) determining, for each estimator from the set of estimators, the observation value corresponding to that estimator, comprises, for each estimator module which is part of the chain that connects each estimator module comprised by that estimator: i) treating the value stored in the observation memory element comprised by that estimator module as part of the observation value for that estimator when the observation memory element comprised by that estimator module is in the first state or the second state; ii) treating that estimator module as not part of that estimator when the observation memory element comprised by that estimator module is in the third state.

Example 155

A method comprising, at each segment cell from a set of segment cells: a) providing a set of input signals to that segment cell over a set of signal connections comprised by that segment cell; b) providing power to that segment cell from outside of that segment cell over one or more power connections from a set of power connections comprised by that segment cell, wherein the set of power connections comprises first and second power connections; and c) providing a set of output signals over the set of signal connections based on: i) the set of input signals; and ii) which one or more power connections from the set of power connections are receiving power from outside of that segment cell.

Example 156

The method of example 155, wherein: a) each segment cell from the set of segment cells is comprised by a processing cell from a set of processing cells; and b) for each processing cell form the set of processing cells: i) that processing cell comprises a plurality of segment cells from the set of segment cells; and ii) for each segment cell comprised by that processing cell: A) the first power connection is configured to receive power from a source exterior to that processing cell; and B) other than the first power connection, each power connection from the set of power connections is configured to receive power from a neighboring segment cell comprised by that processing cell.

Example 157

The method of example 156, wherein: a) the set of processing cells comprises a set of edge processing cells, wherein, for each processing cell from the set of edge processing cells, that processing cell comprises a segment cell whose first power connection is connected to an overall power source which is external to the set of processing cells; and b) for each processing cell from the set of processing cells, each segment cell comprised by that processing cell is configured to determine an orientation of that segment cell relative to the overall power source based on which one or more power connections from the set of power connections are receiving power.

Example 158

The method of example 157, wherein, for each processing cell from the set of processing cells, for each segment cell comprised by that processing cell: a) that segment cell comprises circuitry encoding: i) first logic configured to generate the set of output signals based on the set of input signals, and ii) second logic configured to generate the set of output signals based on the set of input signals; and b) providing the set of output signals over the set of signal connections comprises selectively applying the first logic or the second logic to the set of input signals based on which one or more power connections from the set of power connections are receiving power from outside of that segment cell to generate the set of output signals based on orientation of that segment cell relative to an overall power source.

Example 159

The method of example 158, wherein, for each processing cell from the set of processing cells, for each segment cell comprised by that processing cell, that segment cell is configured to: a) when the first power connection is acting as the power source for that segment cell, provide power to two neighboring segment cells comprised by that processing cell; b) when two power connections from the set of power connections are acting as the power source for that segment cell, provide power to a neighboring processing cell from the set of processing cells; and c) when only one power connection other than the first power connection is acting as the power source for that segment cell, provide power only to one neighboring segment cell comprised by that processing cell.

Example 160

The method of example 159, wherein, for each processing cell from the set of processing cells: a) that processing cell is a hexagonal processing cell; b) that processing cell comprises a first region and a second region, wherein each segment cell comprised by the first region of that processing cell is less separated from the overall power source than any segment cell comprised by the second region of that processing cell; c) for each segment cell comprised by that processing cell, that segment cell comprises circuitry configured to: i) determine the orientation of that segment cell relative to the overall power source by determining the orientation of that segment cell corresponds to the first region when the first power connection is acting as the power source for that segment cell; ii) when the first power connection is acting as the power source for that segment cell, send a first region signal to two neighboring segment cells comprised by that processing cell; iii) when that segment cell receives the first region signal, send a second region signal to only one neighboring segment cell comprised by that processing cell; iv) when that segment cell receives the second region signal from only one neighboring segment cell comprised by that processing cell, send the second region signal to only one neighboring segment cell comprised by that processing cell; and v) determine the orientation of that segment cell relative to the overall power source by determining: A) the orientation of that segment cell corresponds to the first region when that segment cell receives the first region signal; B) the orientation of that segment cell corresponds to the second region when that segment cell receives the second region signal.

Example 161

The method of any of examples 158-160, wherein, for each processing cell from the set of processing cells, for each segment cell comprised by that processing cell: a) the second power connection of that segment cell is a common power input connection; b) the neighboring segment cell that the common power input connection is configured to receive power from is a first neighboring segment cell; c) that segment cell comprises a common power output connection and a power transmission line from the common power input connection to the common power output connection; and d) that segment cell is configured to provide power on the second power connection of a neighboring segment cell other than the first neighboring segment cell in the event that that segment cell receives power on the common power input connection, wherein the neighboring segment cell other than the first neighboring segment cell is a second neighboring segment cell.

Example 162

The method of example 161, wherein, for each processing cell from the set of processing cells, for each segment cell comprised by that processing cell: a) that segment cell comprises a voltage distributor, wherein the voltage distributor has a sequence of inputs; b) the first power connection is configured to receive power from a source exterior to that processing cell; c) that segment cell is configured to, in the event the first power connection is acting as the power source for that segment cell, provide power to an initial input from the sequence of inputs; and d) that segment cell is configured to, in the event it receives power on an input from the sequence of inputs: i) unless the input from the sequence of inputs is a final input from the sequence of inputs, provide power to a neighboring segment cell on a next input of from the sequence of inputs of the voltage distributor comprised by that neighboring segment cell; and ii) in the event that the input from the sequence of inputs is the final input from the sequence of inputs, provide power to a neighboring processing cell from the set of processing cells.

Example 163

The method of example 162, wherein, for each processing cell from the set of processing cells: a) that processing cell comprises a first region and a second region; b) for each segment cell comprised by that processing cell, that segment cell comprises circuitry configured to: i) determine the orientation of that segment cell relative to the overall power source by determining the orientation of that segment cell corresponds to the first region when the first power connection is acting as the power source for that segment cell; ii) determine the orientation of that segment cell relative to the overall power source by determining the orientation of that segment cell corresponds to the first region when that segment cell receives power on an input from the sequence of inputs other than the final input from the sequence of inputs; iii) determine the orientation of that segment cell relative to the overall power source by determining the orientation of that segment corresponds to the second region when that segment cell receives power on the final input from the sequence of inputs; and iv) determine the orientation of that segment cell relative to the overall power source by determining the orientation of that segment corresponds to the second region when that segment cell does not receive power on any of the sequence of inputs.

Example 164

The method of any of examples 162-163, wherein, for each processing cell from the set of processing cells, for each segment cell comprised by that processing cell: a) the sequence of inputs comprises an activation input; and b) that segment cell is configured to, in the event that that segment cell receives power on the activation input, provide power on that segment cell's common power output connection to the common power input connection of the second neighboring segment cell.

Example 165

The method of example 164, wherein the activation input is selected from a group consisting of: a) the initial input from the sequence of inputs; and b) a second input from the sequence of inputs.

Example 166

The method of any of examples 161-165, wherein, for each processing cell from the set of processing cells, for each segment cell comprised by that processing cell, that segment cell is configured to, in the event that that segment cell receives power on the first power connection, provide power on that segment cell's common power output connection to the common power input connection of the second neighboring segment cell.

Example 167

A method comprising: a) propagating signals through a processing grid comprising a plurality of processing cells, each of which is implemented as a cellular automaton, at a first speed; b) propagating signals through a connection grid comprising a plurality of connection cells, each of which is implemented as a cellular automaton, at a second speed; c) recognizing relationships between data items based on signals corresponding to those data items in the processing grid; and d) generating new signals and propagating the new signals through the connection grid based on the recognized relationships between data items.

Example 168

The method of example 167, wherein: a) for each cell from the plurality of processing cells: i) the processing grid comprises a plurality of neighboring processing cells for that processing cell; and ii) that processing cell is configured to propagate signals through the processing grid at the first speed by, based on a first clock signal: A) determining a set of processing output signals based on application of processing logic to a set of processing input signals, wherein each processing output signal from the set of processing output signals corresponds to a neighboring processing cell for that processing cell; and B) providing each processing output signal from the set of processing output signals to the corresponding neighboring processing cell; iii) the processing logic that processing cell is configured to apply to the set of processing input signals is identical to the processing logic which each other processing cell from the plurality of processing cells is configured to apply to the set of processing input signals; b) the first clock signal provides a plurality of instances of a first periodic feature over time; and c) the first speed is one cell per instance of the first periodic feature of the first clock signal.

Example 169

The method of example 168, wherein: a) for each cell from the plurality of connection cells: i) that cell is configured to propagate signals through the connection grid at the second speed by, based on a second clock signal: A) determining a set of connection output signals based on application of communication logic to a set of connection input signals, wherein each connection output signal from the set of connection output signals corresponding to a neighboring connection cell for that connection cell; and B) providing each connection output signal from the set of connection output signals to the corresponding neighboring connection cell; ii) the communication logic that connection cell is configured to apply to the set of connection input signals is identical to the communication logic which each other connection cell from the plurality of connection cells is configured to apply to the set of connection input signals; b) the second clock signal provides a plurality of instances of a second periodic feature over time; and c) the second speed is one cell per instance of the second periodic feature of the second clock signal.

Example 170

The method of example 169, wherein the first periodic feature is a transition edge of the first clock signal, and the second periodic feature is a transition edge of the second clock signal.

Example 171

The method of any of examples 169-170, wherein the method comprises: a) generating a master clock signal, wherein the master clock signal provides a plurality of a third periodic feature over time; and b) generating the first clock signal based on the master clock signal based on including, in the first clock signal, instances of the first periodic feature simultaneous with a first subset of instances of the third periodic feature being provided by the master clock signal.

Example 172

The method of example 171, wherein the master clock signal is the same as the second clock signal, and wherein the third periodic feature is the same as the second periodic feature.

Example 173

The method of any of examples 167-172, wherein, for each cell from the plurality of connection cells, that cell is configured to propagate signals through the connection grid at the second speed by establishing direct communication connections with neighboring cells from the connection grid, wherein a continuous chain of direct communication connections is operable to propagate a signal between any two cells in the connection grid in a single instance of the first periodic feature of the first clock signal.

Example 174

The method of example 173, wherein, for each cell from the plurality of connection cells: a) that cell comprises a plurality of switches; and b) that cell is configured to establish direct communication connections with neighboring cells through closing switches from the plurality of switches.

As set forth herein a cellular automata based artificial intelligence system such as described can provide various benefits relative to conventional approaches. For example, using an array of cells such as described herein, it can be possible to identify correlations between large numbers of variables (e.g., 1000 or more variables) that may not be possible to process using conventional techniques, and then use those correlations to generate practical outputs such as predictions, classifications and/or replacements for missing data. For example, in the healthcare field, by representing both presence or absence of a condition (e.g., whether an individual has prostate cancer) and variables which may be relevant to that condition as values that are provided as input to a processing grid (e.g., a positive result for a certain test is a positive input at a cell, a negative result for a certain test is a negative input at that cell, while no input would be provided at that cell for an individual who had not taken the test), variables (or combinations of variables represented by multi-bit cells) which are correlated with that condition can be identified, because paths may be established in the connection system between the processing grid cells representing the correlated variables and the processing grid cell representing the condition. Additionally, a likelihood that an individual does or does not have the condition can be determined by providing data reflecting the correlated variables and treating the condition as missing data which could be supplied based on the correlations using the techniques described herein. Other applications where the disclosed approaches could be applied (e.g., weather forecasting, mineralogical surveys, preference prediction, etc.) are also possible and will be immediately apparent to those of skill in the art in light of this disclosure. Accordingly, the above example should be understood as being illustrative only, and should not be treated as limiting.

It should be understood that any one or more of the teachings, expressions, embodiments, examples, etc. described herein may be combined with any one or more of the other teachings, expressions, embodiments, examples, etc. that are described herein. The above-described teachings, expressions, embodiments, examples, etc. should therefore not be viewed in isolation relative to each other. Various suitable ways in which the teachings herein may be combined will be readily apparent to those of ordinary skill in the art in view of the teachings herein. Such modifications and variations are intended to be included within the scope of the claims. Other variations are also possible, and will be immediately apparent to and could be implemented without undue experimentation by those of ordinary skill in the art in light of this disclosure. Accordingly, the protection provided by this document, or any related document, should not be treated as being limited to the embodiments, examples and variations described herein, but instead should be understood as being defined by the claims set forth in the relevant document when the terms of those claims which are explicitly defined in the following paragraphs or by subsequently provided explicit definitions are given their explicit definitions, and when the other terms are given their broadest reasonable definitions as provided by a general purpose dictionary.

In this document, "based on" should be understood to mean that something is determined at least in part by the thing it is indicated as being "based on." The phrase "based EXCLUSIVELY on" is used to indicate that something must be completely determined based on something else.

In this document, modifiers such as "first," "second," etc. should be understood as labels used to facilitate identification of a particular item being referred to, and, unless context clearly indicates otherwise, should not be understood as implying any required order or other relationship between the labeled objects. For example, a statement that there is a "first value" and a "second value" should not be understood as implying that one of the values comes first, or is determined first, or even that the "first value" and the "second value" are necessarily different values. Similarly a reference to a cell as a "processing cell," a "memory cell" or a connection cell" should not be treated as implying structural or functional requirements for such cell, but instead should be understood as a use of the modifiers "processing," "memory" or "connection" for ease of reference only.

In this document, "means for establishing high speed connections between locations corresponding to received inputs in the array" should be understood as a limitation set forth in means plus function form as provided for in 35 U.S.C. § 112(f), in which the function is "establishing high speed connections between locations corresponding to received inputs in the array" and the corresponding structure is that described and illustrated in connection with the connection system, including a computer programmed with instructions which, when executed, cause that computer to perform the algorithms described for the connection system.

In this document, "means for probabilistically tracking a ratio of observations" should be understood as a limitation set forth in means plus function form as provided for in 35 U.S.C. § 112(f) in which the function is "probabilistically tracking a radio of observations" and the corresponding structure is an estimator comprising one or more estimator modules as illustrated in FIGS. 43-47 and described in the corresponding text.

In this document, "means for propagating inputs in ripple patterns throughout an array" should be understood as a limitation set forth in means plus function form as provided for in 35 U.S.C. § 112(f) in which the function is "propagating inputs in ripple patterns throughout an array" and the corresponding structure is that described and illustrated in connection with the processing grid, including a computer programmed with instructions which, when executed, cause that computer to perform the algorithms described for the processing grid.

In this document, "means for storing data regarding collisions between ripple patterns in the array" should be understood as a limitation set forth in means plus function form as provided for in 35 U.S.C. § 112(f) in which the function is "for storing data regarding collisions between ripple patterns in the array" and the corresponding structure is that described and illustrated in connection with the memory network, including a computer programmed with instructions which, when executed, cause that computer to perform the algorithms described for the memory network.

In this document, "ripple pattern" should be understood to refer to a pattern which moves outward from a location along a convex perimeter which expands over time.

In this document, "set" should be understood to refer to a number, group or combination of zero or more elements of similar nature, design or function. The terms "subset" and "superset" should be understood as being synonymous with set, with the different terms being used for the sake of understanding, and with a subset and a superset of a set potentially each having the same cardinality as the set, rather than necessarily being smaller or larger than the set they are contained by (in the case of a subset) or that they contain (in the case of a superset).

In this document, "simultaneously" and "simultaneous" should be understood to mean received during a single measured unit of time. For example, in a system in which signals are received and stored for a fixed period (e.g., five milliseconds) before being discarded, then two signals received within the fixed period (e.g., within a five millisecond period) would be considered to have been received simultaneously.

I claim:

1. A machine comprising a plurality of processing cells, wherein:
   i) each cell from the plurality of processing cells is configured to:
      a) based on receiving an input signal, perform a set of input acts comprising sending a ripple pattern outward from that cell;
      b) receive ripple patterns sent from other cells comprised by the plurality of processing cells;
      c) determine that a signal collision has taken place based on simultaneously receiving a plurality of ripple patterns sent from other cells comprised by the plurality of processing cells;
      d) based on determining that the signal collision has taken place, determine whether to report the signal collision; and
      e) based on determining to report the signal collision, send signal collision information for the signal collision to a memory element; and
   ii) each processing cell is a hardware element comprising a plurality of physical connections connecting to a plurality of neighboring processing cells.

2. The machine of claim 1, wherein:
   a) the plurality of processing cells comprises a set of single bit cells and a set of multi-bit cells;
   b) for each cell from the set of single bit cells, the machine comprises a connection between that cell and a corresponding binary value from a set of binary values; and
   c) for each cell from the set of multi-bit cells:
      i) that multi-bit cell is associated with a first cell from the plurality of processing cells, and a second cell from the plurality of processing cells;
      ii) the machine comprises logic configured to:
         A) maintain an association between that multi-bit cell and a trigger condition, and an association between that multi-bit cell and an input function; and
         B) only in the event that the trigger condition associated with that multi-bit cell is satisfied, provide that multi-bit cell an input signal defined based on the input function associated with that multi-bit cell.

3. The machine of claim 2, wherein the machine comprises new multi-bit cell definition logic configured to:
 a) determine whether data from a plurality of collisions between ripple patterns originating from a first origin cell from the plurality of processing cells and ripple patterns originating from a second origin cell from the plurality of processing cells satisfies a multi-bit cell creation condition; and
 b) based on determining that data from the plurality of collisions between ripple patterns originating from the first origin cell and ripple patterns originating from the second origin cell satisfies the multi-bit cell creation condition, expanding the set of multi-bit cells to include a plurality of new multi-bit cells by performing multi-bit cell definition acts comprising:
  i) defining a plurality of new trigger conditions, wherein each new trigger condition is based on an input signal provided to the first origin cell; and
  ii) defining a set of new input functions, wherein each new input function is based on an input signal provided to the second origin cell; and
  iii) for each of the plurality of new multi-bit cells, establishing an association between that new multi-bit cell and:
   A) the first origin cell as the first cell associated with that multi-bit cell;
   B) the second origin cell as the second cell associated with that multi-bit cell;
   C) a new trigger condition from the plurality of new trigger conditions; and
   D) a new input function from the set of new input functions.

4. The machine of claim 3, wherein defining the plurality of new multi-bit cells comprises:
 a) associating a first new multi-bit cell with:
  i) a first new trigger condition, wherein the first new trigger condition is satisfied when the input signal provided to the first origin cell is greater than a threshold, and is not satisfied when the input signal provided to the first origin cell is less than the threshold; and
  ii) a new input function which defines the input signal to that multi-bit cell as being equal to the input signal provided to the second origin cell; and
 b) associating a second new multi-bit cell with:
  i) a second new trigger condition, wherein the second new trigger condition is satisfied when the input signal provided to the first origin cell is less than the threshold, and is not satisfied when the input signal provided to the first origin cell is greater than the threshold; and
  ii) the new input function which defines the input signal to that multi-bit cell as being equal to the input signal provided to the second origin cell.

5. The machine of claim 2, wherein, for at least one multi-bit cell from the set of multi-bit cells, at least one of:
 a) the first cell associated with that multi-bit cell; and
 b) the second cell associated with that multi-bit cell
is comprised by the set of multi-bit cells.

6. The machine of claim 3, wherein:
 a) the plurality of processing cells are comprised by a grid; and
 b) the multi-bit cell definition acts comprise, for each of the plurality of new multi-bit cells, determining a location for that multi-bit cell in the grid, wherein the location is offset an even number of cells from a path between the first origin cell and the second origin cell.

7. The machine of claim 3, wherein, for each multi-bit cell from the set of multi-bit cells, the logic configured to maintain the association between that multi-bit cell and the trigger condition associated with that multi-bit cell and the association between that multi-bit cell and the input function associated with that multi-bit cell is encoded in a triggering cell associated with that multi-bit cell:
 a) having a connection to that multi-bit cell; and
 b) being configured to, based on signal collision information being sent to a memory element comprised by the triggering cell associated with that multi-bit cell:
  i) determining whether the trigger condition associated with that multi-bit cell is satisfied; and
  ii) only in the event that the trigger condition associated with that multi-bit cell is satisfied, send the input signal defined based on the input function associated with that multi-bit cell to that multi-bit cell via the connection to that multi-bit cell comprised by that triggering cell.

8. The machine of claim 7, wherein the new multi-bit cell definition logic is implemented based on, for each cell comprising a memory element to which a cell from the plurality cells is configured to send signal collision information, that cell being configured to:
 a) store the data from the plurality of collisions between ripple patterns originating from the first origin cell and the second origin cell;
 b) determine whether the data from the plurality of collisions between ripple patterns originating from the first origin cell and the second origin cell satisfies the multi-bit cell creation condition;
 c) performing the multi-bit cell definition acts; and
 d) when expanding the set of multi-bit cells to include the plurality of new multi-bit cells by performing the multi-bit cell definition acts, establishing that cell as the triggering cell for each of the plurality of new multi-bit cells.

9. The machine of claim 3, wherein determining whether data from the plurality of collisions between ripple patterns originating from the first origin cell from the plurality of processing cells and ripple patterns originating from the second origin cell from the plurality of processing cells satisfies the multi-bit cell creation condition is based on an absolute value of a correlation between ripple patterns from the first origin cell and ripple patterns from the second origin cell being less than a correlation threshold.

10. The machine of claim 9, wherein the new multi-bit cell definition logic is configured to determine the correlation threshold based on a number of reported signal collisions which are detected based on simultaneously receiving:
 a) a ripple pattern originating from the first origin cell; and
 b) a ripple pattern originating from the second origin cell.

11. The machine of claim 3, wherein determining whether data from the plurality of collisions between ripple patterns originating from the first origin cell from the plurality of processing cells and ripple patterns originating from the second origin cell from the plurality of processing cells satisfies the multi-bit cell creation condition is based on a random value.

12. The machine of claim 11, wherein determining whether data from the plurality of collisions between ripple patterns originating from the first origin cell from the plurality of processing cells and ripple patterns originating from the second origin cell from the plurality of processing cells satisfies the multi-bit cell creation condition based on the random value comprises:
 a) determining a correlation threshold based on the random value; and
 b) determining whether an absolute value of a correlation between ripple patterns from the first origin cell and ripple patterns from the second origin cell is less than the correlation threshold.

13. The machine of claim 2, wherein for each cell from the set of multi-bit cells:
 a) the trigger condition for that cell is based on an input signal provided to a first origin cell;
 b) the input function for that cell is based on an input signal provided to a second origin cell; and
 c) the machine comprises multi-bit cell removal logic configured to:
  i) determine whether data from a plurality of collisions between ripple patterns originating from the first origin cell and ripple patterns originating from the second origin cell satisfy a multi-bit cell removal condition; and
  ii) based on determining that the data from the plurality of conditions between ripple patterns originating from the first origin cell and ripple patterns originating from the second origin cell satisfy the multi-bit cell removal condition, remove that multi-bit cell from the set of multi-bit cells.

14. The machine of claim 13, wherein determining whether data from the plurality of collisions between ripple patterns originating from the first origin cell and ripple patterns originating from the second origin cell satisfy the multi-bit cell removal condition is based on an absolute value of a correlation between ripple patterns from the first origin cell and ripple patterns from the second origin cell being greater than a tear down threshold.

15. The machine of claim 2, wherein:
 a) the machine comprises a mapping module;
 b) the mapping module comprises:
  i) for each cell from the plurality of processing cells, the connection between that cell and the corresponding binary value from the set of binary values; and
  ii) for each cell from the set of multi-bit cells:
   A) the association between that cell and the associated trigger condition;
   B) the association between that cell and the associated input function;
   C) the logic configured to, only in the event that the trigger condition associated with that cell is satisfied, provide that cell the input signal defined based on the input function associated with that cell.

16. A method for detecting patterns in input signals, wherein the method comprises each of a set of processing cells performing acts comprising:
 a) based on receiving an input signal, performing a set of input acts comprising sending a ripple pattern outward from that cell;
 b) receiving ripple patterns sent from other cells comprised by the plurality of processing cells;
 c) determining that a signal collision has taken place based on simultaneously receiving a plurality of ripple patterns sent from other cells comprised by the plurality of processing cells;
 d) based on determining that the signal collision has taken place, determining whether to report the signal collision; and
 e) based on determining to report the signal collision, sending signal collision information for the signal collision to a memory element.

17. The method of claim 16, wherein:
 a) the plurality of processing cells comprises a set of single bit cells and a set of multi-bit cells;
 b) for each cell from the set of single bit cells, that cell is connected to a corresponding binary value from a set of binary values; and
 c) for each cell from the set of multi-bit cells:
  i) that multi-bit cell is associated with a first cell from the plurality of processing cells, and a second cell from the plurality of processing cells;
  ii) the method comprises:
   A) maintaining an association between that multi-bit cell and a trigger condition, and an association between that multi-bit cell and an input function; and
   B) only in the event that the trigger condition associated with that multi-bit cell is satisfied, providing that multi-bit cell an input signal defined based on the input function associated with that multi-bit cell.

18. The method of claim 17, wherein the method comprises executing instruction encoding new multi-bit cell definition logic, wherein the instructions encoding the new multi-bit cell definition logic are configured to:
 a) determine whether data from a plurality of collisions between ripple patterns originating from a first origin cell from the plurality of processing cells and ripple patterns originating from a second origin cell from the plurality of processing cells satisfies a multi-bit cell creation condition; and
 b) based on determining that data from the plurality of collisions between ripple patterns originating from the first origin cell and ripple patterns originating from the second origin cell satisfies the multi-bit cell creation condition, expanding the set of multi-bit cells to include a plurality of new multi-bit cells by performing multi-bit cell definition acts comprising:
  i) defining a plurality of new trigger conditions, wherein each new trigger condition is based on an input signal provided to the first origin cell; and
  ii) defining a set of new input functions, wherein each new input function is based on an input signal provided to the second origin cell; and
  iii) for each of the plurality of new multi-bit cells, establishing an association between that new multi-bit cell and:
   A) the first origin cell as the first cell associated with that multi-bit cell;
   B) the second origin cell as the second cell associated with that multi-bit cell;
   C) a new trigger condition from the plurality of new trigger conditions; and
   D) a new input function from the set of new input functions.

19. The method of claim 18, wherein defining the plurality of new multi-bit cells comprises:
 a) associating a first new multi-bit cell with:
  i) a first new trigger condition, wherein the first new trigger condition is satisfied when the input signal provided to the first origin cell is greater than a threshold, and is not satisfied when the input signal provided to the first origin cell is less than the threshold; and ii) a new input function which defines the input signal to that multi-bit cell as being equal to the input signal provided to the second origin cell; and b) associating a second new multi-bit cell with:
   i) a second new trigger condition, wherein the second new trigger condition is satisfied when the input signal provided to the first origin cell is less than the threshold, and is not satisfied when the input signal provided to the first origin cell is greater than the threshold; and
   ii) the new input function which defines the input signal to that multi-bit cell as being equal to the input signal provided to the second origin cell.

20. The method of claim 17, wherein, for at least one multi-bit cell from the set of multi-bit cells, at least one of:
   a) the first cell associated with that multi-bit cell; and
   b) the second cell associated with that multi-bit cell
   is comprised by the set of multi-bit cells.

21. The method of claim 18, wherein:
   a) the plurality of processing cells are comprised by a grid; and
   b) the multi-bit cell definition acts comprise, for each of the plurality of new multi-bit cells, determining a location for that multi-bit cell in the grid, wherein the location is offset an even number of cells from a path between the first origin cell and the second origin cell.

22. The method of claim 18, wherein, for each multi-bit cell from the set of multi-bit cells, the logic configured to maintain the association between that multi-bit cell and the trigger condition associated with that multi-bit cell and the association between that multi-bit cell and the input function associated with that multi-bit cell is encoded in a triggering cell associated with that multi-bit cell:
   a) having a connection to that multi-bit cell; and
   b) being configured to, based on signal collision information being sent to a memory element comprised by the triggering cell associated with that multi-bit cell:
      i) determining whether the trigger condition associated with that multi-bit cell is satisfied; and
      ii) only in the event that the trigger condition associated with that multi-bit cell is satisfied, send the input signal defined based on the input function associated with that multi-bit cell to that multi-bit cell via the connection to that multi-bit cell comprised by that triggering cell.

23. The method of claim 22, wherein the new multi-bit cell definition logic is implemented based on, for each cell comprising a memory element to which a cell from the plurality cells is configured to send signal collision information, that cell being configured to:
   a) store the data from the plurality of collisions between ripple patterns originating from the first origin cell and the second origin cell;
   b) determine whether the data from the plurality of collisions between ripple patterns originating from the first origin cell and the second origin cell satisfies the multi-bit cell creation condition;
   c) performing the multi-bit cell definition acts; and
   d) when expanding the set of multi-bit cells to include the plurality of new multi-bit cells by performing the multi-bit cell definition acts, establishing that cell as the triggering cell for each of the plurality of new multi-bit cells.

24. The method of claim 18, wherein determining whether data from the plurality of collisions between ripple patterns originating from the first origin cell from the plurality of processing cells and ripple patterns originating from the second origin cell from the plurality of processing cells satisfies the multi-bit cell creation condition is based on an absolute value of a correlation between ripple patterns from the first origin cell and ripple patterns from the second origin cell being less than a correlation threshold.

25. The method of claim 24, wherein the new multi-bit cell definition logic is configured to determine the correlation threshold based on a number of reported signal collisions which are detected based on simultaneously receiving:
   a) a ripple pattern originating from the first origin cell; and
   b) a ripple pattern originating from the second origin cell.

26. The method of claim 18, wherein determining whether data from the plurality of collisions between ripple patterns originating from the first origin cell from the plurality of processing cells and ripple patterns originating from the second origin cell from the plurality of processing cells satisfies the multi-bit cell creation condition is based on a random value.

27. The method of claim 26, wherein determining whether data from the plurality of collisions between ripple patterns originating from the first origin cell from the plurality of processing cells and ripple patterns originating from the second origin cell from the plurality of processing cells satisfies the multi-bit cell creation condition based on the random value comprises:
   a) determining a correlation threshold based on the random value; and
   b) determining whether an absolute value of a correlation between ripple patterns from the first origin cell and ripple patterns from the second origin cell is less than the correlation threshold.

28. The method of claim 17, wherein for each cell from the set of multi-bit cells:
   a) the trigger condition for that cell is based on an input signal provided to a first origin cell;
   b) the input function for that cell is based on an input signal provided to a second origin cell; and
   c) the method comprises executing instructions encoding multi-bit cell removal logic, wherein the instructions encoding the multi-bit cell removal logic are configured to:
      i) determine whether data from a plurality of collisions between ripple patterns originating from the first origin cell and ripple patterns originating from the second origin cell satisfy a multi-bit cell removal condition; and
      ii) based on determining that the data from the plurality of conditions between ripple patterns originating from the first origin cell and ripple patterns originating from the second origin cell satisfy the multi-bit cell removal condition, remove that multi-bit cell from the set of multi-bit cells.

29. The method of claim 28, wherein determining whether data from the plurality of collisions between ripple patterns originating from the first origin cell and ripple patterns originating from the second origin cell satisfy the multi-bit cell removal condition is based on an absolute value of a correlation between ripple patterns from the first origin cell and ripple patterns from the second origin cell being greater than a tear down threshold.

30. The method of claim 16, wherein:
   a) for each processing cell from the plurality of processing cells:
      i) that processing cell is configured to determine whether a relationship has been established for that processing cell, wherein the relationship is a relationship between input signals received by that processing cell and input signals received by another processing cell from the plurality of processing cells;

ii) the set of input acts comprises, in the event it is determined that the relationship has been established, send an input signal communication to a memory cell from a plurality of memory cells; and b) the method comprises, for each memory cell from the plurality of memory cells, that memory cell:

i) maintaining relationship data comprising data identifying:

A) a first processing cell;

B) a second processing cell; and

C) a time offset, wherein the time offset is a length of time between input signals received at the first processing cell and subsequent input signals received at the second processing cell; and ii) sending a predicted input signal to the second processing cell for receipt after the time offset has elapsed, based on the input signal communication.

31. A machine comprising a processor and a non-transitory computer readable medium having stored therein instructions operable to, when executed by the processor, perform operations of a plurality of processing cells, wherein each cell from the plurality of processing cells is configured to:

a) based on receiving an input signal, perform a set of input acts comprising sending a ripple pattern outward from that cell;

b) receive ripple patterns sent from other cells comprised by the plurality of processing cells;

c) determine that a signal collision has taken place based on simultaneously receiving a plurality of ripple patterns sent from other cells comprised by the plurality of processing cells;

d) based on determining that the signal collision has taken place, determine whether to report the signal collision; and e) based on determining to report the signal collision, send signal collision information for the signal collision to a memory element.

32. The machine of claim 31, wherein:

a) the plurality of processing cells comprises a set of single bit cells and a set of multi-bit cells;

b) for each cell from the set of single bit cells, the machine comprises a connection between that cell and a corresponding binary value from a set of binary values; and c) for each cell from the set of multi-bit cells:

i) that multi-bit cell is associated with a first cell from the plurality of processing cells, and a second cell from the plurality of processing cells;

ii) the machine comprises logic configured to:

A) maintain an association between that multi-bit cell and a trigger condition, and an association between that multi-bit cell and an input function; and B) only in the event that the trigger condition associated with that multi-bit cell is satisfied, provide that multi-bit cell an input signal defined based on the input function associated with that multi-bit cell.

33. The machine of claim 32, wherein the machine comprises new multi-bit cell definition logic configured to:

a) determine whether data from a plurality of collisions between ripple patterns originating from a first origin cell from the plurality of processing cells and ripple patterns originating from a second origin cell from the plurality of processing cells satisfies a multi-bit cell creation condition; and b) based on determining that data from the plurality of collisions between ripple patterns originating from the first origin cell and ripple patterns originating from the second origin cell satisfies the multi-bit cell creation condition, expanding the set of multi-bit cells to include a plurality of new multi-bit cells by performing multi-bit cell definition acts comprising:

i) defining a plurality of new trigger conditions, wherein each new trigger condition is based on an input signal provided to the first origin cell; and ii) defining a set of new input functions, wherein each new input function is based on an input signal provided to the second origin cell; and iii) for each of the plurality of new multi-bit cells, establishing an association between that new multi-bit cell and:

A) the first origin cell as the first cell associated with that multi-bit cell;

B) the second origin cell as the second cell associated with that multi-bit cell;

C) a new trigger condition from the plurality of new trigger conditions; and

D) a new input function from the set of new input functions.

34. The machine of claim 33, wherein defining the plurality of new multi-bit cells comprises:

a) associating a first new multi-bit cell with:

i) a first new trigger condition, wherein the first new trigger condition is satisfied when the input signal provided to the first origin cell is greater than a threshold, and is not satisfied when the input signal provided to the first origin cell is less than the threshold; and ii) a new input function which defines the input signal to that multi-bit cell as being equal to the input signal provided to the second origin cell; and b) associating a second new multi-bit cell with:

i) a second new trigger condition, wherein the second new trigger condition is satisfied when the input signal provided to the first origin cell is less than the threshold, and is not satisfied when the input signal provided to the first origin cell is greater than the threshold; and ii) the new input function which defines the input signal to that multi-bit cell as being equal to the input signal provided to the second origin cell.

35. The machine of claim 32, wherein, for at least one multi-bit cell from the set of multi-bit cells, at least one of:

a) the first cell associated with that multi-bit cell; and b) the second cell associated with that multi-bit cell is comprised by the set of multi-bit cells.

36. The machine of claim 33, wherein:

a) the plurality of processing cells are comprised by a grid; and b) the multi-bit cell definition acts comprise, for each of the plurality of new multi-bit cells, determining a location for that multi-bit cell in the grid, wherein the location is offset an even number of cells from a path between the first origin cell and the second origin cell.

37. The machine of claim 33, wherein, for each multi-bit cell from the set of multi-bit cells, the logic configured to maintain the association between that multi-bit cell and the trigger condition associated with that multi-bit cell and the association between that multi-bit cell and the input function associated with that multi-bit cell is encoded in a triggering cell associated with that multi-bit cell:
  a) having a connection to that multi-bit cell; and
  b) being configured to, based on signal collision information being sent to a memory element comprised by the triggering cell associated with that multi-bit cell:
    i) determining whether the trigger condition associated with that multi-bit cell is satisfied; and
    ii) only in the event that the trigger condition associated with that multi-bit cell is satisfied, send the input signal defined based on the input function associated with that multi-bit cell to that multi-bit cell via the connection to that multi-bit cell comprised by that triggering cell.

38. The machine of claim 37, wherein the new multi-bit cell definition logic is implemented based on, for each cell comprising a memory element to which a cell from the plurality cells is configured to send signal collision information, that cell being configured to:
  a) store the data from the plurality of collisions between ripple patterns originating from the first origin cell and the second origin cell;
  b) determine whether the data from the plurality of collisions between ripple patterns originating from the first origin cell and the second origin cell satisfies the multi-bit cell creation condition;
  c) performing the multi-bit cell definition acts; and
  d) when expanding the set of multi-bit cells to include the plurality of new multi-bit cells by performing the multi-bit cell definition acts, establishing that cell as the triggering cell for each of the plurality of new multi-bit cells.

39. The machine of claim 33, wherein determining whether data from the plurality of collisions between ripple patterns originating from the first origin cell from the plurality of processing cells and ripple patterns originating from the second origin cell from the plurality of processing cells satisfies the multi-bit cell creation condition is based on an absolute value of a correlation between ripple patterns from the first origin cell and ripple patterns from the second origin cell being less than a correlation threshold.

40. The machine of claim 39, wherein the new multi-bit cell definition logic is configured to determine the correlation threshold based on a number of reported signal collisions which are detected based on simultaneously receiving:
  a) a ripple pattern originating from the first origin cell; and
  b) a ripple pattern originating from the second origin cell.

41. The machine of claim 33, wherein determining whether data from the plurality of collisions between ripple patterns originating from the first origin cell from the plurality of processing cells and ripple patterns originating from the second origin cell from the plurality of processing cells satisfies the multi-bit cell creation condition is based on a random value.

42. The machine of claim 41, wherein determining whether data from the plurality of collisions between ripple patterns originating from the first origin cell from the plurality of processing cells and ripple patterns originating from the second origin cell from the plurality of processing cells satisfies the multi-bit cell creation condition based on the random value comprises:
  a) determining a correlation threshold based on the random value; and
  b) determining whether an absolute value of a correlation between ripple patterns from the first origin cell and ripple patterns from the second origin cell is less than the correlation threshold.

43. The machine of claim 32, wherein for each cell from the set of multi-bit cells:
  a) the trigger condition for that cell is based on an input signal provided to a first origin cell;
  b) the input function for that cell is based on an input signal provided to a second origin cell; and
  c) the machine comprises multi-bit cell removal logic configured to:
    i) determine whether data from a plurality of collisions between ripple patterns originating from the first origin cell and ripple patterns originating from the second origin cell satisfy a multi-bit cell removal condition; and
    ii) based on determining that the data from the plurality of conditions between ripple patterns originating from the first origin cell and ripple patterns originating from the second origin cell satisfy the multi-bit cell removal condition, remove that multi-bit cell from the set of multi-bit cells.

44. The machine of claim 43, wherein determining whether data from the plurality of collisions between ripple patterns originating from the first origin cell and ripple patterns originating from the second origin cell satisfy the multi-bit cell removal condition is based on an absolute value of a correlation between ripple patterns from the first origin cell and ripple patterns from the second origin cell being greater than a tear down threshold.

45. The machine of claim 32, wherein:
  a) the machine comprises a mapping module;
  b) the mapping module comprises:
    i) for each cell from the plurality of processing cells, the connection between that cell and the corresponding binary value from the set of binary values; and
    ii) for each cell from the set of multi-bit cells:
      A) the association between that cell and the associated trigger condition;
      B) the association between that cell and the associated input function;
      C) the logic configured to, only in the event that the trigger condition associated with that cell is satisfied, provide that cell the input signal defined based on the input function associated with that cell.

* * * * *